(12) United States Patent
Kodama et al.

(10) Patent No.: US 9,953,126 B2
(45) Date of Patent: Apr. 24, 2018

(54) METHOD OF WIRING LAYOUT, SEMICONDUCTOR DEVICE, PROGRAM FOR SUPPORTING DESIGN OF WIRING LAYOUT, AND METHOD FOR MANUFACTURING SEMICONDUCTOR DEVICE

(71) Applicant: TOSHIBA MEMORY CORPORATION, Minato-ku (JP)

(72) Inventors: Chikaaki Kodama, Arakawa (JP); Koichi Nakayama, Hiratsuka (JP); Toshiya Kotani, Machida (JP); Shigeki Nojima, Yokohama (JP); Fumiharu Nakajima, Yokohama (JP); Hirotaka Ichikawa, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 581 days.

(21) Appl. No.: 14/506,436

(22) Filed: Oct. 3, 2014

(65) Prior Publication Data

US 2015/0021782 A1 Jan. 22, 2015

Related U.S. Application Data

(63) Continuation-in-part of application No. 14/156,309, filed on Jan. 15, 2014, which is a continuation-in-part
(Continued)

(30) Foreign Application Priority Data

Sep. 14, 2011 (JP) .................................. 2011-201230

(51) Int. Cl.
*H01L 21/768* (2006.01)
*H01L 21/306* (2006.01)
(Continued)

(52) U.S. Cl.
CPC ...... *G06F 17/5077* (2013.01); *H01L 21/0337* (2013.01); *H01L 21/31144* (2013.01); *H01L 21/76816* (2013.01)

(58) Field of Classification Search
CPC ......... H01L 21/30604; H01L 21/31144; H01L 21/823431; H01L 27/0886; H01L 29/66795; H01L 21/823821
See application file for complete search history.

(56) References Cited

U.S. PATENT DOCUMENTS 6,518,180 B1  2/2003  Fukuda
7,669,172 B2  2/2010  Ito et al.
(Continued)

FOREIGN PATENT DOCUMENTS

JP       3819711 B2    9/2006
JP    2008-116505 A    5/2008
(Continued)

OTHER PUBLICATIONS

Ban et al.; "Layout Decomposition of Self-Aligned Double Patterning for 2D Random Logic Patterning"; Proc. of SPIE vol. 7974, 79740L-1; Feb. 27, 2011-Mar. 3, 2011.
(Continued)

*Primary Examiner* — Marc Armand
*Assistant Examiner* — Quinton Brasfield
(74) *Attorney, Agent, or Firm* — Oblon, McClelland, Maier & Neustadt, L.L.P.

(57) ABSTRACT

According to one embodiment, a design method of layout formed by a sidewall method is provided. The method includes: preparing a base pattern on which a plurality of first patterns extending in a first direction and arranged at a first space in a second direction intersecting the first direction and a plurality of second patterns extending in the first direction and arranged at a center between the first patterns, respectively, are provided; and drawing a connecting portion
(Continued)

which extends in the second direction and connects two neighboring first patterns sandwiching one of the second patterns, and separating the one of the second patterns into two patterns not contacting the connecting portion.

27 Claims, 148 Drawing Sheets

Related U.S. Application Data of application No. 14/133,278, filed on Dec. 18, 2013, which is a continuation-in-part of application No. 13/777,766, filed on Feb. 26, 2013, now abandoned, which is a continuation-in-part of application No. 13/405,922, filed on Feb. 27, 2012, now abandoned.

(51) Int. Cl.
  *G06F 17/50* (2006.01)
  *H01L 21/033* (2006.01)
  *H01L 21/311* (2006.01)

(56) References Cited

U.S. PATENT DOCUMENTS 8,368,182 B2 * 2/2013 Lee .................... H01L 21/0337
  257/623

| | | | |
|---|---|---|---|
| 2009/0087754 A1* | 4/2009 | Aton | G03F 1/26 430/5 |
| 2009/0155990 A1* | 6/2009 | Yanagidaira | H01L 21/31144 438/584 |
| 2010/0244257 A1 | 9/2010 | Matsuno et al. | |
| 2013/0062771 A1 | 3/2013 | Kodama et al. | |

FOREIGN PATENT DOCUMENTS

| JP | 2008-233383 A | 10/2008 |
|---|---|---|
| JP | 2009-146966 | 7/2009 |
| JP | 2013-61575 A | 4/2013 |

OTHER PUBLICATIONS

Yongchan Ban, et al., "Flexible 2D Layout Decomposition Framework for Spacer-Type Double Patterning Lithography", Design Automation Conference, Jun. 2011, pp. 789-794.

Hongbo Zhang, et al., "Self-Aligned Double Patterning Decomposition for Overlay Minimization and Hot Spot Detection", Design Automation Conference, Jun. 2011, pp. 71-76.

Minoo Mirsaeedi, et al., "Self-Aligned Double Patterning (SADP) Layout Decomposition", International Symposium on Quality Electronic Design, Mar. 2011, pp. 103-109.

* cited by examiner

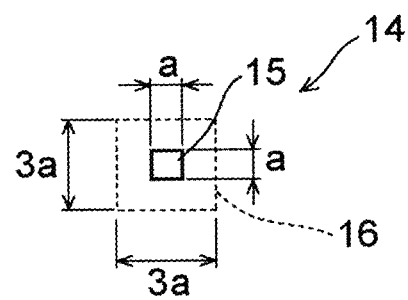
FIG. 2A
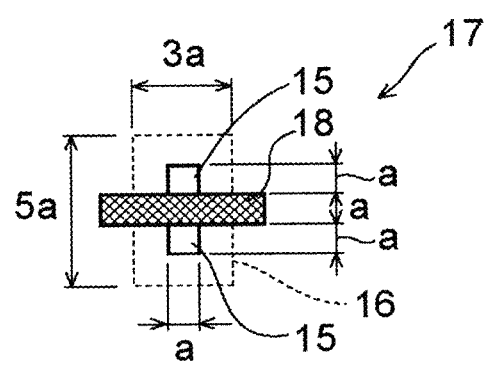
FIG. 2B
FIG. 2C
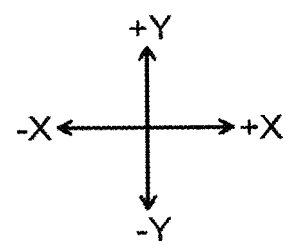

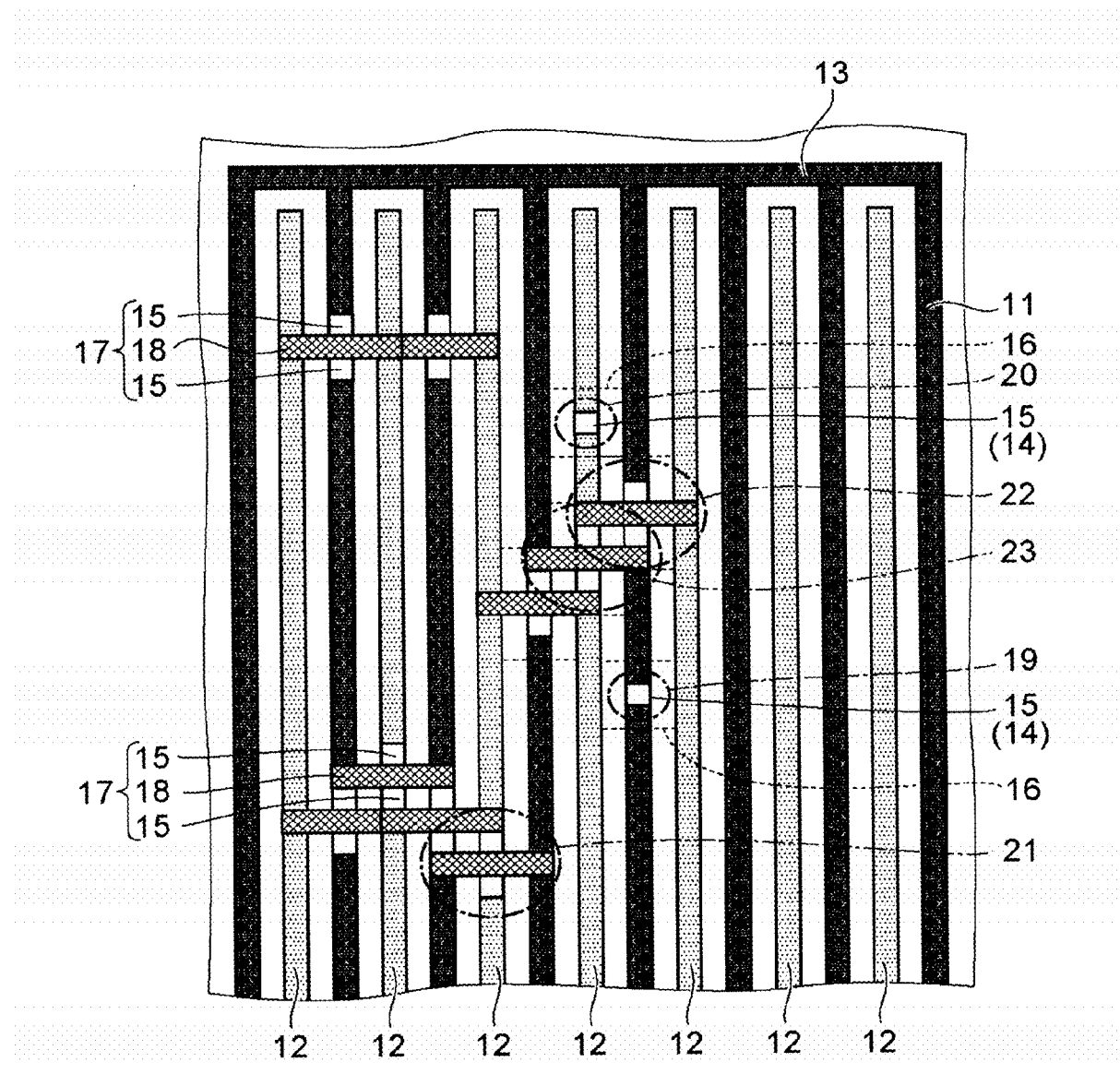
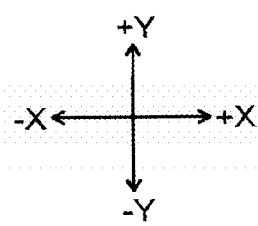
FIG. 3A
FIG. 3B

FIG. 6A
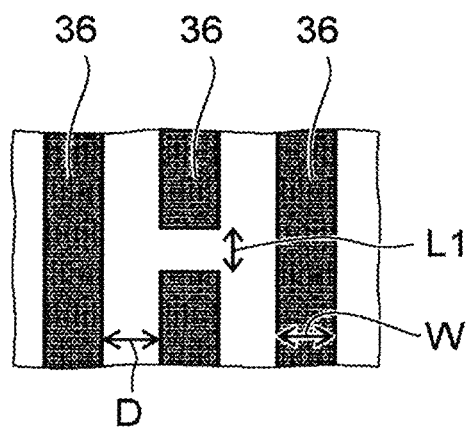
FIG. 6B
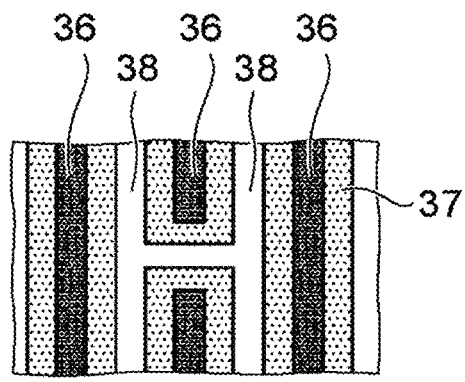
FIG. 6C
FIG. 6D
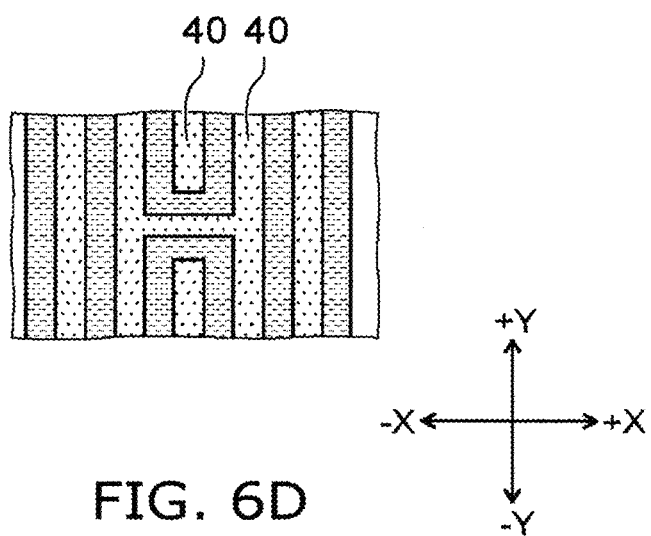

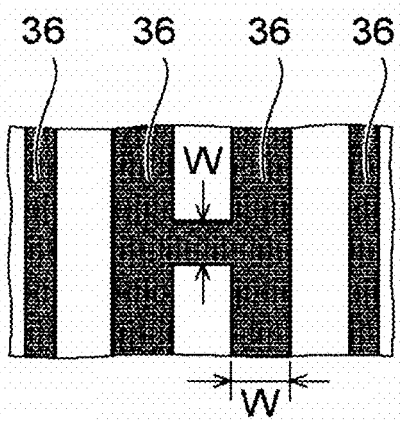
FIG. 7A
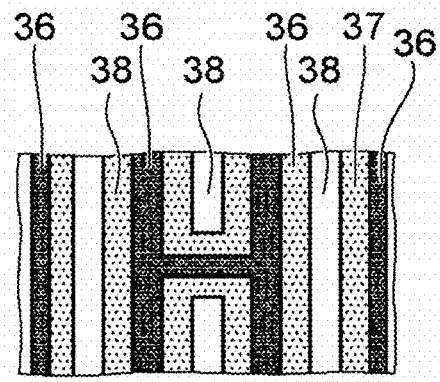
FIG. 7B
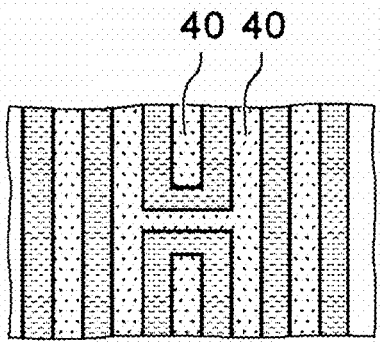
FIG. 7C
FIG. 7D

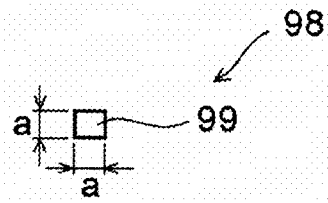
FIG. 20A
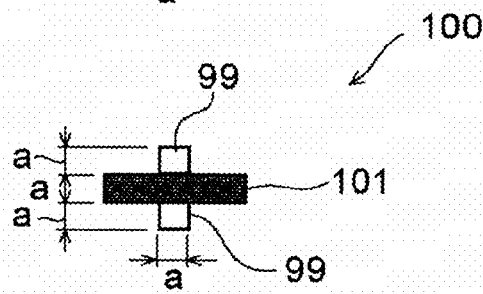
FIG. 20B
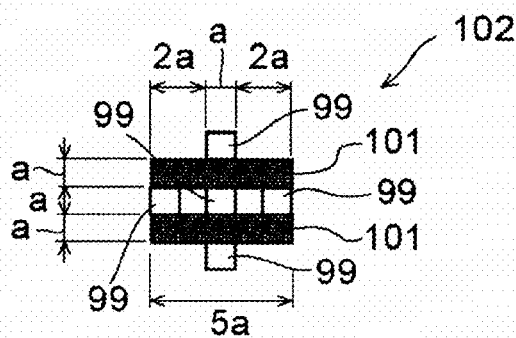
FIG. 20C
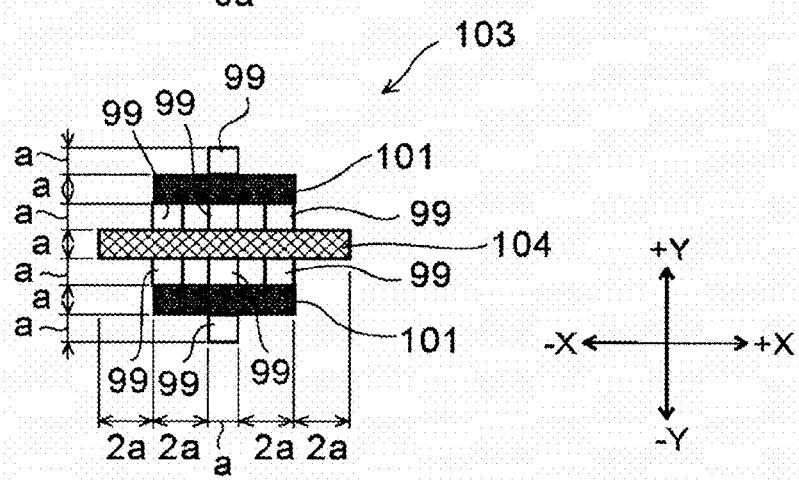
FIG. 20D
FIG. 20E

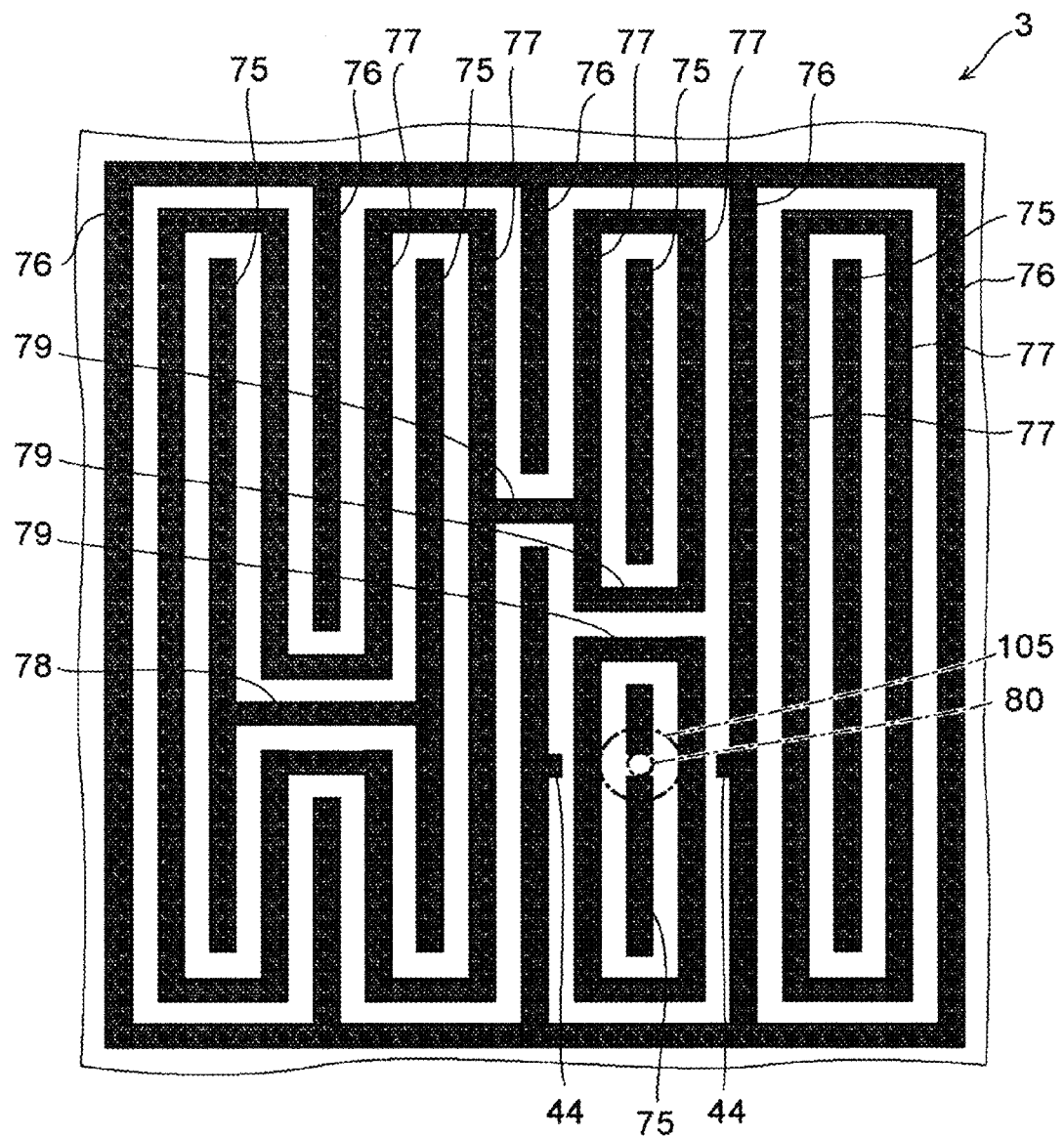
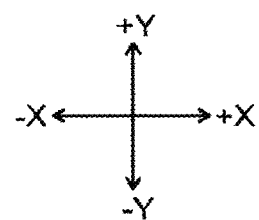
FIG. 40A
FIG. 40B

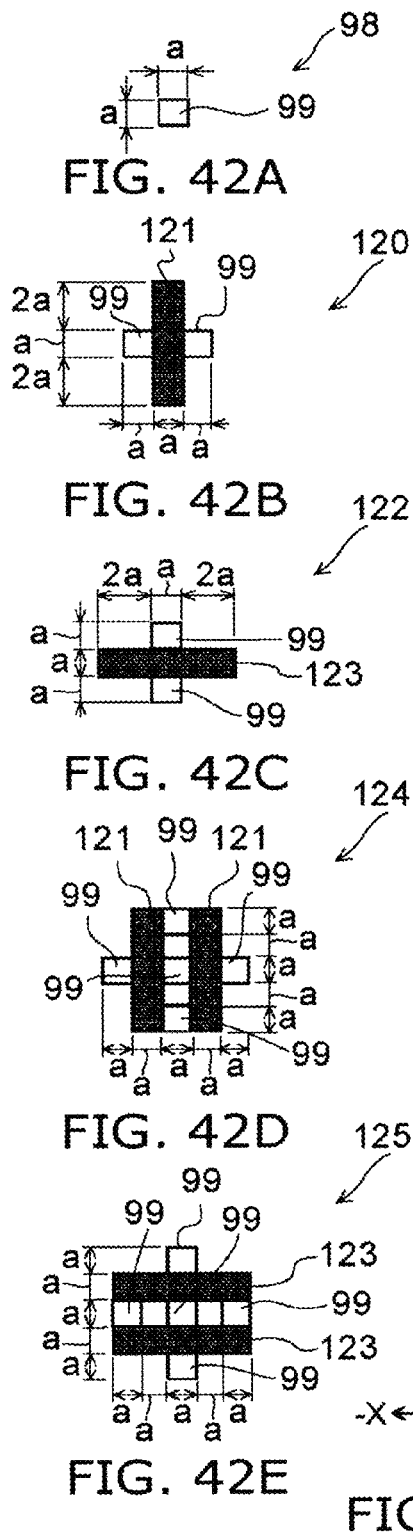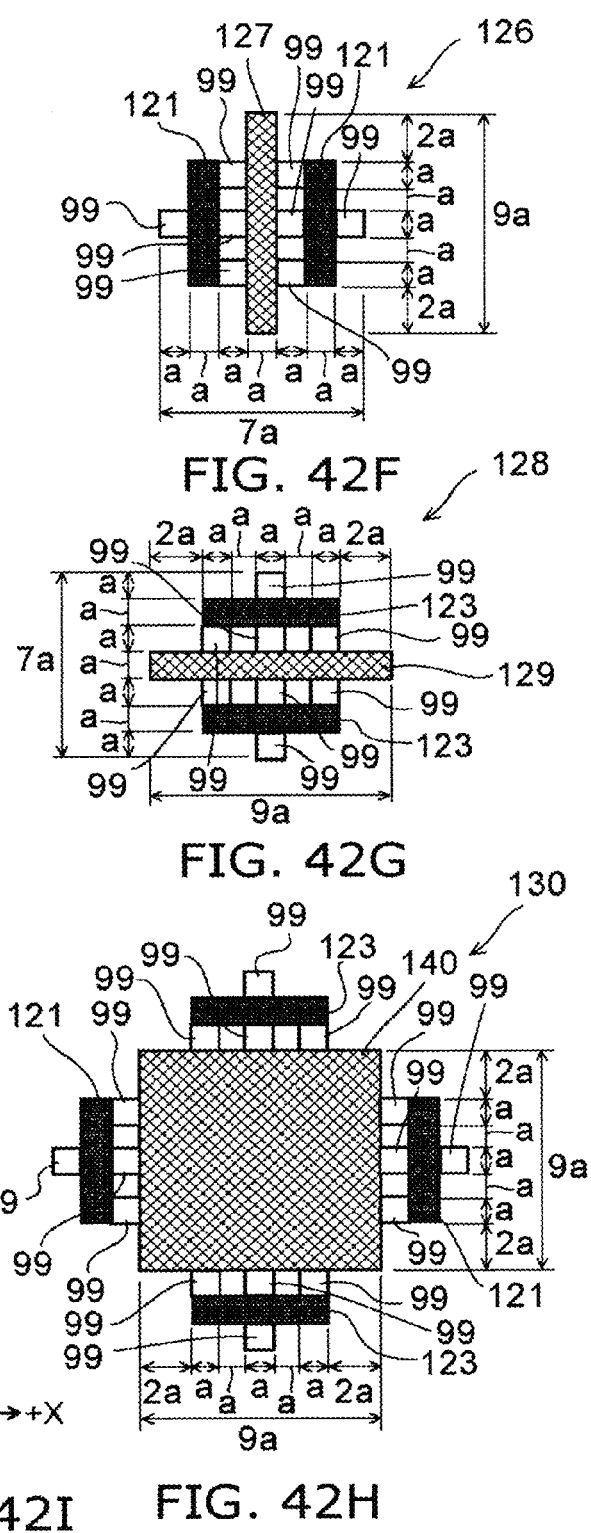
FIG. 42A FIG. 42B FIG. 42C FIG. 42D FIG. 42E FIG. 42F FIG. 42G FIG. 42H FIG. 42I

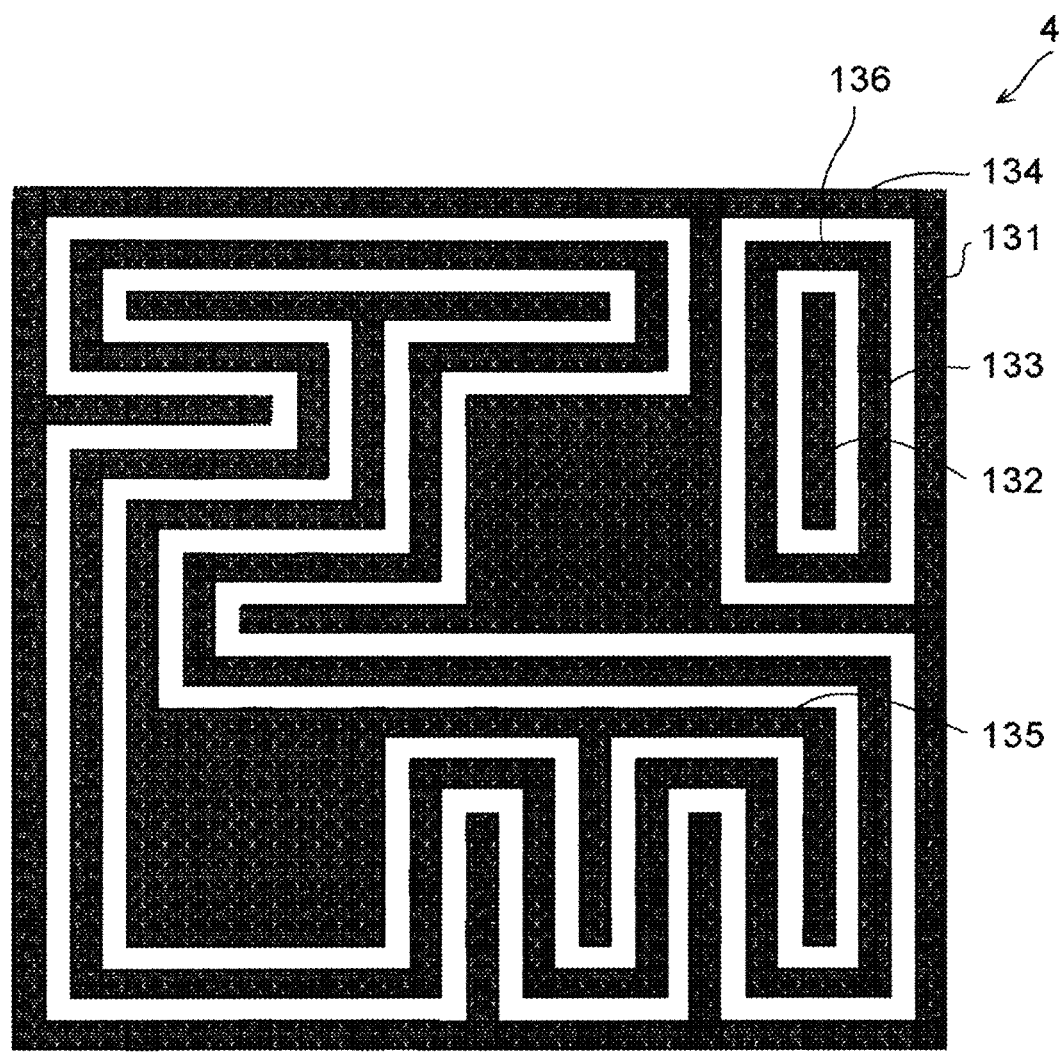
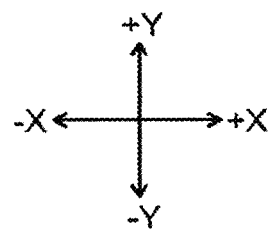
FIG. 45A
FIG. 45B $P=(2^{(n-1)}+1)$

C72

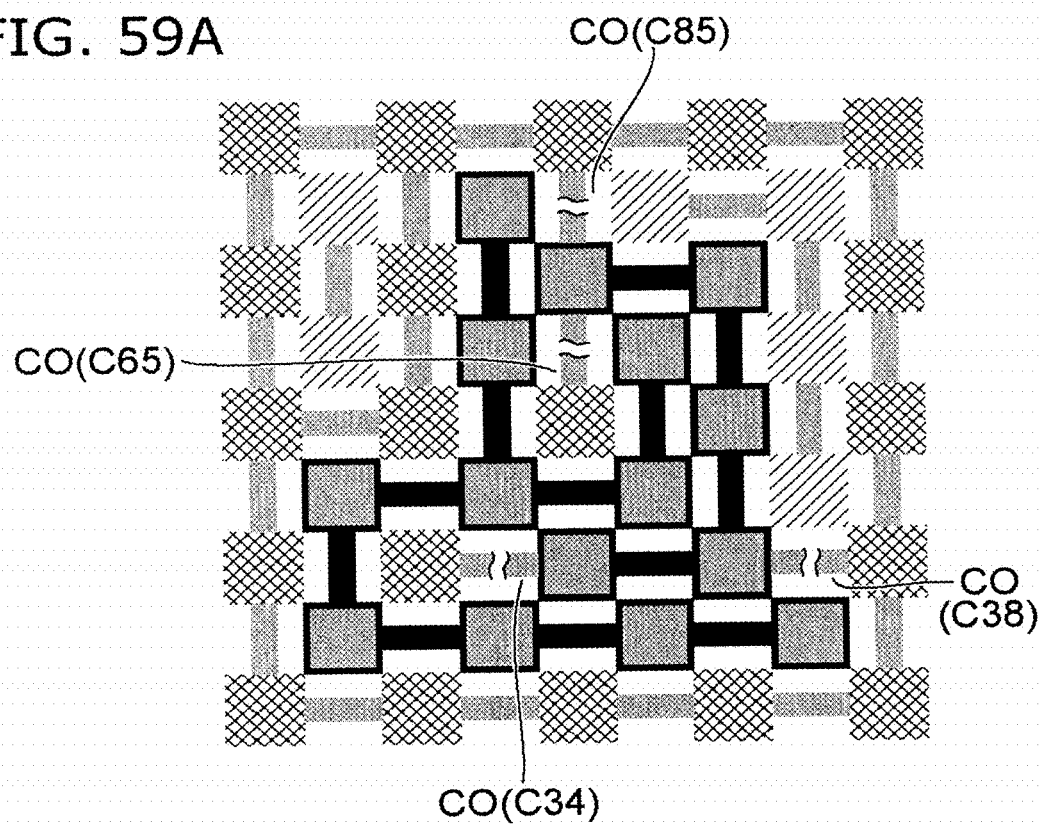
FIG. 59A
CO(C85)
CO(C65)
CO (C38)
CO(C34)
FIG. 59B
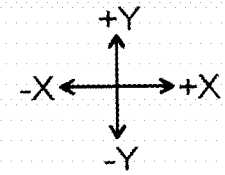

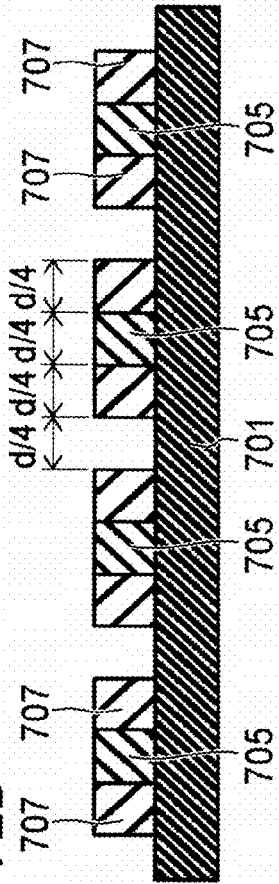
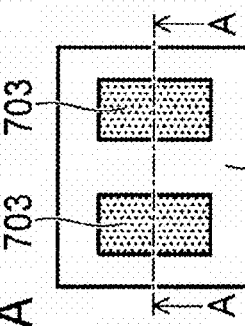
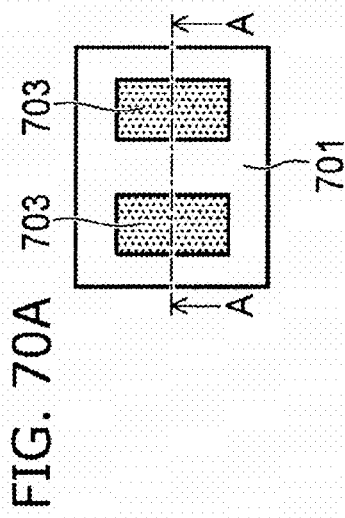
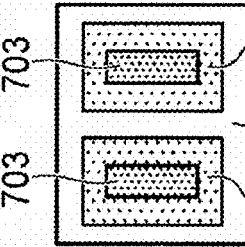
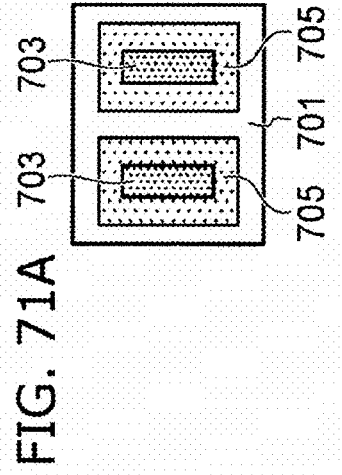
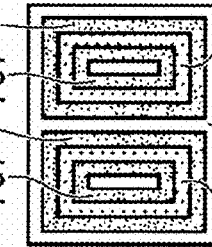
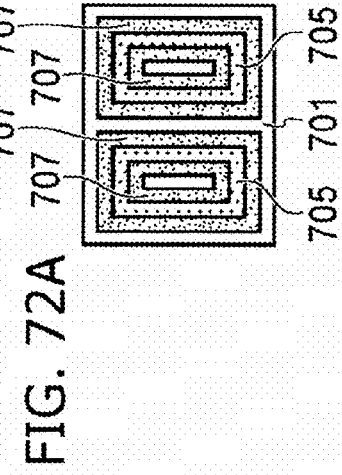

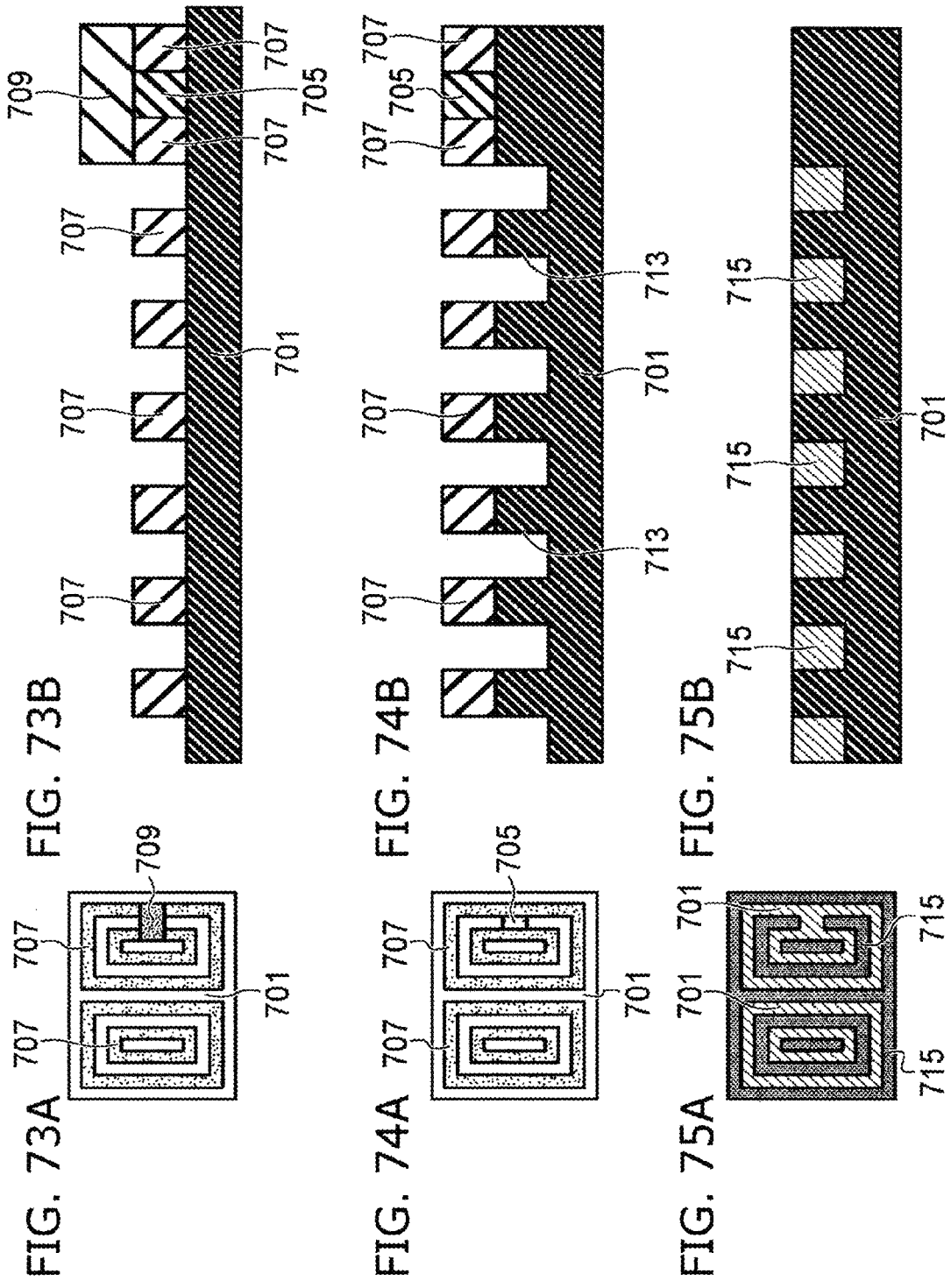

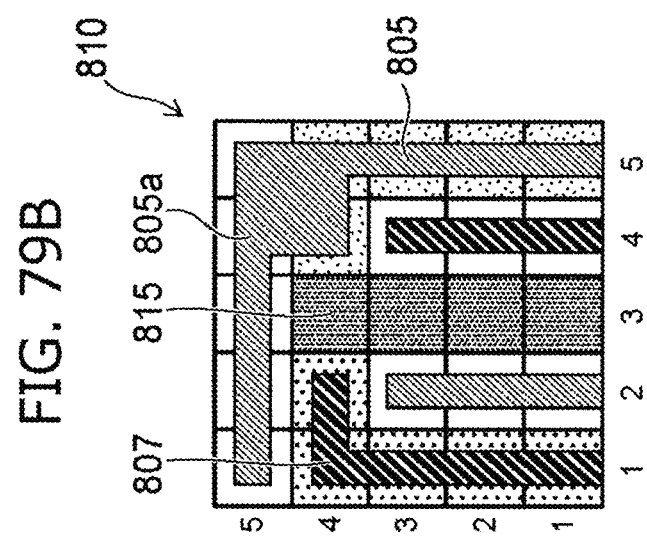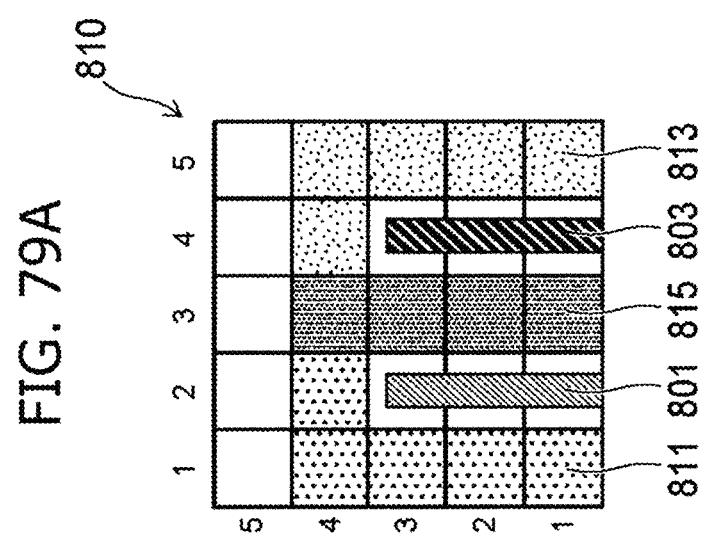

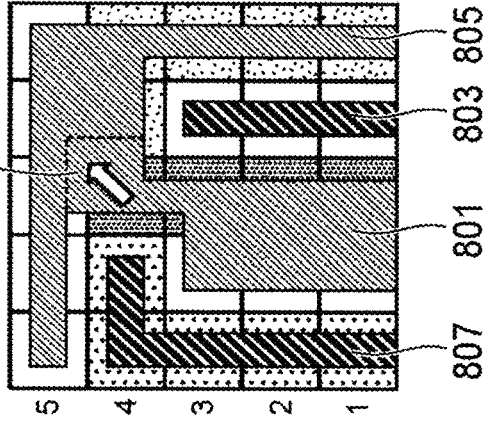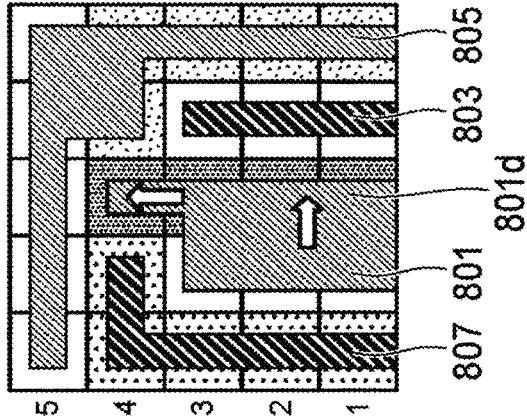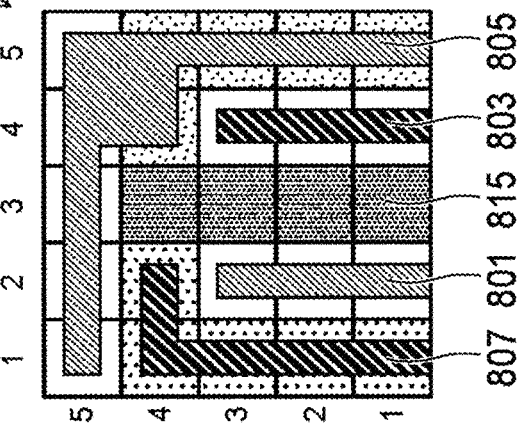

FIG. 82A FIG. 82B FIG. 82C

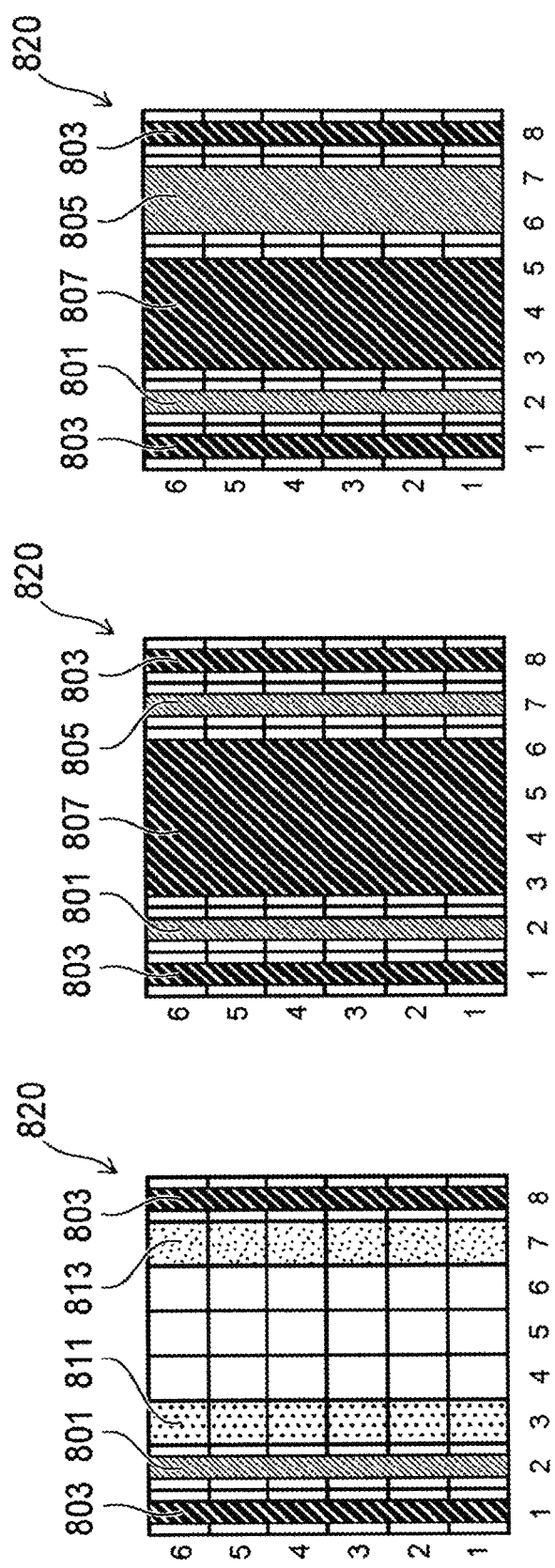

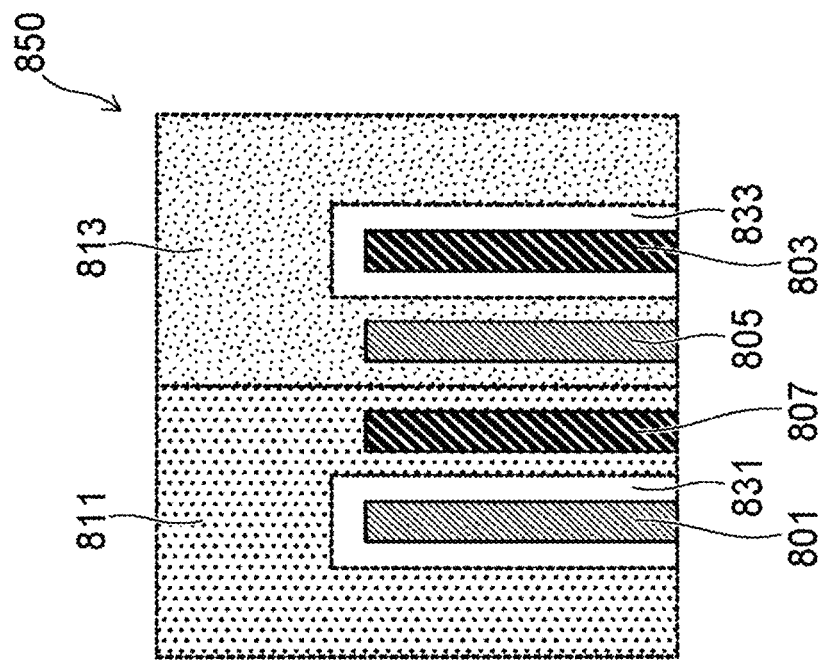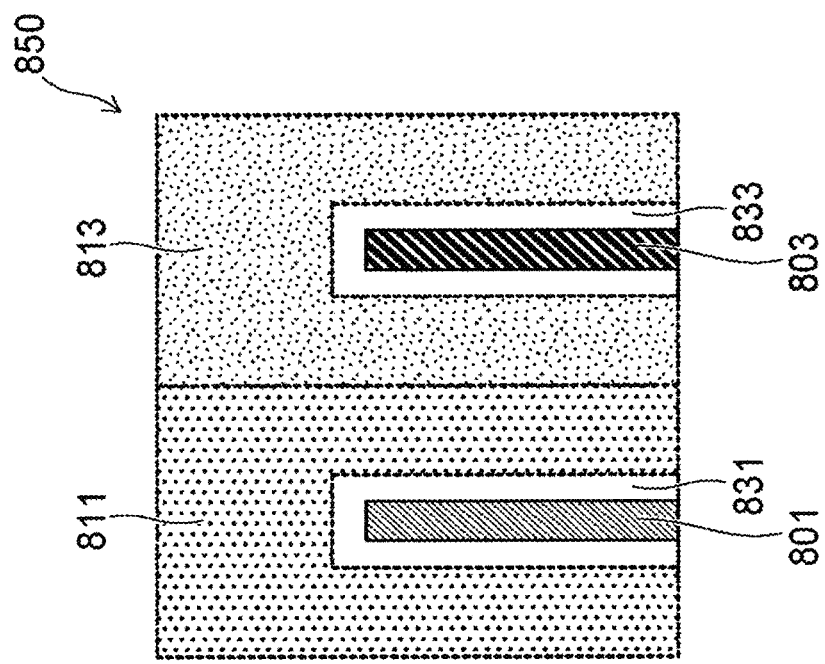

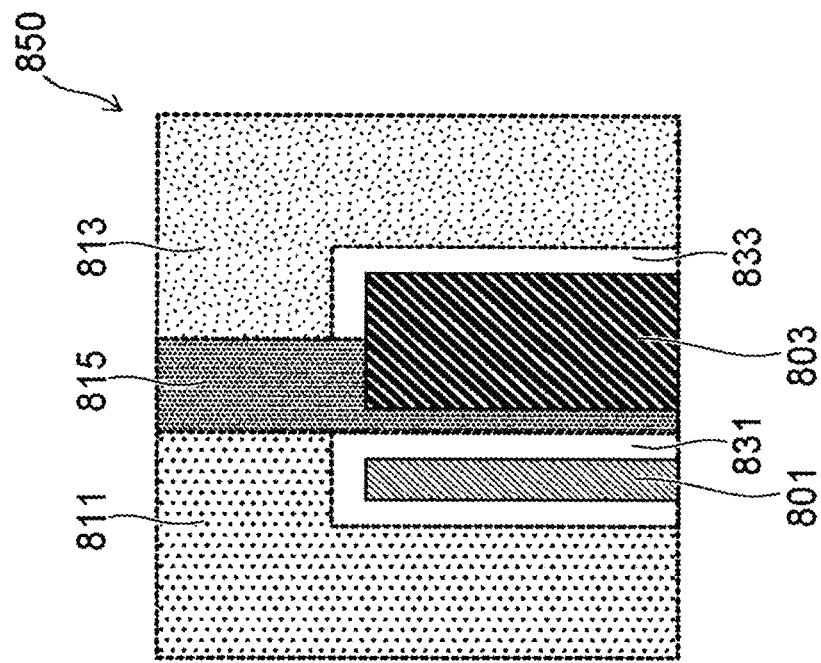
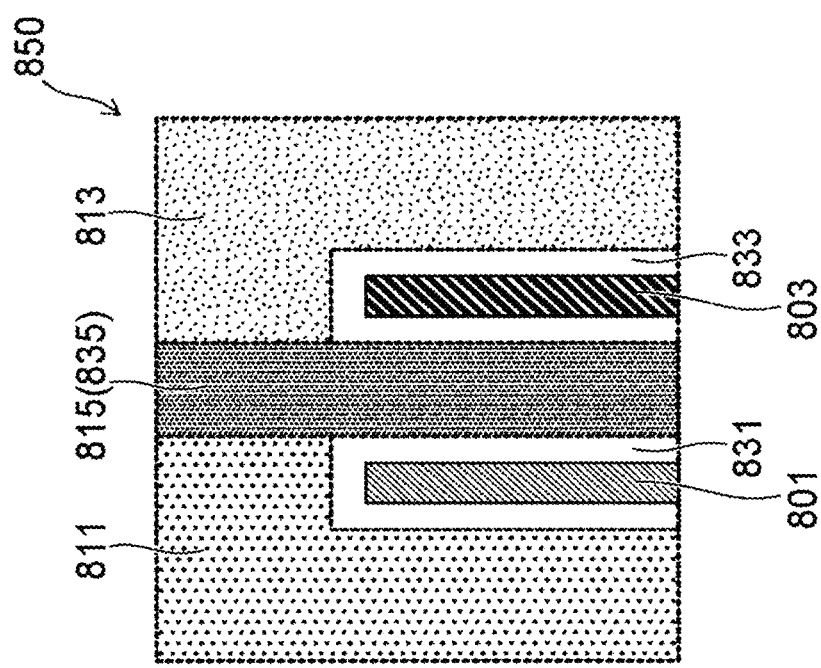

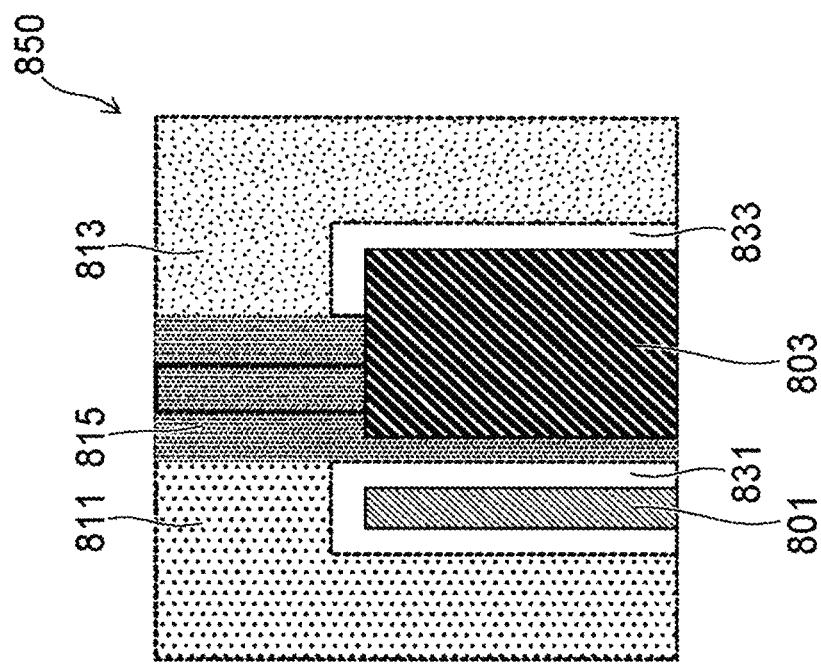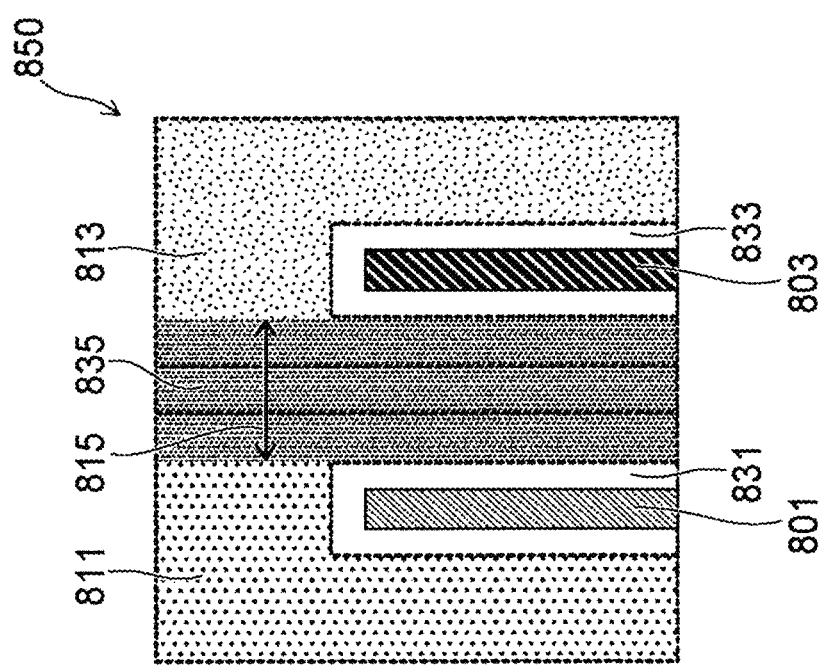

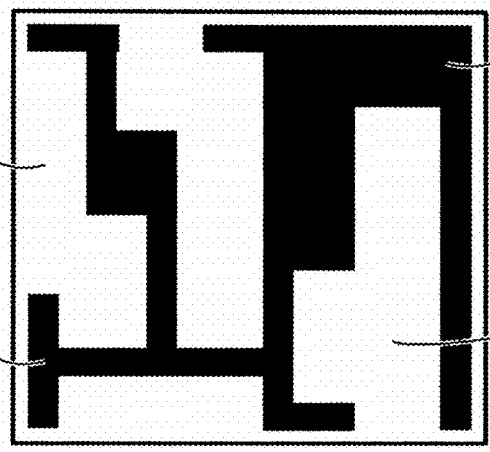
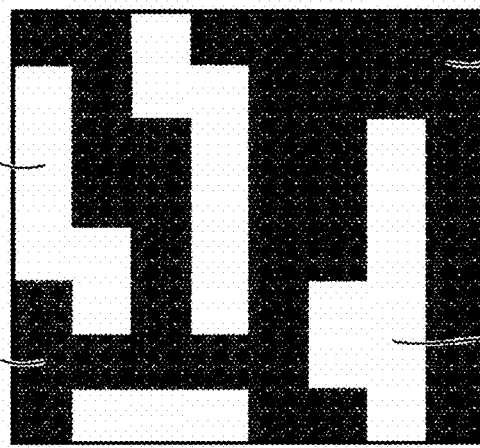

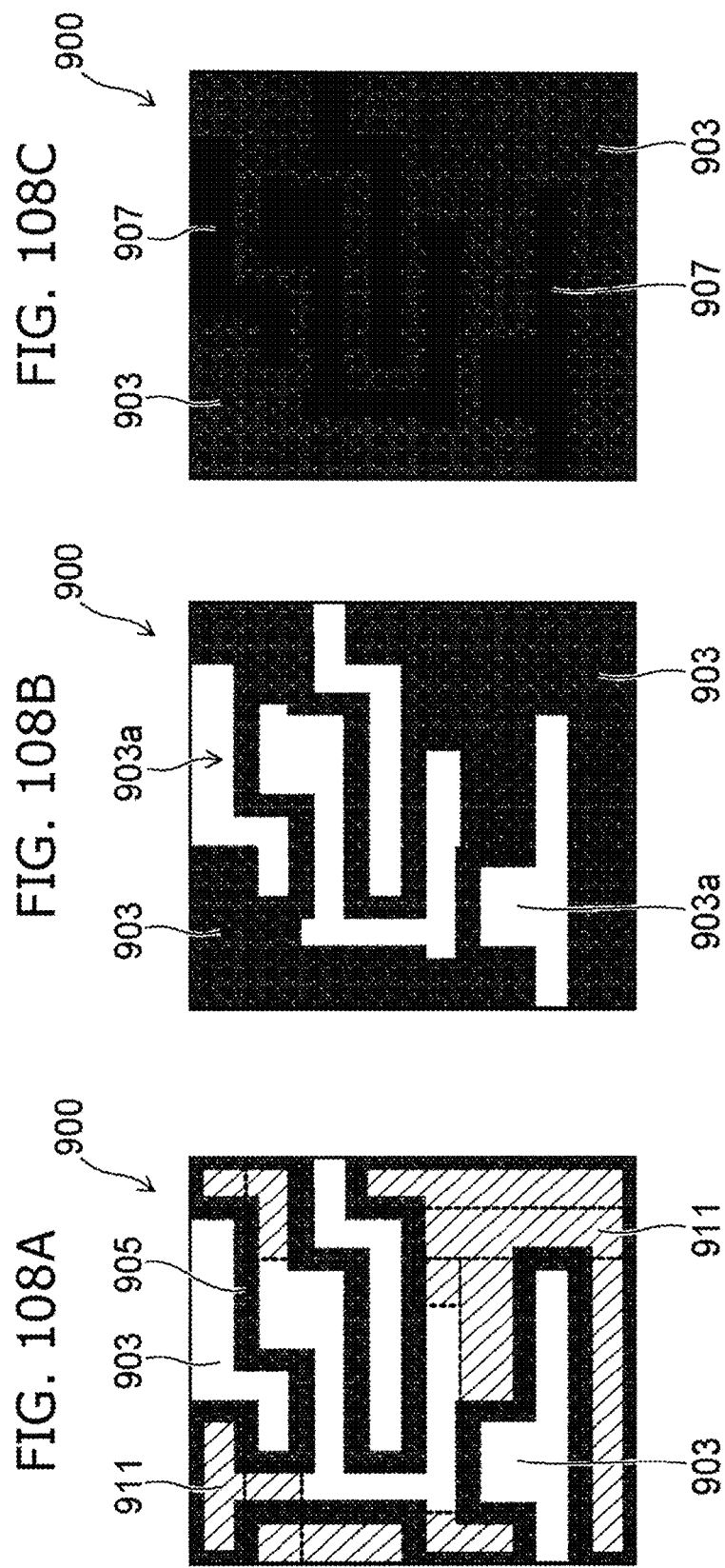

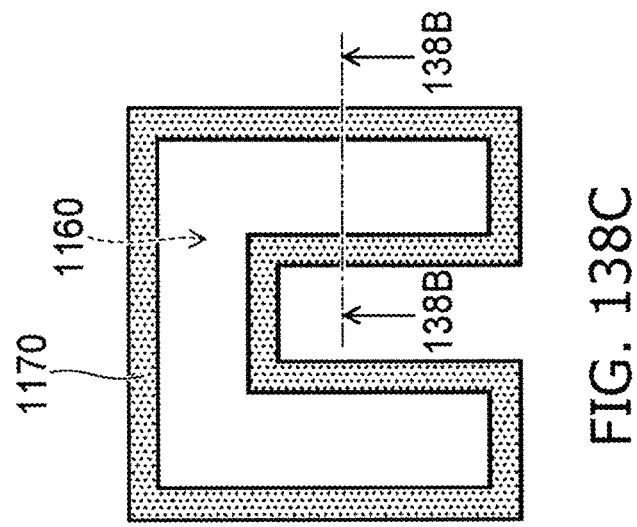
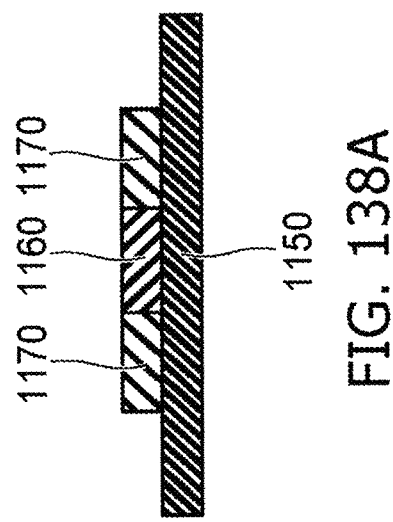
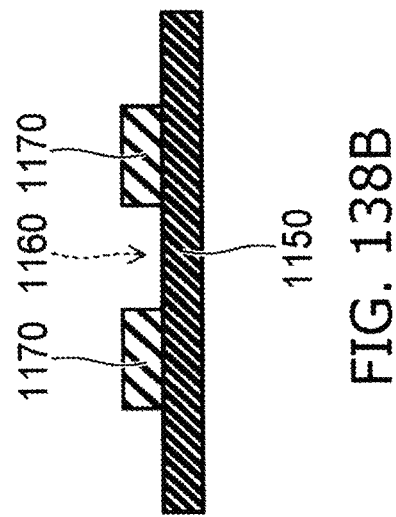
FIG. 138A
FIG. 138B
FIG. 138C

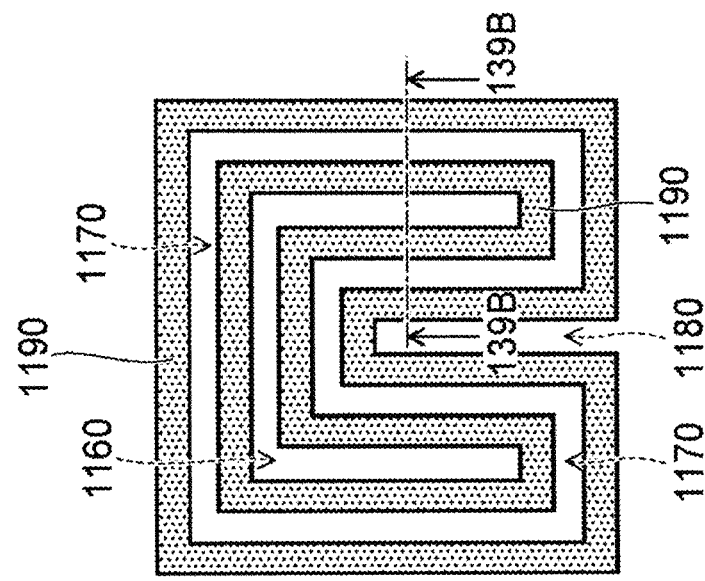
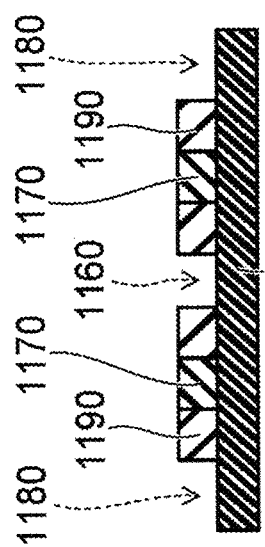
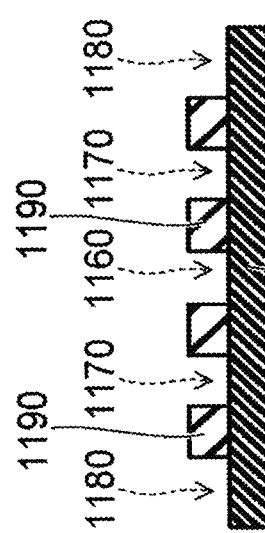
FIG. 139A
FIG. 139B
FIG. 139C

METHOD OF WIRING LAYOUT, SEMICONDUCTOR DEVICE, PROGRAM FOR SUPPORTING DESIGN OF WIRING LAYOUT, AND METHOD FOR MANUFACTURING SEMICONDUCTOR DEVICE

CROSS-REFERENCE TO RELATED APPLICATIONS

This is a Continuation-in-Part application of application Ser. No. 14/156,309, filed on Jan. 15, 2014; the entire contents of which are incorporated herein by reference.

This application is based upon and claims the benefit of priority from the prior Japanese Patent Application No. 2011-201230, filed on Sep. 14, 2011; the entire contents of which are incorporated herein by reference.

FIELD

Embodiments described herein relate generally to a design method of wiring layout, a semiconductor device, a program for supporting design of wiring layout, and a method for manufacturing semiconductor device.

BACKGROUND

Double patterning is technology for exposing a circuit pattern of which has advanced beyond the resolution of lithography technology by dividing the circuit pattern into two circuit patterns that fall within the range of the resolution of lithography technology.

On the other hand, it is possible to deem patterning technology by a sidewall as one kind of double patterning. Hereinafter, this is sometimes referred to as a "sidewall method". The patterning technology by a sidewall is a technique for forming a pattern using a sidewall formed on the side face of a mandrel as a mask.

However, the double patterning technology by a sidewall does not permit an H-shaped wiring pattern (stitch pattern), and therefore, the degree of freedom in a design of a wiring layout is low.

BRIEF DESCRIPTION OF THE DRAWINGS

FIGS. 2A and 2B are plan views illustrating layout parts used in the first embodiment, wherein FIG. 2A shows a line-cutting part and FIG. 2B shows a bridge part;

FIG. 2C shows an XY rectangular coordinate system adopted in FIGS. 2A and 2B;

FIG. 3A is a plan view illustrating a state where the bridge parts and line-cutting parts are arranged on the base pattern in the first embodiment;

FIG. 3B shows an XY rectangular coordinate system adopted in FIG. 3A;

FIGS. 6A to 6C are process plan views illustrating the method for manufacturing a pattern by the sidewall method according to the first embodiment, showing a method for manufacturing a pattern corresponding to a pattern connecting between neighboring sidewalls;

FIG. 6D shows an XY rectangular coordinate system adopted in FIGS. 6A to 6C;

FIGS. 7A to 7C are process section views illustrating the method for manufacturing a pattern by the sidewall method according to the first embodiment, showing a method for manufacturing a pattern corresponding to a pattern connecting neighboring mandrels;

FIG. 7D shows an XY rectangular coordinate system adopted in FIGS. 7A to 7C;

FIGS. 15A to 15D are plan views illustrating layout parts used in the second embodiment, wherein FIG. 15A illustrates a line-cutting part, FIG. 15B a Y bridge part, FIG. 15C an X bridge part, and FIG. 15D a contact fringe;

FIGS. 20A to 20D are plan views illustrating layout parts used in the third embodiment, wherein FIG. 20A shows a line-cutting part and FIGS. 20B to 20D show bridge parts;

FIG. 20E shows an XY rectangular coordinate system adopted in FIGS. 20A to 20D;

FIG. 40A is a plan view illustrating the semiconductor device according to the third embodiment;

FIG. 40B shows an XY rectangular coordinate system adopted in FIG. 40A

FIGS. 42A to 42H are plan views illustrating layout parts used in the fourth embodiment, wherein FIG. 42A shows a line-cutting part, FIGS. 42B, 42D, and 42F show Y bridge parts, FIGS. 42C, 42E, and 42G show X bridge parts, and FIG. 42H shows a contact fringe;

FIG. 42I shows an XY rectangular coordinate system adopted in FIGS. 42A to 42H;

FIG. 45A is a plan view illustrating the method for manufacturing a semiconductor device according to the fourth embodiment;

FIG. 45B shows an XY rectangular coordinate system adopted in FIG. 45A;

FIG. 59A is a plan view illustrating a state in which a wiring is drawn on the sidewall wiring grid in the sixth embodiment, and FIG. 59B shows an XY rectangular coordinate system adopted in FIG. 59A;

FIG. 70A to FIG. 75B are plan views showing schematically a process of a 2-time sidewall method;

FIG. 78A to FIG. 81B are schematic plan views showing a rule of mask design according to the eighth embodiment;

FIG. 82A to FIG. 82C are plan views showing a method for extracting the mandrel pattern;

FIGS. 100A to 101C are schematic plan views showing another rules of the mask design;

FIGS. 102A and 104B are schematic plan views showing a rule of mask design according to a variation of the eighth embodiment;

FIGS. 105A and 105B are schematic views showing a mask designs according to the eighth embodiment; and FIG. 106A to FIG. 108C are schematic plan views showing a manufacturing process of a semiconductor device according to the eighth embodiment.

FIG. 109A to FIG. 109C are schematic views illustrating examples of a wiring layout according to a connection rule;

FIG. 110 to FIG. 113 are schematic views illustrating a design process of a wiring layout according to a ninth embodiment;

FIG. 114A to FIG. 115F are schematic plan views illustrating a manufacturing process of a semiconductor device according to a tenth embodiment;

FIG. 116 to FIG. 121 are schematic plan views illustrating a process of mask design according to the tenth embodiment;

FIG. 122 to FIG. 127 are schematic plan views illustrating a process for forming a wiring mask in the manufacturing process according to the tenth embodiment;

FIG. 128 is a flow chart showing a method of mask design according to an eleventh embodiment;

FIG. 129 to FIG. 136 are schematic plan views illustrating a process of mask design according to the eleventh embodiment;

FIG. 137A to FIG. 141B are schematic views illustrating a manufacturing process of a semiconductor device according to the eleventh embodiment;

FIG. 142A to FIG. 147 are schematic views showing a mask design method according to a variation of the eleventh embodiment;

Figures 1A, 1B:
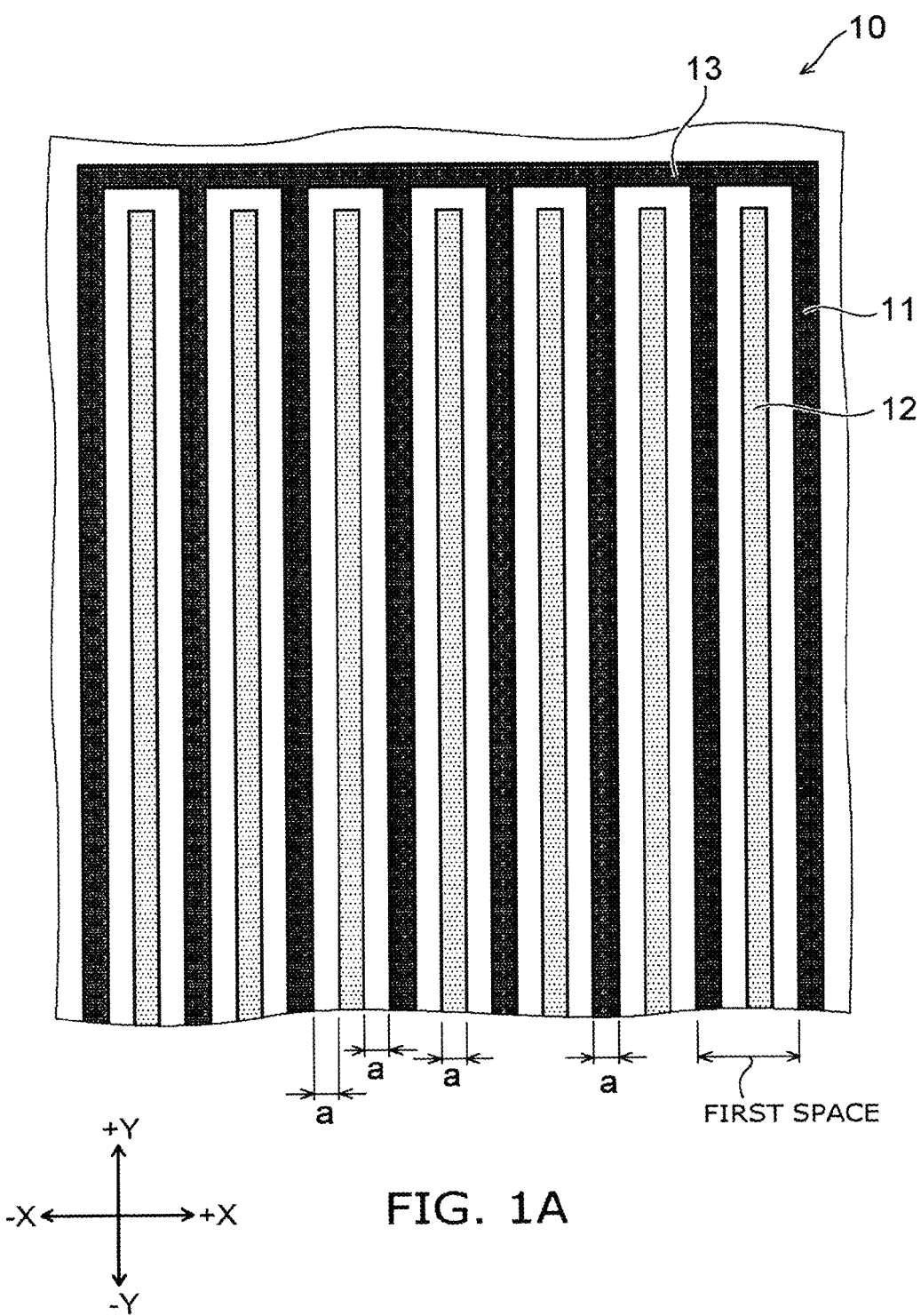
FIG. 1A is a plan view illustrating a base pattern used in the design method of a wiring layout according to a first embodiment.
FIG. 1B shows an XY rectangular coordinate system adopted in FIG. 1A.

FIG. 148A to FIG. 150 are schematic views showing a mask design method according to another variation of the eleventh embodiment; and FIG. 151A to FIG. 153 are schematic views showing a mask design method according to other variation of the eleventh embodiment.

DETAILED DESCRIPTION

In general, according to one embodiment, a design method of layout formed by a sidewall method is provided. The method includes: preparing a base pattern on which a plurality of first patterns extending in a first direction and arranged at a first space in a second direction intersecting the first direction and a plurality of second patterns extending in the first direction and arranged at a center between the first patterns, respectively, are provided; and drawing a connecting portion which extends in the second direction and connects two neighboring first patterns sandwiching one of the second patterns, and separating the one of the second patterns into two patterns not contacting the connecting portion.

In general, according to another embodiment, a design method of layout formed by a sidewall method includes: providing a base pattern on which a plurality of first points arranged in a matrix at a second space in a first direction and at a first space in a second direction intersecting the first direction, and a plurality of second points arranged in a matrix at the second space in the first direction and at the first space in the second direction, the second points being arranged at a space shifted by half the second space in the first direction with respect to the first point and arranged at a space shifted by half the first space in the second direction, are provided; arranging a first bridge part connecting the two first points in a predetermined position between the two first points neighboring in the first direction; arranging a second bridge part connecting the two second points in a predetermined position between the two second points neighboring in the first direction; arranging a third bridge part connecting the two first points in a predetermined position between the two first points neighboring in the second direction; and arranging a fourth bridge part connecting the two second points in a predetermined position between the two second points neighboring in the second direction.

In general, according to another embodiment, a semiconductor device includes: a semiconductor substrate; a plurality of first patterns extending in a first direction in a plane parallel to the top face of the semiconductor substrate; a plurality of second patterns extending in the first direction in the plane; a third pattern extending in a second direction intersecting the first direction in the plane; and a fourth pattern extending in the second direction in the plane, when a plurality of first lines extending in the first direction and arranged at a first space in the second direction are supposed in the plane and integers from one are assigned to the first lines in order from the end, the first patterns being arranged in the odd-numbered first lines, the second patterns being arranged in the even-numbered first lines, the third pattern connecting the first patterns, the fourth pattern connecting the second patterns, and the first pattern and the third pattern, and the second pattern and the fourth pattern being separated from each other.

In general, according to another embodiment, a semiconductor device includes: a semiconductor substrate; a plurality of first patterns extending in a first direction in a plane parallel to the top face of the semiconductor substrate; a plurality of second patterns extending in the first direction and arranged one by one between the first patterns in the plane; a plurality of third patterns extending in the first direction and arranged one by one between the first pattern and the second pattern in the plane; and a fourth pattern extending in the second direction in the plane, the fourth pattern connecting two neighboring the first patterns, and the first pattern and the third pattern, and the second pattern and the third pattern being separated from each other.

In general, according to another embodiment, a semiconductor device includes: a semiconductor substrate; a plurality of first patterns extending in a first direction in a plane parallel to the top face of the semiconductor substrate; a plurality of second patterns extending in the first direction in the plane; a plurality of third patterns extending in a second direction intersecting the first direction in the plane; and a plurality of fourth patterns extending in the second direction in the plane, when a plurality of first lines extending in the first direction and arranged at a first space in the second direction are supposed in the plane and integers from one are assigned to the first lines in order from the end, and when a plurality of third lines extending in the second direction, arranged at a second space in the first direction, and intersecting the first lines are supposed in the plane and integers from one are assigned to the third lines in order from the end, the first patterns being arranged in the odd-numbered first lines, the second patterns being arranged in the even-numbered first lines, the third patterns being arranged in the odd-numbered third lines, the fourth patterns being arranged in the even-numbered third lines, at least one of the first patterns connecting with the third pattern, at least one of the second patterns connecting with the fourth pattern, and the first pattern and the third pattern, and the second pattern and the fourth pattern being separated from each other.

In general, according to another embodiment, a program for supporting a design of a layout formed by a sidewall method is provided. The program causes a computer to execute: a procedure to display a base pattern on which a plurality of first patterns extending in a first direction and arranged at a first space in a second direction intersecting the first direction, and a plurality of second patterns extending in the first direction and arranged respectively at the center between the first patterns are provided on a display unit; and a procedure, when a first bridge part extending in the second direction is arranged in a predetermined position between the two neighboring first patterns sandwiching the one second pattern in the base pattern displayed on the display unit via an input unit, to replace the one second pattern with two patterns sandwiching the first bridge part and not contacting the first bridge part as well as connecting the two first patterns.

In general, according to another embodiment, a program for supporting a design of a wiring layout formed by a sidewall method is provided. The program causes a computer to execute: a procedure to display a base pattern on which a plurality of first points arranged in a matrix at a second space in a first direction and at a first space in a second direction intersecting the first direction, and a plurality of second points arranged in a matrix at the second space in the first direction and at the first space in the second direction, the second points being arranged at a space shifted by half the second space in the first direction with respect to the first point and at a space shifted by half the first space in the second direction are provided on a display unit; and a procedure, when a first bridge part extending in the first direction is arranged in a predetermined position between the two first points neighboring in the first direction in the base pattern displayed on the display unit via an input unit, to connect the two first points.

In general, according to another embodiment, a method for manufacturing a semiconductor device includes: forming an insulating film on a semiconductor substrate; forming a mandrel on the insulating film; forming a sidewall on a side face of the mandrel; removing the mandrel; selectively removing the insulating film to form a concave portion by performing etching using the sidewall as a mask; removing the sidewall; and embedding an electrically conductive material within the concave portion, the mandrel being formed in a region corresponding to a first pattern in a layout designed by a method including: preparing a base pattern on which a plurality of the first patterns extending in a first direction and arranged at a first space in a second direction intersecting the first direction and a plurality of second patterns extending in the first direction and arranged at a center between the first patterns, respectively, are provided; and replacing one of the second patterns with two patterns not contacting a connecting portion which extends the second direction and connects two neighboring first patterns sandwiching the one of the second patterns.

First Embodiment

Hereinafter, embodiments of the invention are explained with reference to the drawings.

First, a design method of a wiring layout formed by the sidewall method is explained.

FIG. 1 is a plan view illustrating a base pattern used in the design method of a wiring layout according to a first embodiment.

FIGS. 2A and 2B are plan views illustrating layout parts used in the first embodiment, wherein FIG. 2A shows a line-cutting part and FIG. 2B shows a bridge part.

FIG. 3 is a plan view illustrating a state where the bridge parts and line-cutting parts are arranged on the base pattern in the first embodiment.

Figure 4A:
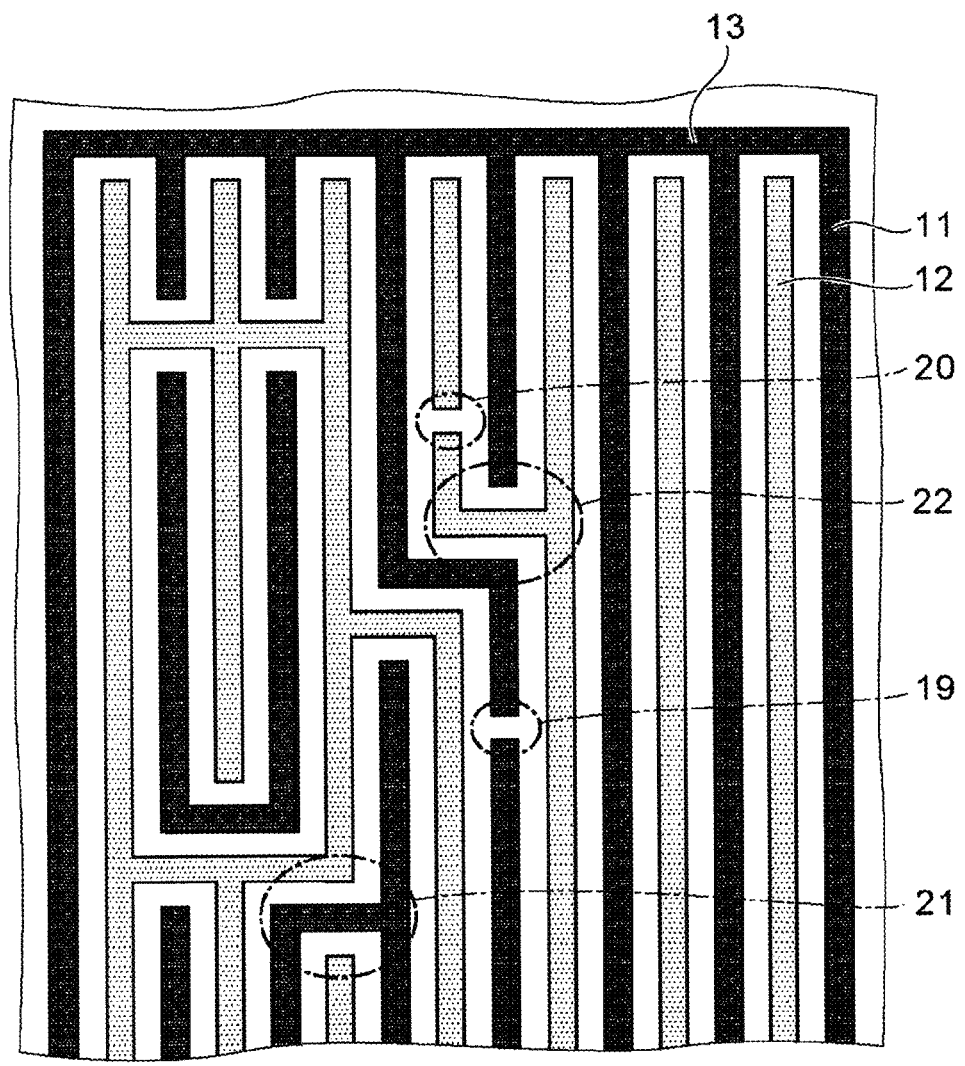
FIG. 4A is a plan view illustrating a state where the pattern and bridge part are classified by two colors in the first embodiment.
Figure 4B:
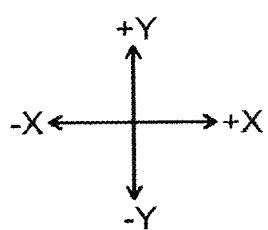
FIG. 4B shows an XY rectangular coordinate system adopted in FIG. 4A.

FIG. 4 is a plan view illustrating a state where the pattern and bridge part are classified by two colors in the first embodiment.

First, the base pattern, the line-cutting part, and the bridge part used in the design method of a wiring layout according to the embodiment are explained.

In the embodiment, a wiring layout is designed by arranging the line-cutting parts and bridge parts in arbitrary positions on the base pattern according to fixed rules.

Figure 49:
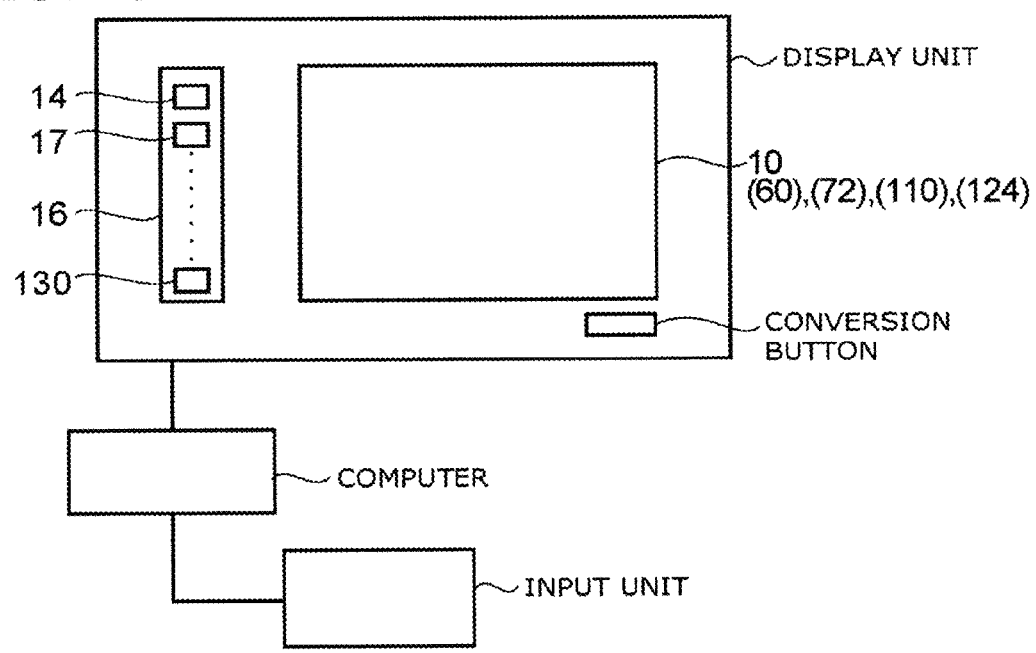
FIG. 49 illustrates a display unit.

A designer may design the wiring layout using, for example, an input unit, a computer and a display unit shown in FIG. 49. That is, the designer can operate the computer and arrange line-cutting parts and bridge parts in arbitrary positions on the base pattern of the display unit under the support of the computer.

As shown in FIG. 1, on a base pattern 10 according to the embodiment, a plurality of first patterns 11 extending in one direction and a plurality of second patterns 12 extending in the one direction are provided. One end of the first pattern 11 is connected to a horizontal pattern 13 extending in a direction perpendicular to the one direction.

In the embodiment, in order to explain the base pattern 10, an XY rectangular coordinate system is adopted. In the XY rectangular coordinate system, of the directions in which the first pattern 11 and the second pattern 12 extend, the direction toward the horizontal pattern 13 is referred to as +Y direction and the opposite direction is referred to as −Y direction. Of the directions perpendicular to the direction in which the first pattern 11 and the second pattern 12 extend, the direction 90 degrees rotated clockwise from the +Y direction is referred to as +X direction and the opposite direction is referred to as −X direction. The "+X direction" and the "−X direction" are together referred to also as "X direction". The "+Y direction" and the "−Y direction" are together referred to also as "Y direction". In each of the drawings to be described later, the same XY rectangular coordinate system is used according to the necessity.

The first patterns 11 extend in the Y direction and are arranged at a fixed space (hereinafter, referred to as the "first space") in the X direction.

The second patterns 12 extend in the Y direction and arranged one by one substantially at the center between the first patterns. Consequently, the second patterns are arranged at the first space in the X direction. A distance between the first pattern 11 and the second pattern 12 is constant. The width of each of the first pattern 11 and the second pattern 12 can vary as long as the distance between the first pattern 11 and the second pattern 12 is kept constant.

In the embodiment, the width of the first pattern 11 and the second pattern 12 is set to a length ¼ of the first space. This width is referred to as "length a". The "length a" is a value that varies depending on the process conditions. For example, when the minimum processing dimension of lithography is 20 nm, the length "a" is about 10 nm.

As shown in FIG. 2A, a line-cutting part 14 includes a rectangular portion 15. The rectangular portion 15 is formed into the shape of a square the side of which in the longitudinal and transverse directions is equal to the width of the first pattern 11 and the second pattern 12, that is, the length a. Around the rectangular portion 15, a BOX region 16 is set. The BOX region 16 is set so that the width is ¼ of the first space, that is, the length a in the +X direction and the −X direction from the rectangular portion 15 and the width in the +Y direction and the −Y direction from the rectangular portion 15 is a width ¼ of the first space, that is, the length a. That is, the BOX region 16 is formed into the shape of a square the side of which is three times the length a (3a). There is a case where the "length a" of the line-cutting part 14 is not equal to the "length a", which is the width of the first pattern 11 and the second pattern 12 because of processes etc. Consequently, the rectangular portion 15 and the BOX region 16 are regulated using the "length a" in the line-cutting part 14 so that it is easy to create a wiring layout.

As shown in FIG. 2B, a bridge part 17 includes a cross-linking portion 18 and the two rectangular portions 15. The cross-linking portion 18 extends in the X direction. The length in the X direction is set to a length five times the length a (5a). The width of the cross-linking portion 18 is set to the length a. The rectangular portion 15 is provided at the center portion on the side faces facing in the +Y direction and the −Y direction of the cross-linking portion 18. Around the rectangular portion 15, the BOX region 16 is set. The BOX region 16 around the rectangular portion 15 arranged in the +Y direction of the cross-linking portion 18 is set so that the width is the length a in the +X direction, the −X direction, and the +Y direction from the end portion of the rectangular portion 15. The BOX region 16 around the rectangular portion 15 arranged in the −Y direction of the cross-linking portion 18 is set so that the width is the length a in the +X direction, the −X direction, and the −Y direction from the end portion of the rectangular portion 15. There is also a case where the "length a" of the bridge part 17 is not equal to the "length a", which is the width of the first pattern 11 and the second pattern 12, because of processes etc. Consequently, the rectangular portion 15, the BOX region 16, and the cross-linking portion 18 are regulated using the "length a" in the bridge part 17 so that it is easy to create a wiring layout.

Next, a method for designing a wiring layout using the base pattern 10, the line-cutting part 14, and the bridge part 17 described above is explained.

As shown in FIG. 3, the rectangular portion 15 of the line-cutting part 14 is arranged on a portion of the first pattern 11 where it is to be divided, for example, on the first pattern 11 in a region 19. Further, the rectangular portion 15 of the line-cutting part 14 is arranged on a portion of the second pattern 12 where it is to be divided, for example, on the second pattern 12 in a region 20.

Furthermore, the bridge part 17 is arranged between the first patterns 11 to be connected, for example, between the two neighboring first patterns 11 sandwiching the one second pattern 12 in a region 21. In that case, the cross-linking portion 18 is arranged so as to connect the neighboring first patterns 11 (to span the second pattern 12 on which the rectangular portion 15 is arranged). The rectangular portion 15 is arranged on the second pattern 12. Because of that, the second pattern 12 on which the bridge part 17 is arranged is divided in the Y direction.

The bridge part 17 is arranged between the second patterns 12 to be connected, for example, between the two neighboring second patterns 12 sandwiching the one first pattern 11 in a region 22. In that case, the cross-linking portion 18 is arranged so as to span the second pattern 12. The rectangular portion 15 is arranged on the first pattern 11. Because of that, the second pattern 11 on which the bridge part 17 is arranged is divided in the Y direction.

That is, the bridge part 17 connects the first patterns 11 or the second patterns 12 and at the same time, separates the first pattern 11 or the second pattern 12 that the bridge part 17 crosses in the Y direction.

When arranging the line-cutting part 14 and the bridge part 17, the "BOX rules" are applied. The "BOX rules" regulate positions where the line-cutting part 14 and the bridge part 17 can be arranged.

The first rule is that the BOX region 16 in the line-cutting part 14 must not overlap the BOX region 16 in another line-cutting part 14.

The second rule is that the BOX region 16 in the line-cutting part 14 must not overlap the BOX region 16 in the bridge part 17.

The third rule is that the contact between the BOX regions 16 is permitted. This means that, for example, the BOX regions 16 in the region 20 and in the region 22 may be in contact with each other.

The fourth rule is that the BOX regions 16 of the bridge parts 17 may overlap each other unless the rectangular portion 15 overlaps the rectangular portion 15 of another bridge part 17. This means that the BOX regions 16 of the bridge parts 17 in the region 22 and in the region 23 may overlap each other.

Next, as shown in FIG. 4, after arranging the line-cutting parts 14 and the bridge parts 17 in positions on the base pattern 10 according to the BOX rules, the first patterns 11 and the second patterns 12 on which the line-cutting parts 14 and the bridge parts 17 are arranged are replaced with patterns. This replacement is performed automatically by a computer in which a layout tool is installed. For example, the replacement is performed by a designer pressing a conversion button after arranging a fixed number of the line-cutting parts 14 and the bridge parts 17.

The designer can not only arrange the parts, but also layout according to a rule. For example, the designer can connect two of the first patterns 11, or separate the second pattern 12 which is disposed between the first patterns 11.

For example, the portions (the region 19 and the region 20) where the line-cutting part 14 is arranged in the first pattern 11 and the second pattern 12 are replaced with layout patterns. Here, the replacement is visual replacement by a computer by which respective parts are replaced visually with the first and second patterns. Due to this replacement, the first pattern 11 in the region 19 and the second pattern 12 in the region 20 are turned into two patterns, respectively, in which the patterns are separated in the Y direction and between the patterns no bridge part is arranged. In FIG. 4 also, the XY rectangular coordinate system adopted in FIG. 1 for explaining the base pattern 10 is adopted.

On the other hand, the portion (the region 21) where the bridge part 17 is arranged in the first patterns 11 is replaced with a layout pattern. Due to this, the region 21 is replaced with the first pattern 11 extending in the X direction and connecting the two first patterns 11 and at the same time, the one second pattern 12 intersecting the bridge part 17 is separated into the two second patterns 12 sandwiching the bridge part 17 and not contacting the bridge part 17. Similarly, in the region 22, the second pattern 12 on which the bridge part 17 is arranged is replaced with the second pattern 12 extending in the X direction and connecting the two second patterns 12 and at the same time, the one first pattern 11 intersecting the bridge part 17 is separated into the two second patterns 12 sandwiching the bridge part 17 and not contacting the bridge part 17.

As a result of such replacement, the first patterns 11 and the bridge part 17 connecting the first patterns 11, and the second patterns 12 and the bridge part 17 connecting the second patterns 12 are turned into patterns separated from each other.

After that, the layout pattern in FIG. 4 is converted into actual mask data. This conversion is performed automatically by a computer etc. in which a conversion tool is installed. For example, when the computer executes conversion so that the first pattern 11 corresponds to a mandrel, the computer converts the layout pattern into mask data by which the portion where the first pattern 11 is arranged forms a mandrel and the second pattern 12 is deleted.

Figure 8A:
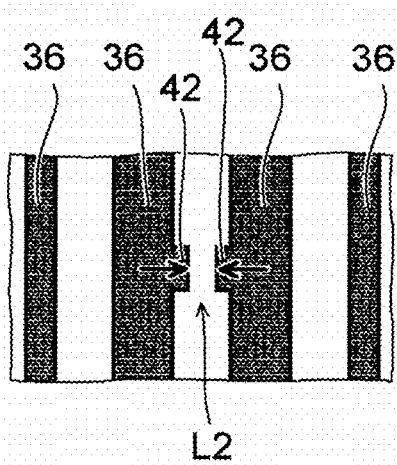
FIGS. 8A to 8C are process plan views illustrating the method for manufacturing a pattern by the sidewall method according to the first embodiment, showing a method for manufacturing a pattern corresponding to a pattern between separated sidewalls.
Figure 9A:
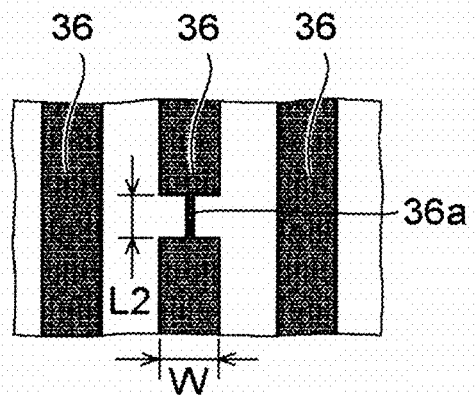
FIGS. 9A to 9C are process plan views illustrating the method for manufacturing a pattern by the sidewall method according to the first embodiment, showing a method for manufacturing a pattern corresponding to a pattern of a separated mandrel.

Explanation is given below using a layout pattern for forming a mandrel in the portion of the first pattern 11 as an example. The computer converts the portion (the region 19) where the line-cutting part 14 is arranged in the first pattern 11 into mask data by which a mandrel pattern shown in FIG. 8A is formed. Similarly, the computer replaces the portion (the region 20) where the line-cutting part 14 is arranged in the second pattern 12 with mask data by which a mandrel pattern shown in FIG. 9A is formed.

Due to this, in the final wiring shape, the patterns in the region 19 and the region 20 are turned into two patterns separated from each other in the Y direction and between which no pattern is arranged.

On the other hand, the computer replaces the portion (the region 21) in which the bridge part 17 is arranged in the first patterns 11 with mask data by which a mandrel pattern shown in FIG. 6A is formed. Due to this, in the final wiring shape, the region 21 is turned into the pattern extending in the X direction and connecting the two patterns and at the same time, the pattern extending in the Y direction is separated into two patterns so as to sandwich the bridge part 17. Similarly, in the region 22, the computer converts the portion (the region 22) where the bridge part 17 is arranged in the second patterns 12 into mask data by which a mandrel pattern shown in FIG. 7A is formed. In the final wiring shape, the region 22 is turned into the pattern extending in the X direction and connecting the two second patterns 12 and at the same time, the pattern extending in the Y direction is separated into two patterns sandwiching the bridge part 17.

As will be described later, it is possible to form the wiring layout designed in this manner by the sidewall method. That is, according to the method for designing a wiring layout according to the embodiment, it is possible to easily design a wiring layout that can be formed by the sidewall method.

According to the design method of a wiring layout according to the embodiment, it is possible to design a wiring layout including an H-shaped connection pattern in which two patterns extending in one direction are connected by the bridge part 17.

Further, it is possible to design a wiring layout including a pattern in which the pattern is separated in the direction in which the pattern extends in both the first pattern 11 and the second pattern 12. Hereinafter, this is simply referred to as a "separated pattern" in some cases.

Furthermore, the first patterns 11 and the bridge part 17 connecting the first patterns 11, and the second patterns 12 and the bridge part 17 connecting the second patterns 12 are turned into patterns separated from each other, and therefore, it is possible to turn one of the first patterns 11 and the bridge part 17 connecting the first patterns 11 and the second patterns 12 and the bridge part 17 connecting the second patterns 12 into a pattern of a mandrel of a wiring layout formed by the sidewall method. Consequently, it is possible to design a wiring layout including an H-shaped pattern and a separated pattern in a wiring layout formed by the sidewall method easily. Therefore, it is possible to aim at high integration of a wiring layout.

Next, a program for supporting a design of a wiring layout formed by the sidewall method is explained.

The program according to the embodiment causes a computer to execute the procedures shown below.

The program causes the computer to execute a procedure to display the base pattern 10 on a display unit, for example, a display. As shown in FIG. 1, on the base pattern 10, a plurality of the first patterns 11 extending in the Y direction and arranged at the first space in the X direction and a plurality of the second patterns 12 extending in the Y direction and arranged at the center between the first patterns 11 are provided. It is preferable for the computer to classify the first pattern 11 and the second pattern 12 by different colors or hatch them differently so that it is easy for a designer to make a layout.

Further, the program also causes the computer to execute a procedure to display the line-cutting part 14 and the bridge part 17.

The designer, via an input unit, arranges the bridge part 17 in a position between the two neighboring first patterns 11 sandwiching the one second pattern 12 in the base pattern 10 displayed on the display unit by, for example, the drag operation of a mouse. At this time, the program causes the computer to execute a procedure to connect the two first patterns 11 and at the same time, to replace the one second pattern 12 with two patterns sandwiching the bridge part 17 and not contacting the bridge part 17.

The designer, via the input unit, arranges the bridge part 17 in a position between the two neighboring second patterns 12 sandwiching the one first pattern 11 in the base pattern 10 displayed on the display unit. At this time, the program causes the computer to execute a procedure to connect the two second patterns 12 and at the same time, to replace the one first pattern 11 with two patterns sandwiching the bridge part 17 and not contacting the bridge part 17.

The designer, via the input unit, arranges the line-cutting part 14 in a position on the first pattern 11 in the base pattern 10 displayed on the display unit. At this time, the program causes the computer to execute a procedure to replace the first pattern 11 with two patterns which are separated from each other in the Y direction and between which no bridge part 17 is arranged.

The designer arranges the line-cutting part 14 in a position on the second pattern 12 in the base pattern 10 displayed on the display unit via the input unit. At this time, the program causes the computer to execute a procedure to replace the second pattern 12 with two patterns which are separated from each other in the Y direction and between which no bridge part 17 is arranged.

As a result of this, the first patterns 11 and the bridge part 17 connecting the first patterns 11, and the second patterns 12 and the bridge part 17 connecting the second patterns 12 are turned into patterns separated from each other.

In this manner, it is possible for the program for supporting a design of a wiring layout formed by the sidewall method to cause the computer to support the design of the wiring layout as shown in FIG. 4.

According to the program according to the embodiment, it is possible to cause a computer to support a design of a wiring layout, and therefore, it is possible to reduce the time which the designer designs a wiring layout that can be formed by the sidewall method.

It may also be possible for the program to cause a computer to execute a procedure to replace patterns at a time when a designer clicks a conversion button displayed on the display unit after arranging a plurality of the line-cutting parts 14 and the bridge parts 17 (FIG. 49). As a result of that, it is possible for the designer to arrange the line-cutting part 14 and the bridge part 17 in a state where the BOX region 16 is displayed, and therefore, it is possible for the designer to make a layout while confirming the BOX rules (FIG. 49).

Next, a method for manufacturing a pattern by the sidewall method is explained. As an example, explanation is given using the damascene method in which a pattern is embedded in a groove.

Figure 5A:
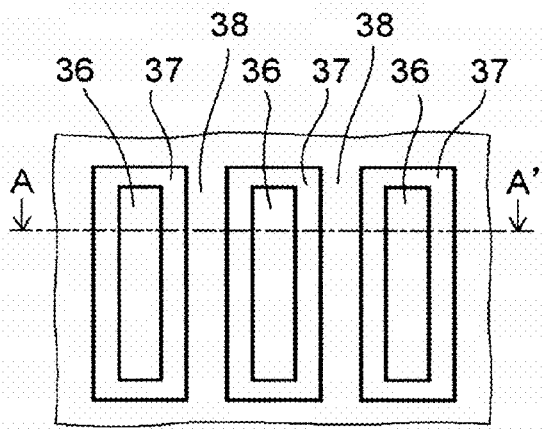
FIGS. 5A to 5C are process plan views illustrating a method for manufacturing a pattern by the sidewall method according to the first embodiment and FIGS. 5D to 5F are process section views along A-A' plane shown in FIGS. 5A to 5C, respectively.
Figure 5D:
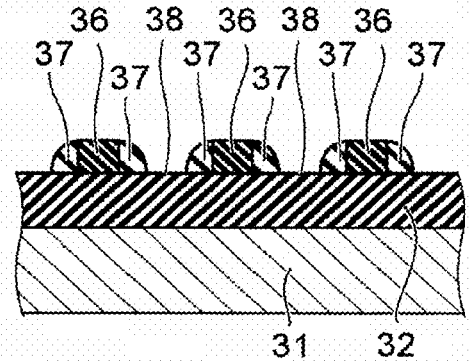
Figure 5B:
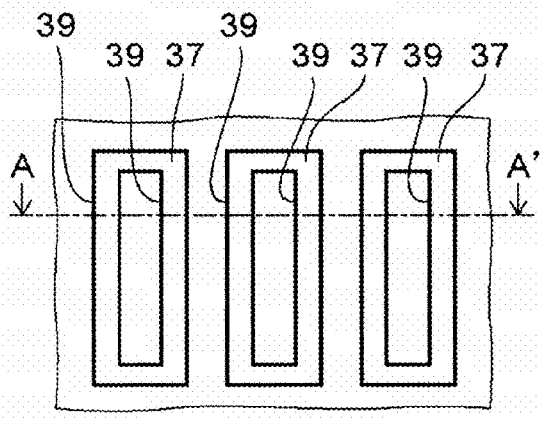
Figure 5E:
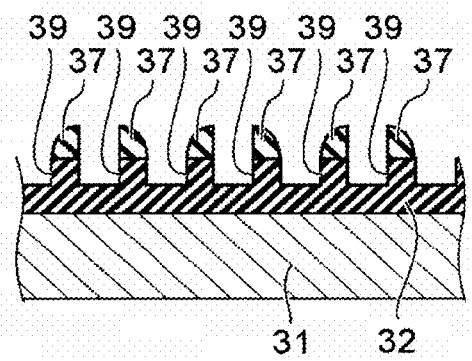
Figure 5C:
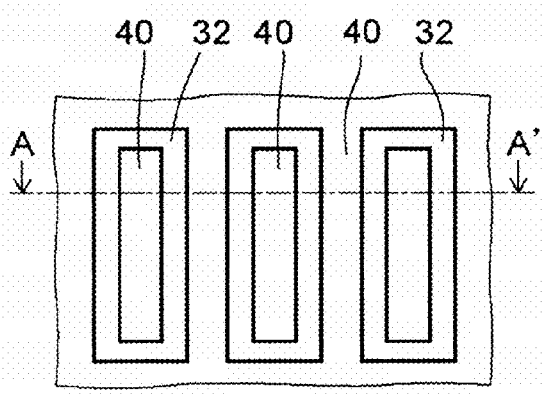
Figure 5F:
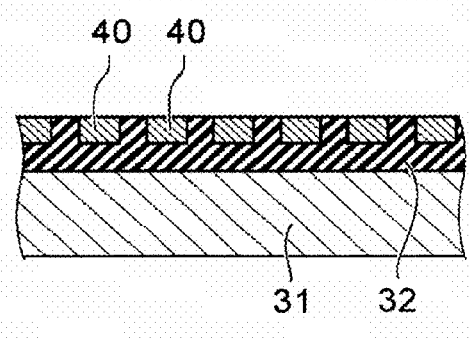

FIGS. 5A to 5C are process plan views illustrating a method for manufacturing a pattern by the sidewall method according to the first embodiment and FIGS. 5D to 5F are process section views along A-A' plane shown in FIGS. 5A to 5C, respectively.

FIGS. 6A to 6C are process plan views illustrating the method for manufacturing a pattern by the sidewall method according to the first embodiment, showing a method for manufacturing a pattern corresponding to a pattern connecting between neighboring sidewalls.

FIGS. 7A to 7C are process section views illustrating the method for manufacturing a pattern by the sidewall method according to the first embodiment, showing a method for manufacturing a pattern corresponding to a pattern connecting neighboring mandrels.

Figure 8B:
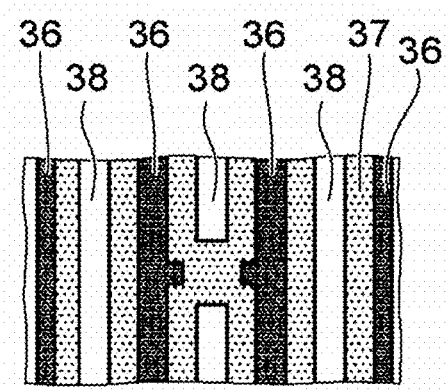
Figure 8C:
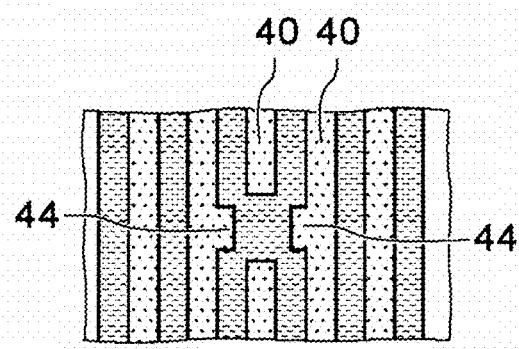
Figure 8D:
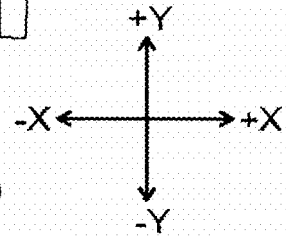
FIG. 8D shows an XY rectangular coordinate system adopted in FIGS. 8A to 8C.

FIGS. 8A to 8C are process plan views illustrating the method for manufacturing a pattern by the sidewall method according to the first embodiment, showing a method for manufacturing a pattern corresponding to a pattern between separated sidewalls.

Figure 9B:
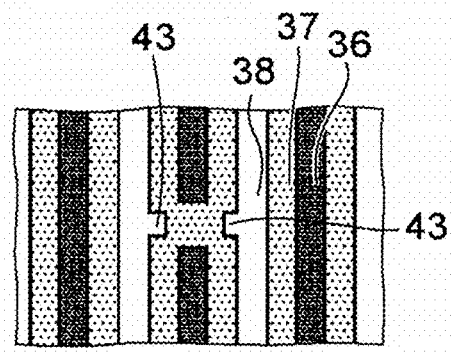
Figure 9C:
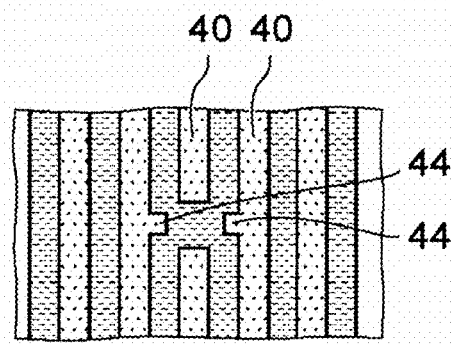
Figure 9D:
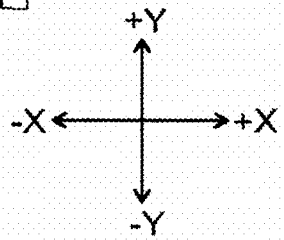
FIG. 9D shows an XY rectangular coordinate system adopted in FIGS. 9A to 9C.

FIGS. 9A to 9C are process plan views illustrating the method for manufacturing a pattern by the sidewall method according to the first embodiment, showing a method for manufacturing a pattern corresponding to a pattern of a separated mandrel.

FIGS. 10 to 13 are plan views illustrating a method for manufacturing a semiconductor device according to the first embodiment.

As shown in FIGS. 5A and 5D, an insulating film 32 is formed on a semiconductor substrate 31. Then, on the insulating film 32, a material film that forms a mandrel 36 is formed. Further, on the material film that forms the mandrel 36, a resist film (not shown schematically) is formed. Next, the resist film is subjected to patterning by the lithography method. Patterning is performed by irradiating a mask (not shown schematically) placed on the resist film with exposure light. At this time, the width of a pattern formed on the resist film is the minimum processing dimension value of lithography in many cases.

The material film that forms the mandrel 36 is etched using the patterned resist film as a mask. Due to this, the mandrel 36 is formed. The mandrel 36 is thinned by slimming according to the necessity. Here, the width of the final mandrel 36 is substantially equal to the "length a" in the wiring layout.

A sidewall 37 is formed on the side face of the mandrel 36. The sidewall 37 is formed by, for example, removing a flat portion of a material film that forms the sidewall 37 by performing anisotropic etching after forming the material film that forms the sidewall 37 on the semiconductor substrate 31 so as to cover the mandrel 36 and then leaving the portion on the side face of the mandrel 36. As a result of that, the sidewall 37 is formed into the shape of a closed loop that surrounds the mandrel 36 when viewed in the top view. It is preferable for the thickness of the material film that forms the sidewall 37 to be the same as the width of the mandrel 36. Further, the thickness of the material film that forms the sidewall 37 is reduced smaller than a length ½ of the space between the neighboring mandrels 36. Due to this, a gap is formed between the sidewalls 37 of the neighboring mandrels 36. Hereinafter, this gap is referred to as an "inter-mandrel gap 38". As a result of that, the length of the inter-mandrel gap 38 is substantially the same as the width between the first pattern 11 and the second pattern 12 in the wiring layout.

As shown in FIGS. 5B and 5E, the mandrel 36 is removed. Then, by etching the insulating film 32 using the sidewall 37 as a mask, the insulating film 32 is removed selectively and thus a concave portion 39 is formed. According to the necessity, the end portion of the sidewall 37 in the shape of a closed loop is removed. This process is sometimes referred to as a "loop-cut process".

As shown in FIGS. 5C and 5F, the sidewall 37 is removed. After that, an electrically conductive material is deposited on the insulating film 32 so as to fill in the concave portion 39. Then, the electrically conductive material is flattened until the top face of the insulating film 32 is exposed. In this manner, a pattern 40 embedded in the concave portion 39 is formed.

The length of the space between the patterns 40 neighboring in a direction perpendicular to the direction in which the pattern 40 embedded in the concave portion 39 and including the electrically conductive material extends is smaller than the length of the minimum space of patterns that can be separated by the lithography method used when patterning a resist film 34.

Next, a method for forming the pattern 40 corresponding to an H-shaped pattern by the sidewall method is explained.

A case where the pattern 40 formed within the concave portion 39 of the inter-mandrel gap 38 is connected in the sidewall method is explained.

As shown in FIG. 6A, as a pattern of the mandrel 36, patterns of the two mandrels 36 separated on the way are formed between the two patterns extending in the Y direction. The patterns of the two mandrels 36 separated on the way are formed by the lithography method using a mask in the same shape as the shape of the mandrel 36. The mandrel 36 is slimmed so that the width of the mandrel is W. Further, in the patterns of the mandrels 36 separated on the way, a space L1 in the Y direction is set to a space substantially not less than a space D in the X direction between the mandrels 36.

As shown in FIG. 6B, the sidewall 37 is formed on the side face of the mandrel 36. The thickness of the sidewall 37 on the side face of the mandrel 36 is reduced smaller than L1/2. Due to this, even if the sidewall 37 is formed at the end portion of the separated mandrel 36, it is unlikely that the portion separated by the sidewall 37 is closed. Further, the inter-mandrel gap 38 extending in the X direction at the separated portion is connected with the inter-mandrel gap 38 formed between the separated mandrel 36 and the mandrel 36 adjacent thereto and extending in the Y direction. Due to this, shape of the inter-mandrel gap 38 is formed into the shape of H.

As shown in FIG. 6C, the mandrel 36 is removed. Due to this, in the portion from which the separated mandrel 36 is removed, a pattern of the separated patterns 40 is formed.

By performing processes shown in FIGS. 5B and 5E, and FIGS. 5C and 5F, it is possible to form the pattern 40 corresponding to the H-shaped pattern.

Next, another method for forming the pattern 40 corresponding to the H-shaped connection pattern is explained.

As shown in FIG. 7A, as a pattern of the mandrel 36, an H-shaped pattern is formed. The pattern of the H-shaped mandrel 36 is formed by the lithography method described previously. As an example, a case is explained where the width of the H-shaped mandrel 36 is W and the width of the connection portion of the pattern of the H-shaped mandrel 36 is also W. The width of the connection portion of the H-shaped mandrel 36 can be formed by the lithography method and any width is acceptable unless it disappears by slimming.

As shown in FIG. 7B, the sidewall 37 is formed on the side face of the mandrel 36. In the +Y and −Y directions of the mandrel 36 extending in the X direction, a pattern of the separated inter-mandrel gap 38 is formed.

As shown in FIG. 7C, the mandrel 36 is removed. Due to this, an H-shaped pattern is formed at the portion from which the mandrel 36 is removed.

After that, by performing the processes shown in FIGS. 5B and 5E, and 5C and 5F, it is possible to form the pattern 40 corresponding to the H-shaped pattern.

Next, a method for forming a pattern corresponding to a separated pattern by the sidewall method is explained.

As shown in FIG. 8A, as a pattern of the mandrel 36, the mandrel 36 extending in the Y direction is formed. When the pattern of the inter-mandrel gap 38 is formed into two separated patterns, in the pattern of the mandrel 36 sandwiching the region between the two separated patterns, a convex portion 42 protruding toward the region between the two patterns is formed. A space L2 between the convex portions 42 in the mandrels 36 is set to a space not more than twice the thickness of the sidewall 37 on the side face of the mandrel 36. The space L2 is, for example, a width thinned by slimming after formed by the lithography method when slimming is used.

As shown in FIG. 8B, the sidewall 37 is formed on the side face of the mandrel 36. Due to this, the sidewalls 37 formed on the side faces of the convex portions 42 couple with each other at the portion between the convex portions 42 and the inter-mandrel gap 38 at the portion is separated in the Y direction.

As shown in FIG. 8C, the mandrel 36 is removed. By performing the processes in FIGS. 5B and 5E, and 5C and 5F, the pattern is formed. Due to this, it is possible to form the pattern 40 corresponding to the pattern of the separated inter-mandrel gap 38. In the two patterns sandwiching the region between the separated two patterns 40, a convex part 44 protruding toward the region between the two patterns is formed.

Further, as shown in FIG. 9A, when the pattern of the mandrel 36 is separated into two patterns, as a pattern of the mandrel 36, the mandrel 36 extending in the Y direction is formed. Then, a portion 36a located between the two separated patterns is made thinner than other portions. It is preferable for the length L2 in the Y direction of the portion 36a to be shorter than the width W of the mandrel 36. After formed by the lithography method, the portion 36a may disappear by slimming. In the example, a case where the portion 36a disappears by slimming is explained.

As shown in FIG. 9B, the sidewall 37 is formed on the side face of the mandrel 36. Due to this, the sidewalls 37 formed on the side faces on both sides of the thinned mandrel 36 become not more than twice the film thickness of the material of the sidewall 37 at the portion 36a, and therefore, the sidewalls coupled with each other at the portion 36a. When the portion 36a of the mandrel 36 thinned by slimming remains, the portion 36a is not removed but remains by the subsequent etching of the mandrel 36 because the portion 36a is thin. Due to this, it is possible to form the pattern of the mandrel 36 into two separated patterns. On the other hand, in the inter-mandrel gap 38 sandwiching the portion of the thinned mandrel 36, a concave portion 43 is formed.

As shown in FIG. 9C, the mandrel 36 is removed. By performing the processes in FIGS. 5B and 5E, and 5C and 5F, it is possible to form the pattern 40 corresponding to the pattern of the separated mandrel 36. Further, in the two patterns sandwiching the region between the two separated patterns, the convex portion 44 protruding toward the region between the two patterns is formed.

Next, a method for manufacturing a semiconductor device based on a wiring layout including the line-cutting part 14 and the bridge part 17 described previously is explained.

Figure 10:
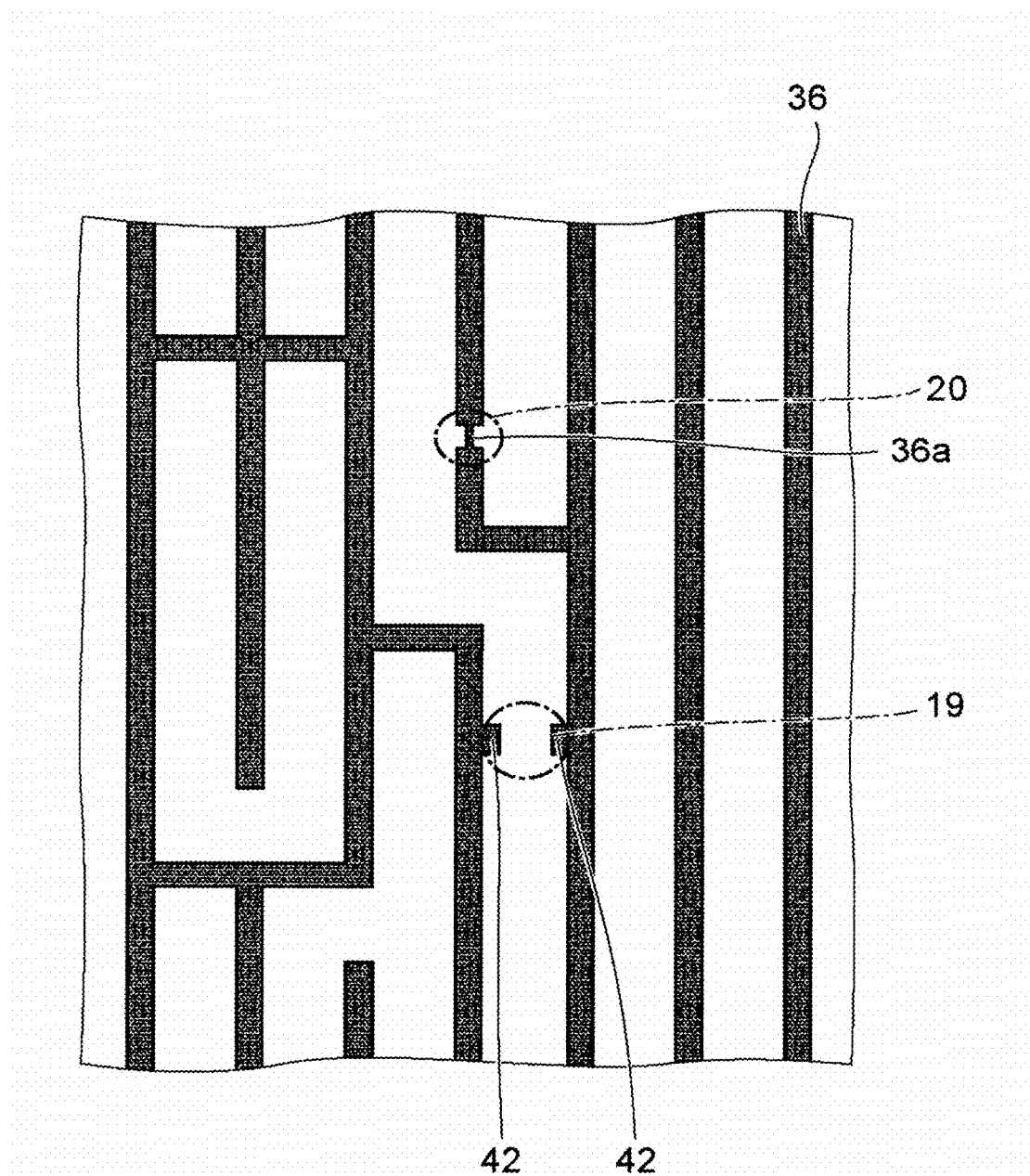
FIG. 10 is a plan view illustrating a method for manufacturing a semiconductor device according to the first embodiment.

As shown in FIG. 10, in the wiring layout described previously, the mandrel 36 is formed on the insulating film 32 using one of the first patterns 11 and the bridge part 17 connecting the first patterns 11, and the second patterns 12 and the bridge part 17 connecting the second patterns 12 as a pattern of the mandrel 36. After that, slimming is performed according to the necessity.

For example, the mandrel 36 is formed on the insulating film 32 using the second patterns 12 and the bridge part 17 connecting the second patterns 12 in FIG. 4 in the embodiment as the pattern of the mandrel 36.

At the portion (the region 20) that forms the pattern of the separated mandrel 36, the portion 36a located between the two patterns to be separated is made thinner than other portions. At the portion (the region 19) that forms the pattern of the separated inter-mandrel gap 38, in the pattern of the two mandrels 36 sandwiching the region between the separated two patterns, the convex portion 42 protruding toward the region is formed.

Figure 11:
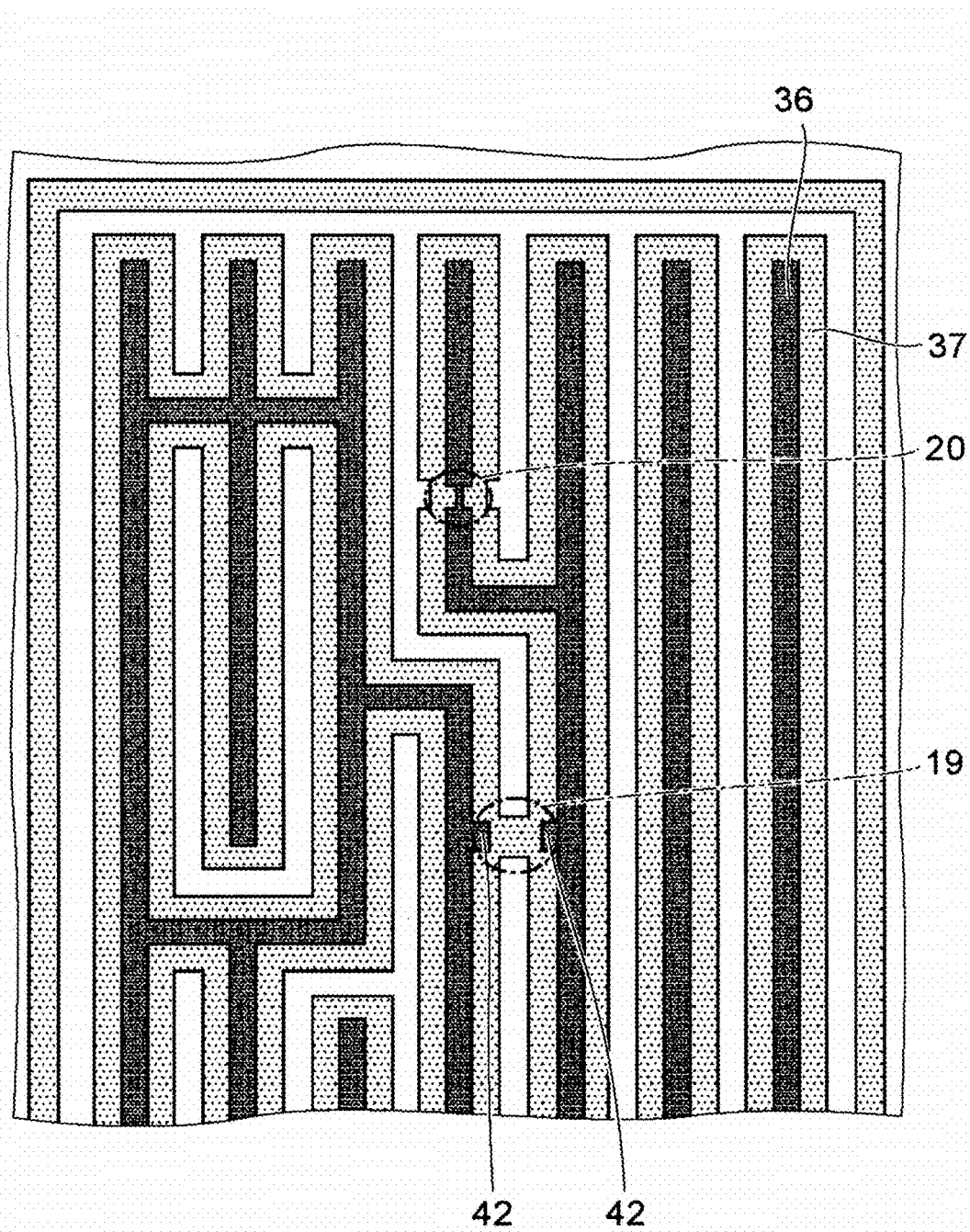
FIG. 11 is a plan view illustrating a method for manufacturing a semiconductor device according to the first embodiment.

As shown in FIG. 11, on the side face of the mandrel 36, the sidewall 37 is formed. In the region 20, the formed sidewall 37 is caused to eliminate the thin portion 36a by slimming or the mandrel 36 sandwiched by the sidewalls 37 is prevented from being removed by the subsequent etching of the mandrel 36. When the portion 36a is eliminated by slimming, the length of the portion 36a is set to a length not more than twice the film thickness of the material of the sidewall 37. In the region 19, the sidewalls 37 formed on the side faces of the convex portions 42 connect with each other and an inter-mandrel gap 38 is separated.

Figure 12:
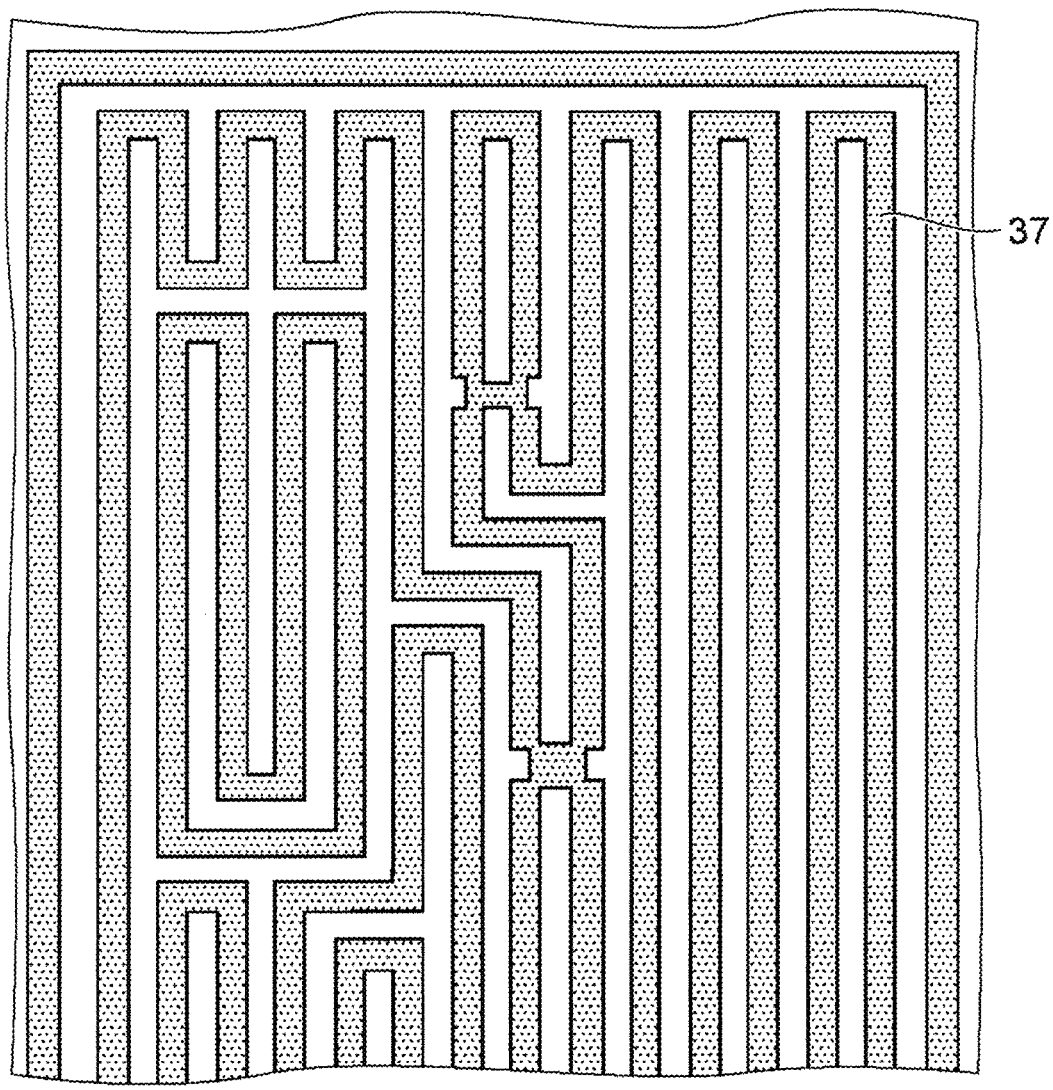
FIG. 12 is a plan view illustrating a method for manufacturing a semiconductor device according to the first embodiment.

As shown in FIG. 12, the mandrel 36 is removed by etching.

After that, the processes in FIGS. 5B and 5E, and 5C and 5F are performed.

Figures 13A, 13B:
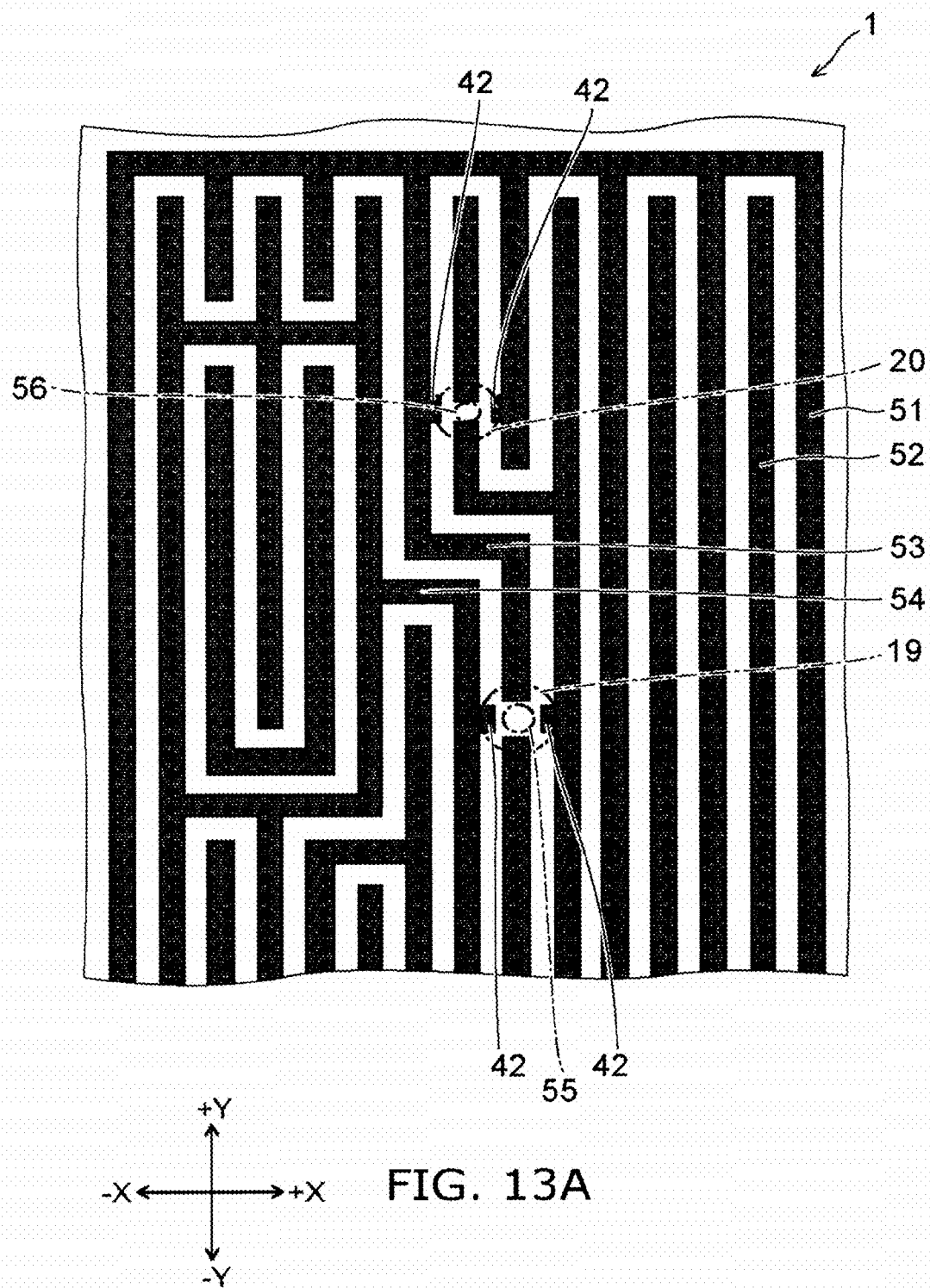
FIG. 13A is a plan view illustrating a method for manufacturing a semiconductor device according to the first embodiment.
FIG. 13B shows an XY rectangular coordinate system adopted in FIG. 13A.

As shown in FIG. 13, a semiconductor device 1 including the pattern 40 formed based on the wiring layout shown in FIG. 4 is manufactured.

According to the method for manufacturing a semiconductor device according to the embodiment, it is possible to manufacture the semiconductor device 1 including the pattern 40 of the H-shaped pattern and the separated pattern 40.

Further, it is possible to form the H-shaped pattern 40 and the separated pattern 40 by using one of the pattern of the mandrel 36 and the pattern of the inter-mandrel gap 38 with the convex portion 42. Consequently, it is made possible to create a free design including a wiring space narrower than the minimum value of space by the resolution of lithography, and therefore, it is possible to manufacture a semiconductor device including highly integrated patterns.

Next, the semiconductor device 1 according to the first embodiment is explained.

As shown in FIGS. 5A to 5F and FIG. 13, the semiconductor device 1 includes the semiconductor substrate 31 and the pattern 40 provided on the semiconductor substrate 31.

In the semiconductor device 1, a plurality of patterns 51 corresponding to a plurality of the first patterns 11 extending in the Y direction, a plurality of patterns 52 corresponding to a plurality of the second patterns 12 extending in the Y direction, a plurality of patterns 53 corresponding to a plurality of the bridge parts 17 extending in the X direction and connecting the first patterns 11, and a plurality of patterns 54 corresponding to a plurality of the bridge parts 17 extending in the X direction and connecting the second patterns 12 are provided.

If a plurality of lines extending in the Y direction and arranged at a space ½ of the first space in the X direction are supposed in the XY plane and integers are allocated from one to the lines in order from the end, the patterns 51 are arranged in the odd-numbered lines and the patterns 52 in the even-numbered lines.

Further, the pattern 53 connects the patterns 51 and the pattern 54 connects the patterns 52. Then, the pattern 51 and the pattern 53, and the pattern 52 and the pattern 54 are separated from each other.

In the region 19, two of the patterns 51 are arranged in the same line extending in the Y direction, separated from each other in the Y direction, and the pattern 54 is not arranged therebetween.

In the region 20, two of the patterns 52 are arranged in the same line extending in the Y direction, separated from each other in the Y direction, and the pattern 53 is not arranged therebetween.

Then, in the two patterns 52 sandwiching a region 55 between the two patterns 51 in the X direction, the convex portion 42 protruding toward the region 55 is formed.

Further, in the two patterns 51 sandwiching a region 56 between the two patterns 52 in the X direction, the convex portion 42 protruding toward the region 56 is formed.

According to the method for manufacturing a semiconductor device according to the embodiment, it is possible to manufacture a highly-integrated semiconductor device including the H-shaped pattern 40 and the separated pattern 40 and a wiring space narrower than the minimum value of space by the resolution of lithography.

Second Embodiment

Next, a second embodiment is explained.

First, a method for designing a wiring layout formed by the sidewall method according to the second embodiment is explained.

Figures 14A, 14B:
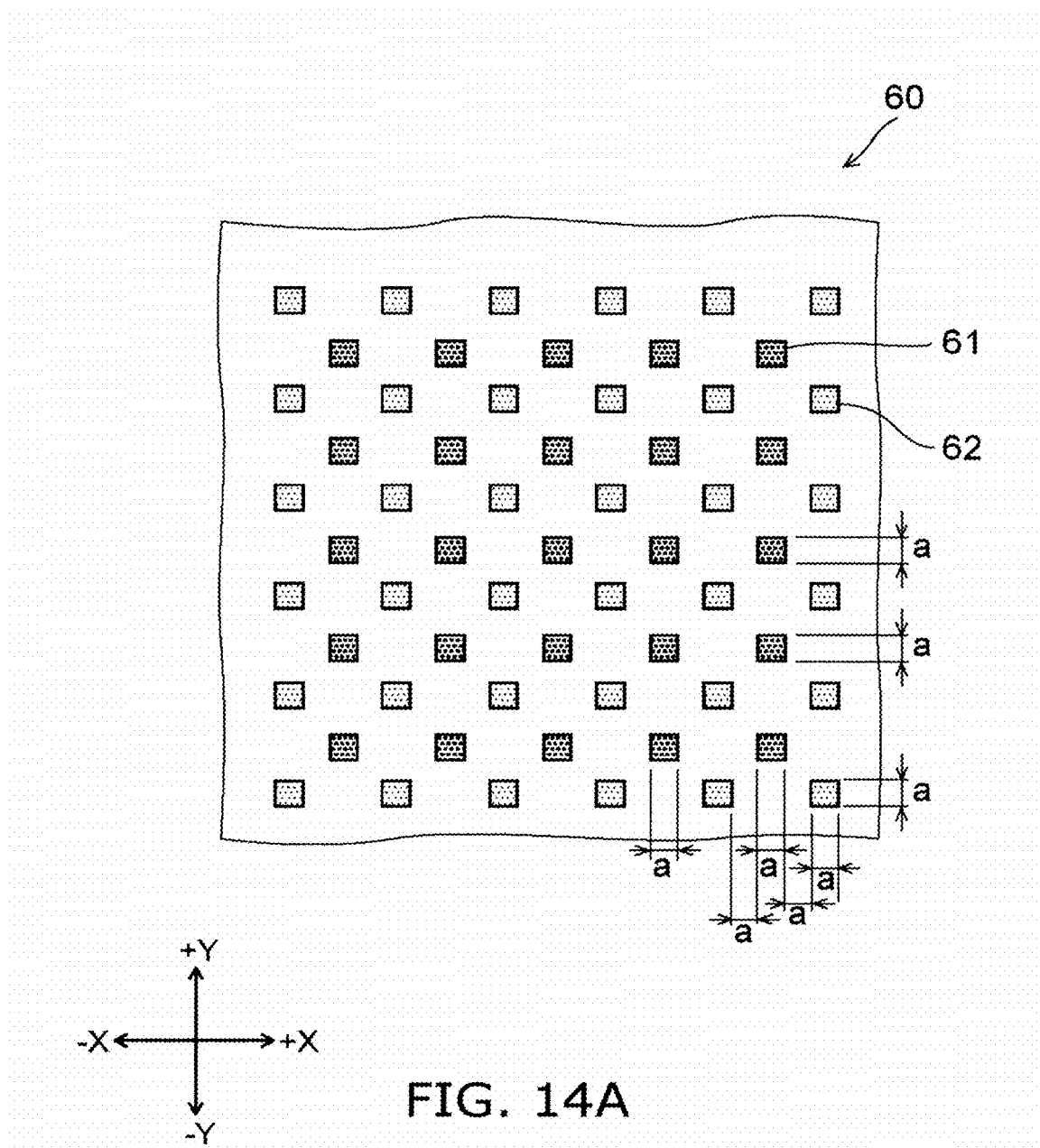
FIG. 14A is a plan view illustrating a base pattern to be used in the method for designing a wiring layout according to the second embodiment.
FIG. 14B shows an XY rectangular coordinate system adopted in FIG. 14A.

FIG. 14 is a plan view illustrating a base pattern to be used in the method for designing a wiring layout according to the second embodiment.

Figure 15A:
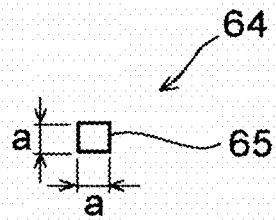
Figure 15B:
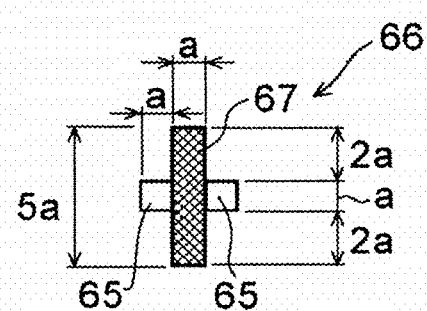
Figure 15C:
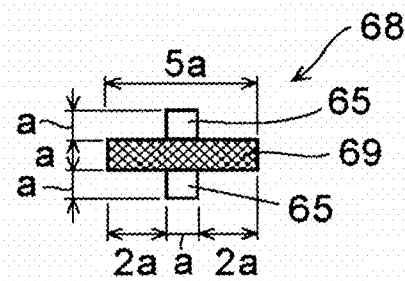
Figure 15D:
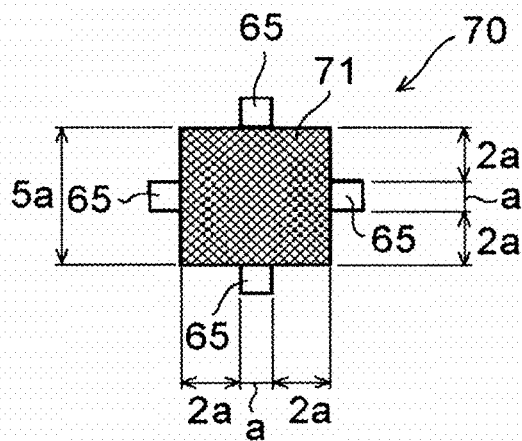

FIGS. 15A to 15D are plan views illustrating layout parts used in the second embodiment, wherein FIG. 15A illustrates a line-cutting part, FIG. 15B a Y bridge part, FIG. 15C an X bridge part, and FIG. 15D a contact fringe.

Figure 16:
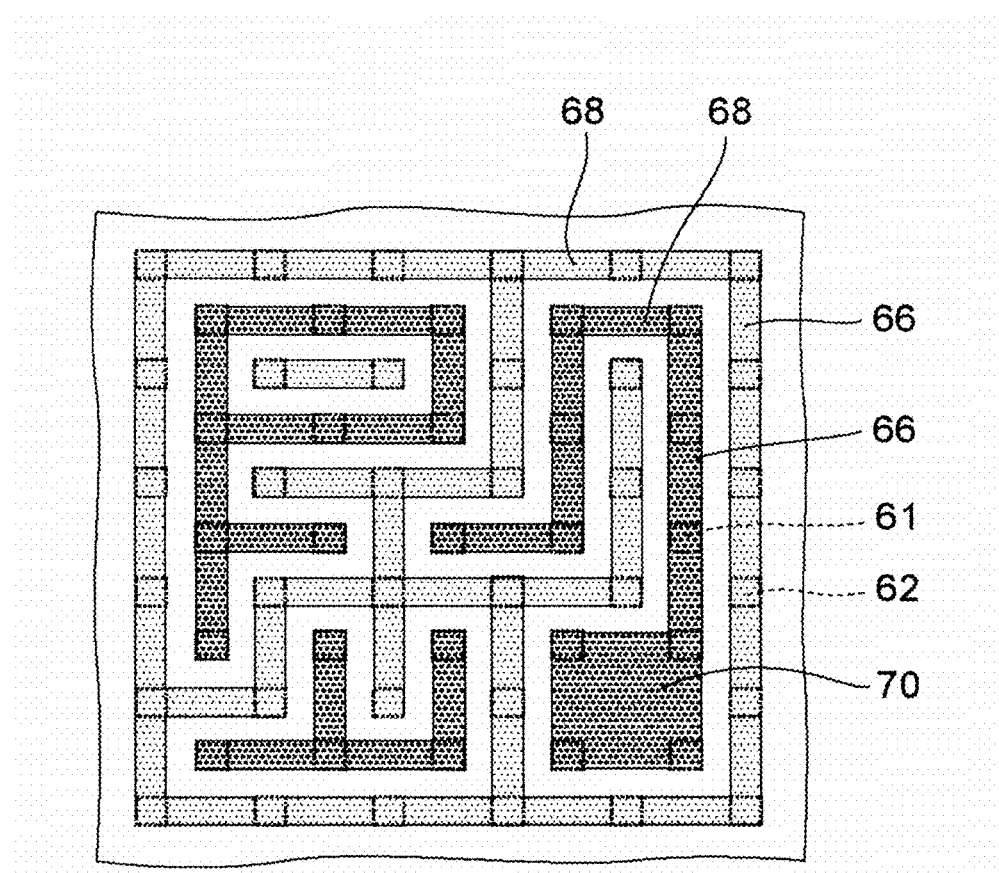
FIG. 16 is a plan view illustrating a state where the bridge parts are arranged on the base pattern in the second embodiment.

FIG. 16 is a plan view illustrating a state where the bridge parts are arranged on the base pattern in the second embodiment.

As shown in FIG. 14, on a base pattern 60 according to the embodiment, a plurality of first points 61 arranged in a matrix and a plurality of second points 62 arranged in a matrix are provided.

The plurality of the first points 61 are arranged in a matrix at the second space in the Y direction and at the first space in the X direction. The plurality of the second points 62 are arranged in a matrix at the second space in the Y direction and at the first space in the X direction. However, the second points 62 are arranged at a space shifted by half the second space in the Y direction and arranged at a space shifted by half the first space in the X direction with respect to the first points.

In the embodiment, the first space and the second space are made the same. Further, the first point 61 and the second point 62 are formed into the shape of a square and the length of one side is set to the length a ¼ of the first and second spaces.

As shown in FIG. 15A, a line-cutting part 64 includes a rectangular portion 65. The rectangular portion 65 is formed into the shape of a square. The length of one side is set to the length a.

As shown in FIG. 15B, a Y bridge part 66 includes a Y cross-linking portion 67 and the two rectangular portions 65. The Y cross-linking portion 67 extends in the Y direction. The length in the Y direction is set to a length five times the length a (5a). The width of the Y cross-linking portion 67 is set to the length a, the same as the length of one side of the rectangular portion 65. The rectangular portion 65 is provided at the center on the side face in the X direction of the Y cross-linking portion 67.

As shown in FIG. 15C, an X bridge part 68 includes an X cross-linking portion 69 and the two rectangular portions 65. The X cross-linking portion 69 extends in the X direction. The length in the X direction is set to a length five times the length a. The width of the X cross-linking portion 69 is set to the length a, the same as the length of one side of the rectangular portion 65. The rectangular portion 65 is provided at the center on the side face in the Y direction of the X cross-linking portion 69.

As shown in FIG. 15D, a contact fringe 70 includes a contact portion 71 and the four rectangular portions 65. The contact portion 71 is formed into the shape of a rectangle and the length of the side in the Y direction is set to a length five times the length a (5a), the same as the length of the Y cross-linking portion 67, and the length of the side in the X direction is set to a length five times the length a (5a), the same as the length of the X cross-linking portion 69. The four rectangular portions 65 are provided at the centers on the side faces of the four sides of the contact portion 71. That is, one pair of the rectangular portions 65 is on the same line in the X direction and the other pair is on the same line in the Y direction.

As shown in FIG. 16, the Y bridge part 66 is arranged between the first points 61 adjacent to each other in the Y direction and between the second points 62 adjacent to each other in the Y direction. Next, the X bridge part 68 is arranged between the first points 61 adjacent to each other in the X direction and between the second points 62 adjacent to each other in the X direction. That is, the X bridge part 68 and the Y bridge part 66 are arranged so that the end portions of the X cross-linking portion 69 and the Y cross-linking portion 67 overlap the first points 61 or the second points 62.

Further, the contact fringe 70 is arranged so that the four corners of the contact portion 71 overlap the four first points 61 arranged so as to surround the second point 62 with one of the second points 62 as a reference. It is also possible to arrange the contact fringe 70 so that the four corners of the contact portion 71 overlap the four second points 62 arranged so as to surround the first point 61 with one of the first points 61 as a reference.

If necessary, the line-cutting part 64 is arranged at the portion to be separated in the Y cross-linking portion 67 and the X cross-linking portion 69.

In this manner, a wiring layout formed by the sidewall method is manufactured.

According to the method for designing a wiring layout according to the embodiment, a pattern including a plurality of points arranged in the form of a two-dimensional matrix is used as the base pattern 60, and therefore, it is made possible to create a freer design not limited to a pattern extending in one direction while aiming at higher integration of the wiring layout.

Further, according to the embodiment, the X bridge part 68 and the Y bridge part 66 connecting the first points 61 and the X bridge part 68 and the Y bridge part 66 connecting the second points 62 are turned into patterns separated from each other. Consequently, it is possible to make a wiring layout formed by the sidewall method.

Next, a base pattern according to a modified example of the second embodiment is explained.

Figure 17:
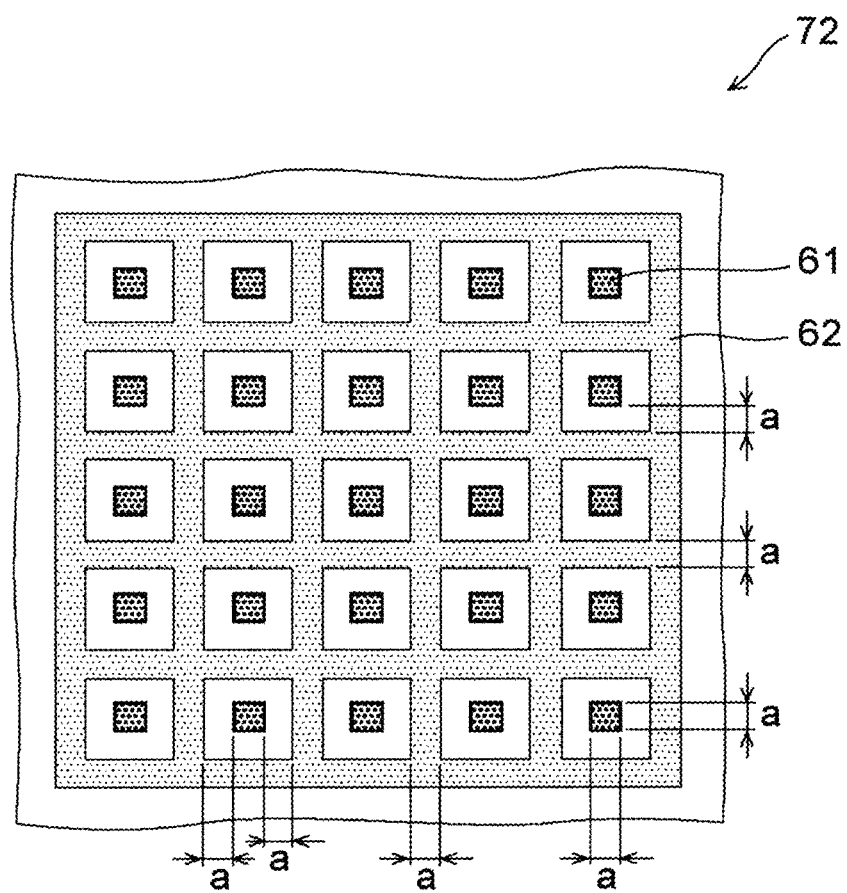
FIG. 17 is a plan view illustrating a base pattern according to a modified example of the second embodiment.

FIG. 17 is a plan view illustrating a base pattern according to a modified example of the second embodiment.

As shown in FIG. 17, on a base pattern 72, a lattice pattern in which the second points 62 are connected by the X bridge parts 68 and the Y bridge parts 66 and the first point 61 arranged at the center of each lattice are provided.

The line-cutting part 64, the X bridge part 68, the Y bridge part 66, and the contact fringe 70 are arranged in predetermined positions in the base pattern 72. Due to this, a wiring layout is manufactured.

According to the modified example, it is sufficient to arrange the X bridge part 68 and the Y bridge part 66 so as to connect the first points 61 and it is not necessary to arrange the X bridge part 68 and the Y bridge part 66 on the second point 62. Consequently, it is possible to eliminate the process of arranging the bridge parts. It is possible to arrange the contact fringe 70 so that the center portion of the contact portion 71 overlaps one of the first point 61 and the second point 62. In the case of FIG. 17, when the center portion of the contact portion 71 of the contact fringe 70 is overlapped on the second point 62, the X bridge part 68 and the Y bridge part 66 connected to the second point 62 are separated by the rectangular portion 65 of the contact fringe 70.

Next, a program for supporting a design of a wiring layout formed by the sidewall method is explained.

The program according to the embodiment causes a computer to execute procedures shown below.

The program causes the computer to execute a procedure to display the base pattern 60 on the display unit. On the base pattern 60, a plurality of the first points 61 arranged in a matrix at the second space in the Y direction and at the first space in the X direction and a plurality of the second points 62 arranged in a matrix at the second space in the Y direction and at the first space in the X direction, the second points 62 being arranged at a space shifted by half the second space in the Y direction and arranged at a space shifted by half the first space in the X direction with respect to the first point, are provided.

The program causes the computer to execute a procedure to display the line-cutting part 64, the X bridge part 68, the Y bridge part 66, and the contact fringe 70 on the display unit. It is preferable for the computer to classify the first points 61 and the second points 62, or the lattice pattern connecting the second points by different colors or hatch differently to make it easy for a designer to make a layout.

When the designer, via the input unit, arranges the Y bridge part 66 in a predetermined position between the two first points 61 adjacent to each other in the Y direction in the base pattern 60 displayed on the display unit by, for example, the drag operation of a mouse, the program causes the computer to execute a procedure to connect the two first points 61.

When the designer, via the input unit, arranges the X bridge part 68 in a predetermined position between the two first points 61 adjacent to each other in the X direction in the base pattern 60 displayed on the display unit, the program causes the computer to execute a procedure to connect the two first points 61.

Similarly, the program also causes the computer to execute a procedure to connect the two second points 62 by the X bridge part 68 and the Y bridge part 66. That is, when the Y bridge part 66 is arranged in a position between the two second points 62 adjacent to each other in the Y direction in the base pattern 60 displayed on the display unit, the program causes the computer to execute a procedure to connect the two second points 62 and when the X bridge part 68 is arranged in a position between the two second points 62 adjacent to each other in the X direction in the base pattern 60 displayed on the display unit, the program causes the computer to execute a procedure to connect the two second points 62.

When the designer arranges, via the input unit, the contact fringe 70 on the following four first points 61 displayed on the display unit, that is, on the one first point 61, on the first point 61 adjacent thereto in the X direction with the one first point 61 as a reference, and on the two first points 61 adjacent to the two first points 61 in the Y direction, the program causes the computer to execute a procedure to arrange the contact fringe on the four first points 61.

When the designer arranges, via the input unit, the line-cutting part 64 on the portions to be separated in the Y cross-linking portion 67 and the X cross-linking portion 69, the program causes the computer to execute a procedure to replace the portions with two separated patterns.

In this manner, a wiring layout formed by the sidewall method is manufactured.

According to the program according to the embodiment, it is possible to cause a computer to support a design of a wiring layout, and therefore, it is possible to reduce the time which the designer designs a wiring layout that can be formed by the sidewall method.

It may also be possible for the program to cause the computer to execute a procedure to replace patterns at a time when the designer clicks a conversion button displayed on the display unit after arranging a plurality of the X bridge parts 68 etc (FIG. 49). As a result of that, it is possible for the designer to arrange other parts in a state where each part is displayed, and therefore, making a layout is made easy.

Next, a method for manufacturing a semiconductor device including patterns formed based on a wiring layout by the sidewall method is explained.

FIGS. 18A to 18D are plan views illustrating a method for manufacturing a semiconductor device according to the second embodiment.

Figure 18A:
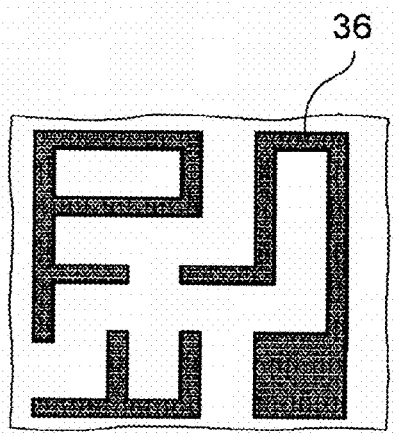
FIGS. 18A to 18D are plan views illustrating a method for manufacturing a semiconductor device according to the second embodiment.

As shown in FIG. 18A, in the wiring layout described previously, the mandrel 36 is formed on the insulating film 32 using one of the Y bridge part 66 and the X bridge part 68 connecting the first points 61 and the Y bridge part 66 and the X bridge part 68 connecting the second points 62 as a pattern of the mandrel 36.

For example, in FIG. 16 in the embodiment, the mandrel 36 is formed on the insulating film 32 using the Y bridge part 66 and the X bridge part connecting the first points 61 as a pattern of the mandrel 36. According to the necessity, the mandrel 36 is slimmed.

Figure 18C:
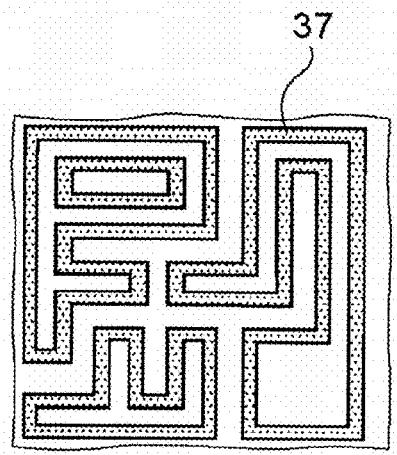
Figure 18B:
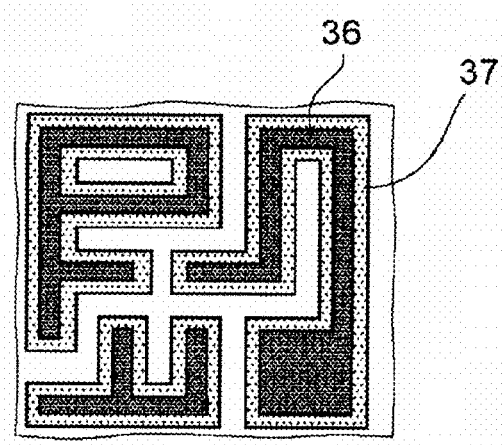

As shown in FIG. 18B, the sidewall 37 is formed on the side face of the mandrel 36. The relationship between the width of the mandrel 36 and the film thickness of the sidewall 37 is the same as the relationship in the first embodiment.

As shown in FIG. 18C, the mandrel 36 is removed by etching.

The processes in FIGS. 5B and 5E, and 5C and 5F are performed.

Figure 18D:
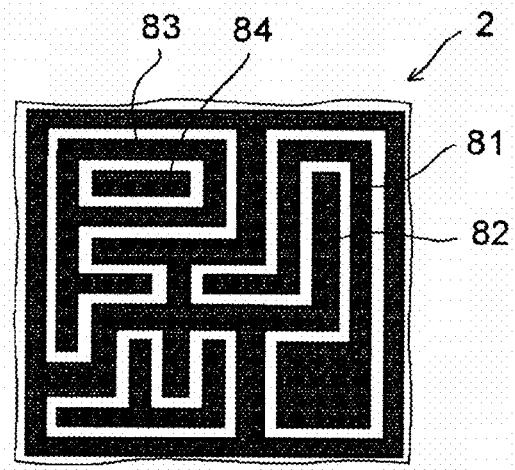
Figure 18E:
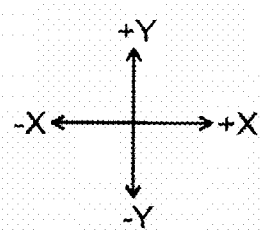
FIG. 18E shows an XY rectangular coordinate system adopted in FIGS. 18A to 18D.

In this manner, as shown in FIG. 18D, a semiconductor device 2 including patterns formed based on the above-described wiring layout is manufactured.

According to the method for manufacturing a semiconductor device according to the embodiment, it is possible to form the H-shaped pattern 40 and the separated pattern 40 using one of the patterns of the mandrel 36 and the inter-mandrel gap 38. Consequently, it is made possible to design a wiring layout including a wiring space narrower than the minimum value of space by the resolution of lithography easily. And therefore, it is possible to manufacture a semiconductor device including highly integrated patterns. In particular, it is possible to design patterns mainly based on the final layout instead of designing patterns by calculating the sidewall 37 from the mandrel 36. As a result of that, the design efficiency is improved considerably.

Next, the semiconductor device 2 according to the embodiment is explained.

In the semiconductor device 2, a plurality of patterns 82 corresponding to the Y bridge part 66 connecting the first points 61, a plurality of patterns 82 corresponding to the Y bridge part 66 connecting the second points 62, a plurality of patterns 83 corresponding to the X bridge part 68 connecting the first points 61, and a plurality of patterns 84 corresponding to the X bridge part connecting the second points 62 are provided.

If a plurality of first lines extending in the Y direction and arranged at a space ½ of the first space in the X direction are supposed in the XY plane and integers are allocated from one to the first lines in order from the end, and if a plurality of second lines extending in the X direction, arranged at a space ½ of the second space in the Y direction, and intersecting the first lines are supposed in the XY plane and integers are allocated from one to the second lines in order from the end, the patterns are arranged in the odd-numbered first lines and the patterns 82 are arranged in the even-numbered first lines. Further, the patterns 83 are arranged in the odd-numbered second lines and the patterns 84 are arranged in the even-numbered second lines.

Then, at least one of the patterns 81 connects with the pattern 83 and at least one of the patterns 82 connects with the pattern 84. Further, the pattern 81 and the pattern 83, and the pattern 82 and the pattern 84 are separated from each other.

The semiconductor device 2 according to the embodiment includes the H-shaped pattern and the separated pattern and also includes the wiring space narrower than the minimum value of space by the resolution of lithography, and therefore, the degree of integration is high.

Third Embodiment

Next, a third embodiment is explained.

The embodiment is an embodiment of a method for designing a wiring layout formed by the two-time sidewall method.

First, a method for designing a wiring layout according to the embodiment is explained.

Figures 19A, 19B:
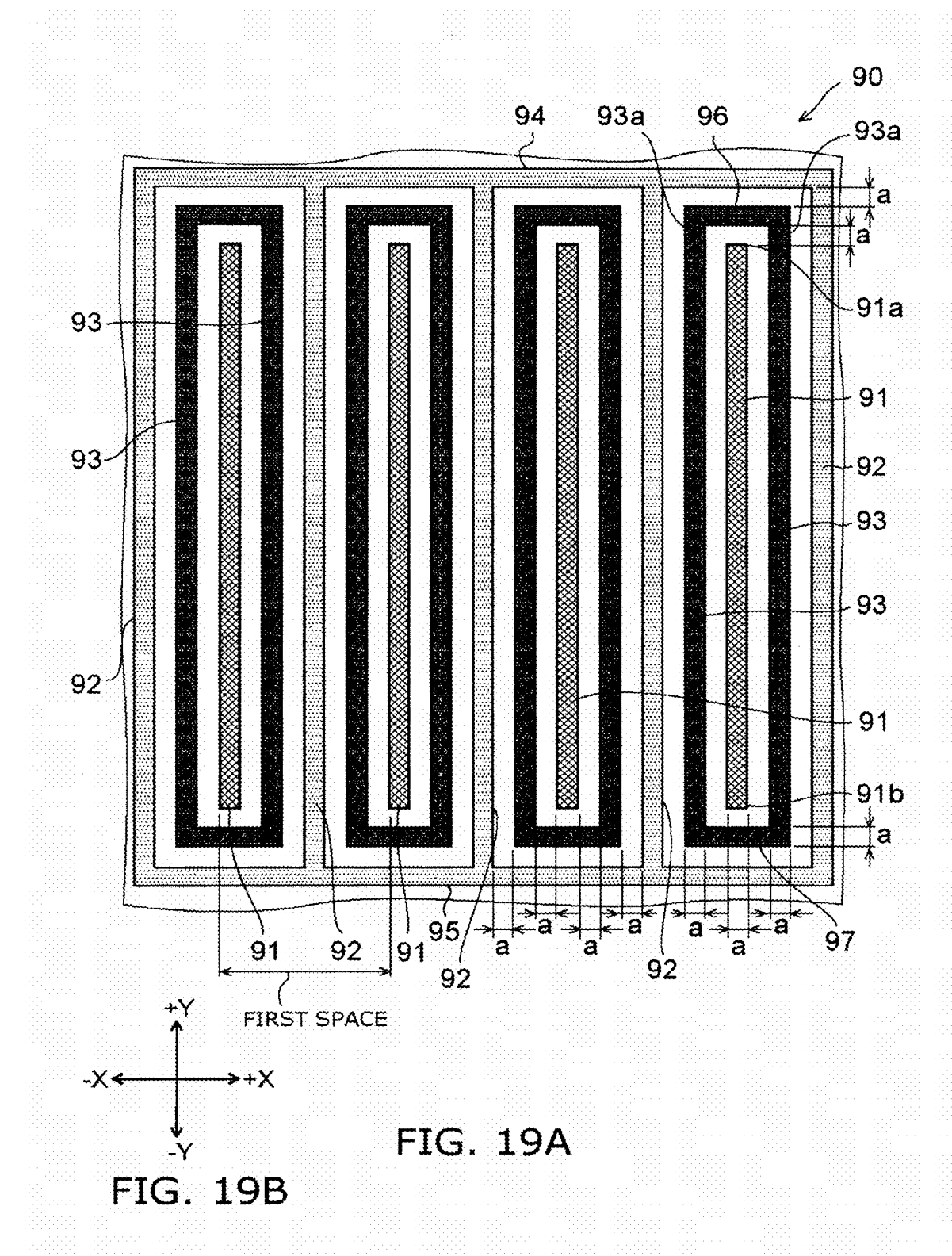
FIG. 19A is a plan view illustrating a base pattern used in the method for designing a wiring layout according to the third embodiment.
FIG. 19B shows an XY rectangular coordinate system adopted in FIG. 19A.

FIG. 19 is a plan view illustrating a base pattern used in the method for designing a wiring layout according to the third embodiment.

FIGS. 20A to 20D are plan views illustrating layout parts used in the third embodiment, wherein FIG. 20A shows a line-cutting part and FIGS. 20B to 20D show bridge parts.

Figure 21A:
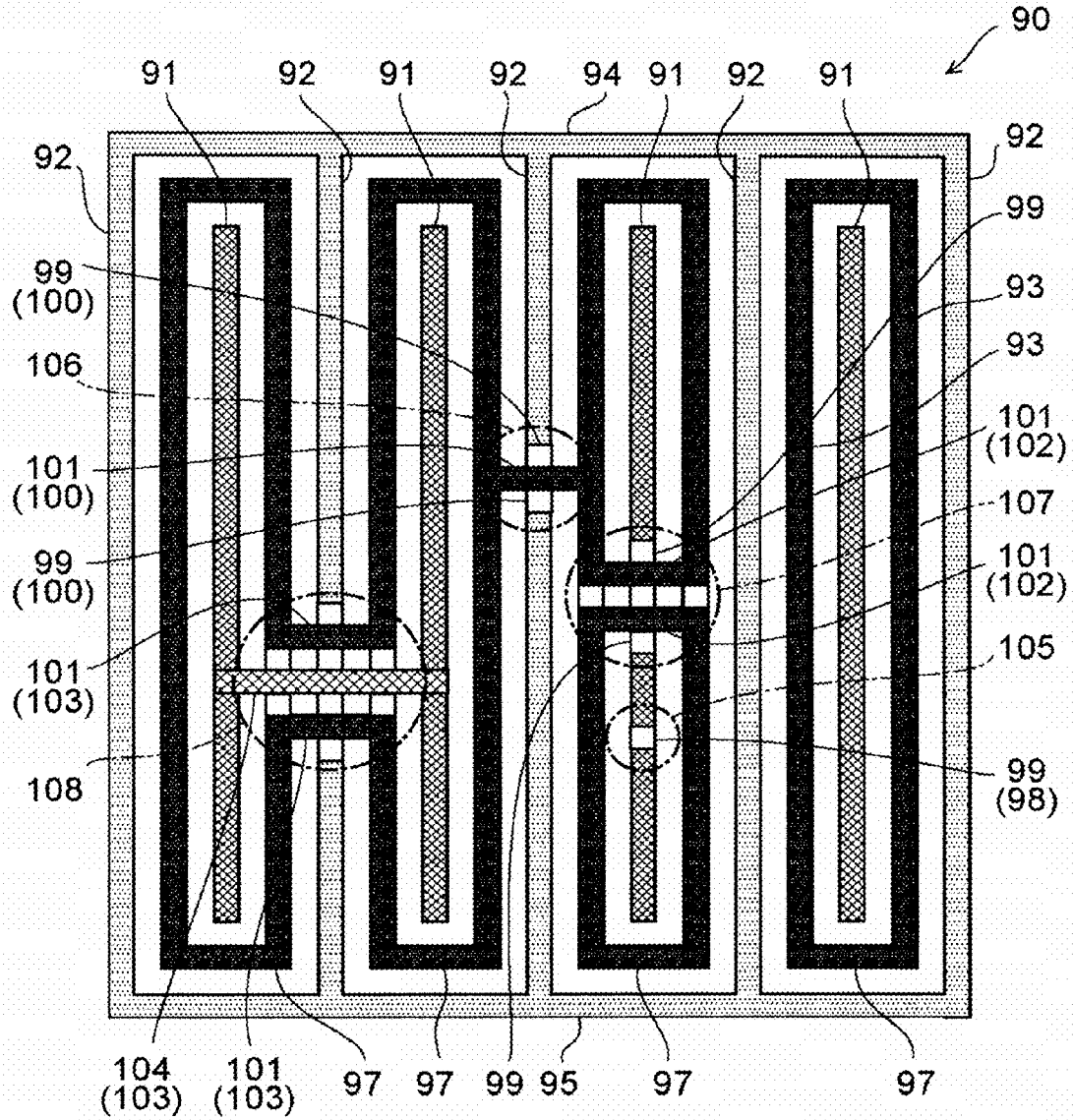
FIG. 21A is a plan view illustrating a state where the bridge parts and line-cutting parts are arranged on the base pattern.
Figure 21B:
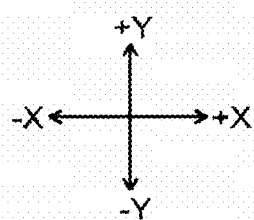
FIG. 21B shows an XY rectangular coordinate system adopted in FIG. 21A.

FIG. 21 is a plan view illustrating a state where the bridge parts and line-cutting parts are arranged on the base pattern.

Figure 22A:
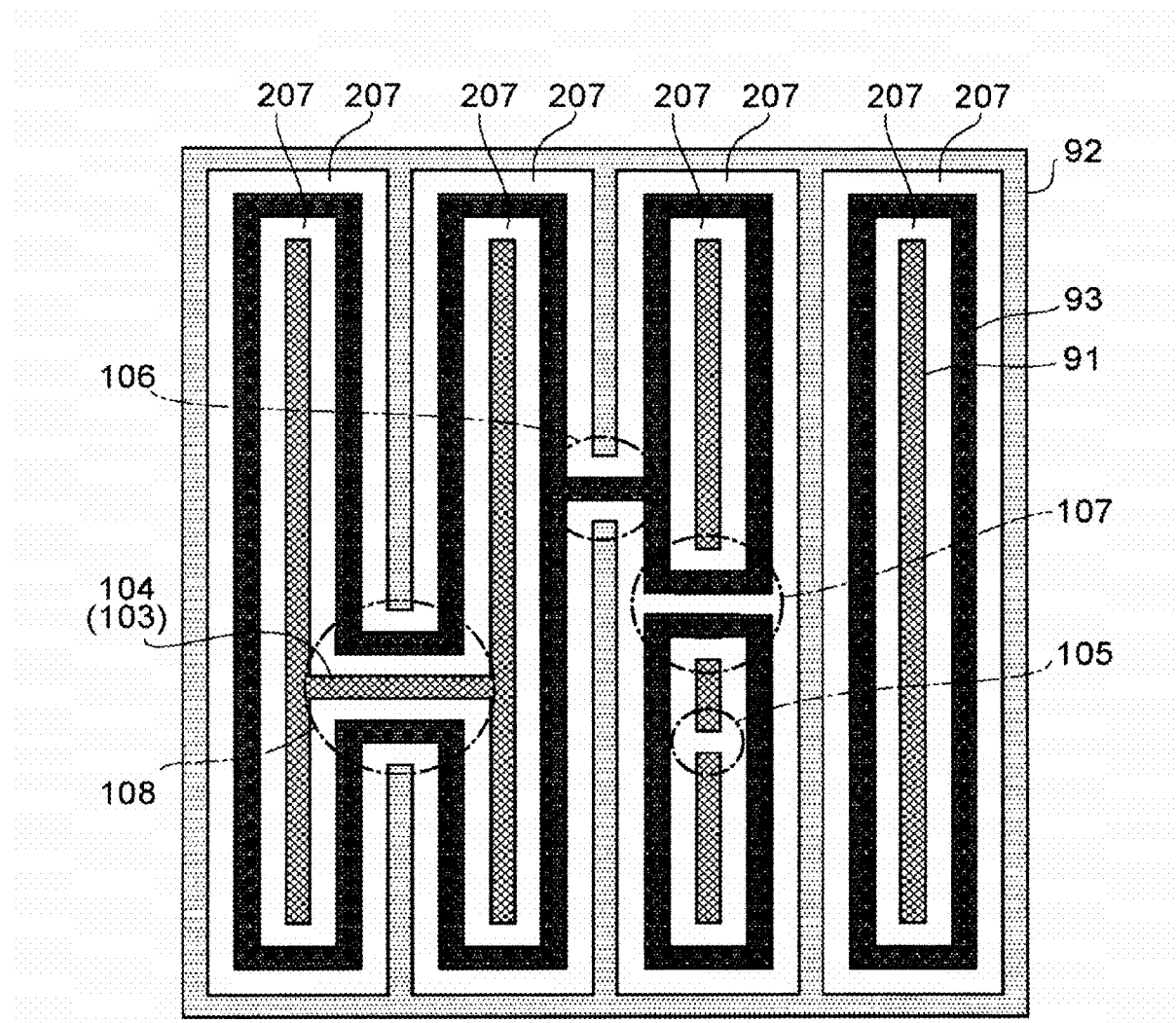
FIG. 22A is a plan view illustrating a state where patterns and the bridge parts are classified by three colors in the third embodiment.
Figure 22B:
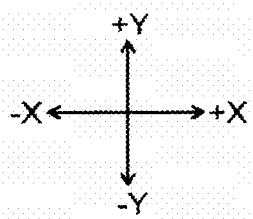
FIG. 22B shows an XY rectangular coordinate system adopted in FIG. 22A.

FIG. 22 is a plan view illustrating a state where patterns and the bridge parts are classified by three colors in the third embodiment.

First, the base pattern and each part used in the embodiment are explained.

As shown in FIG. 19, on a base pattern 90 used in the embodiment, a plurality of first patterns 91 extending in one direction, a plurality of second patterns 92 extending in the one direction, and a plurality of third patterns 93 extending in the one direction are provided.

In the embodiment also, in order to explain the base pattern 90, the same XY rectangular coordinate system as in the first embodiment described previously is adopted. In the XY rectangular coordinate system, of the directions in which the first pattern 91, the second pattern 92, and the third pattern 93 extend, the upward direction in the figure is referred to as the +Y direction and the opposite direction is referred to as the −Y direction. The "+Y direction" and the "−Y direction" are together referred to also as the "Y direction". The direction 90 degrees rotated clockwise from the +Y direction is referred to as the +X direction and the opposite direction is referred to as the −X direction. The "+X direction" and the "−X direction" are together referred to also as the "X direction".

The first patterns 91 extend in the Y direction and are arranged at the first space along the X direction. The end in the +Y direction of the first pattern 91 is referred to as an end 91a and the end in the −Y direction of the first pattern 91 is referred to as an end 91b.

The second patterns 92 extend in the Y direction and are arranged one by one at the center between the first patterns 91. Consequently, the second patterns 92 are arranged at the first space in the X direction. The end in the +Y direction of the second pattern 92 is connected to a horizontal pattern 94 extending in the horizontal direction. The end in the −Y direction of the second pattern 92 is connected to a horizontal pattern 95 extending in the X direction.

The third patterns 93 extend in the Y direction and are arranged one by one at the center between the first pattern 91 and the second pattern 92 adjacent to each other. Consequently, the third patterns 93 are arranged at a space ½ of the first space in the X direction. Further, ends 93a in the +Y direction of the two third patterns 93 adjacent to each other with the one first pattern 91 sandwiched in between are connected by a horizontal pattern 96 provided between the end 91a and the horizontal pattern 94 and extending in the X direction. Ends 93b in the −Y direction of the two third patterns adjacent to each other with the one first pattern 91 sandwiched in between are connected by a horizontal pattern 97 provided between the end 91b and the horizontal pattern 95 and extending in the X direction. That is, the third patterns 93 are arranged so as to surround the one first pattern 91.

In the embodiment, the width of the first pattern 91, the second pattern 92, and the third pattern 93 is set to a length ⅛ of the first space. This length is referred to as the length a. The space between the first pattern 91 and the third pattern 93 and the space between the second pattern 92 and the third pattern 93 are also the length a.

As shown in FIG. 20A, a line-cutting part 98 includes a rectangular portion 99.

The rectangular portion 99 is formed into the shape of a square each side of which has the length a, which is the width of the first pattern 91 and the second pattern 92.

It is possible to arrange the line-cutting part 98 on the first pattern 91 and the second pattern 92 but not on the third pattern 93.

As shown in FIG. 20B, a bridge part 100 includes a cross-linking portion 101 and the two rectangular portions 99. The cross-linking portion 101 extends in the X direction. The length in the X direction of the cross-linking portion 101 is set to the length a. The width of the cross-linking portion 101 is set to the length a. The rectangular portion 99 is provided at the center portion on the side faces facing in the +Y direction and the −Y direction of the cross-linking portion 101.

It is possible to arrange the bridge part 100 between the two third patterns 93 sandwiching the one first pattern 91 or the one second pattern 92.

As shown in FIG. 20C, a bridge part 102 includes the two cross-linking portions 101 and the five rectangular portions 99. The two cross-linking portions 101 extend in the X direction and arranged in tandem in the Y direction. At the center portion and both ends between the two cross-linking portions 101, the three in total rectangular portions 99 are arranged. At the center portion on the side face facing in the +Y direction of the cross-linking portion 101 on the side in the +Y direction, the rectangular portion 99 is provided. At the center portion on the side face facing in the −Y direction of the cross-linking portion 101 on the side in the −Y direction, the rectangular portion 99 is provided. That is, the rectangular portions 99 are arranged along a straight line in the Y direction at the center portion in the X direction of the cross-linking portion 101. Further, the rectangular portions 99 are arranged side by side in the X direction between the cross-linking portions 101.

It is possible to arrange the bridge part 102 between the two third patterns 93 sandwiching the one first pattern 91 or the one second pattern 92. That is, by overlapping the end portion of the cross-linking portion 101 on the third pattern 93, the third patterns 93 adjacent to each other are connected and at the same time, the first pattern 91 or the second pattern 92 that the cross-linking portion 101 crosses is divided in the Y direction.

As shown in FIG. 20D, a bridge part 103 includes one large cross-linking portion 104, the two cross-linking portions 101, and eight rectangular portions. The length of the one large cross-linking portion 104 is set to a length nine times the length a (9a). The width of the large cross-linking portion 104 is set to the length a. On the side in the +Y direction and on the side in the −Y direction of the large cross-linking portion 104, the cross-linking portion 101 is provided. The center in the X direction of the large cross-linking portion 104 and the center in the X direction of the cross-linking portion 101 agree in the X direction. Between the cross-linking portion 101 on the side in the +Y direction of the large cross-linking portion 104 and the large cross-linking portion 104, the three in total rectangular portions 99 are provided at the center portion and both ends on the side face of the cross-linking portion 101 on the side in the +Y direction. Between the cross-linking portion 101 on the side in the −Y direction of the large cross-linking portion 104 and the large cross-linking portion 104, the three in total rectangular portions 99 are provided at the center portion and both ends on the side face of the cross-linking portion 101 on the side in the −Y direction. At the center portion on the side face facing in the +Y direction of the cross-linking portion 101 on the side in the +Y direction, the rectangular portion 99 is provided. At the center portion on the side face facing in the −Y direction of the cross-linking portion 101 on the side in the −Y direction, the rectangular portion 99 is provided. That is, the rectangular portions 99 are aligned along a straight line in the Y direction at the center portion in the X direction of the large cross-linking portion 104 and the cross-linking portion 101. Further, the rectangular portions 99 are aligned along a straight line in the X direction between the large cross-linking portion 104 and the cross-linking portion 101.

It is possible to arrange the bridge part 103 between the two second patterns 92 sandwiching the one first pattern 91 and the two third patterns 93 or between the first patterns 91 sandwiching the one second pattern 92 and the two third patterns 93. That is, by overlapping the end portion of the large cross-linking portion 104 on the first pattern and the end portion of the cross-linking portion 101 on the third pattern 93, the neighboring first patterns are connected and at the same time, the second pattern 92 and the third pattern 93 that the large cross-linking portion 104 crosses are divided in the Y direction and the second patterns 92 are connected by the cross-linking portion 101 in the X direction.

Next, a method for designing a wiring layout by arranging each part described above on the base pattern 90 is explained.

As shown in FIG. 21, the rectangular portion 99 of the line-cutting part 98 is arranged on a portion to be divided in the Y direction in the first pattern 91, for example, on the first pattern 91 in a region 105.

When connecting the neighboring third patterns 93 sandwiching the second pattern 92 in the X direction, the bridge part 100 is arranged between the two third patterns 93 to be connected, for example, between the neighboring two third patterns sandwiching the one second pattern 92 in a region 106. In that case, the cross-linking portion 101 is arranged so as to span the second pattern 92. The rectangular portion 99 is arranged on the second pattern 92.

Further, when connecting the neighboring third patterns 93 sandwiching the first pattern 91 in the X direction, the bridge part 102 is arranged between the third patterns 93 to be connected, for example, between the two neighboring third patterns 93 sandwiching the one first pattern 91 in a region 107. In that case, the two cross-linking portions 101 are arranged so as to span the first pattern 91. The rectangular portion 99 is arranged on the first pattern 91 and the second pattern 92.

When connecting the first patterns 91 neighboring in the X direction, the large cross-linking portion 104 in the bridge pattern 103 is arranged between the first patterns 91 to be connected, for example, between the two neighboring first patterns 91 sandwiching the one second pattern 92 and the two third patterns 92 in a region 108. In this case, the two cross-linking portions 101 are arranged so as to span the second pattern 92. The rectangular portion 99 is arranged on the second pattern 92 and the third pattern 93.

The computer replaces the first pattern 91, the second pattern 92, and the third pattern 93 in which the line-cutting part 98, the bridge part 100, the bridge part 102, and the bridge part 103 are arranged with predetermined patterns. Here, the replacement is replacement in which the computer visually replaces each part with the first and second patterns.

As shown in FIG. 22, the computer replaces the first pattern 91 in which the line-cutting part 98 is arranged with two patterns separated from each other in the Y direction and no bridge part is arranged in between (the region 105)

On the other hand, the computer replaces the third pattern 93 in which the bridge part 100 is arranged with a pattern connecting the two third patterns 93 and at the same time, replaces the one second pattern 92 intersecting the bridge part 100 with two patterns sandwiching the bridge part 100 and not contacting the bridge part 100 (the region 106).

Further, the computer replaces the two third patterns 93 in which the bridge part 102 is arranged with a pattern connecting the two third patterns separated on the side in the +Y direction and extending in the X direction and a pattern connecting the two third patterns separated on the side in the −Y direction and extending in the X direction, both patterns being separated from each other in the Y direction and at the same time, replaces the one first pattern 91 intersecting the bridge part 102 with two patterns sandwiching the bridge part 102 and not contacting the bridge part 102 (the region 107).

Furthermore, the computer replaces the first pattern 91 in which the bridge part 103 is arranged with one pattern extending in the X direction and connecting the two first patterns 91. The computer replaces the two third patterns 93 intersecting the bridge part 103 with two patterns sandwiching the bridge part 103 and not contacting the bridge part 103, respectively. The computer replaces the one second pattern 91 intersecting the bridge part 103 with two patterns sandwiching the bridge part 103 and not contacting the bridge part 103 (the region 108).

The computer converts the layout pattern in FIG. 22 into actual mask data. This conversion is performed automatically by a computer in which a conversion tool is installed. For example, when a computer converts the third pattern 93 so as to correspond to a mandrel, the computer converts the layout pattern into mask data by which the portion where the third pattern 93 is arranged forms a mandrel and converts so that the first pattern 91 and the second pattern 92 are deleted.

Figure 32A:
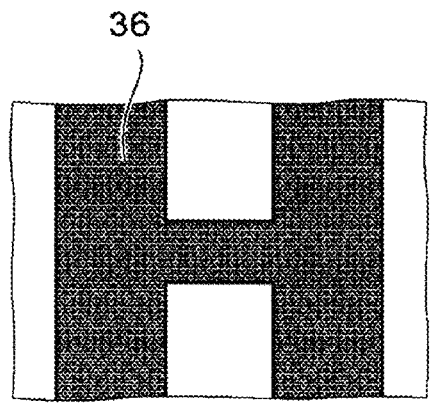
FIGS. 32A to 32C are process plan views illustrating the method for manufacturing patterns by the sidewall method according to the third embodiment.
Figure 38A:
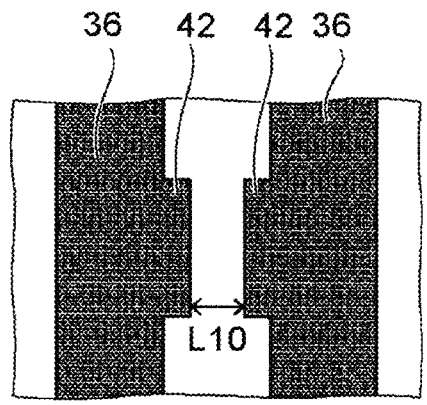
FIGS. 38A to 38C are process plan views illustrating the method for manufacturing patterns by the sidewall method according to the third embodiment.

Hereinafter, explanation is given with an example of a layout pattern in which a mandrel is formed on the portion of the third pattern 93. A computer converts the portion (the region 105) where the line-cutting part 98 is arranged in the first pattern 91 into mask data in which a mandrel pattern shown in FIG. 38A is formed. Similarly, the computer converts the portion (the region 106) where the bridge part 100 is arranged in the third pattern 93 into mask data in which a mandrel pattern shown in FIG. 32A is formed.

Figure 24A:
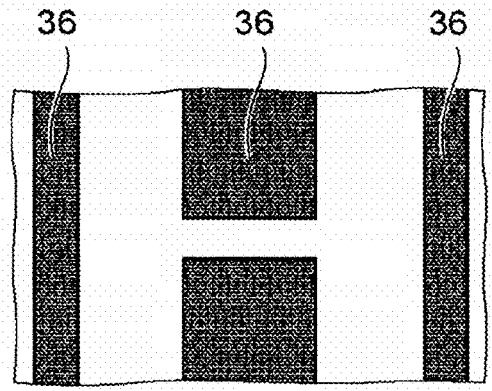
FIGS. 24A to 24C are process plan views illustrating the method for manufacturing patterns by the sidewall method according to the third embodiment.
Figure 28A:
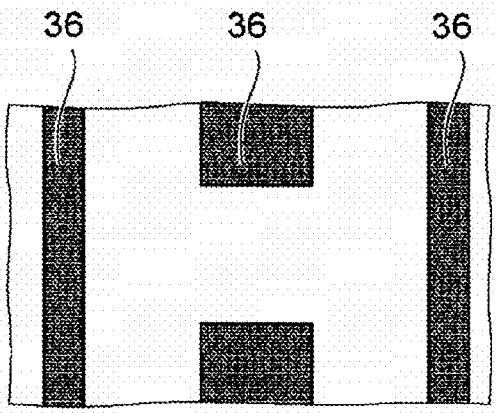
FIGS. 28A to 28C are process plan views illustrating the method for manufacturing patterns by the sidewall method according to the third embodiment.

The computer replaces the portion (the region 107) where the bridge part 102 is arranged in the third pattern 93 with mask data in which a mandrel pattern shown in FIG. 24A is formed. The computer replaces the portion (the region 108) where the bridge part 103 is arranged in the first pattern 91 with mask data in which a mandrel pattern shown in FIG. 28A is formed.

As a result of such replacement, the first patterns 91 and the large cross-linking portion 104 of the bridge part 103 connecting the first patterns 91, the second pattern 92, and the third patterns 93 and the bridge parts 100, 102 connecting the third patterns 93 are turned into patterns separated from one another.

In this manner, it is possible to design a wiring layout formed by the sidewall method.

Next, the effect of the method for designing a wiring layout according to the embodiment is explained.

According to the method for designing a wiring layout according to the embodiment, it is possible to design a wiring layout including an H-shaped connection pattern connecting two patterns extending in one direction by the bridge parts 100, 102, and 103.

Further, it is possible to design a wiring layout including a pattern that forms patterns separated from each other in one direction.

Furthermore, the first patterns 91 and the large cross-linking portion 104 of the bridge part 103 connecting the first patterns 91, the second pattern 92 and the large cross-linking portion 104 of the bridge part 103 connecting the second patterns 92, and the third pattern 93 and the cross-linking portions 101 of the bridge part 100, the bridge part 102, and the bridge part 103 connecting the third patterns 93 are turned into patterns separated from one another, and therefore, it is possible to turn one of the first patterns 91 and the large cross-linking portion 104 of the bridge part 103 connecting the first patterns 91, and the second patterns 92 and the large cross-linking portion 104 of the bridge part 103 connecting the second patterns 92 into a mandrel pattern of a wiring layout formed by the two-time sidewall method in which the sidewall is formed twice. Consequently, it is made possible to design a wiring layout including the H-shaped pattern and separated pattern in a wiring layout formed by the sidewall method easily. And therefore, it is possible to aim at a high degree of integration of a wiring layout.

Next, a program for supporting a design of a wiring layout formed by the sidewall method is explained.

The program according to the embodiment causes a computer to execute procedures shown below.

The program causes the computer to execute a procedure to display the base pattern 90 on a display unit, for example, a display. As shown in FIG. 19, on the base pattern 90, a plurality of the first patterns 91 extending in the Y direction and arranged at the first space in the X direction, a plurality of the second patterns 92 extending in the Y direction and arranged respectively at the center between the first patterns 91, and a plurality of the third patterns 93 extending in the Y direction and arranged respectively at the center between the first pattern 91 and the second pattern 2 neighboring each other are provided.

It is preferable for the computer to, on the display unit, classify the first pattern 91, the second pattern 92, and the third pattern 93 by different colors or hatch differently so that it is easy for a designer to make a layout.

Further, the program causes the computer to execute a procedure to display the line-cutting part 98, the bridge part 100, the bridge part 102, and the bridge part 103.

The designer, via an input unit, for example a pointing device such as a mouse, arranges the bridge part 100 in a predetermined position between the two neighboring third patterns 93 sandwiching the one first pattern 91 or the one second pattern 92 in the base pattern 90 displayed on the display unit. After that, the computer executes a procedure to connect the two third patterns 93 and at the same time, to replace the one first pattern 91 or the one second pattern 92 with two patterns sandwiching the bridge part 100 and not contacting the bridge part 100.

The designer, via the input unit, arranges the bridge part 102 in a predetermined position between the two neighboring third patterns 93 sandwiching the one first pattern 91 or the one second pattern 92 in the base pattern 90 displayed on the display unit. After that, the computer executes a procedure to replace the two third patterns 93 with a pattern connecting the two third patterns separated on the side in the +Y direction and extending in the X direction and a pattern connecting the two third patterns separated on the side in the −Y direction and extending in the X direction, both patterns being separated from each other in the Y direction and at the same time, to replace the one first pattern 91 or the second pattern 92 intersecting the bridge part 102 with two patterns sandwiching the bridge part 102 and not contacting the bridge part 102.

The designer, via the input unit, arranges the bridge part 103 in a predetermined position between the two neighboring second patterns 92 sandwiching the one first pattern 91 and the two third patterns 93 in the base pattern 90 displayed on the display unit. After that, the computer executes a procedure to replace the two third patterns 93 connecting the two second patterns 92 and intersecting the bridge part 103, respectively, with two patterns sandwiching the bridge part 103 but not coming into the bridge part 103 and at the same time, to replace the one first pattern 91 with two patterns sandwiching the bridge part 103 and not contacting the bridge part 103.

The designer, via the input unit, arranges the bridge part 103 in a predetermined position between the two neighboring first patterns 91 sandwiching the one second pattern 92 and the two third patterns 93 in the base pattern 90 displayed on the display unit. After that, the computer executes a procedure to replace the two third patterns 93 connecting the two first patterns 91 and intersecting the bridge part 103, respectively, with two patterns sandwiching the bridge part 103 and not contacting the bridge part 103 and at the same time, to replace the one second pattern 92 with two patterns sandwiching the bridge part 103 and not contacting the bridge part 103.

The designer, via the input unit, arranges the line-cutting part 98 in a predetermined position on the first pattern 91 in the base pattern 90 displayed on the display unit. After that, the computer executes a procedure to replace the first pattern 91 with two patterns separated from each other in the Y direction and between which the bridge part 100, the bridge part 102, or the bridge part 103 is not arranged.

The designer, via the input unit, arranges the line-cutting part 98 in a predetermined position on the second pattern 92 in the base pattern 90 displayed on the display unit. After that, the computer executes a procedure to replace the second pattern 92 with two patterns separated from each other in the Y direction and between which the bridge part 100, the bridge part 102, or the bridge part 103 is not arranged.

In this manner, it is possible for the program for supporting a design of a wiring layout formed by the two-time sidewall method in which the sidewall is formed twice to cause the computer to support the design of the wiring layout as shown in FIG. 22.

It may also be possible for the program to cause the computer to execute a procedure to replace the patterns at a time when the designer clicks the conversion button displayed on the display unit after arranging a plurality of parts (FIG. 49). As a result of that, it is possible for the designer to arrange other parts in a state where each part is displayed, and therefore, making a layout is made easy.

Next, the effect of the program according to the embodiment is explained.

According to the program according to the embodiment, it is possible to cause a computer to support a design of a wiring layout, and therefore, it is possible to reduce the time which the designer designs a wiring layout that can be formed by the sidewall method.

In particular, it is almost impossible to create a design by considering the first-time sidewall from the mandrel in the two-time sidewall method and further considering the second-time sidewall from the first-time sidewall. On the other hand, according to the program according to the embodiment, it is possible to design wiring mainly based on the final layout. As a result of that, the design efficiency is improved considerably.

Next, a method for manufacturing patterns by the two-time sidewall method is explained.

FIGS. 23A to 23D are process plan views illustrating a method for manufacturing patterns by the sidewall method according to the third embodiment and FIGS. 23E to 23H are process section views along B-B' surface shown in FIGS. 23A to 23D, respectively.

FIGS. 24 to 39 are process plan views illustrating the method for manufacturing patterns by the sidewall method according to the third embodiment.

Figure 23A:
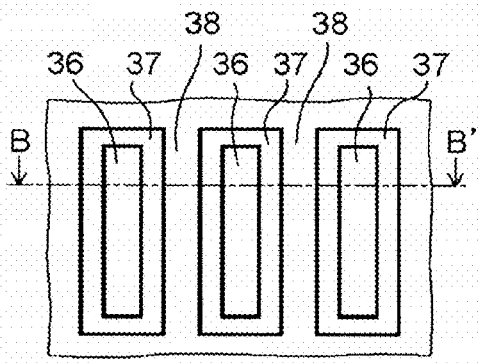
FIGS. 23A to 23D are process plan views illustrating a method for manufacturing patterns by the sidewall method according to the third embodiment and FIGS. 23E to 23H are process section views along B-B' surface shown in FIGS. 23A to 23D, respectively.
Figure 23B:
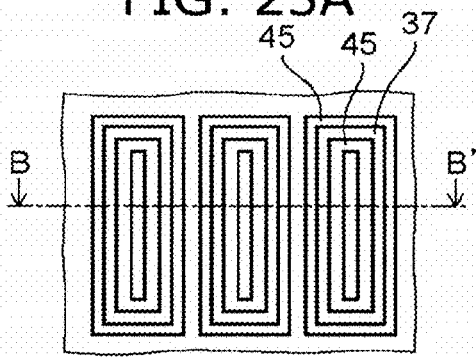
Figure 23C:
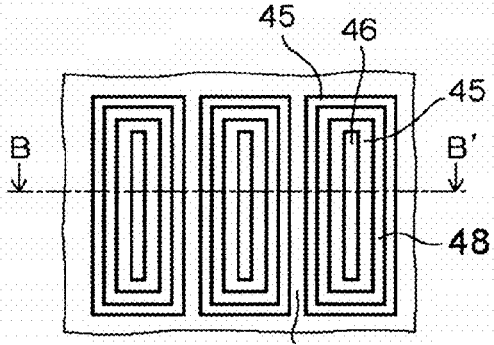
Figure 23D:
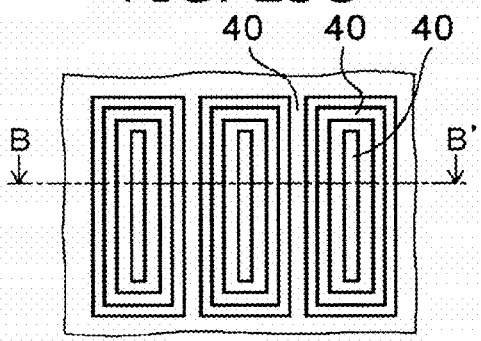
Figure 23E:
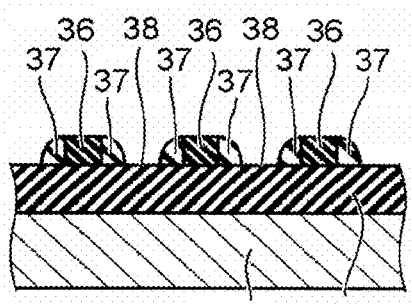

As shown in FIGS. 23A and 23E, the insulating film 32 is formed on the semiconductor substrate 31. After that, on the insulating film 32, a film of a material that forms the mandrel 36 is formed. Further, on the film of the material that forms the mandrel 36, a resist film (not shown schematically) is formed. Next, the resist film is patterned by the lithography method. Patterning is performed by irradiating a mask (not shown schematically) placed on the resist film with exposure light. At this time, the width of a pattern formed on the resist film is the minimum processing dimension value of lithography in many cases.

The film of the material that forms the mandrel 36 is etched using the patterned resist film as a mask. In this manner, the mandrel 36 is formed. The mandrel 36 is thinned by slimming according to the necessity. Here, the width of the final mandrel 36 is substantially the same as three times the length a in the wiring layout.

The sidewall 37 is formed on the side face of the mandrel 36. The sidewall 37 is formed by, for example, removing the flat portion of the film of the material that forms the sidewall 37 by performing anisotropic etching and leaving the portion on the side face of the mandrel 36 after forming the film of the material that forms the sidewall 37 on the semiconductor substrate 31 so as to cover the mandrel 36. As a result of that, the sidewall 37 is formed into the shape of a closed loop surrounding the mandrel 36 when viewed in the top view. The thickness of the film of material that forms the sidewall 37 is reduced smaller than ¼ of the space between the neighboring mandrels 36. Due to this, a gap is formed between the sidewall 37 of the mandrel 36 and the sidewall 37 of the neighboring mandrel 36. Hereinafter, this gap is referred to as the "inter-mandrel gap 38". As a result of that, the length of the inter-mandrel gap 38 is substantially the same as three times the length a in the wiring layout.

Figure 23F:
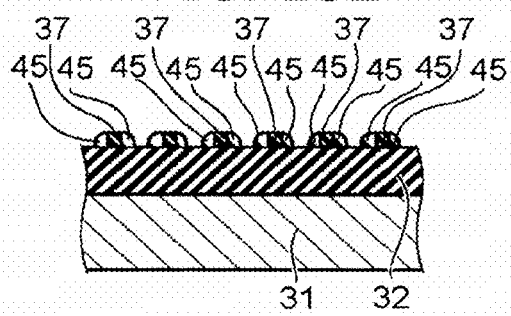

As shown in FIGS. 23B and 23F, the mandrel 36 is removed. Then, the sidewall 37 is slimmed according to the necessity. Here, the width of the final sidewall 37 is substantially the same as the length a in the wiring layout. After that, a second-time sidewall 45 is formed on the side face of the sidewall 37. As a result of that, the sidewall 45 is formed into the shape of two closed loops surrounding both sides of the sidewall 37. The sidewall 45 is formed by, for example, removing the flat portion of the film of material that forms the sidewall 45 by performing anisotropic etching and leaving the portion on the side face of the sidewall 45 after forming the film of material that forms the sidewall 45 on the semiconductor substrate 31 so as to cover the sidewall 37.

Figure 23G:
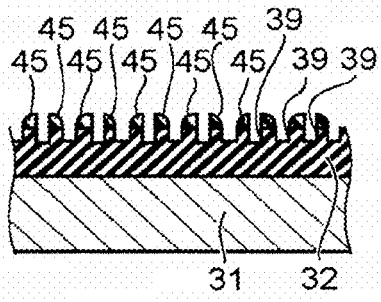

As shown in FIGS. 23C and 23G, the sidewall 37 is removed. Hereinafter, a gap between the sidewalls 45 in the region where the mandrel 36 exists is referred to as a "mandrel region 46". Hereinafter, a region between the sidewalls 45 in the inter-mandrel gap 38 is referred to as an "inter-mandrel region 47". Hereinafter, a region between the sidewalls 45 in the region where the sidewall 37 exists is referred to as a "sidewall-to-sidewall region 48". Here, the width of the sidewall-to-sidewall region 48 is substantially the same as the length a in the wiring layout. After that, by performing etching on the insulating film 32 using the sidewall 45 as a mask, the concave portion 39 is formed by selectively removing the insulating film 32. The loop cut process is performed according to the necessity.

Figure 23H:
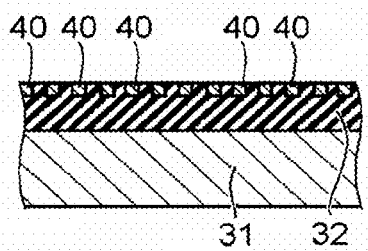

As shown in FIGS. 23D and 23H, the sidewall 45 is removed. After that, an electrically conductive material is deposited on the insulating film 32 so as to fill in the concave portion 39. Then, the electrically conductive material is flattened until the top face of the insulating film 32 is exposed and the concave portion 39 is filled in with the electrically conductive material. In this manner, the pattern 4 filled in the concave portion 39 is formed.

The length of the space between the patterns 40 neighboring in the direction perpendicular to the direction in which the pattern 40 made of the electrically conductive material filled in the concave portion 39 is smaller than the length of the minimum space of a pattern that can be separated by the lithography method used when patterning the resist film 34.

The pattern 40 in the sidewall-to-sidewall region 48 is formed between the pattern 40 in the mandrel region 46 and the pattern 40 in the inter-mandrel region 47.

Next, a method for forming the pattern 40 corresponding to the bridge part 100, the bridge part 102, and the bridge part 103 is explained. In this method, the pattern 40 in the mandrel region 46 is cut and the patterns 40 in the inter-mandrel region 47 and the sidewall-to-sidewall region 48 are connected.

A method for forming the pattern 40 corresponding to the bridge part 100 is explained.

As shown in FIG. 24A, as a pattern of the mandrel 36, between two patterns extending in the Y direction, two patterns of the mandrel 36 separated on the way are formed.

The two patterns of the mandrel 36 separated on the way are formed by the lithography method using a mask in the same shape as the shape of the mandrel 36.

Figure 24B:
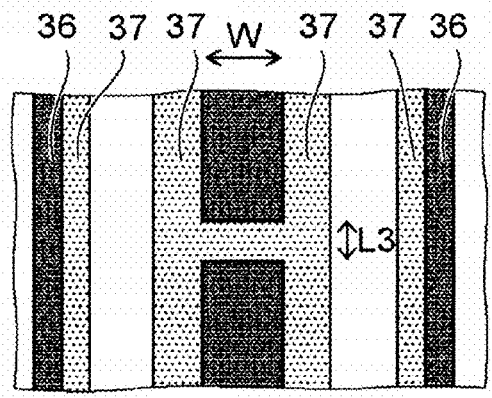

As shown in FIG. 24B, the width of the mandrel 36 is slimmed to W. Then, in the patterns of the mandrel 36 separated on the way, a space L3 in the Y direction is set to a space that is filled in with the sidewall 37, that is, to a length not more than twice the thickness of the film made of the material of the sidewall 37. Then, the sidewall 37 is formed on the side face of the mandrel 36. Due to this, the gap of the separated mandrels 36 is filled in with the sidewall 37. Further, the sidewall 37 formed in the gap between the separated mandrels 36 connects with the sidewalls 37 on both sides of the separated mandrels 36 and forms an H-shape.

Figure 24C:
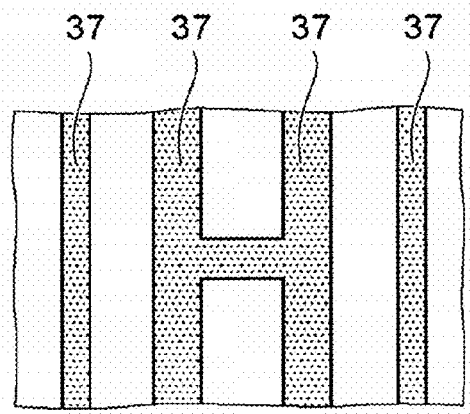
Figure 24D:
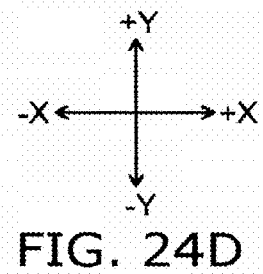
FIG. 24D shows an XY rectangular coordinate system adopted in FIGS. 24A to 24C.

As shown in FIG. 24C, the mandrel 36 is removed. At the portions where the separated mandrels 36 are removed, patterns of the separated patterns 40 are formed.

Figure 25A:
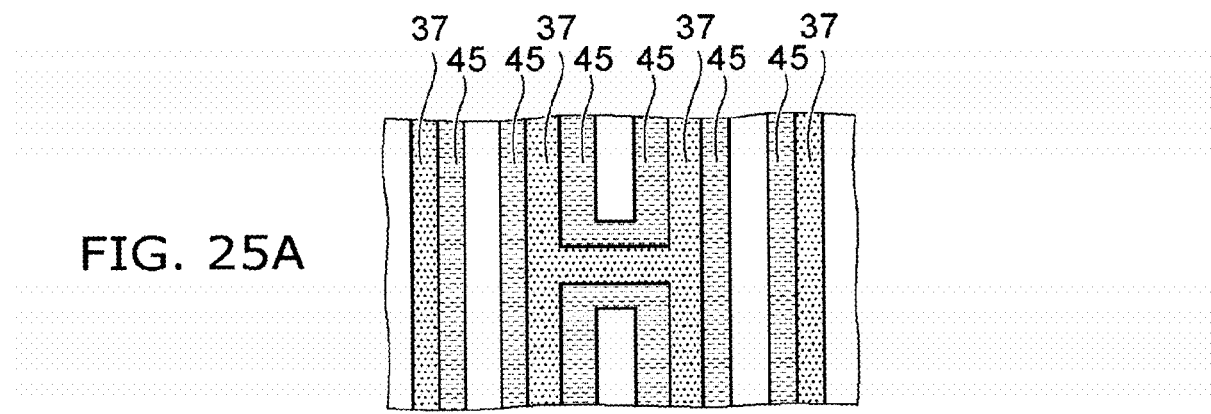
FIGS. 25A to 25C are process plan views illustrating the method for manufacturing patterns by the sidewall method according to the third embodiment.

As shown in FIG. 25A, the sidewall 37 is slimmed. After that, on the side face of the sidewall 37, the sidewall 45 is formed.

Figure 25B:
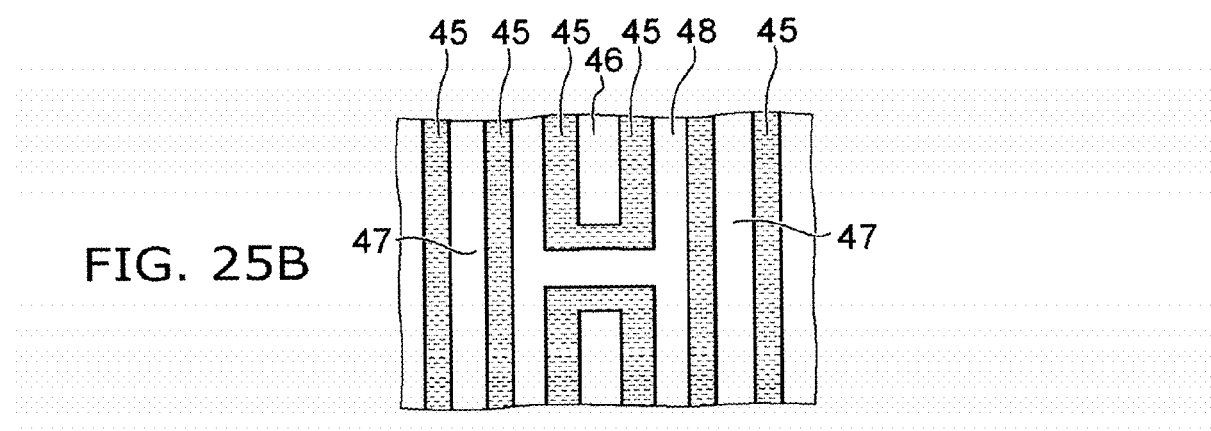

As shown in FIG. 25B, the sidewall 37 is removed.

Figure 25C:
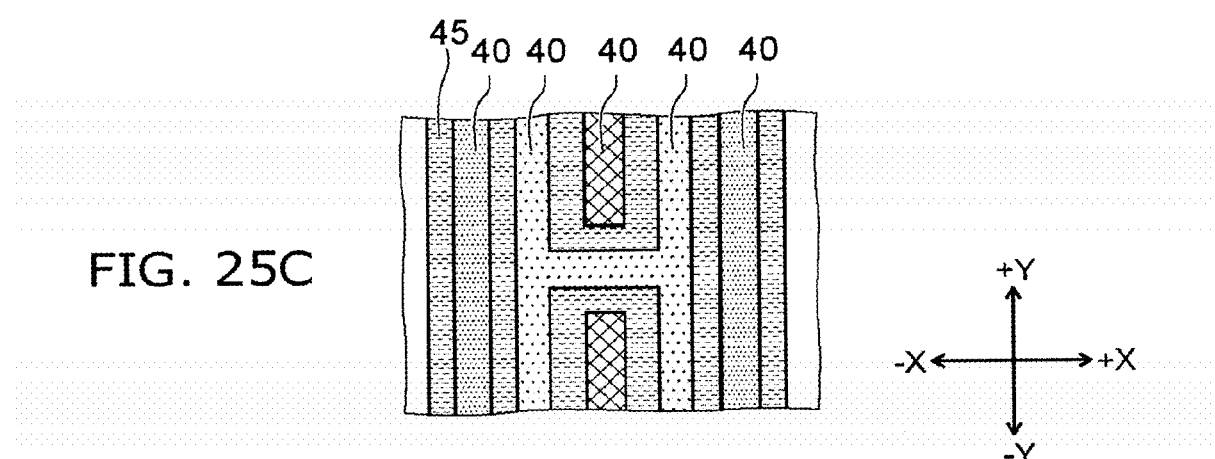
Figure 25D:
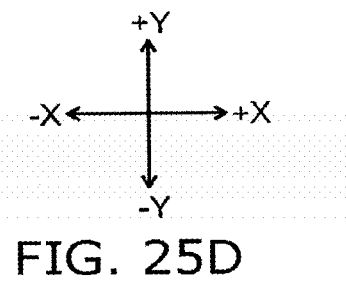
FIG. 25D shows an XY rectangular coordinate system adopted in FIGS. 25A to 25C.

By performing the processes shown in FIGS. 23C and 23G, and 23D and 23H, in the sidewall-to-sidewall region 48, a pattern of the H-shaped pattern 40 is formed as shown in FIG. 25C. In the mandrel regions 46, patterns of the separated patterns 40 are formed. In the inter-mandrel region 47, a pattern of the pattern 40 extending in the Y direction is formed.

Next, a method for forming the pattern 40 corresponding to the bridge part 102 is explained. A case is explained where the pattern 40 in the mandrel region 46 is cut and the two patterns in the sidewall-to-sidewall region 48 are connected.

Figure 26A:
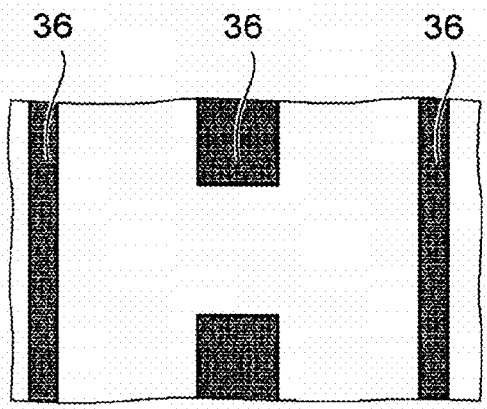
FIGS. 26A to 26C are process plan views illustrating the method for manufacturing patterns by the sidewall method according to the third embodiment.

As shown in FIG. 26A, as a pattern of the mandrel 36, between two patterns extending in the Y direction, two patterns of the mandrels 36 separated on the way are formed.

Figure 26B:
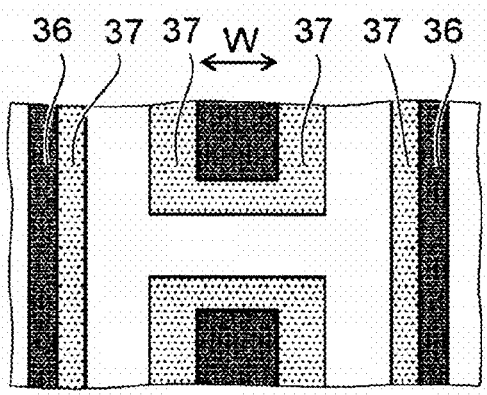

Next, as shown in FIG. 26B, the width of the mandrel 36 is slimmed to W.

The sidewall 37 is formed on the side face of the mandrel 36. The gap between the separated mandrels 36 is not filled in with the sidewall 37.

Figure 26C:
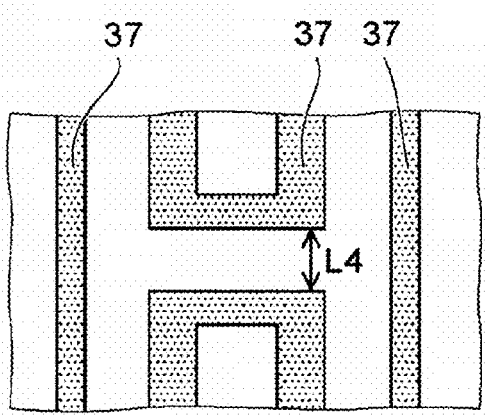
Figure 26D:
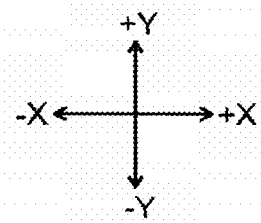
FIG. 26D shows an XY rectangular coordinate system adopted in FIGS. 26A to 26C.

As shown in FIG. 26C, the mandrel 36 is removed.

Figure 27A:
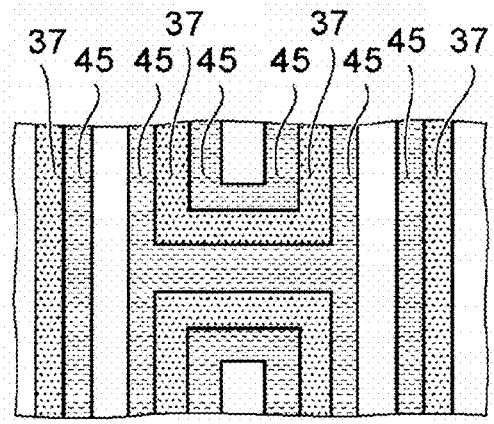
FIGS. 27A to 27C are process plan views illustrating the method for manufacturing patterns by the sidewall method according to the third embodiment.

Then, as shown in FIG. 27A, the sidewall 37 is slimmed. Here, a space L4 between the sidewalls 37 separated in the Y direction is set to a space that is filled in with the sidewall 37 and the sidewall 45, that is, to a length not more than twice the thickness of the film made of the material of the sidewall 37 and not more than twice the thickness of the film made of the material of the sidewall 45. After that, on the side face of the sidewall 37, the sidewall 45 is formed. Due to this, the gap between the separated mandrels 36 is closed by the sidewall 37 and the sidewall 45.

Figure 27B:
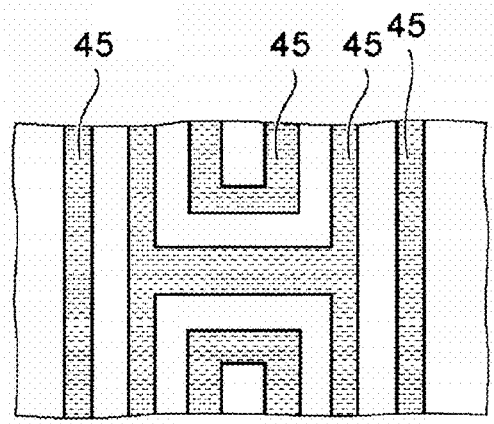

As shown in FIG. 27B, the sidewall 37 is removed.

Figure 27C:
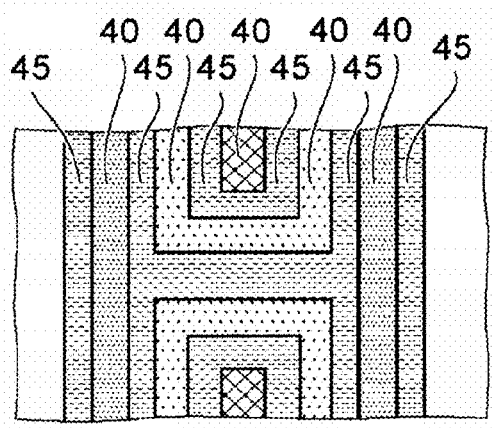
Figure 27D:
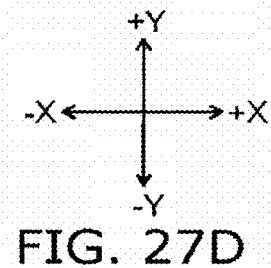
FIG. 27D shows an XY rectangular coordinate system adopted in FIGS. 27A to 27C.

By performing the processes shown in FIGS. 23C and 23G, and 23D and 23H, as shown in FIG. 27C, it is possible to form a pattern of the pattern 40 corresponding to the bridge part 102. In the mandrel region 46, patterns of the separated patterns 40 are formed. In the inter-mandrel region 47, a pattern of the pattern 40 extending in the Y direction is formed.

Next, a method for forming the pattern 40 corresponding to the bridge part 103 is explained. A case is explained where the pattern 40 in the mandrel region 46 is cut and the patterns 40 in the inter-mandrel region 47 is connected and at the same time, the two patterns 40 in the sidewall-to-sidewall region 48 are connected.

As shown in FIG. 28A, as a pattern of the mandrel 36, between two patterns extending in the Y direction, two patterns of the mandrels 36 separated on the way are formed.

Figure 28B:
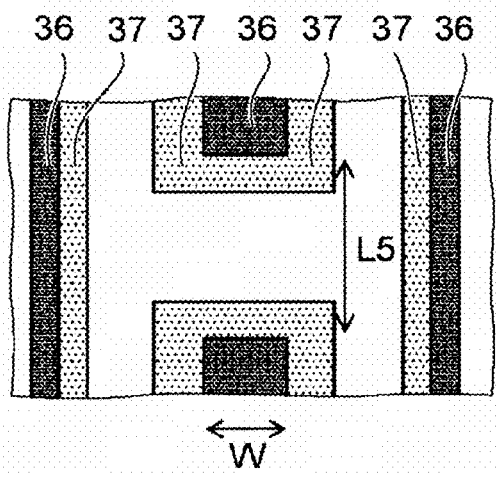

As shown in FIG. 28B, the width of the mandrel 36 is slimmed to W. Further, in the patterns of the mandrels 36 separated on the way, a space L5 in the Y direction is set to a space that is not filled in with the sidewall 37 and the sidewall 45, that is, to a length not less than twice the thickness of the film made of the material of the sidewall 37 and not less than twice the thickness of the film made of the material of the sidewall 45.

The sidewall 37 is formed on the side face of the mandrel 36. The gap between the separated mandrels 36 is not filled in with the sidewall 37.

Figure 28C:
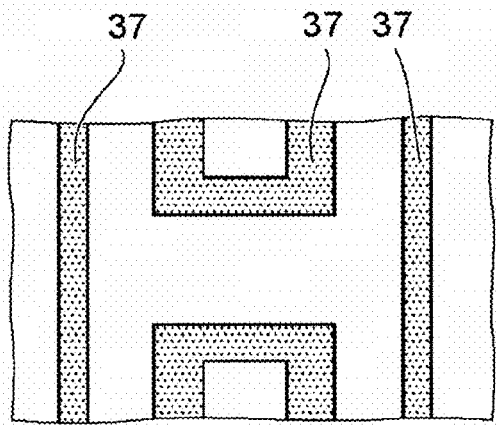
Figure 28D:
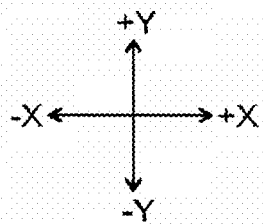
FIG. 28D shows an XY rectangular coordinate system adopted in FIGS. 28A to 28C.

As shown in FIG. 28C, the mandrel 36 is removed. At the portions from which the separated mandrels 36 are removed, patterns of the separated patterns 40 are formed.

Figure 29A:
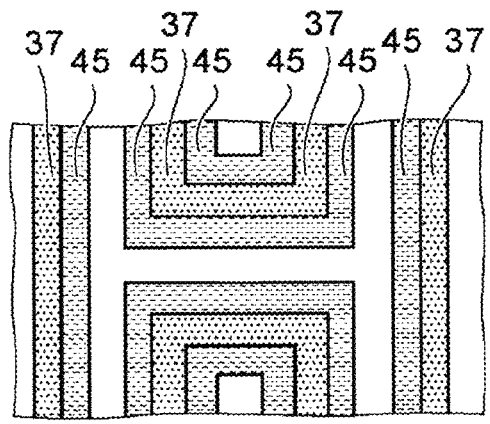
FIGS. 29A to 29C are process plan views illustrating the method for manufacturing patterns by the sidewall method according to the third embodiment.

As shown in FIG. 29A, the sidewall 37 is slimmed. After that, the sidewall 45 is formed on the side face of the sidewall 37. The gap where the separated mandrels 36 are formed is not filled in with the sidewall 37 and the sidewall 45. The gap where the separated mandrels 36 are formed couples with the gap between the sidewalls 45 extending in the Y direction, forming an H-shape.

Figure 29B:
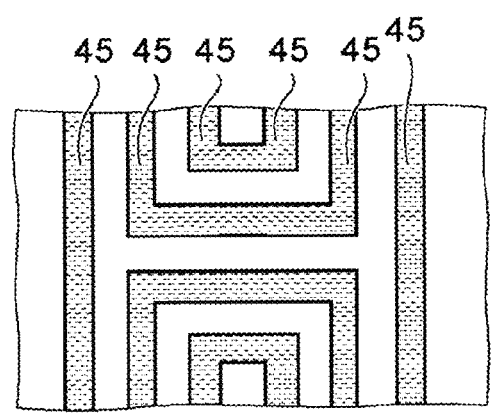
Figure 29C:
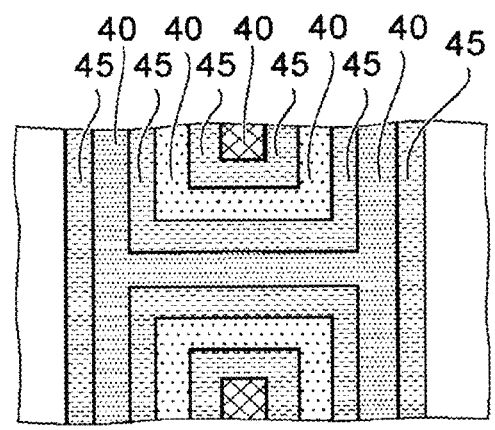
Figure 29D:
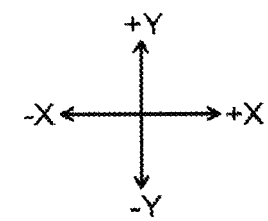
FIG. 29D shows an XY rectangular coordinate system adopted in FIGS. 29A to 29C.

As shown in FIG. 29B, the sidewall 37 is removed.

The processes shown in FIGS. 23C and 23G, and 23D and 23H are performed. Due to this, it is possible to form the pattern 40 corresponding to the bridge part 103. In the mandrel region 46, patterns of the separated patterns 40 are formed. In the inter-mandrel region 47, a pattern of the H-shaped pattern 40 is formed.

Next, another method for forming the pattern 40 corresponding to the bridge part 100, the bridge part 102, and the bridge part 103 is explained. This method is opposite to the method described previously in which the pattern 40 in the mandrel region 46 is cut and in this method, the pattern 40 in the inter-mandrel region 47 is cut.

First, a method for forming the pattern 40 corresponding to the bridge part 100 is explained.

Figure 30A:
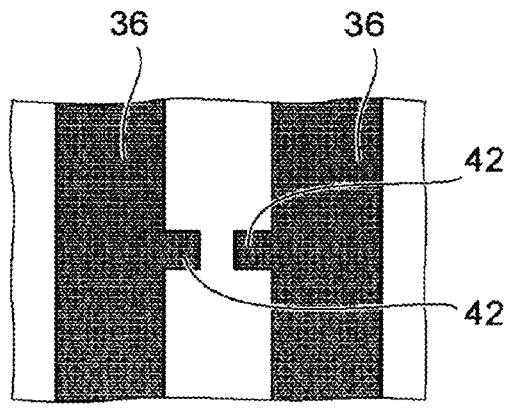
FIGS. 30A to 30C are process plan views illustrating the method for manufacturing patterns by the sidewall method according to the third embodiment.

As shown in FIG. 30A, as a pattern of the mandrel 36, the mandrel 36 extending in the Y direction is formed. When the pattern of the inter-mandrel region 47 is formed as two separated patterns, in the patterns of the mandrels 36 sandwiching the region between the two separated patterns, the convex portion 42 protruding toward the region between the two patterns is formed.

Figure 30B:
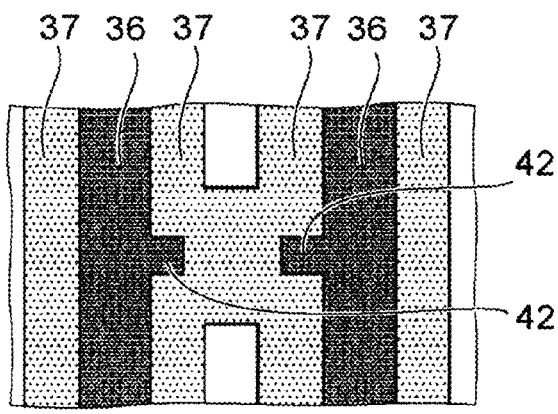

As shown in FIG. 30B, a space L6 between the convex portions 42 in the mandrels 36 is set to a space that is filled in with the first-time sidewall 37, that is, to a space not more than twice the thickness of the sidewall 37 on the side face of the mandrel 36. After that, the sidewall 37 is formed on the side face of the mandrel 36. Due to this, the sidewalls formed on the side faces of the convex portions 42 are united at that portion and the inter-mandrel gap 38 at that portion is separated. The sidewall 37 having separated the inter-mandrel gap 38 and extending in the X direction and the sidewall 37 formed on the side face of the mandrel 36 are coupled to form an H-shape.

Figure 30C:
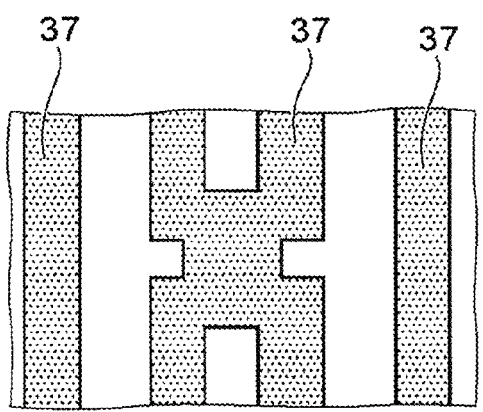
Figure 30D:
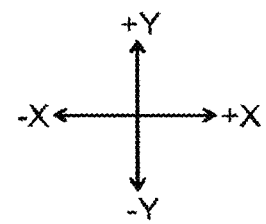
FIG. 30D shows an XY rectangular coordinate system adopted in FIGS. 30A to 30C.

As shown in FIG. 30C, the mandrel 36 is removed.

Figure 31A:
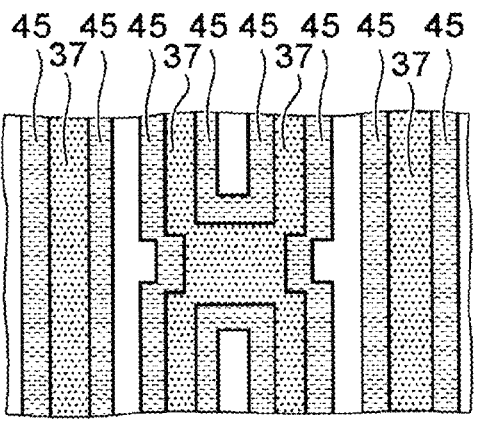
FIGS. 31A to 31C are process plan views illustrating the method for manufacturing patterns by the sidewall method according to the third embodiment.

As shown in FIG. 31A, the sidewall 37 is slimmed and the sidewall 45 is formed on the side face of the sidewall 37.

Figure 31B:
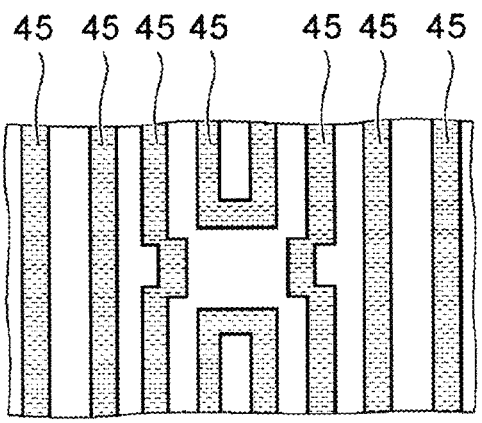

As shown in FIG. 31B, the sidewall 37 is removed. At the portion from which the sidewall 37 is removed, an H-shaped pattern is formed.

Figure 31C:
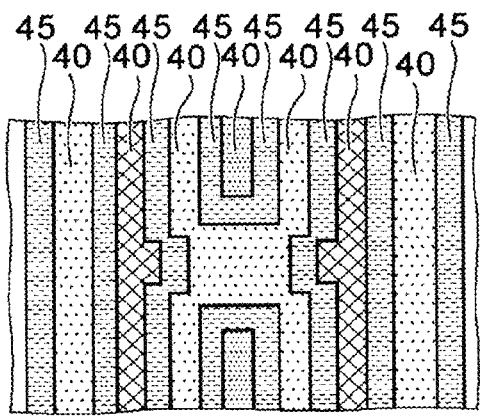
Figure 31D:
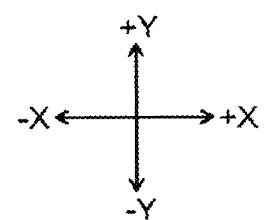
FIG. 31D shows an XY rectangular coordinate system adopted in FIGS. 31A to 31C.

By performing the processes shown in FIGS. 23C and 23G, and 23D and 23H, as shown in FIG. 31C, it is possible to form a pattern of the H-shaped pattern 40 in the sidewall-to-sidewall region 48. In the mandrel region 46, a pattern of the pattern 40 extending in the Y direction is formed. In the inter-mandrel region 47, patterns of the patterns 40 separated in the Y direction are formed.

Next, a method for forming the pattern 40 corresponding to the bridge part 102 is explained.

As shown in FIG. 32A, as a pattern of the mandrel 36, an H-shaped pattern is formed.

Figure 32B:
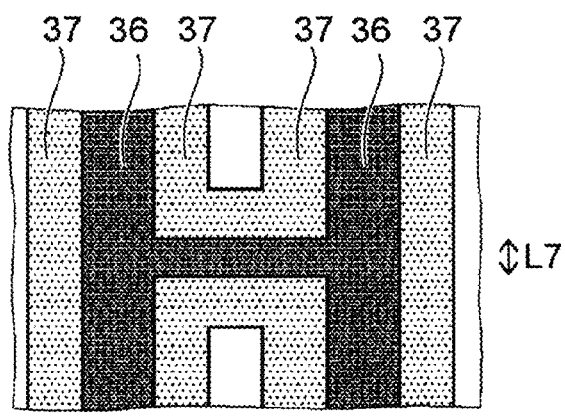

As shown in FIG. 32B, the mandrel 36 is slimmed and a width L7 of a portion extending in the X direction of the H-shaped mandrel 36 is set to a width that is filled in with the second-time sidewall 45, that is, to a length not more than twice the thickness of the film made of the material of the sidewall 45. Then, the sidewall 37 is formed on the side face of the mandrel 36. In the +Y direction and the −Y direction of the mandrel 36 extending in the X direction, patterns of the separated inter-mandrel gaps 38 are formed.

Figure 32C:
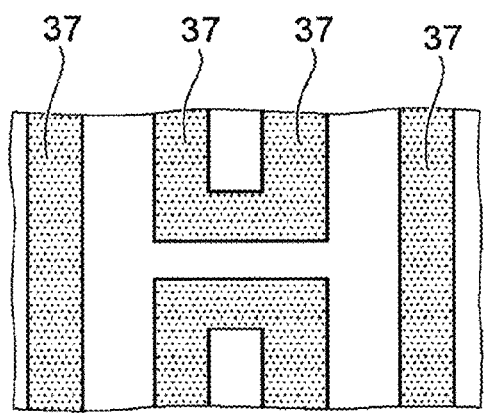
Figure 32D:
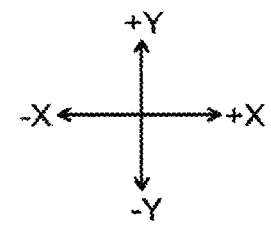
FIG. 32D shows an XY rectangular coordinate system adopted in FIGS. 32A to 32C.

As shown in FIG. 32C, the mandrel 36 is removed. Due to this, at the portion from which the mandrel 36 is removed, an H-shaped pattern is formed.

Figure 33A:
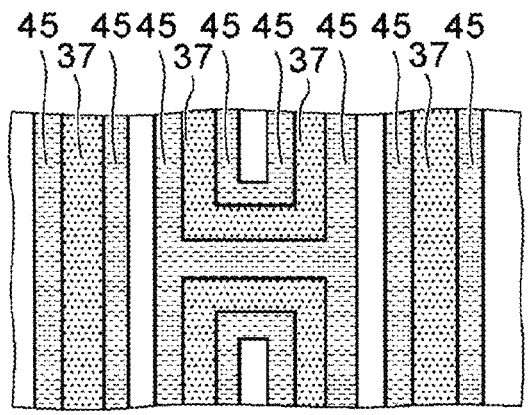
FIGS. 33A to 33C are process plan views illustrating the method for manufacturing patterns by the sidewall method according to the third embodiment.

As shown in FIG. 33A, the sidewall 37 is slimmed. Then, the sidewall 45 is formed on the side face of the sidewall 37. Due to this, the gap between the sidewalls 37 extending in the X direction is closed by the sidewall 37 and the sidewall 45.

Figure 33B:
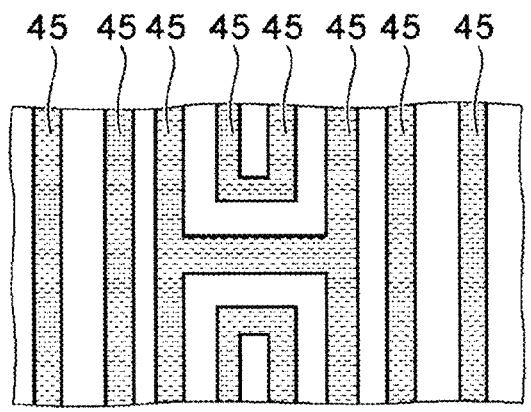

As shown in FIG. 33B, the sidewall 37 is removed.

Figure 33C:
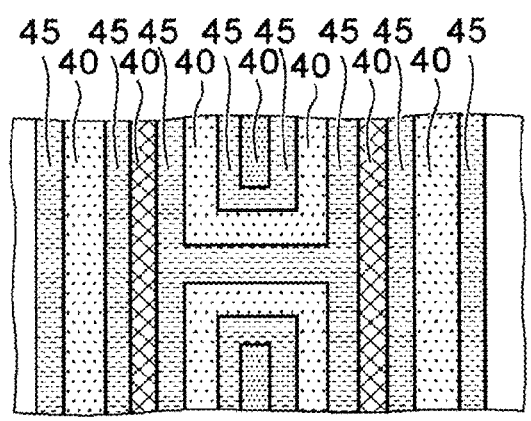
Figure 33D:
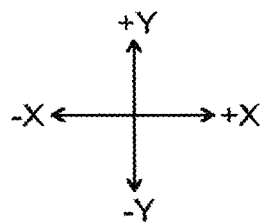
FIG. 33D shows an XY rectangular coordinate system adopted in FIGS. 33A to 33C.

By performing the processes shown in FIGS. 23C and 23G, and 23D and 23H, as shown in FIG. 33C, it is possible to form the pattern 40 corresponding to the bridge part 102. In the mandrel region 46, a pattern of the pattern extending in the Y direction is formed. In the inter-mandrel region 47, patterns of the separated patterns 40 are formed.

Next, a method for forming the pattern 40 corresponding to the bridge part 103 is explained.

Figure 34A:
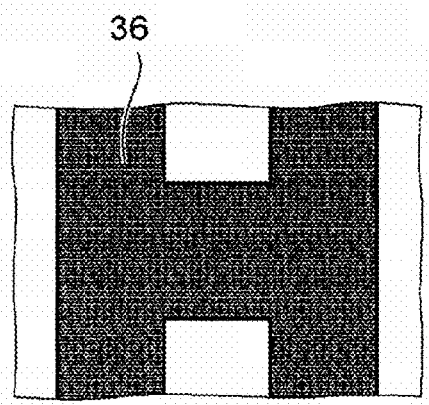
FIGS. 34A to 34C are process plan views illustrating the method for manufacturing patterns by the sidewall method according to the third embodiment.

As shown in FIG. 34A, as a pattern of the mandrel 36, an H-shaped pattern is formed.

Figure 34B:
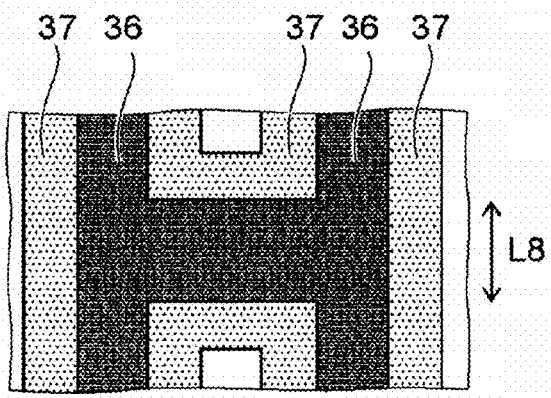

Next, as shown in FIG. 34B, a width L8 of a portion extending in the X direction in the H-shaped mandrel 36 is set to a width that is not filled in with the second-time sidewall 45, that is, to a length not less than twice the thickness of the film made of the material of the sidewall 45. Then, the sidewall 37 is formed on the side face of the mandrel 36. In the +Y direction and the −Y direction of the mandrel 36 extending in the X direction, patterns of the separated inter-mandrel gaps 38 are formed.

Figure 34C:
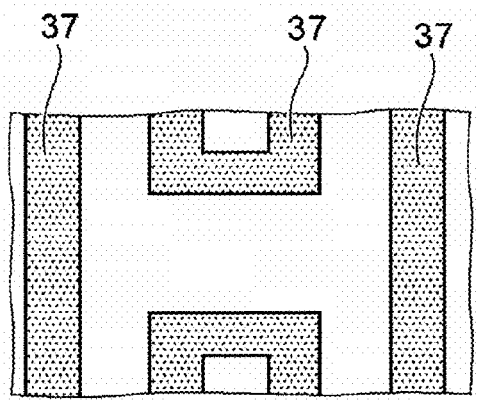
Figure 34D:
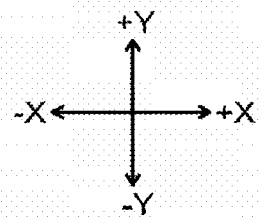
FIG. 34D shows an XY rectangular coordinate system adopted in FIGS. 34A to 34C.

As shown in FIG. 34C, the mandrel 36 is removed. Due to this, at the portion from which the mandrel 36 is removed, an H-shaped pattern is formed.

Figure 35A:
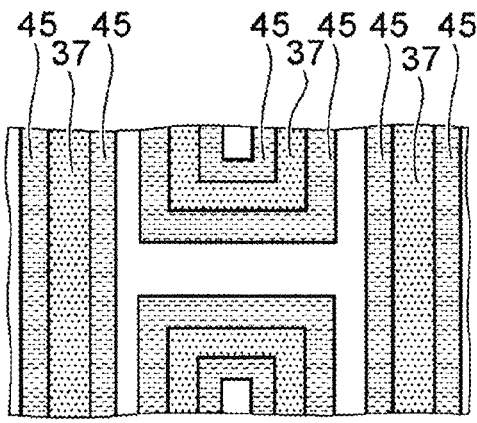
FIGS. 35A to 35C are process plan views illustrating the method for manufacturing patterns by the sidewall method according to the third embodiment.

As shown in FIG. 35A, the sidewall 37 is slimmed. Then, the sidewall 45 is formed on the side face of the sidewall 37. In the separated inter-mandrel gap 38, a region extending in the X direction that is not closed by the sidewall 37 or the sidewall 45 is formed. This region and the gap in the sidewall extending in the Y direction are coupled to foam an H-shaped pattern.

Figure 35B:
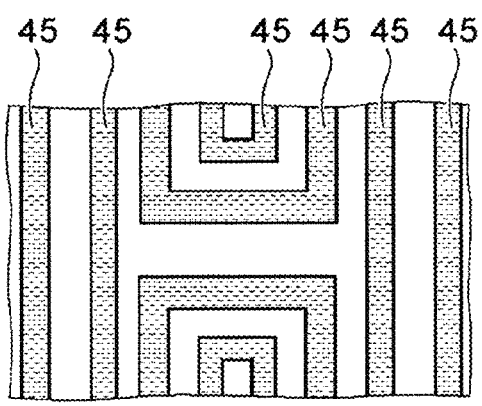

As shown in FIG. 35B, the sidewall 37 is removed.

Figure 35C:
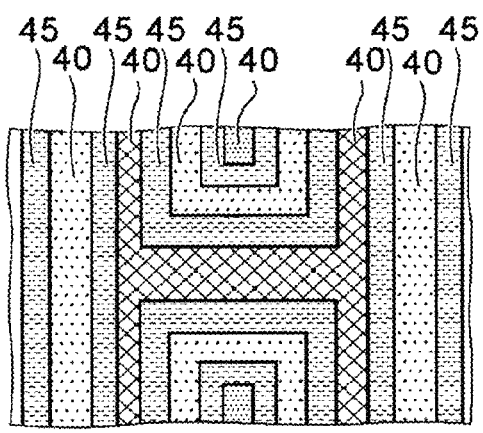
Figure 35D:
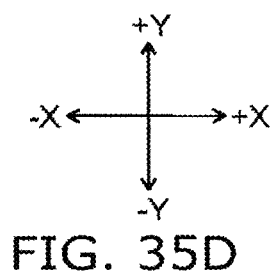
FIG. 35D shows an XY rectangular coordinate system adopted in FIGS. 35A to 35C.

By performing the processes shown in FIGS. 23C and 23G, and 23D and 23H, as shown in FIG. 35C, it is possible to form the pattern 40 corresponding to the bridge part 103. In the mandrel region 46, a pattern of the H-shaped pattern is formed. In the inter-mandrel region 47, patterns of the separated patterns 40 are formed.

Next, a method for forming a pattern corresponding to the line-cutting part 98, that is, a separated pattern is explained.

First, a method for cutting the pattern 40 in the mandrel region 46 is explained.

Figure 36A:
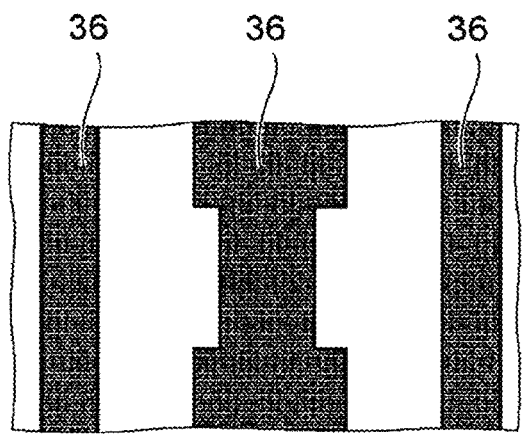
FIGS. 36A to 36C are process plan views illustrating the method for manufacturing patterns by the sidewall method according to the third embodiment.

As shown in FIG. 36A, when the pattern of the mandrel 36 is separated into two patterns, as a pattern of the mandrel 36, the mandrel 36 extending in the Y direction is formed. Then, the portion corresponding to the region of the mandrel 36 to be separated is thinned.

Figure 36B:
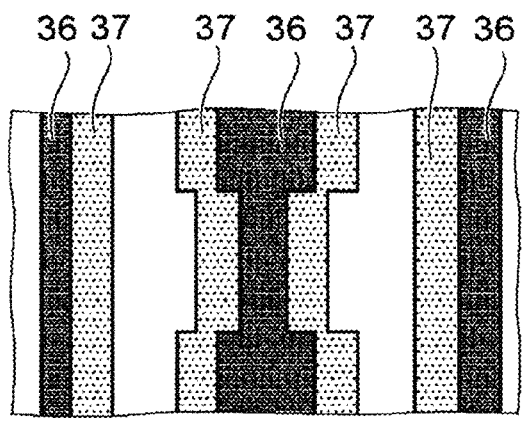

As shown in FIG. 36B, the sidewall 37 is formed on the side face of the mandrel 36. The space between the sidewalls 37 formed on the side faces on both sides of the thinned portion of the mandrel 36 is formed thin.

Figure 36C:
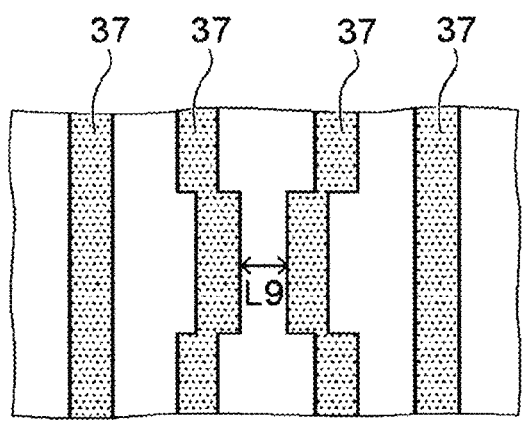
Figure 36D:
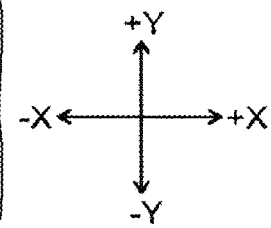
FIG. 36D shows an XY rectangular coordinate system adopted in FIGS. 36A to 36C.

As shown in FIG. 36C, the mandrel 36 is removed.

The sidewall 37 is slimmed. Then, a space L9 between the sidewalls 37 formed on the side faces on both sides of the thinned portion of the mandrel 36 is set to a width that is filled in with the sidewall 45, that is, to a length not more than twice the thickness of the film made of the material of the sidewall 45.

Figure 37A:
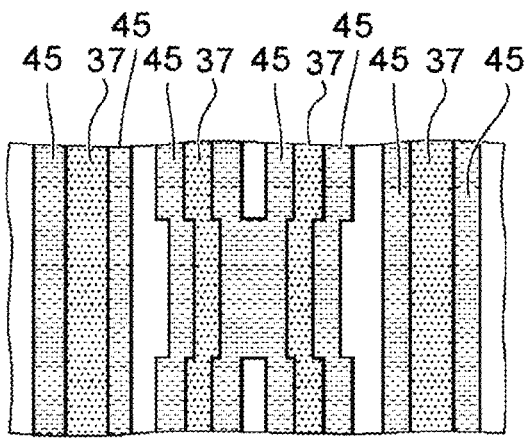
FIGS. 37A to 37C are process plan views illustrating the method for manufacturing patterns by the sidewall method according to the third embodiment.

As shown in FIG. 37A, the sidewall 45 is formed on the side face of the sidewall 37.

Due to this, the gap between the sidewalls 37 at the portions located between the two separated patterns is filled in with the sidewall 45.

Figure 37B:
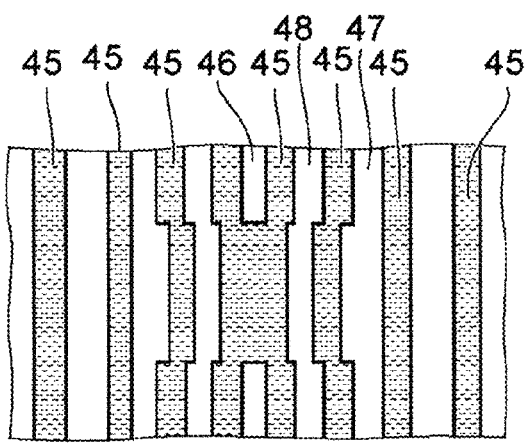

As shown in FIG. 37B, the sidewall 37 is removed.

Figure 37C:
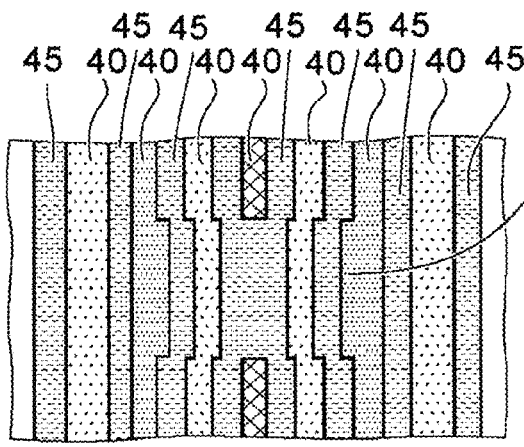
Figure 37D:
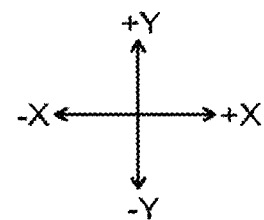
FIG. 37D shows an XY rectangular coordinate system adopted in FIGS. 37A to 37C.

After that, by performing the processes shown in FIGS. 23C and 23G, and 23D and 23H, as shown in FIG. 37C, it is possible to form a pattern of the pattern 40 corresponding to the pattern of the mandrel 36 separated in the Y direction. Further, in the pattern formed in the sidewall-to-sidewall region 48, the convex portion 44 protruding toward the region where the mandrel 36 is thinned is formed.

Next, in the method for forming a pattern corresponding to a separate pattern by the sidewall method, a method for cutting the pattern 40 in the inter-mandrel region 47 is explained.

As shown in FIG. 38A, as a pattern of the mandrel 36, the mandrel 36 extending in the Y direction is formed. When the pattern of the mandrel 36 is formed as two separated patterns, in the patterns of the mandrels 36 sandwiching the region between the two separated patterns, the convex portion 42 protruding toward the region between the two patterns is formed. A space L10 between the convex portions 42 in the mandrels 36 is set to a width that is filled in with the sidewall 37 and the sidewall 45, that is, to a width not more than twice the thickness of the film made of the material of the sidewall 37 and twice the thickness of the film made of the material of the sidewall 45.

Figure 38B:
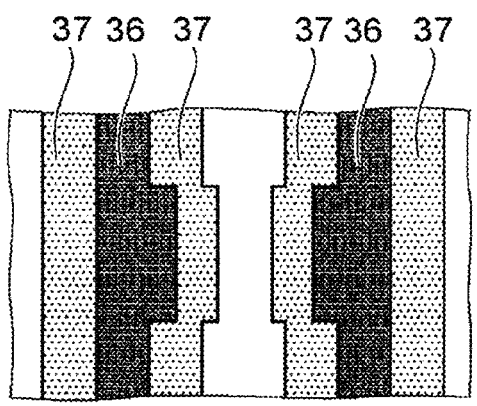

As shown in FIG. 38B, the sidewall 37 is formed on the side face of the mandrel 36.

Figure 38C:
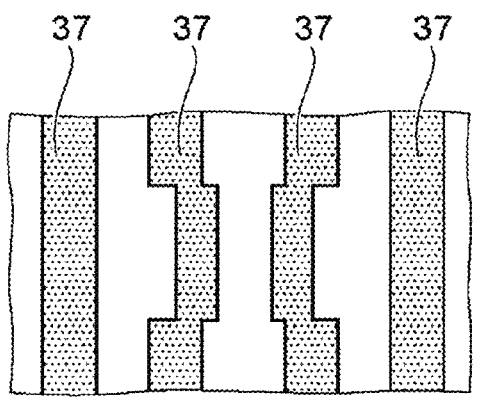
Figure 38D:
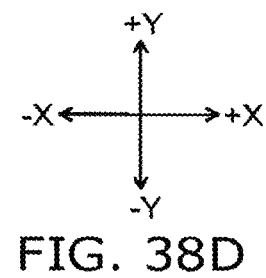
FIG. 38D shows an XY rectangular coordinate system adopted in FIGS. 38A to 38C.

As shown in FIG. 38C, the mandrel 36 is removed.

Figure 39A:
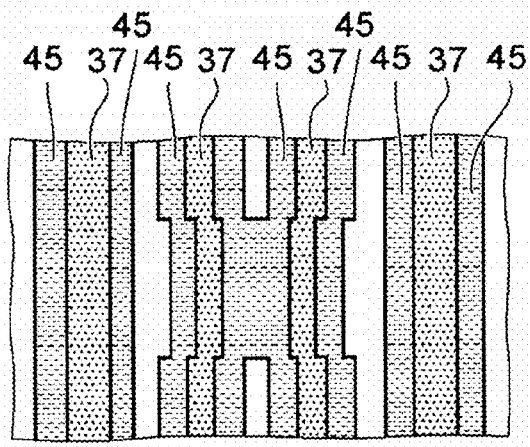
FIGS. 39A to 39C are process plan views illustrating the method for manufacturing patterns by the sidewall method according to the third embodiment.

As shown in FIG. 39A, the sidewall 45 is formed on the side face of the sidewall 37. Due to this, the sidewalls 45 formed on the side faces of the convex portions 42 are united at the portion and the inter-mandrel gap 38 at that portion is separated.

Figure 39B:
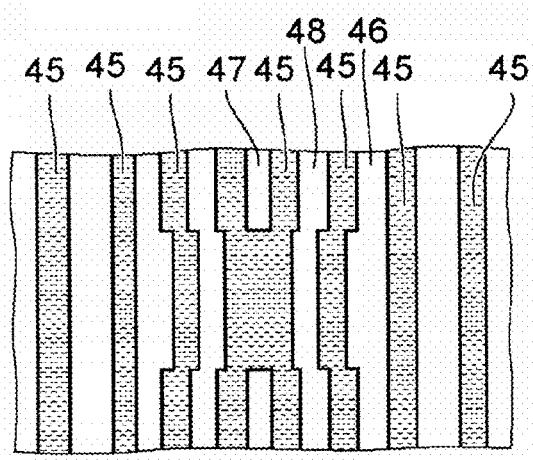

As shown in FIG. 39B, the sidewall 37 is removed.

Figure 39C:
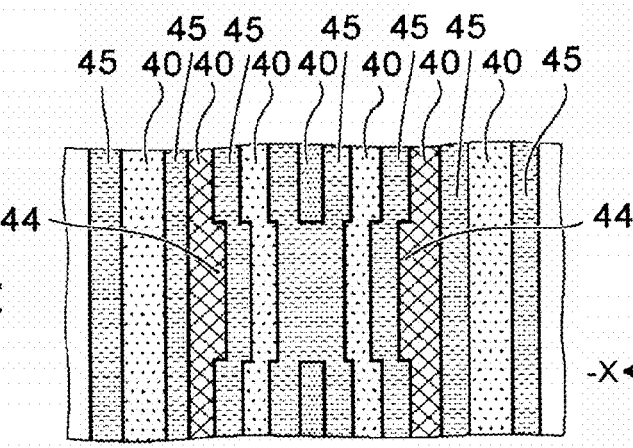
Figure 39D:
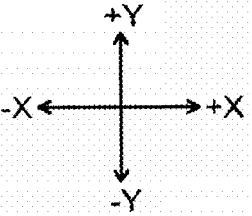
FIG. 39D shows an XY rectangular coordinate system adopted in FIGS. 39A to 39C.

By performing the processes shown in FIGS. 23C and 23G, and 23D and 23H, as shown in FIG. 39C, it is possible to form the pattern of the pattern 40 in the inter-mandrel region 47 separated in the Y direction. Further, in the pattern formed in the sidewall-to-sidewall region 48, the convex portion 44 protruding toward the direction in which the convex portion 42 is formed is formed.

Next, a method for manufacturing a semiconductor device based on a wiring layout including the line-cutting part 98 and the bridge parts 100, 102, and 103 described previously is explained.

As shown in FIG. 22 described previously, in the wiring layout, the mandrel 36 is formed on the insulating film 32 using one of the first patterns 91 and the large cross-linking portion 104 of the bridge part 103 connecting the first patterns 91, and the second patterns 22 and the large cross-linking portion 104 of the bridge part 103 connecting the second patterns 22 as a pattern of the mandrel 36.

For example, the mandrel 36 is formed on the insulating film 32 using the first patterns 11 and the large cross-linking portion 104 of the bridge part 103 connecting the first patterns 91 in FIG. 22 in the embodiment as a pattern of the mandrel 36.

At the portion (the region 105) that is turned into patterns of the separated mandrels 36, as shown in FIG. 36A, the width of the mandrel 36 in the region between the two separated patterns is thinned.

At the portion (the region 106) corresponding to the bridge part 100, as shown in FIG. 30A described previously, in the patterns of the mandrels 36 sandwiching the region between the two separated patterns, the convex portions 42 protruding toward the region between the two patterns are formed.

At the portion (the region 107) corresponding to the bridge part 102, in the pattern of the separated mandrel 36, the space L4 in the Y direction is set to a space that is filled in with the sidewall 37 and the sidewall 45, that is, to a length not more than the thickness of the film made of the material of the sidewall 37 and the thickness of the film made of the material of the sidewall 45.

At the portion (the region 108) corresponding to the bridge part 103, as a pattern of the mandrel 36, an H-shaped pattern is formed. The width L8 of the portion extending in the X direction in the H-shaped mandrel 36 is set to a width that is not filled in with the second-time sidewall 45, that is, to a length not less than twice the thickness of the film made of the material of the sidewall 45.

The processes shown in FIGS. 23B and 23F, FIGS. 23C and 23G, and FIGS. 23D and 23H are performed. At this time, in the region 105, the processes as shown in FIG. 36 and FIG. 37 are performed. In the region 106, the processes as shown in FIG. 30 and FIG. 31 are performed. In the region 107, the processes as shown in FIG. 26 and FIG. 27 are performed. In the region 108, the processes as shown in FIG. 34 and FIG. 35 are performed.

In this manner, as shown in FIG. 40, a semiconductor device 3 including the pattern 40 formed based on the wiring layout shown in FIG. 22 is manufactured.

Next, the effect of the method for manufacturing patterns by the two-time sidewall method according to the embodiment is explained.

According to the method for manufacturing patterns by the two-time sidewall method according to the embodiment, it is possible to manufacture the semiconductor device 3 including the pattern 40 of the H-shape pattern and the separated pattern 40.

Further, by using one of the patterns of the mandrel 36 and the inter-mandrel gap 38, it is possible to form the H-shaped pattern 40 and the separated pattern 40. Consequently, it is made possible to design a wiring layout including a wiring space narrower than the minimum value of the space by the resolution of lithography easily. And therefore, it is possible to manufacture a semiconductor device including highly integrated patterns.

Next, the semiconductor device 3 according to the third embodiment is explained.

FIG. 40 is a plan view illustrating the semiconductor device according to the third embodiment.

As shown in FIG. 23 and FIG. 40, the semiconductor device 3 includes the semiconductor substrate 31 and the pattern 40 provided on the semiconductor substrate 31.

In the semiconductor device 3, a plurality of patterns 75 corresponding to the plurality of the first patterns 91 extending in the Y direction, a plurality of patterns 76 corresponding to the plurality of the second patterns 92 extending in the Y direction, a plurality of patterns 77 corresponding to the plurality of the third patterns 93 extending in the Y direction, a pattern 78 extending in the X direction and corresponding to the large cross-linking portion 104 of the bridge part 103 connecting the first patterns 91, and a plurality of patterns 79 extending in the X direction and corresponding to the bridge part 100 and the bridge part 102 connecting the third patterns 93 are provided.

If a plurality of first lines extending in the Y direction and arranged at a space ½ of the first space in the X direction are supposed in the XY plane and integers from one are assigned to the first lines in order from the end, the patterns 75 are arranged in the odd-numbered first lines and the patterns 76 in the even-numbered first lines. Further, if a plurality of second lines extending in the Y direction and provided one by one between the first lines are supposed, the patterns 77 are arranged in the second lines.

The pattern 78 connects the patterns 75. The pattern 79 connects the patterns 77. Then, the pattern 75 and the pattern 78 are separated from each other and the pattern 76, the pattern 77, and the pattern 79 are separated from one another.

In the region 105, two of the patterns 75 are arranged in the same line, separated from each other in the Y direction, and the pattern 79 is not arranged therebetween.

Then, in the X direction, in the two patterns 76 sandwiching a region 80 between the two patterns 75, the convex portion 44 protruding toward the region 80 is formed.

Next, the effect of the method for manufacturing the semiconductor device 3 according to the embodiment is explained.

According to the method for manufacturing the semiconductor device 3 according to the embodiment, the H-shaped pattern 40 and the separated pattern 40 are included and the wiring space narrower than the minimum value of the space by the resolution of lithography is included, and therefore, it is possible to highly integrate the semiconductor device.

Fourth Embodiment

Next, a fourth embodiment is explained.

First, a method for designing a wiring layout that is formed by the sidewall method according to the fourth embodiment is explained.

Figures 41A, 41B:
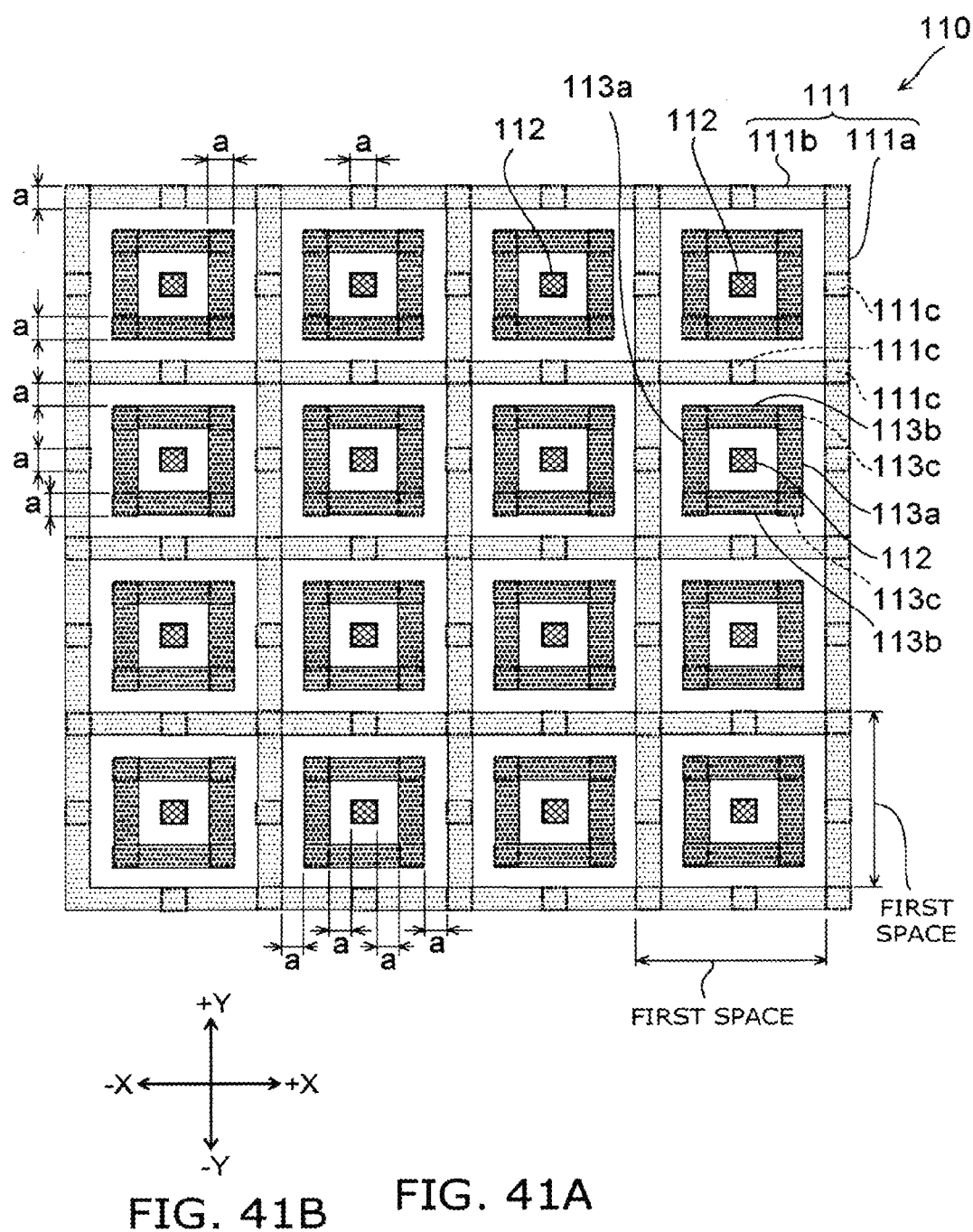
FIG. 41A is a plan view illustrating a base pattern used in the method for designing a wiring layout according to the fourth embodiment.
FIG. 41B shows an XY rectangular coordinate system adopted in FIG. 41A.

FIG. 41 is a plan view illustrating a base pattern used in the method for designing a wiring layout according to the fourth embodiment.

FIGS. 42A to 42H are plan views illustrating layout parts used in the fourth embodiment, wherein FIG. 42A shows a line-cutting part, FIGS. 42B, 42D, and 42F show Y bridge parts, FIGS. 42C, 42E, and 42G show X bridge parts, and FIG. 42H shows a contact fringe.

Figures 43A, 43B:
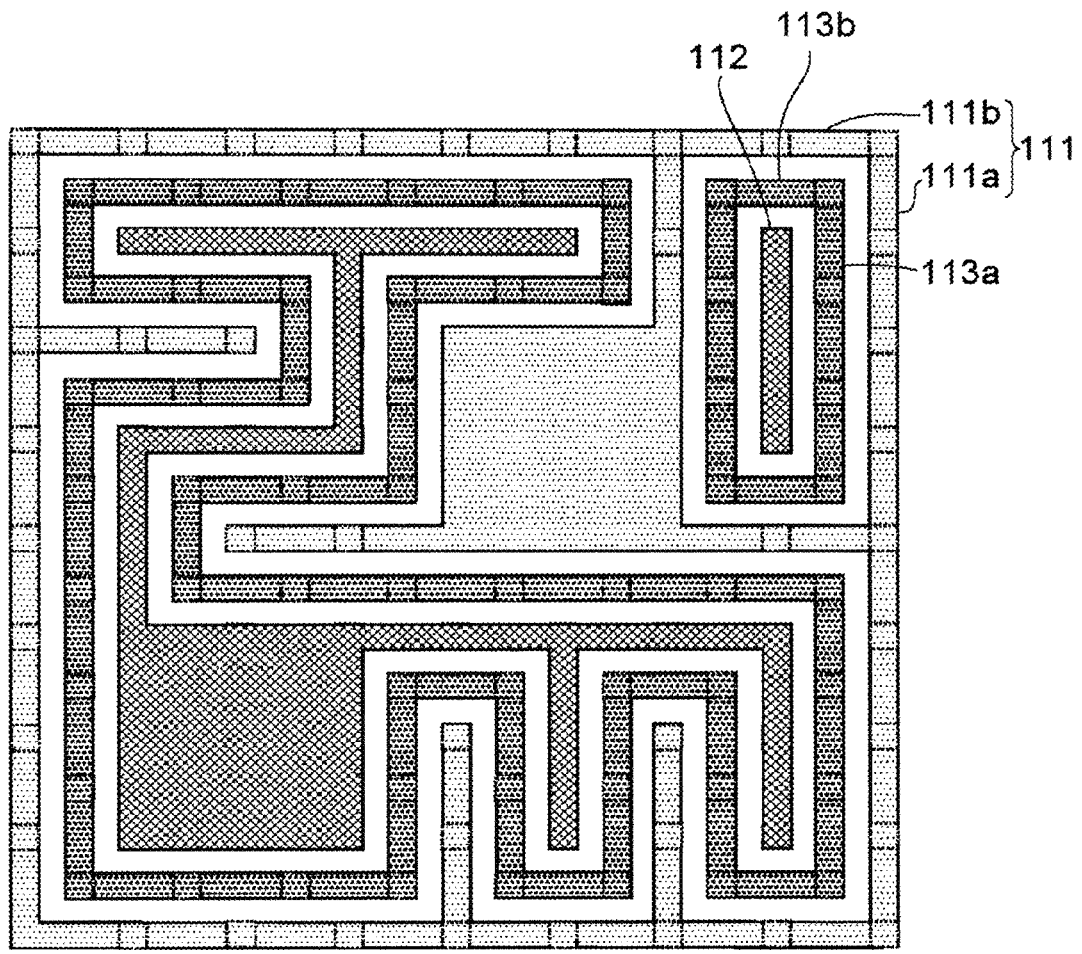
FIG. 43A is a plan view illustrating a state where the bridge parts and the contact fringe are arranged on the base pattern in the fourth embodiment.
FIG. 43B shows an XY rectangular coordinate system adopted in FIG. 43A.

FIG. 43 is a plan view illustrating a state where the bridge parts and the contact fringe are arranged on the base pattern in the fourth embodiment.

As shown in FIG. 41, on a base pattern 110 according to the embodiment, a first pattern 111 formed by a plurality of patterns extending in one direction and in a direction perpendicular to the one direction is provided.

The first pattern 111 includes patterns 111a extending in the Y direction and arranged at the first space in the X direction and patterns 111b extending in the X direction and arranged at the second space in the Y direction. The patterns 111a and the patterns 111b form a lattice. At the intersection of the lattices and at the middle point between neighboring intersections on the pattern 111a and the pattern 111b, a first point 111c is provided. That is, the pattern 111a and the pattern 111b are formed so as to connect the three first points 111c by a straight line and form a lattice by sharing the first point 111c at the end portion. The first pattern 111a and the first pattern 111b are together referred to as the first pattern 111 in some cases.

On the base pattern 110 a plurality of second points 112 are provided. The plurality of the second points 112 are arranged in a matrix at the first space in the X direction and at the second space in the Y direction. However, the second points 112 are arranged at a space shifted by ½ of the first space in the X direction with respect to the first pattern 111a. Further, the second points 112 are arranged at a space shifted by ½ of the second space in the Y direction with respect to the first pattern 111b.

On the base pattern 110, a plurality of third points 113c are provided. The plurality of the third points 113c are arranged in a matrix at a space ½ of the first space in the X direction and at a space ½ of the second space in the Y direction. However, the third points 113c are arranged at a space shifted by ¼ of the first space in the X direction with respect to the first point 111c or the second point 112. Further, the third points 113c are arranged at a space shifted by ¼ of the second space in the Y direction with respect to the first point 111c or the second point 112. Further, the third points 113 are arranged in fours in one lattice formed by the first pattern 111a and the first pattern 111b. The four third points 113c are connected by a third pattern 113b extending in the X direction and a third pattern 113a extending in the Y direction so as to surround the second point. The third pattern 113a and the third pattern 113b are together referred to as the third pattern 113 in some cases. At the center portion of the first pattern 111 and the third pattern 113, the second point 112 is arranged.

In the embodiment, the first space and the second space are made the same. Further, the width of the first pattern 111 and the third pattern 113 is set to a length ⅛ of the first space. This length is referred to as the length a. Furthermore, the shape of the first point 111c, the second point 112, and the third point 113c are formed into a square one side of which has the length a.

As shown in FIG. 42A, the line-cutting part 98 includes the rectangular portion 99. As shown in FIG. 42B, a Y bridge part 120 includes a Y cross-linking portion 121 and the two rectangular portions 99. The Y cross-linking portion 121 extends in the Y direction. The length in the Y direction is set to a length five times the length a (5a). The width of the Y cross-linking portion 121 is set to the length a. The rectangular portion 99 is provided at the center on the side face in the X direction of the Y cross-linking portion 121.

As shown in FIG. 42C, an X bridge part 122 includes an X cross-linking portion 123 and the two rectangular portions 99. The X cross-linking portion 123 extends in the X direction. The length in the X direction of the X cross-linking portion 123 is set to a length five times the length a (5a). The width of the X cross-linking portion 123 is set to the length a. The rectangular portion 99 is provided at the center on the side face in the Y direction of the X cross-linking portion 123.

As shown in FIG. 42D, a Y bridge part 124 includes the two Y cross-linking portions 121 and the five rectangular portions 99. The two Y cross-linking portions 121 are arranged side by side in the X direction. At the center portion and both ends between the two Y cross-linking portions 121, the rectangular portion 99 is provided. At the center portion on the side face facing in the +Y direction of the Y cross-linking portion 121 on the side in the +X direction, the rectangular portion 99 is provided. At the center portion on the side face facing in the −Y direction of the Y cross-linking portion 121 on the side in the −Y direction, the rectangular portion 99 is provided.

As shown in FIG. 42E, an X bridge part 125 includes the two X cross-linking portions 123 and the five rectangular portions 99. The two X cross-linking portions 123 are arranged in tandem in the Y direction. At the center portion and both ends between the two X cross-linking portions 123, the rectangular portion 99 is provided. At the center portion on the side face facing in the +Y direction of the X cross-linking portion 123 on the side in the +Y direction, the rectangular portion 99 is provided. At the center portion on the side face facing in the −Y direction of the X cross-linking portion 123 on the side in the −Y direction, the rectangular portion 99 is provided.

As shown in FIG. 42F, a Y bridge part 126 includes one large Y cross-linking portion 127, the two Y cross-linking portions 121, and the eight rectangular portions 99. The one large Y cross-linking portion 127 extends in the Y direction. The length in the Y direction of the large Y cross-linking portion 127 is set to a length nine times the length a (9a). The width of the large Y cross-linking portion 127 is set to the length a. On the side in the +X direction and on the side in the −X direction of the large Y cross-linking portion 127, the Y cross-linking portion 121 is provided. The center in the Y direction of the large Y cross-linking portion 127 and the center in the Y direction of the Y cross-linking portion 121 agree in the Y direction. Between the Y cross-linking portion 121 on the side in the +X direction of the large Y cross-linking portion 127 and the large Y cross-linking portion 127, the rectangular portion 99 is provided at the center portion and both ends on the side face of the Y cross-linking portion 121 on the side in the +X direction. Between the Y cross-linking portion 121 on the side in the −X direction of the large Y cross-linking portion 127 and the large Y cross-linking portion 127, the rectangular portion 99 is provided at the center portion and both ends on the side face of the Y cross-linking portion 121 on the side in the −X direction. At the center portion on the side face facing in the +X direction of the Y cross-linking portion 121 on the side in the +X direction, the rectangular portion 99 is provided. At the center portion on the side face facing in the −X direction of the Y cross-linking portion 121 on the side in the −X direction, the rectangular portion 99 is provided.

As shown in FIG. 42G, an X bridge part 128 includes one large X cross-linking portion 129, the two X cross-linking portions 123, and the eight rectangular portions 99. The one large X cross-linking portion 129 extends in the X direction. The length in the X direction of the large X cross-linking portion 129 is set to a length nine times the length a (9a). The width of the large X cross-linking portion 129 is set to the length a. On the side in the +Y direction and on the side in the −Y direction of the large X cross-linking portion 129, the X cross-linking portion 123 is provided. The center in the X direction of the large X cross-linking portion 129 and the center in the X direction of the X cross-linking portion 123 agree in the X direction. Between the X cross-linking portion 123 on the side in the +Y direction of the large X cross-linking portion 129 and the large X cross-linking portion 129, the rectangular portion 99 is provided at the center portion and both ends on the side face of the X cross-linking portion 123 on the side in the +Y direction. Between the X cross-linking portion 123 on the side in the −Y direction of the large X cross-linking portion 129 and the large X cross-linking portion 129, the rectangular portion 99 is provided at the center portion and both ends on the side face of the X cross-linking portion 123 on the side in the −Y direction. At the center portion on the side face facing in the +Y direction of the X cross-linking portion 123 on the side in the +Y direction, the rectangular portion 99 is provided. At the center portion on the side face facing in the −Y direction of the X cross-linking portion 123 on the side in the −Y direction, the rectangular portion 99 is provided.

As shown in FIG. 42H, a contact fringe 130 includes a contact portion 140, the two Y cross-linking portions 121, the two X cross-linking portions 123, and 16 rectangular portions 99. The contact portion 140 is formed into the shape of a rectangular and the length of the side in the Y direction is set to a length nine times the length a (9a) and the length of the side in the X direction is set to a length nine times the length a (9a). On the side in the +X direction and on the side in the −X direction of the contact portion 140, the Y cross-linking portion 121 is provided. The center in the Y direction of the contact portion 140 and the center in the Y direction of the Y cross-linking portion 121 agree in the Y direction. Between the Y cross-linking portion 121 on the side in the +X direction of the contact portion 140 and the contact portion 140, the rectangular portion 99 is provided at the center portion and both ends on the side face of the Y cross-linking portion 121 on the side in the +X direction. Between the Y cross-linking portion 121 on the side in the −X direction of the contact portion 140 and the contact portion 140, the rectangular portion 99 is provided at the center portion and both ends on the side face of the Y cross-linking portion 121 on the side in the −X direction. At the center portion on the side face facing in the +Y direction of the Y cross-linking portion 121 on the side in the +X direction, the rectangular portion 99 is provided. At the center portion on the side face facing in the −Y direction of the Y cross-linking portion 121 on the side in the −X direction, the rectangular portion 99 is provided.

On the side in the +Y direction and on the side in the −Y direction of the contact portion 140, the X cross-linking portion 123 is provided. The center in the X direction of the contact portion 140 and the center in the X direction of the X cross-linking portion 123 agree in the X direction. Between the X cross-linking portion 123 on the side in the +Y direction of the contact portion 140 and the contact portion 140, the rectangular portion 99 is provided at the center portion and both ends on the side face of the X cross-linking portion 123 on the side in the +Y direction. Between the X cross-linking portion 123 on the side in the −Y direction of the contact portion 140 and the contact portion 140, the rectangular portion 99 is provided at the center portion and both ends on the side face of the X cross-linking portion 123 on the side in the −Y direction. At the center portion on the side face facing in the +Y direction of the X cross-linking portion 123 on the side in the +Y direction, the rectangular portion 99 is provided. At the center portion on the side face facing in the −Y direction of the X cross-linking portion 123 on the side in the −Y direction, the rectangular portion 99 is provided.

As shown in FIG. 43, the Y bridge part 120 is arranged between the third points 113c neighboring in the Y direction. The X bridge part 122 is arranged between the third points 113c neighboring in the X direction.

Further, the Y bridge part 126 is arranged between the second points 112 neighboring in the Y direction. The X bridge part 128 is arranged between the second points 112 neighboring in the X direction.

Furthermore, the contact fringe 130 is arranged so as to span the first point 111c the first space distant in the X direction with the one first point 111c as a reference and the first point the second space distant in the Y direction with the one first point 111c as a reference.

Still furthermore, the contact fringe 130 is arranged so as to span the second point 112 the first space distant in the X direction with the one second point 112 as a reference and the second point the second space distant in the Y direction with the one second point 112 as a reference.

If necessary, the line-cutting part 98 is arranged on the portion to be separated in the first pattern 111, the large Y cross-linking portion 127, and the large X cross-linking portion 129. Further, the Y bridge part 124 and the X bridge part 125 are arranged between the third patterns 113b or between the third patterns 113a.

In this manner, a wiring layout formed by the sidewall method is made.

Next, the effect of the method for designing a wiring layout according to the embodiment is explained.

According to the method for designing a wiring layout according to the embodiment, patterns arranged in the form of a two-dimensional lattice are included as the base pattern 110, and therefore, it is made possible to create a freer design not limited to a pattern extending in one direction and it is possible to aim at a high degree of integration of the wiring layout.

Further, according to the embodiment, the first pattern 111 and the large Y cross-linking portion 127 connected to the first pattern 111, the large X cross-linking portion 129 and the contact portion 140, the large Y cross-linking portion 127 connected to the second point 112, the large X cross-linking portion 129, and the contact portion 140, and the third pattern 113 and the Y cross-linking portion 121 the X cross-linking portion 123 connected to the third pattern 113 are turned into patterns separated from one another. Consequently, it is possible to make a wiring layout formed by the sidewall method.

Next, a base pattern according to a modified example of the fourth embodiment is explained.

Figure 44A:
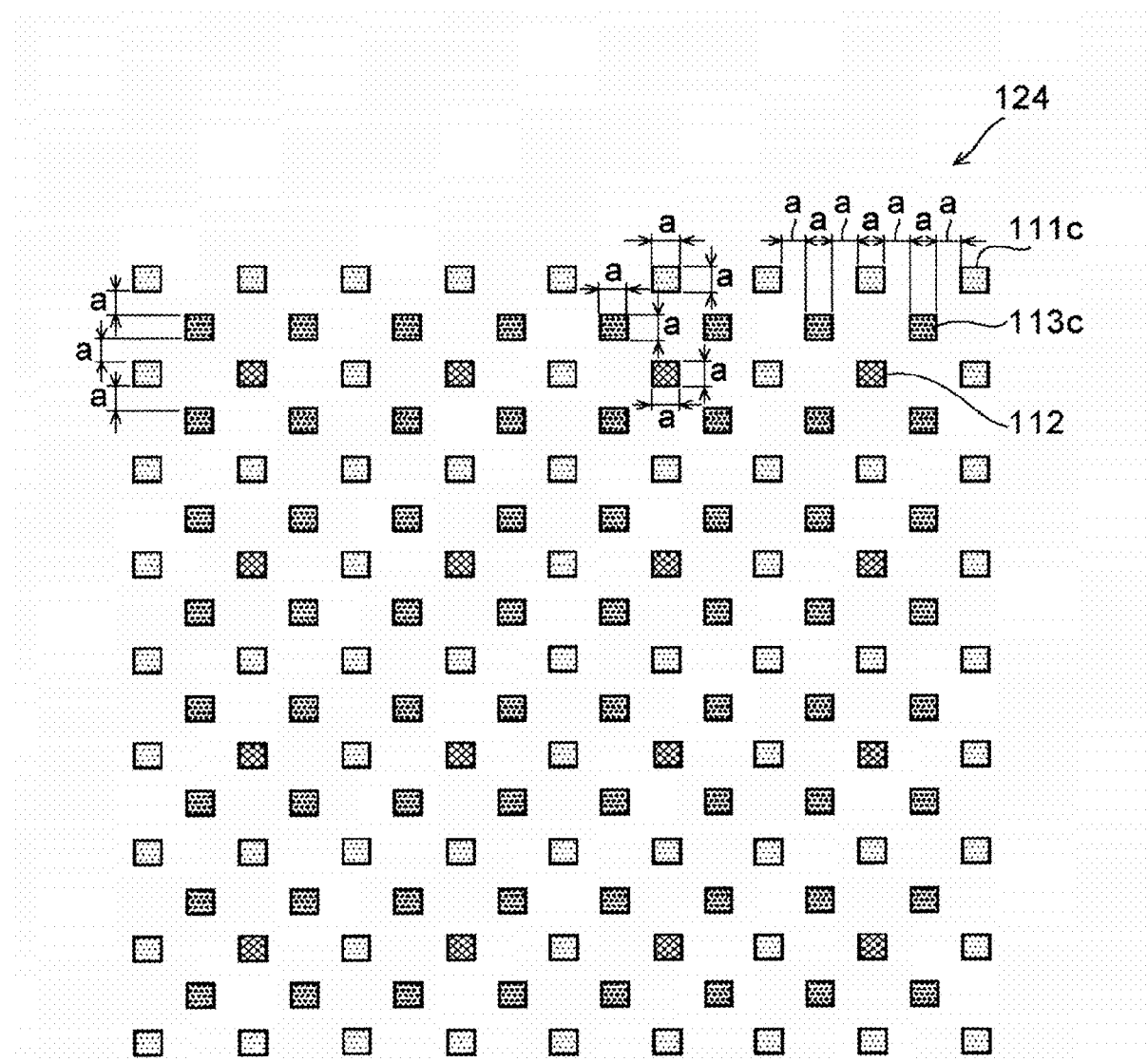
FIG. 44A is a plan view illustrating a base pattern in the modified example of the fourth embodiment.
Figure 44B:
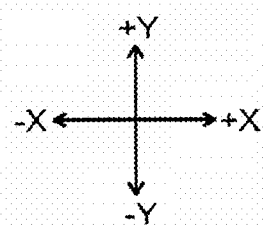
FIG. 44B shows an XY rectangular coordinate system adopted in FIG. 44A.

FIG. 44 is a plan view illustrating a base pattern in the modified example of the fourth embodiment.

As shown in FIG. 44, on the base pattern 124, the first point 111c, the second point 112, and the third point 113c are provided.

In predetermined positions in the base pattern 124, the parts shown in FIGS. 42A to 42H are arranged. Due to this, a wiring layout is made.

Next, the effect of the modified example is explained.

According to the modified example, the first point 111c and the third point 113c are used. It is made possible to design a wiring layout not limited to a lattice pattern and it is possible to aim at a high degree of integration of the wiring layout easily.

Next, a program for supporting a design of a wiring layout formed by the sidewall method is explained.

The program according to the embodiment causes a computer to execute procedures shown below.

The program causes the computer to execute a procedure to display the base pattern 110 on the display unit.

Further, the program causes the computer to execute a procedure to display the line-cutting part 98, the Y bridge part 120, the Y bridge part 124, the Y bridge part 126, the X bridge part 122, the X bridge part 125, the X bridge part 128, and the contact fringe 130 on the display unit. It is preferable for the computer to classify the first point 111c to the third point 113c by different colors or hatch differently to make it easy for a designer to make a layout. Similarly, it is preferable for the computer to classify the first pattern 111, the third pattern, and the second point by different colors or hatch differently to make it easy for the designer to make a layout.

The designer, via the input unit, arranges the Y bridge part 120 in a predetermined position between the two third points 113c adjacent to each other in the Y direction in the base pattern 110 displayed on the display unit. At this time, the computer executes a procedure to connect the two third points 113c and at the same time, to replace the one first pattern 111b with two patterns sandwiching the Y bridge part 120 and not contacting the bridge part 120.

The designer, via the input unit, arranges the X bridge part 122 in a predetermined position between the two third points 113c adjacent to each other in the X direction in the base pattern 110 displayed on the display unit. At this time, the computer executes a procedure to connect the two third points 113c and at the same time, to replace the one first pattern 111a with two patterns sandwiching the Y bridge part 122 and not contacting the Y bridge part 122.

The designer, via the input unit, arranges the Y bridge part 126 in a predetermined position between the two second points 112 adjacent to each other in the Y direction in the base pattern 110 displayed on the display unit. At this time, the computer executes a procedure to connect the two second points 112 and replace the two third patterns 113b intersecting the Y bridge part 126 with two patterns sandwiching the Y bridge part 126 and not contacting the Y bridge part 126 and at the same time, to replace the one first pattern 111b with two patterns sandwiching the Y bridge part 126 and not contacting the Y bridge part 126.

The designer, via the input unit, arranges the Y bridge part 128 in a predetermined position between the two second points 112 adjacent to each other in the X direction in the base pattern 110 displayed on the display unit. At this time, the computer executes a procedure to connect the two second points 112 and replace the two third patterns 113a intersecting the Y bridge part 128 with two patterns sandwiching the Y bridge part 128 and not contacting the Y bridge part 128 and at the same time, to replace the one first pattern 111a with two patterns sandwiching the Y bridge part 128 and not contacting the Y bridge part 128.

The designer, via the input unit, arranges the contact fringe 130 so as to span the first point 111c the first space distant in the X direction and the first point 111c the second space distant in the Y direction with the one first point 111c in the base pattern 110 displayed on the display unit as a reference. At this time, the computer executes a procedure to replace the contact fringe 130 with a pattern covering the first point 111c the first space distant in the X direction and the first point 111c the second space distant in the Y direction with the first point 111c as a reference.

The designer, via the input unit, arranges the contact fringe 130 so as to span the second point 112 the first space distant in the X direction and the second point 112 the second space distant in the Y direction with the one second point 112 in the base pattern 10 displayed on the display unit as a reference. At this time, the computer executes a procedure to replace the contact fringe 130 with a pattern covering the second point 112 the first space distant in the X direction and the second point 112 the second space distant in the Y direction with the second point 112 as a reference.

The designer, via the input unit, arranges the line-cutting part 98 at portions to be separated in the first pattern 111, the large Y cross-linking portion 127, and the large X cross-linking portion 129. At this time, the computer executes a procedure to replace the portions with two separated patterns.

In this manner, it is possible for the program for supporting a design of a wiring layout formed by the sidewall method in which the sidewall is formed twice to cause a computer to support the design of the wiring layout as shown in FIG. 43.

It may also be possible for the program to cause the computer to execute a procedure to replace the patterns at a time when the designer clicks the conversion button displayed on the display unit after arranging a plurality of parts (FIG. 49). As a result of that, it is possible for the designer to arrange other parts in a state where each part is displayed, therefore, making a layout is made easy.

Next, the effect of the program for supporting a design of a wiring layout according to the embodiment is explained.

According to the program according to the embodiment, it is possible to cause a computer to support a design of a wiring layout, and therefore, it is possible to reduce the time which designer designs a wiring layout formed by the sidewall method.

In particular, it is almost impossible to create a design by considering the first-time sidewall from the mandrel in the two-time sidewall method and further considering the second-time sidewall from the first-time sidewall. On the other hand, according to the program according to the embodiment, it is possible to design wiring mainly based on the final layout. As a result of that, the design efficiency is improved considerably.

Next, a method for manufacturing a semiconductor device including patterns formed based on a wiring layout by the sidewall method in which the sidewall is formed twice is explained.

FIG. 45 is a plan view illustrating the method for manufacturing a semiconductor device according to the fourth embodiment.

As shown in FIG. 43, in the wiring layout described previously, the mandrel 36 is formed on the insulating film 32 using the first pattern 111 and the contact portion 140 connected to the first pattern 111 as a pattern of the mandrel 36.

The sidewall 37 is formed on the side face of the mandrel 36.

The mandrel 36 is removed by etching.

The processes in FIGS. 5B and 5F, FIGS. 5C and 5G, and FIGS. 5D and 5H are performed.

In this manner, a semiconductor device 4 including the pattern 40 formed based on the wiring layout is manufactured as shown in FIG. 45.

Next, the effect of the method for manufacturing a semiconductor device according to the embodiment is explained.

It is made possible to design a wiring layout including a wiring space narrower than the minimum value of space by the resolution of lithography easily. And therefore, it is possible to manufacture a semiconductor device including highly integrated patterns.

Next, the semiconductor device 4 according to the embodiment is explained.

The semiconductor device 4 includes a semiconductor substrate and the pattern 40 provided on the semiconductor substrate. In order to explain the semiconductor device 4, the XY rectangular coordinate system is adopted. In the XY rectangular coordinate system, the upward direction in the figure is set to the +Y direction and the opposite direction the −Y direction as in the XY rectangular coordinate system adopted in order to explain the base pattern 60 in FIG. 41. The direction 90 degrees rotated clockwise from the +Y direction is set to the +X direction and the opposite direction the −X direction.

In the semiconductor device 4, a plurality of patterns 131 corresponding to the first pattern 111a extending in the Y direction, a plurality of patterns 132 corresponding to the large Y cross-linking portion 127 connecting the second points 112, and a plurality of patterns 133 corresponding to the third pattern 113a extending in the Y direction and the Y cross-linking portion 121 are provided. Further, in the semiconductor device 4, a plurality of patterns 134 corresponding to the first pattern 111b extending in the X direction, a plurality of patterns 135 corresponding to the large X cross-linking portion 129 connecting the second points 112, and a plurality of patterns 136 corresponding to the third pattern 113b extending in the X direction and the X cross-linking portion 123.

If a plurality of first lines extending in the Y direction and arranged at a space ½ of the first space in the X direction are supposed in the XY plane and integers from one are assigned to the first lines in order from the end, and if a plurality of second lines extending in the X direction, arranged at a space ½ of the second space in the Y direction, and intersecting the first lines are supposed in the XY plane and integers from one are assigned to the second lines in order from the end, the patterns 131 are arranged in the odd-numbered first lines and the patterns 132 in the even-numbered first lines. The patterns 134 are arranged in the odd-numbered second lines and the patterns 135 in the even-numbered second lines.

If a plurality of third lines extending in the Y direction and arranged one by one between the first lines adjacent to each other are supposed, the patterns 133 are arranged in the third lines. Further, if a plurality of fourth lines extending in the X direction and arranged one by one between the second lines adjacent to each other are supposed, the patterns 136 are arranged in the fourth lines.

Then, at least one of the patterns 131 connects with the pattern 134 and at least one of the patterns 132 connects with the pattern 135. Further, at least one of the patterns 133 connects with the pattern 136.

Furthermore, the pattern 131 and the pattern 134, the pattern 132 and the pattern 135, and the pattern 133 and the pattern 136 are separated from one another.

Next, the method for manufacturing a semiconductor device according to the embodiment is explained.

According to the semiconductor device 4 according to the embodiment, the H-shaped pattern 40 and the separated pattern 40 are included and a wiring space narrower than the minimum value of space by the resolution of lithography is included, and therefore, it is possible to increase the degree of integration of the semiconductor device.

Fifth Embodiment

Next, a fifth embodiment is explained.

FIGS. 46A to 46D are plan views illustrating constituent units of a base pattern in the fifth embodiment.

Figure 47A:
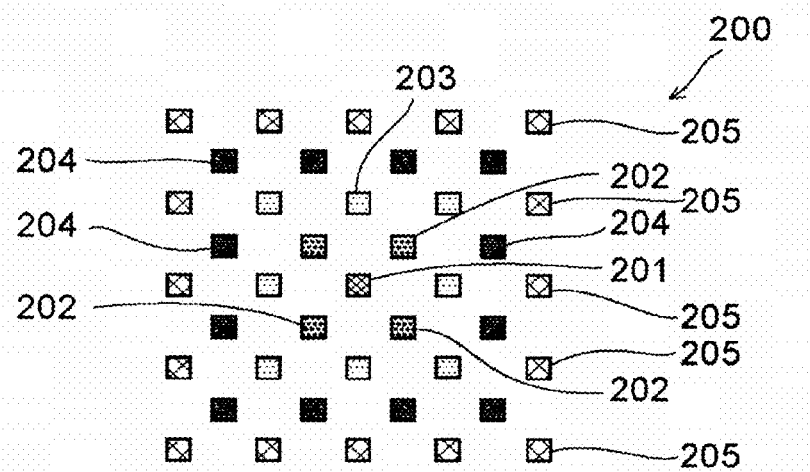
FIGS. 47A and 47B are plan views illustrating constituent units of the base pattern in the fifth embodiment and FIG. 47C is a plan view illustrating a wiring layout in the fifth embodiment.
Figure 47B:
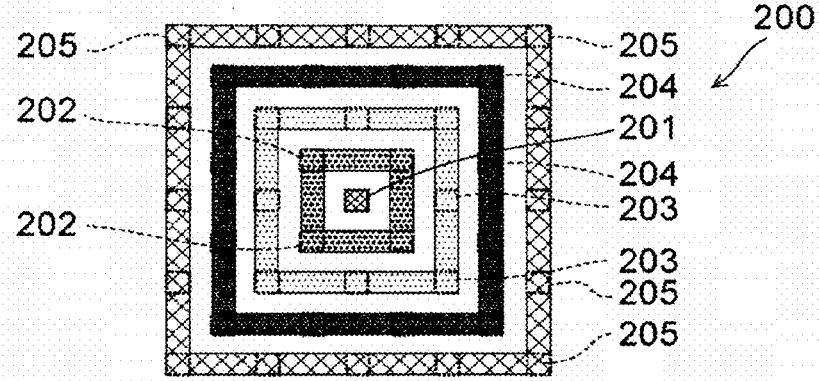
Figure 47C:
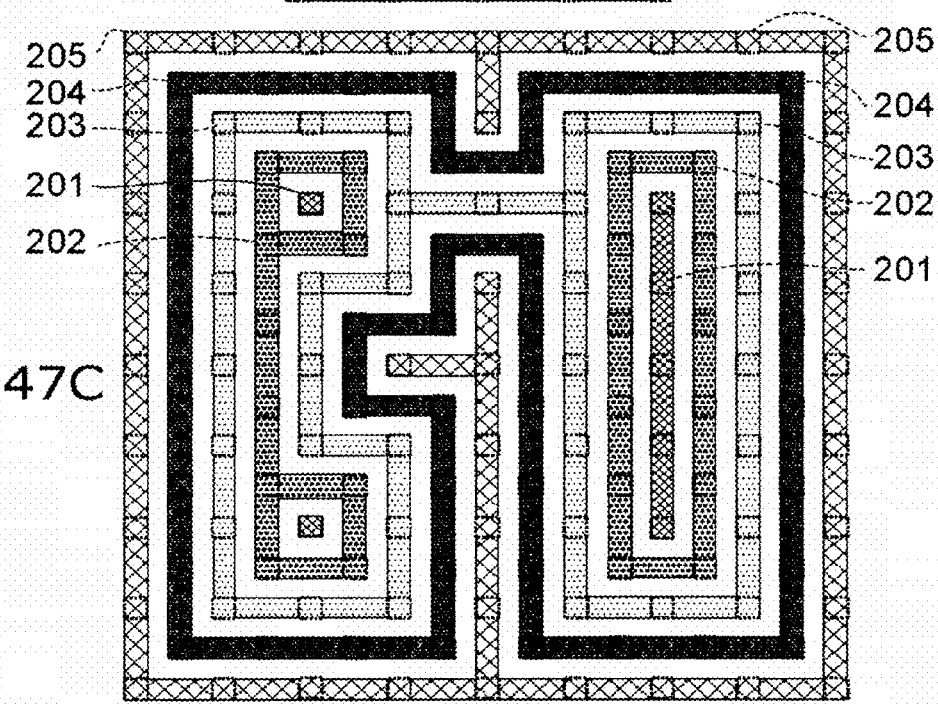

FIGS. 47A and 47B are plan views illustrating constituent units of the base pattern in the fifth embodiment and FIG. 47C is a plan view illustrating a wiring layout in the fifth embodiment.

Figure 48:
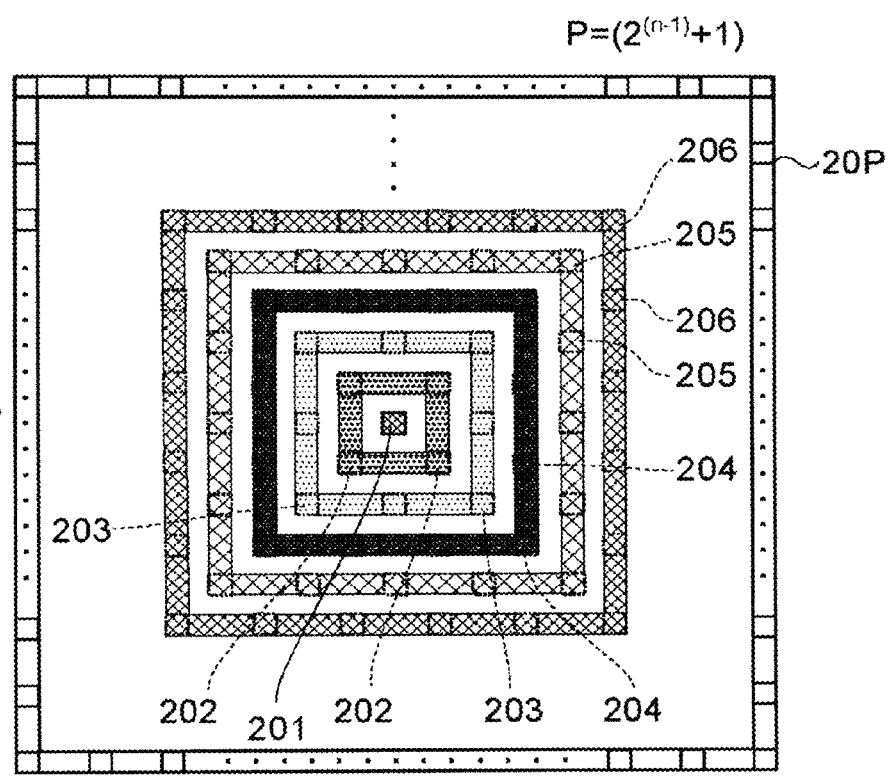
FIG. 48 exemplarily shows a base pattern used in a sidewall method where sidewall is formed n times.

FIG. 48 is a plan view illustrating a constituent unit of the base pattern in the fifth embodiment.

As shown in FIGS. 46A to 46F, the constituent units of a base pattern 200 in the embodiment are formed into the shape of a matrix or lattice. Then, the constituent units in a matrix or lattice are selected according to the number of times the sidewall is formed in the sidewall method.

First, the constituent units of the base pattern 200 to be used in a design of a wiring layout in the sidewall method in which the sidewall is formed once are explained.

Figure 46A:
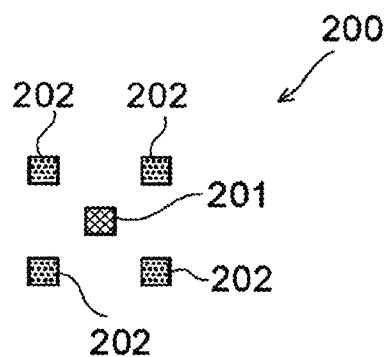
FIGS. 46A to 46D are plan views illustrating constituent units of a base pattern in the fifth embodiment.

As shown in FIG. 46A, the constituent unit of the base pattern 200 includes a first point 201 and four second points 202 provided, respectively, with the first point 201 as a reference, in a position the first space distant in the +X direction and the second space distant in the +Y direction, in a position the space distant in the −X direction and the second space distant in the +Y direction, in a position the first space distant in the +X direction and the second space distant in the −Y direction, and in a position the first space distant in the −X direction and the second space distant in the −Y direction.

Figure 46C:
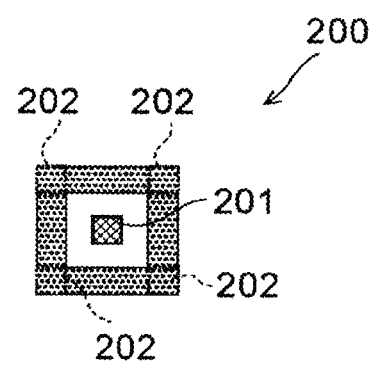

As shown in FIG. 46C, the constituent unit of the base pattern 200 may be a unit surrounded by two patterns the distance of which is the first space with the first point 201 as a reference, extending in the Y direction, and connecting the second points 202, and two patterns the distance of which is the second space with the first point 201 as a reference, extending in the X direction, and connecting the second points 202. By using the base pattern 200 on which such constituent units are arrayed two-dimensionally, a wiring layout formed by the sidewall method is designed. Then, a pattern is formed by the sidewall method using one of the first point 201 and the pattern connecting the second points 202 as a mandrel. In other words, it can be said that the first point 201 and the pattern connecting the second points 202 are differentiated by two different colors.

Next, a case of the sidewall method in which the sidewall is formed twice is explained.

Figure 46B:
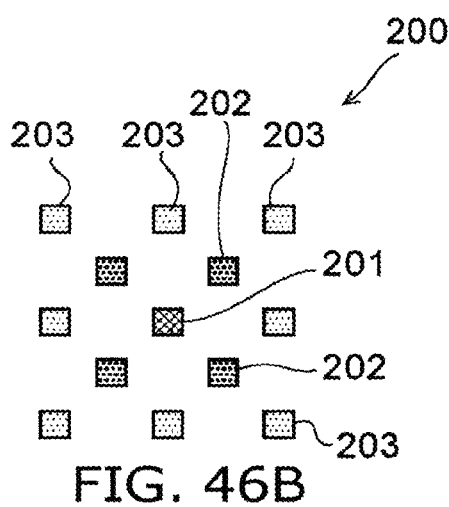

As shown in FIG. 46B, constituent units of the base pattern 200 are the units described previously to which third points 203 as follows are further added. That is, the eight third points 203 provided, respectively, with the first point as a reference, in a position twice the first space distant in the +X direction, in a position twice the first space distant in the +X direction and twice the second space distant in the +Y direction, in a position twice the first space distant in the +X direction and twice the second space distant in the −Y direction, in a position twice the second space distant in the +Y direction, in a position twice the second space distant in the −Y direction, in a position twice the first space distant in the −X direction, in a position twice the first space distant in the −X direction and twice the second space distant in the +Y direction, and in a position twice the first space distant in the −X direction and twice the second space distant in the −Y direction are added.

Figure 46D:
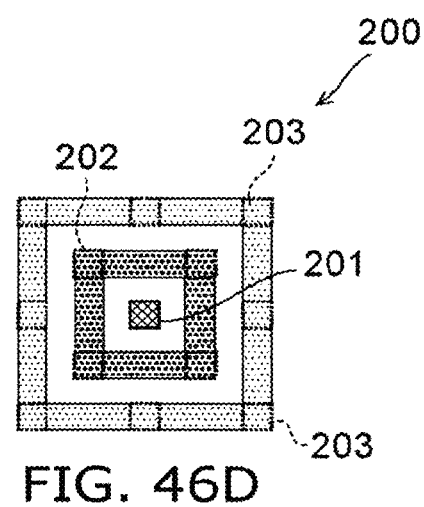

As shown in FIG. 46D, the constituent unit of the base pattern 200 may be a unit surrounded by two patterns the distance of which is twice the first space with the first point as a reference, extending in the Y direction, and connecting the third points 203, and two patterns the distance of which is twice the second space with the first point as a reference, extending in the X direction, and connecting the third points 203 in addition to the constituent unit of FIG. 46C. By using the base pattern 200 on which such constituent units are arrayed two-dimensionally, a wiring layout by the sidewall method in which the sidewall is formed twice is designed. A pattern is formed by the sidewall method using one of the first point and the pattern connecting the third points 203 as a mandrel. In other words, it can be said that the first point 201, the pattern connecting the second points 202, and the pattern connecting the third points 203 are differentiated with each other by three different colors.

Next, a case of the sidewall method in which the sidewall is formed three times is explained.

As shown in FIG. 47A, constituent units of the base pattern 200 are the constituent units shown in FIG. 46B to which fourth points 204 and fifth points 205 as follows are further added.

That is, the 12 fourth points 204 provided, respectively, with the first point 201 as a reference, in a position three times the first space distant in the +X direction and the second space distant in the +Y direction, in a position three times the first space distant in the +X direction and three times the second space distant in the +Y direction, in a position three times the first space distant in the +X direction and the second space distant in the −Y direction, in a position three times the first space distant in the +X direction and three times the second space distant in the −Y direction, in a position the first space distant in the +X direction and three times the second space distant in the +Y direction, in a position the first space distant in the +X direction and three times the second space distant in the −Y direction, in a position the first space distant in the −X direction and three times the second space distant in the +Y direction, in a position the first space distant in the −X direction and three times the second space distant in the −Y direction, in a position three times the first space distant in the −X direction and the second space distant in the +Y direction, in a position three times the first space distant in the −X direction and three times the second space distant in the +Y direction, in a position three times the first space distant in the −X direction and the second space distant in the −Y direction, and in a position three times the first space distant in the −X direction and three times the second space distant in the −Y direction are added.

That is, the 16 fifth points 205 provided, respectively, with the first point as a reference, in a position four times the first space distant in the +X direction, in a position four times the first space distant in the +X direction and twice the second space distant in the +Y direction, in a position four times the first space distant in the +X direction and four times the second space distant in the +Y direction, in a position four times the first space distant in the +X direction and twice the second space distant in the −Y direction, in a position four times the first space distant in the +X direction and four times the second space distant in the −Y direction, in a position twice the first space distant in the +X direction and four times the second space distant in the +Y direction, in a position twice the first space distant in the +X direction and four times the second space distant in the −Y direction, in a position four times the second space distant in the +Y direction, in a position four times the second space distant in the −Y direction, in a position four times the first space distant in the −X direction, in a position four times the first space distant in the −X direction and twice the second space distant in the +Y direction, in a position four times the first space distant in the −X direction and four times the second space distant in the +Y direction, in a position four times the first space distant in the −X direction and twice the second space distant in the −Y direction, in a position four times the first space distant in the −X direction and four times the second space distant in the −Y direction, in a position twice the first space distant in the −X direction and four times the second space distant in the +Y direction, and in a position twice the first space distant in the −X direction and four times the second space distant in the −Y direction are added.

As shown in FIG. 47B, the constituent unit of the base pattern 200 may be a unit surrounded by two patterns the distance of which is three times the first space with the first point 201 as a reference, extending in the Y direction, and connecting the fourth points 204, and two patterns the distance of which is three times the second space with the first point 201 as a reference, extending in the X direction, and connecting the fourth points 204 in addition to the constituent unit of FIG. 46E. Alternatively, the constituent unit of the base pattern 200 may include a unit surrounded by two patterns the distance of which is four times the first space with the first point 201 as a reference, extending in the Y direction, and connecting the fifth points 205, and two patterns the distance of which is four times the second space with the first point 201 as a reference, extending in the X direction, and connecting the fifth points 205.

As exemplarily described above, according to the embodiments, a wiring layout by sidewall method in which the sidewall is formed three times is designed by using the base pattern 200 on which constituent units are arrayed two-dimensionally. Then, a pattern is formed by the sidewall method using one of the first point 201 and the pattern connecting the fourth points 204 as a mandrel.

As shown in FIG. 47C, by using the base pattern 200 on which such constituent units are arrayed two-dimensionally, a wiring layout by the sidewall method in which the sidewall is formed three times is designed.

Then, a pattern is formed by the sidewall method using one of the first points 201 and the pattern connecting the fifth points 205 as a mandrel. In other words, it can be said that the first point 201, the pattern connecting the second points 202, the pattern connecting the third points 203, the pattern connecting the fourth points 204, and the pattern connecting the fifth points 205 are differentiated with each other by five different colors.

Next, a case of the sidewall method in which the sidewall is formed n times is explained.

The constituent unit of the base pattern 200 will be first to $(2^{(n-1)}+1)$-th points. Here, n is a natural number not less than unity. The $(2^{(n-1)}+1)$-th points will be surrounded by two patterns the distance of which is $(2^{(n-1)}+1)$ times the first space with the first point 201 as a reference, extending in the Y direction, and connecting $(2^{(n-1)}+1)$-th points, and two patterns the distance of which is $(2^{(n-1)}+1)$ times the second space with the first point 201 as a reference, extending in the X direction, and connecting the $(2^{(n-1)}+1)$-th points.

Then, a pattern is formed by the sidewall method using one of the first point and the pattern connecting the $(2^{(n-1)}+1)$-th points.

FIG. 48 exemplarily shows a base pattern 200 used in the sidewall method where sidewall is formed n times. As shown in FIG. 48, the base pattern 200 includes first point 201 through $(2^{(n-1)}+1)$-th points 20n. In other words, it can be said that the first point 201, the pattern connecting the second points 202, and the pattern connecting the n-th points 20P are differentiated with each other by $(2^{(n-1)}+1)$ different colors. So, the different colors $P=(2^{(n-1)}+1)$, "n" is the sidewall method in which the sidewall is formed n times.

Next, the effect of the embodiment is explained.

It is possible to use the base pattern 200 in the embodiment as a base pattern of a wiring layout in the sidewall method in which the sidewall is formed n times.

Sixth Embodiment

Next, a design method of a wiring layout formed by the sidewall method according to a sixth embodiment will be described.

Figure 50:
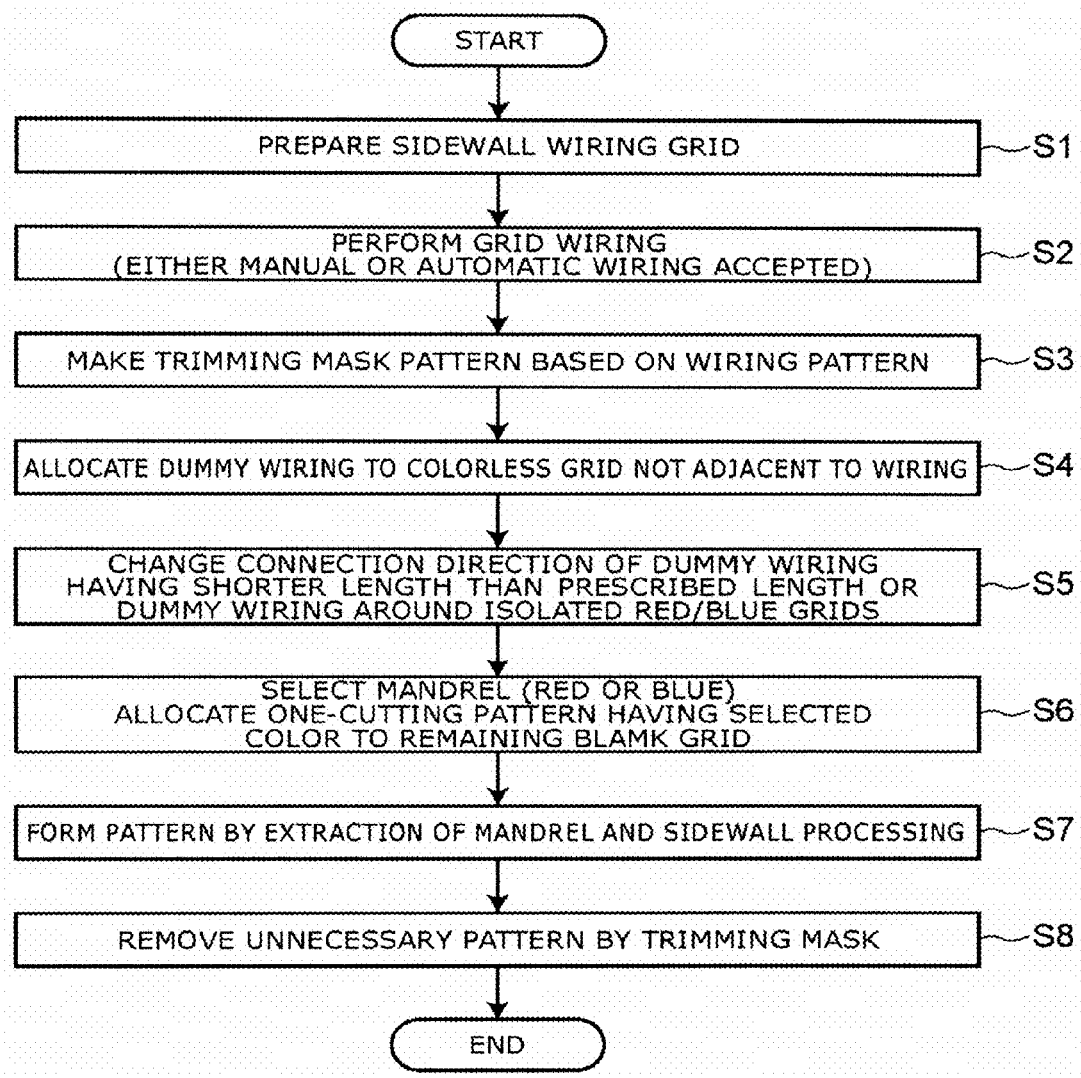
FIG. 50 is a flow chart illustrating a design method of a wiring layout and a method for manufacturing a semiconductor device according to a sixth embodiment.

FIG. 50 is a flow chart illustrating a design method of a wiring layout and a method for manufacturing a semiconductor device according to a sixth embodiment.

Figure 51A:
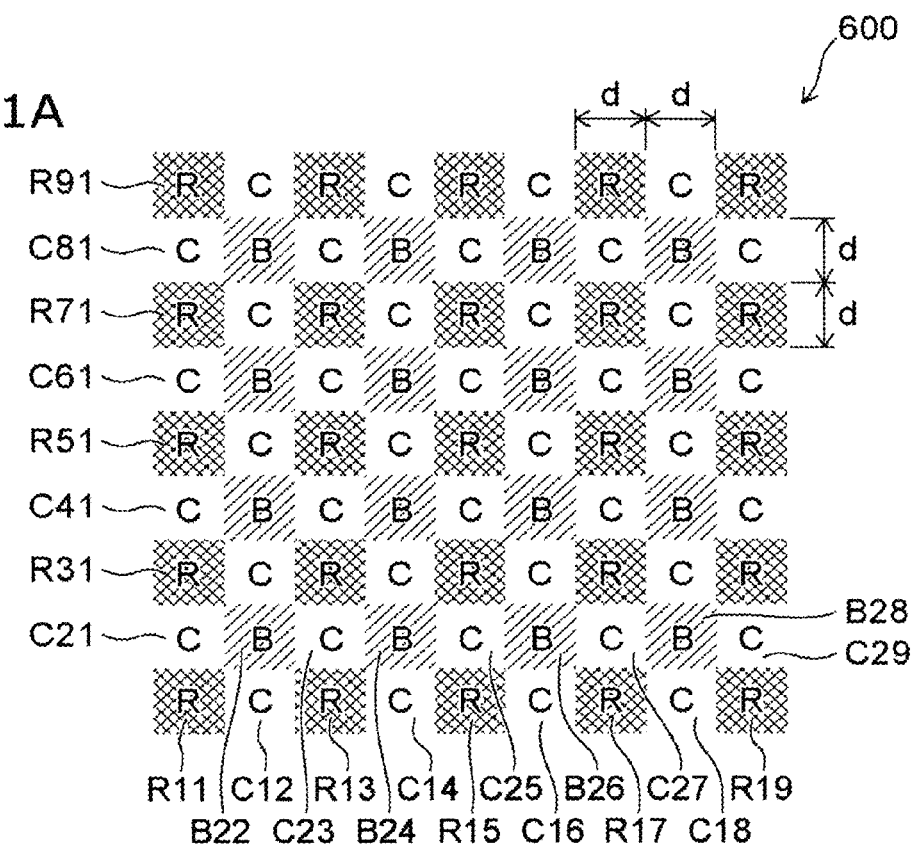
FIG. 51A is a plan view illustrating a sidewall wiring grid used in the design method of the wiring layout according to the sixth embodiment.
Figure 51B:
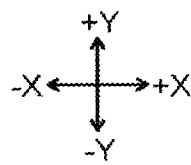
FIG. 51B shows an XY rectangular coordinate system adopted in FIG. 51A.

FIG. 51A is a plan view illustrating a sidewall wiring grid used in the design method of the wiring layout according to the sixth embodiment, and FIG. 51B shows an XY rectangular coordinate system adopted in FIG. 51A.

As shown in FIG. 51A and step S1 of FIG. 50, first, the sidewall wiring grid 600 is prepared. The sidewall wiring grid 600 is used for the wiring layout formed by the sidewall method.

As shown in FIG. 51B, in the embodiment, the XY rectangular coordinate system is adopted in order to describe the sidewall wiring grid 600. In the XY coordinate system, the upward direction in the figure is referred to as the +Y direction and the opposite direction is referred to as the −Y direction. The direction 90 degrees rotated clockwise from the +Y direction is referred to as the +X direction and the opposite direction is referred to as the −X direction. The "+X direction" and the "−X direction" are together referred to also as the "X direction". The "+Y direction" and the "−Y direction" are together referred to also as the "Y direction". In each of the drawings to be described later, the same XY rectangular coordinate system is used according to the necessity.

The sidewall wiring grid 600 includes, for example, three kinds of grids, namely, a plurality of red grids R disposed in a matrix configuration, a plurality of blue grids B disposed in a matrix configuration and a plurality of colorless grids C.

The plurality of red grids R are disposed in a matrix configuration in the X direction at a third period and in the Y direction at a fourth period. The plurality of blue grids B are disposed in a matrix configuration in the X direction at the third period and in the Y direction at the fourth period. However, the blue grids B are disposed in the X direction with a shift of a half period of the third period and in the Y direction with a shift of a half period of the fourth period.

The plurality of colorless grids C are disposed one by one between the red grids R adjacent in the X direction and between the blue grids adjacent in the X direction. Therefore, the plurality of colorless grids C include grids disposed in a matrix configuration in the X direction at the third period and in the Y direction at the fourth period, and grids disposed in a matrix configuration in the X direction at the third period and in the Y direction at the fourth period and disposed in the X direction with a shift of a half of the third period and in the Y direction with a shift of a half of the fourth period In the embodiment, the third period is taken as the same as the fourth period. The shape of the red grids R, the blue grids B and the colorless grids C is taken as a square having a length of one side being the same length d as a half period of the third period and the fourth period. When the X direction of the sidewall wiring grid 600 is taken as a row direction and the Y direction is taken as a column direction, the sidewall wiring grid 600 is in a matrix configuration in which three kinds of grids are disposed in the column direction and the row direction.

An arbitrary grid R is taken as the grid R11 at the 1st row and the 1st column. Starting from the grid R11, the grid R at the j-th row in the X direction and at the i-th column in the Y direction is taken as the grid Rij. For example, the arrangement of the grids in the 1st row is in order of the grid C12, the grid R13, the grid C14, the grid R15, the grid C16, the grid R17, the grid C18 and the grid R19 from the grid R11 in the +X direction. The arrangement of the grids in the second row is in order of the grid B22, the grid C23, the grid B24, the grid C25, the grid B26, the grid C27, the grid B28 and the grid C29 from the grid C21 adjacent to the grid R11 in the +Y direction along the +X direction. The arrangement in the first column is in order of the grid C21, the grid R31, the grid C41, the grid R51, the grid C61 the grid R71, the grid C81 and the grid R91 from the grid R11 in the +Y direction.

Figure 52A:
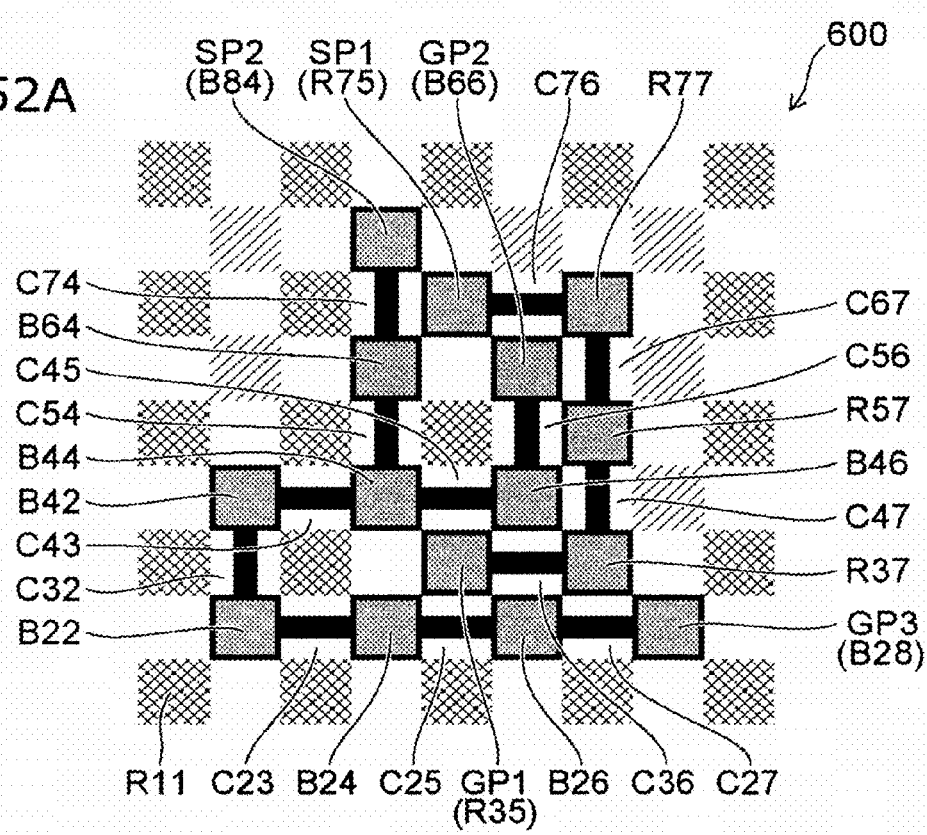
FIG. 52A is a plan view illustrating a state in which a wiring is drawn on the sidewall wiring grid in the sixth embodiment.
Figure 52B:
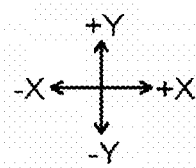
FIG. 52B shows an XY rectangular coordinate system adopted in FIG. 52A.

FIG. 52A is a plan view illustrating a state in which a wiring is drawn on the sidewall wiring grid in the sixth embodiment, and FIG. 52B shows an XY rectangular coordinate system adopted in FIG. 52A.

Next, as shown in step S2 of FIG. 50 and in FIG. 52A, grid wiring is performed through connecting between the grids with a wiring. When connecting between the grids with a wiring, following three connection rules are applied. The first is that a start point of the wiring and an end point of the wiring are grids of the same color of red or blue. The second is that a grid with color different from the color of the start point and the end point are not used as a pathway of the wiring. However, a colorless grid C can be used as a pathway of the wiring regardless of the color of the start point of the wiring and the end point of the wiring. Third is that a colorless grid C set to the pathway of the wiring is set to a grid with the same color as the color of the grid of the start point and the grid of the end point.

For example, first, the red grid R is selected as the grid SP1 of the start point and the grid GP1 of the end point of the wiring. For example, the grid R75 is taken as the grid SP1 of the start point, and the grid R35 is taken as the grid GP1 of the end point. Next, a wiring is disposed on the grid C76 between the grid SP1 and the grid R77 adjacent to the grid SP1 in the +X direction, the grid R77 having the same color as the grid SP1 of the start point, and the grid SP1 is connected to the grid R77 by the wiring. Next, a wiring is disposed on the grid C67 between the grid R77 and the grid R57 adjacent to the grid R77 in the −Y direction, the grid R57 having the same color as the grid R77, and the grid R77 is connected to the grid R57 by the wiring.

Next, a wiring is disposed on the grid C47 between the grid R57 and the grid R37 adjacent to the grid R57 in the −Y direction, the grid R37 having the same color as the grid R57, and the grid R57 is connected to the grid R37 by the wiring. Furthermore, a wiring is disposed on the grid C36 between the grid R37 and the grid GP1 of the end point adjacent to the grid R37 in the −X direction, the grid GP1 having the same color as the grid R37, and the grid R37 is connected to grid GP1 of the end point by the wiring. In this manner, connection from the grid SP1 of the start point to the grid GP1 of the end point is made by the wiring so that the red grid R and the colorless grid C form a pathway of the wiring. This determines one pathway passing through only the red and colorless grids.

The grid of the start point and the grid of the end point in the wiring may not be limited to be set one by one. For example, the blue grid B84 is selected as the grid SP2 of one start point. Two grids of the blue grid B66 and the blue grid B28 are selected as the grid GP2 and the grid GP3 of the end points. Next, a wiring is disposed on the grid C74, the grid C54, the grid C45 and the grid C56 so that the grid B64, the grid B44 and the grid B46 having the same color as the grid SP2 of the start point form a pathway of the wiring from the grid SP2 to the grid GP2, and adjacent grids B are connected.

Furthermore, a wiring is disposed on the grid C43, the grid C32, the grid C23, the grid C25 and the grid C27 so that the grid B44, the grid B42, the grid B22, the grid B24 and the grid B26 having the same color as the grid SP2 of the start point form a pathway of the wiring from the grid SP2 to the grid GP3, and the adjacent grids B are connected.

In this manner, the wiring is caused to pass through the blue grids B and the colorless grids C, and connection is made from the grid SP2 of one start point to the grid GP2 and the grid GP3 of two end points by the wiring. This determines two pathways passing through only the blue and colorless grids. Thus, the wiring pattern connecting the grid SP of the start point to the grid GP of the end point is formed.

An one-line cutting pattern 42 or 36a shown in FIGS. 8A and 9A may be allocated to the most outer circumferential grid in the sidewall wiring grid 600, and thus it is preferable not to form the wiring pattern thereon.

Figure 53A:
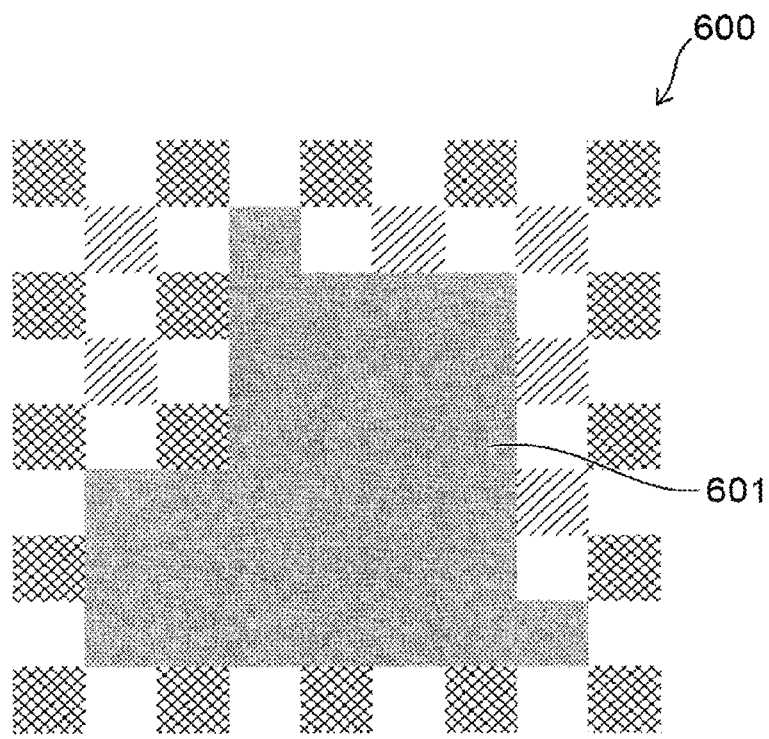
FIG. 53A is a plan view illustrating a pattern for trimming mask in the sixth embodiment.
Figure 53B:
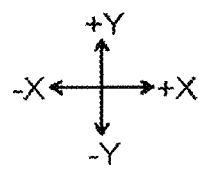
FIG. 53B shows an XY rectangular coordinate system adopted in FIG. 53A.

FIG. 53A is a plan view illustrating a mask pattern for trimming in the sixth embodiment, and FIG. 53B shows an XY rectangular coordinate system adopted in FIG. 53A.

Next, as shown in step S3 of FIG. 50 and in FIG. 53A, the trimming mask pattern 601 is made after forming the wiring pattern. The trimming mask pattern 601 is a mask for removing unnecessary wirings in the later process of the manufacturing process of the semiconductor device. In the case where a half pitch of the wiring pattern is 30 nm, the trimming mask is expanded with 15 nm in each of the X direction and the Y direction with respect to the wiring pattern, and the margin is allowed for dimension.

Figure 54A:
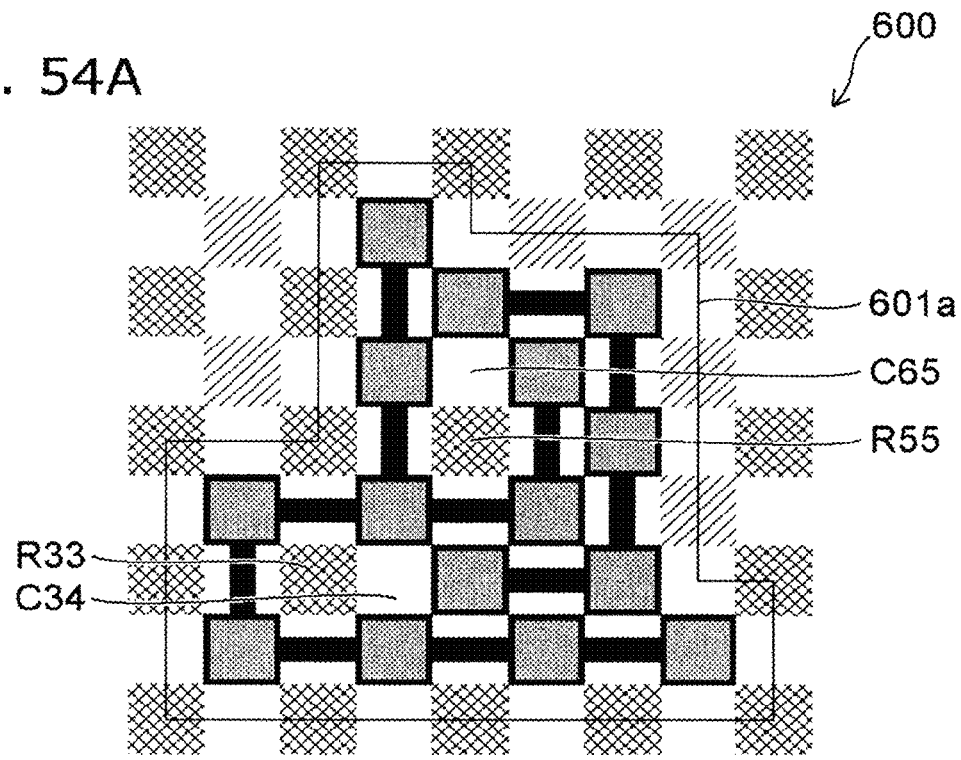
FIGS. 54A and 54B are process plan views illustrating a method for forming the trimming mask in the sixth embodiment.
Figure 54B:
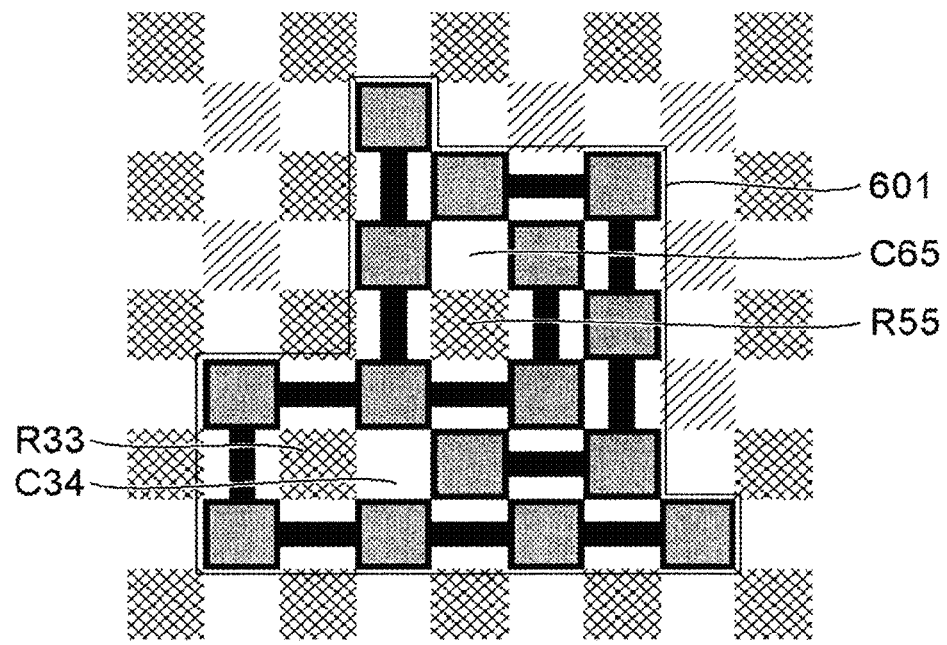

FIGS. 54A and 54B are process plan views illustrating a method for forming the trimming mask in the sixth embodiment.

Next, as shown in FIG. 54A, for example, a trimming mask pattern 601a is formed expanding from the end edge of the wiring pattern with 50 nm. The wiring is not disposed on the grid C65, the grid R55, the grid C34 and the grid R33, however the wiring is disposed on adjacent grids. Therefore, the expanded trimming mask pattern 601a overlaps the grid C65, the grid R55, the grid C34 and the grid R33 and covers those grids. Consequently, there is no hole in the grid C65, the grid R55, the grid C34 and the grid R33, except for a portion where the trimming mask pattern 601a may have an opening.

Subsequently, as shown in FIG. 54B, the end edge of the expanded trimming mask pattern 601a is shrunken with a width of 35 nm. This allows the trimming mask pattern 601 expanded with 15 nm in each of the X direction and the Y direction with respect to the wiring pattern to be formed. It prevents a hole unresolved in lithography being formed on the grids where the wiring is not disposed in the trimming mask pattern 601.

Figure 55A:
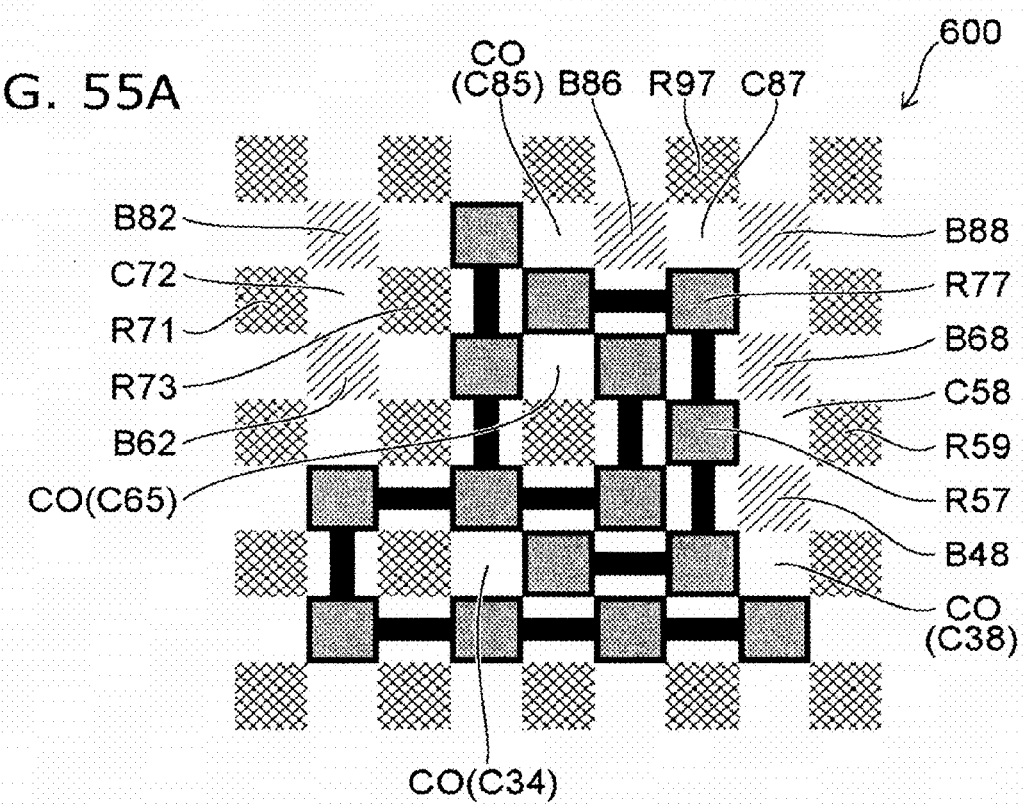
FIG. 55A is a plan view illustrating a state in which a wiring is drawn on the sidewall wiring grid in the sixth embodiment.
Figure 55B:
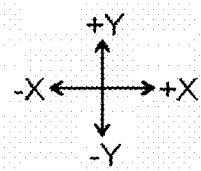
FIG. 55B shows an XY rectangular coordinate system adopted in FIG. 55A.

FIG. 55A is a plan view illustrating a state in which a wiring is drawn on the sidewall wiring grid in the sixth embodiment, and FIG. 55B shows an XY rectangular coordinate system adopted in FIG. 55A.

Next, as shown in step S4 of FIG. 50 and in FIG. 55A, dummy wirings are allocated to the grids C with wiring not arranged.

First, a preferred direction of the dummy wiring allocated between the adjacent grids R or between the adjacent grids B, namely, which direction of the X direction or the Y direction is preferentially connected is decided ahead of time. The grid C to which the dummy wiring can be allocated is a grid contacting grids R or grids B, i.e. the grids R contacting the grid C in the +X direction and −X direction, the grids B contacting the grid C in the +X direction and −X direction, the grids R contacting the grid C in the +Y direction and the −Y direction or the grids B contacting the grid C in the +Y direction and the −Y direction, any of which the wiring is not connected to.

For example, the grid R73 and the grid R71 contacting the grid C72 in the +X direction and −X direction, and the grid B82 and the grid B62 contacting the grid C72 in the +Y direction and the −Y direction are not pathways of the wiring, i.e. have no wiring connected thereto. Therefore, the grid C72 can be disposed with the dummy wiring connecting the grid R73 to the gird R71 in the X direction, and can be disposed with the dummy wiring connecting the grid B82 to the grid B62 in the Y direction. Therefore, when the preferred direction is a horizontal direction, namely, the X direction, the dummy wiring connecting the grid R73 to the grid R71 in the X direction may be allocated.

With regard to the grid C87, the red grid R77 contacting the grid C87 in the −Y direction is the pathway of the wiring, and thus the dummy wiring cannot be connected to the grid R77. Therefore, the dummy wiring connecting the grid B86 to the grid B88 in the X direction is allocated to the grid C87.

With regard to the grid C58, the grid R57 contacting the grid C58 in the −X direction is the pathway of the wiring, and thus the dummy wiring cannot be connected to the grid R57. Therefore, the dummy wiring connecting the grid B48 to the grid B68 in the Y direction is allocated to the grid C58.

Since with regard to the grid C85, the grid C65, the grid C34 and the grid C38, the grid R or the grid B contacting the grid C in one of the +X direction and the −X direction, and the grid R or the grid B contacting the grid C in one of the +Y direction and the −Y direction are pathways of the wiring, the dummy wiring cannot be allocated. In this case, a blank grid C0 is allocated. The blank grid C0 is held to be blank.

Figure 56A:
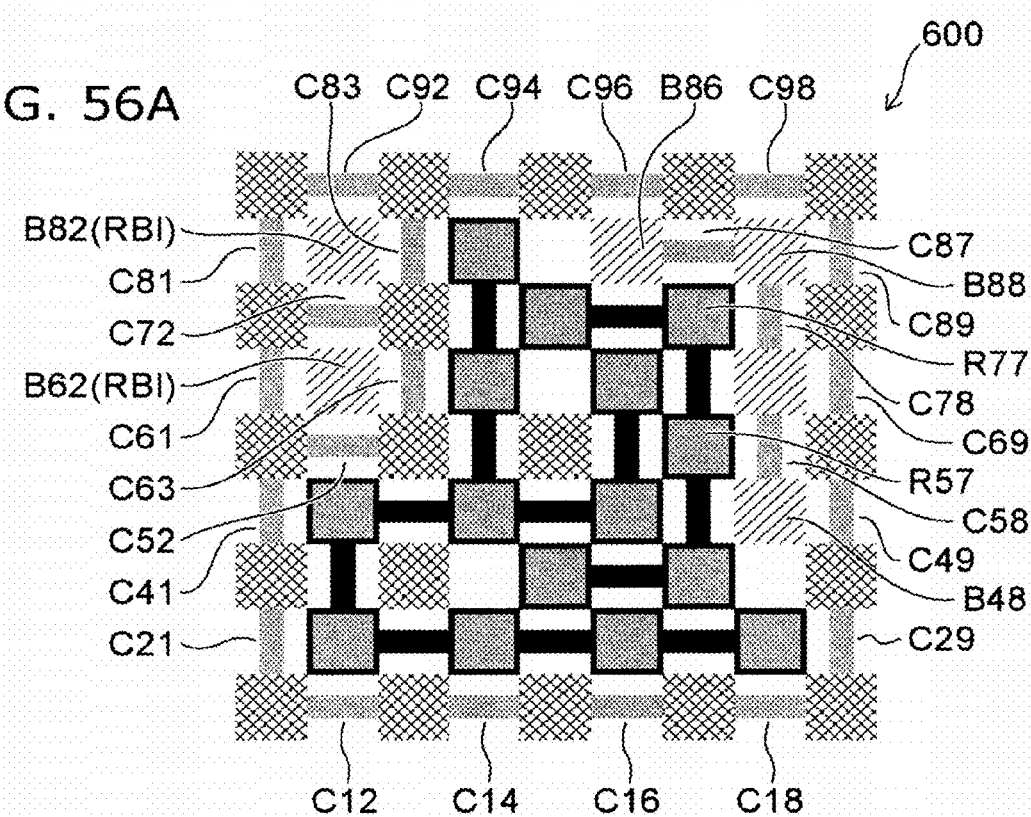
FIG. 56A is a plan view illustrating a state in which a wiring is drawn on the sidewall wiring grid in the sixth embodiment.
Figure 56B:
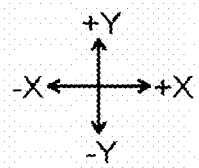
FIG. 56B shows an XY rectangular coordinate system adopted in FIG. 56A.

FIG. 56A is a plan view illustrating a state in which a wiring is drawn on the sidewall wiring grid in the sixth embodiment shown as S4 of FIG. 50, and FIG. 56B shows an XY rectangular coordinate system adopted in FIG. 56A.

As shown in FIG. 56A, the dummy wiring is disposed on the grid C possible to be allocated. The dummy wiring connecting the adjacent grids R in the X direction is disposed on the grid C12, the grid C14, the grid C16, the grid C18, the grid C92, the grid C94, the grid C96 and the grid C98 in the outermost circumference of the sidewall wiring grid 600, and the dummy wiring connecting the adjacent grids R in the Y direction is disposed on the grid C21, the grid C41, the grid C61, the grid C81, the grid C29, the grid C49, the grid C69 and the grid C89. The dummy wiring connecting the adjacent girds R in the X direction is disposed on the grid C52. The dummy wiring connecting the adjacent grids B in the X direction is disposed on the grid C87. The dummy wiring connecting the adjacent grids B in the Y direction is disposed on the grid C58 and the grid C78. The dummy wiring connecting the adjacent grids R in the X direction according to the preferred direction is disposed on the grid C72 to which any dummy wiring can be allocated. The grid B62 and the grid B 82 are isolated grids RBI.

Figure 57A:
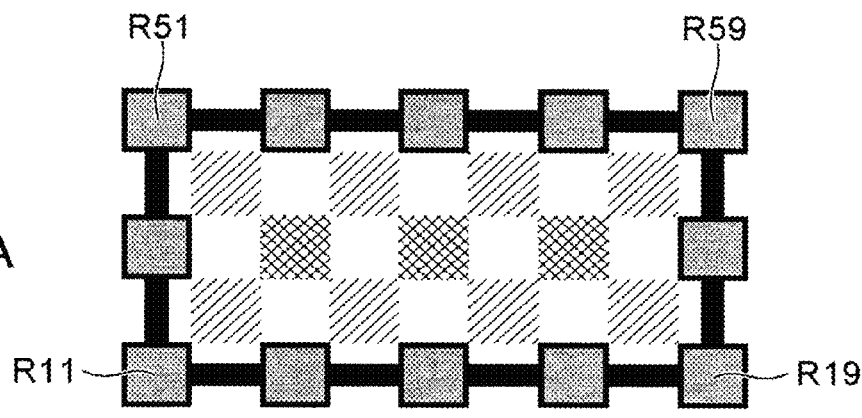
FIGS. 57A to 57C are plan views illustrating a method for determining a preferred direction of a dummy wiring.
Figure 57B:
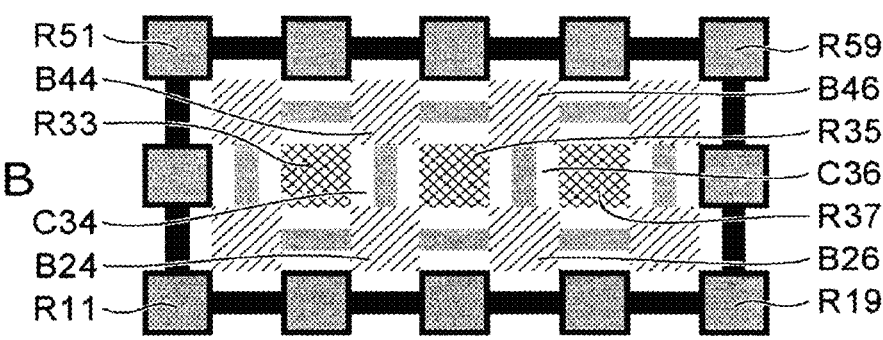
Figure 57C:
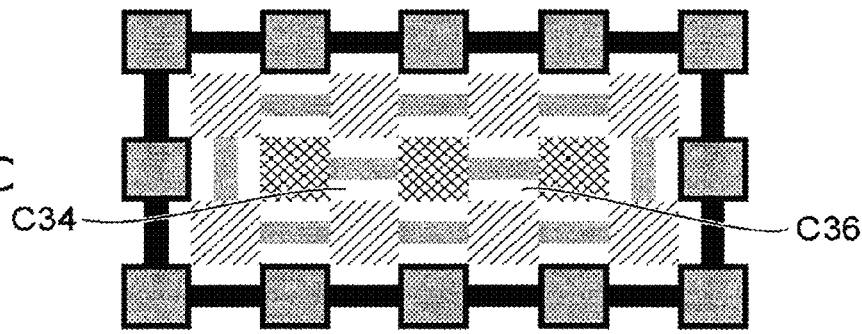
Figure 57D:
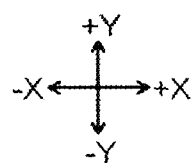
FIG. 57D shows an XY rectangular coordinate system adopted in FIGS. 57A to 57C.

FIGS. 57A to 57C are plan views illustrating a method for determining a preferred direction of a dummy wiring, and FIG. 57D shows an XY rectangular coordinate system adopted in FIGS. 57A to 57C.

As shown in FIG. 57A, for example, in the case where a rectangular wiring pattern having four corners of the grid R11, the grid R19, the grid R51 and the grid R59 is formed, perpendicular preference, namely, the dummy wiring connecting in the Y direction is assumed to be preferentially allocated.

In this case, as shown in FIG. 57B, the dummy wiring connecting the adjacent grid B24 and the grid B44 in the Y direction and the dummy wiring connecting the grid B26 and the grid B46 in the Y direction are allocated on the grid C34 and the grid C36. However, in this case, the grid R33, the grid R35 and the grid R37 are isolated from the other grids (hereinafter it may be simply referred to as "isolated grid"). In the lithography and patterning in the manufacturing process of the semiconductor device, it is difficult to form a wiring corresponding to an isolated grid. Then, it is discussed whether change of the connection direction of the dummy wiring is possible or not. In FIG. 57B, the dummy wirings around the isolated grids R33, R35 and R37 are taken as candidates for the change. The connection direction of the candidate dummy wirings is changed and horizontal preference, namely, the dummy wiring connecting in the X direction is allocated.

As shown in FIG. 57C, the dummy wiring connecting the adjacent grids R in the X direction is disposed on the grid C34 and the grid C36. This can reduce the number of the isolated grids.

As shown in step S5 of FIG. 50, in FIG. 56A described above, change of connection direction of the dummy wiring shorter than a prescribed length or the dummy wiring around the isolated red/blue grids will be tried. It is because of difficulty of forming a wiring corresponding to a dummy wiring shorter than a prescribed length in the lithography or patterning in the manufacturing process of the semiconductor device. The change of the connection direction will be tried in order of a length from a tip end of the dummy wiring pattern to a bend portion of the dummy wiring pattern. For example, the prescribed length is taken as 4 grids. The grid B48 is at the tip end of the dummy wiring pattern, and a length to the grid B88 at the bend portion of the dummy wiring is a length of 4 grids. Then, the change of the connection direction of the dummy wiring disposed on the grid C58 and the grid C78 between the grid B48 and the grid B88 will be tried. However, since the grid R57 and the grid R77 contacting the grid C58 and the grid C78 in the −X direction are set to the pathway of the wiring, the dummy wiring cannot be connected. Thus, the connection direction of the dummy wiring disposed on the grid C58 and the grid C78 cannot be changed.

Next, for example, the prescribed length is taken as 2 grids. The grid B86 is at the tip end of the dummy wiring pattern, and a length to the grid B88 at the bend portion of the dummy wiring is a length of 2 grids. Then, the change of the connection direction of the dummy wiring arranged on the grid C78 between the grid B86 and the grid B88 will be tried. However, since the grid R77 contacting the grid C87 in the −Y direction is set to the pathway of the wiring, the dummy wiring cannot be connected. Thus, the connection direction of the dummy wiring disposed on the grid C87 cannot be changed.

Next, for example the isolated grid will be discussed. The grid B62 and the grid B82 are at the tip end of the dummy wiring pattern, and are isolated grids. Then, the change of the connection direction of the dummy wiring disposed on the grid C around the grid B62 and the grid B82 will be tried. The connection direction of the dummy wiring of the grid C72 can be changed to the Y direction. So the dummy wiring of grid C72 is not the pathway of the wiring.

Figure 58A:
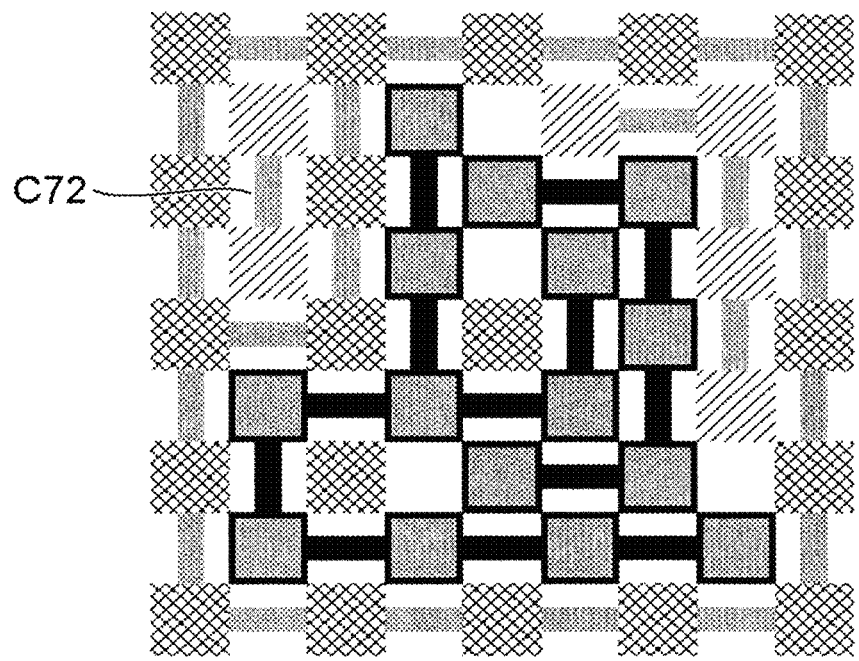
FIG. 58A is a plan view illustrating a state in which a wiring is drawn on the sidewall wiring grid in the sixth embodiment.
Figure 58B:
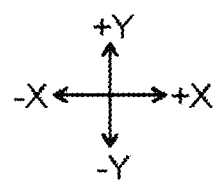
FIG. 58B shows an XY rectangular coordinate system adopted in FIG. 58A.

FIG. 58A is a plan view illustrating a state in which a wiring is drawn on the sidewall wiring grid in the sixth embodiment, and FIG. 58B shows an XY rectangular coordinate system adopted in FIG. 58A.

As shown in FIG. 58A, the connection direction of the dummy wiring of the grid C72 can be changed to the Y direction. This can reduce the number of isolated grids.

FIG. 59A is a plan view illustrating a state in which a wiring is drawn on the sidewall wiring grid in the sixth embodiment, and FIG. 59B shows an XY rectangular coordinate system adopted in FIG. 59A.

As shown in step S6 of FIG. 50 and in FIG. 59A, a mandrel is selected. For example, the grid R, the wiring connected to the grids R and the dummy wiring are selected as the mandrel. Next, the one-line cutting pattern is allocated to the blank grid C0. The color of the one-line cutting pattern is a color of the selected mandrel. It is for preventing connection of the wiring to the dummy wiring. The one-line cutting pattern may be one kind of pattern with a thin slit as shown in FIG. 59A.

In this manner, the layout of the wiring can be designed using the sidewall method wiring grid.

According to the design method of the wiring layout of the embodiment, the wiring layout including the wiring pattern connecting the grid SP of the start point to the grid GP of the end point can be designed. In both of the wiring pattern including the pathway passing through only the red and colorless grids, and the wiring pattern including the pathway passing through only the blue and colorless grids, the wiring layout including the pattern forming the separated wiring can be designed. Hereinafter, the above may be simply referred to as "separated wiring".

Furthermore, since the wiring pattern including the pathway passing through only the red and colorless grids and the wiring pattern including the pathway passing through only the blue and colorless grids are divided each other, one of the wiring pattern including the pathway passing through only the red and colorless grids and the wiring pattern including the pathway passing through only the blue and colorless grids can be the pattern of the mandrel of the wiring layout formed by the sidewall method. Thus, in the wiring layout formed by the sidewall method, free design including the separated wiring becomes possible, and highly integrating the wiring layout can be achieved.

According to the embodiment, difficult patters for forming in the lithography and the patterning can be reduced by changing the connection direction of the dummy wiring.

Figure 60A:
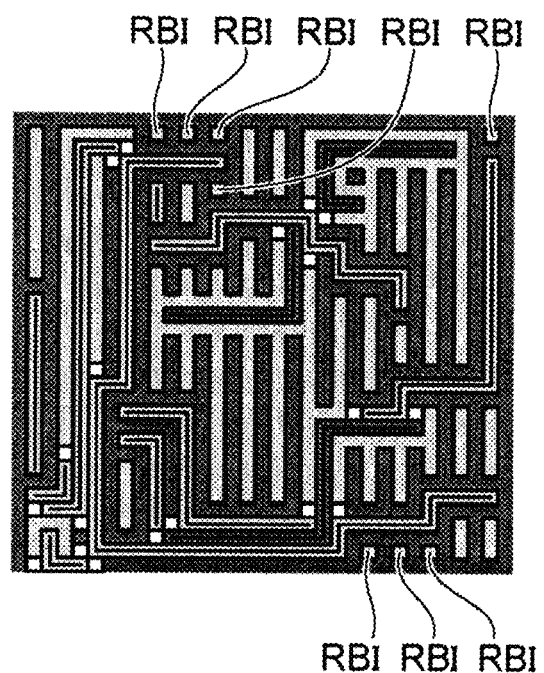
FIG. 60A is a plan view illustrating a state in which a wiring is drawn on the sidewall wiring grid before changing a connection direction of the dummy wiring, and FIG. 60B a plan view illustrating a state in which a wiring is drawn on the sidewall wiring grid after changing a connection direction of the dummy wiring.
Figure 60B:
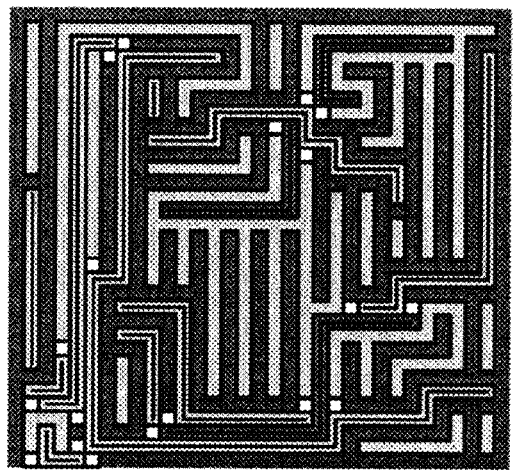

FIG. 60A is a plan view illustrating a state in which a wiring is drawn on the sidewall wiring grid before changing a connection direction of the dummy wiring, and FIG. 60B a plan view illustrating a state in which a wiring is drawn on the sidewall wiring grid after changing a connection direction of the dummy wiring.

As shown in FIG. 60A, before the change of the connection direction of the dummy wiring, isolated grids RBI are arranged.

As shown in FIG. 60B, as a result of the change of the connection direction in order of a length from a tip end of the dummy wiring pattern to a bend portion of the dummy wiring pattern, the number of the isolated grids RBI can be reduced.

For example, the number of portions including the isolated grids, where formation is difficult in the lithography and the patterning, can be reduced by the change of the connection direction. For example, when the grid R and the wiring connected to the grids R are selected as the mandrel, the number of the isolated grids RBI can be reduced from 35 to 12. For another example, when the grid B and the wiring connected to the grids B are selected as the mandrel, the number of isolated grids RBI can be reduced from 20 to 18.

The wiring has been drawn by disposing the wiring manually between the grid of the start point and the grid of the end point, however the disposal is not limited thereto. For example, information about the grid of the start point and the grid of the end point is given as a netlist, and an automatic wiring algorithm represented by a maze method is applied so as to pass through only grid of the same color or colorless, and thus the wiring pathway may be automatically determined.

Next, a program supporting the design of the wiring layout formed by the sidewall method will be described.

The program according to the embodiment causes the computer to perform the following procedure.

First, the procedure is performed displaying the sidewall wiring grid 600 on a display device, namely, the display shown as FIG. 49, for example. As shown in FIG. 50A, the sidewall wiring grid 600 is provided with three kinds of grids including the plurality of red grids R and the plurality of blue grids disposed in a matrix configuration, and the plurality of colorless grids C. The computer preferably color-codes the red grids and the blue grids with different colors or hatches differently on the display device so as to lay out easily for a designer.

Next, the designer selects the grid SP of the start point and the grid GP of the end point of the wiring, for example, by a drag operation of a mouse via an input device on the sidewall wiring grid 600 displayed on the display device. At this time, the computer performs the procedure displaying the selected grid SP of the start point and the selected grid GP of the end point.

Next, the designer disposes the wiring according to a connection rule from the grid S to the grid G via the display device on the sidewall wiring grid 600 displayed on the display device. At this time, the computer performs the procedure connecting the adjacent grids with the disposed wiring.

Next, the designer specifies a range of the wiring pattern via the input device. At this time, the computer performs the procedure displaying a trimming mask pattern 601 covering the specified wiring pattern. When the designer instructs to store the trimming mask pattern 601 via the input device, the computer performs the procedure storing the trimming mask pattern 601 displayed on the display device. Furthermore, when the designer instructs to clear the trimming mask pattern 601 from the display via the input device, the computer performs the procedure erasing the trimming mask pattern 601 displayed on the display device.

Next, the designer specifies the preferred direction of the dummy wiring disposed on the grid C having no wiring disposed on the sidewall wiring grid 600 displayed on the display device via the input device. At this time, the computer performs the procedure in which the dummy wiring with the preferred direction being preferred is disposed on the grid C where the dummy wiring can be allocated. The computer performs the procedure in which the grid C where the dummy wiring cannot be allocated is replaced with the blank grid C0.

Next, the designer specifies a prescribed length of the dummy wiring having the connection direction to be changed via the input device. At this time, the computer performs the procedure displaying the dummy wiring with a length shorter than the prescribed length or the dummy wiring around the isolated red/blue grids as a candidate for the change.

The designer instructs to change the connection direction of the dummy wiring of the candidate via the input device. At this time, the computer performs the procedure changing the connection direction of the dummy wiring of the candidate of the change to display the change.

Next, the designer selects the mandrel via the input device. At this time, the computer color-codes the red grid R or the blue grid B selected for the mandrel with different colors, and hatches differently so as to be easy for the designer to lay out on the sidewall wiring grid 600. The computer performs the procedure allocating the one-cutting pattern to the blank grid C0.

As a result, the wiring pattern including the pathway passing through only the red and colorless grids and the wiring pattern including the pathway passing through only the blue and colorless grids are patterns separated each other.

In this way, the program assisting the design of the wiring layout formed by the sidewall method allows the computer to perform to assist the design of the wiring layout as shown in FIG. 59A.

According to the program of the embodiment, it is possible to cause the computer to assist the design of the wiring layout, and thus a time needed for the design of the wiring layout formable by the sidewall method can be reduced. After the designer disposed a plurality of wirings and dummy wirings, the computer may perform the procedure in which the program replaces the pattern collectively by clicking a conversion button displayed in the display device. As a result, since the designer can arrange other parts in a state where each part is displayed, the layout is easy to be made.

Next, a method for manufacturing a semiconductor device including the wiring formed based on the wiring layout by the sidewall method is explained.

Figure 61A:
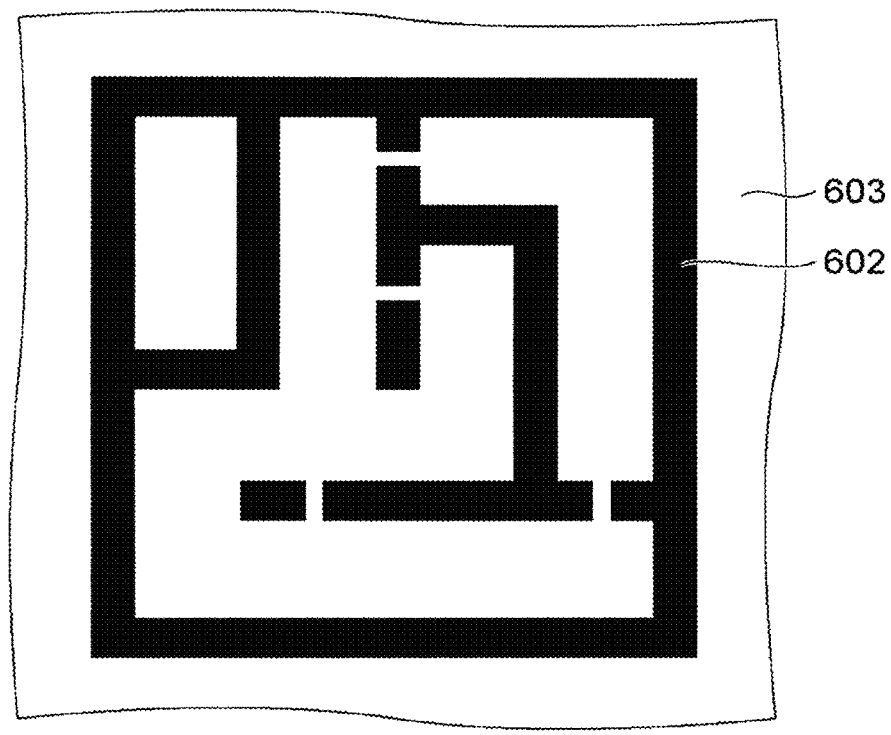
FIG. 61A is a process plan view illustrating a method for manufacturing a semiconductor device according to the sixth embodiment.
Figure 61B:
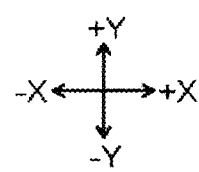
FIG. 61B shows an XY rectangular coordinate system adopted in FIG. 61A.

FIG. 61A is a mask pattern using a method for manufacturing a semiconductor device according to the sixth embodiment, and FIG. 61B shows an XY rectangular coordinate system adopted in FIG. 61A.

Figure 62A:
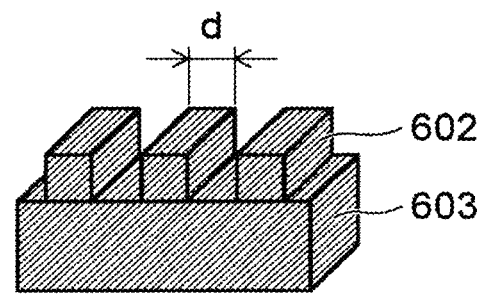
FIGS. 62A to 62C are process sectional views illustrating the method for manufacturing the semiconductor device according to the sixth embodiment.
Figure 62B:
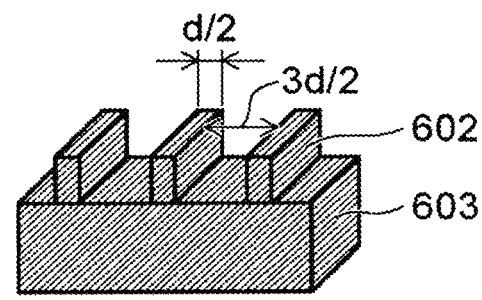
Figure 62C:
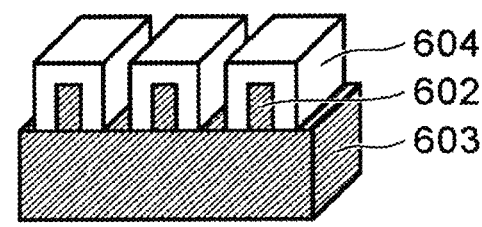

FIGS. 62A to 62C are process plan views illustrating the method for manufacturing the semiconductor device according to the sixth embodiment.

First, as shown in step S7 of FIG. 50, FIG. 61A, and FIG. 62A, in the layout of the wiring described above, for example, a mandrel 602 is formed on an insulating film 603, as the grid R selected for the mandrel 602, the wiring connected to the grid R, and the dummy wiring being a pattern of the mandrel 602. A width of the mandrel 602 is set to, for example, d. At this time, the mandrel patterns shown in FIGS. 6 to 9 or FIGS. 24 to 39 are adopt by the mask pattern shown as FIG. 61A.

Next, as shown in FIG. 62B, the mandrel 602 is subjected to slimming as necessary, and the width is set to d/2. At this time, a space between the mandrels 602 is set to 3d/2 being three times of the width d/2 of the mandrel 602.

Next, as shown in FIG. 62C, a sidewall 604 is formed so as to cover the mandrel 602. A thickness of the sidewall 604 is controlled to be d/2.

Figure 63A:
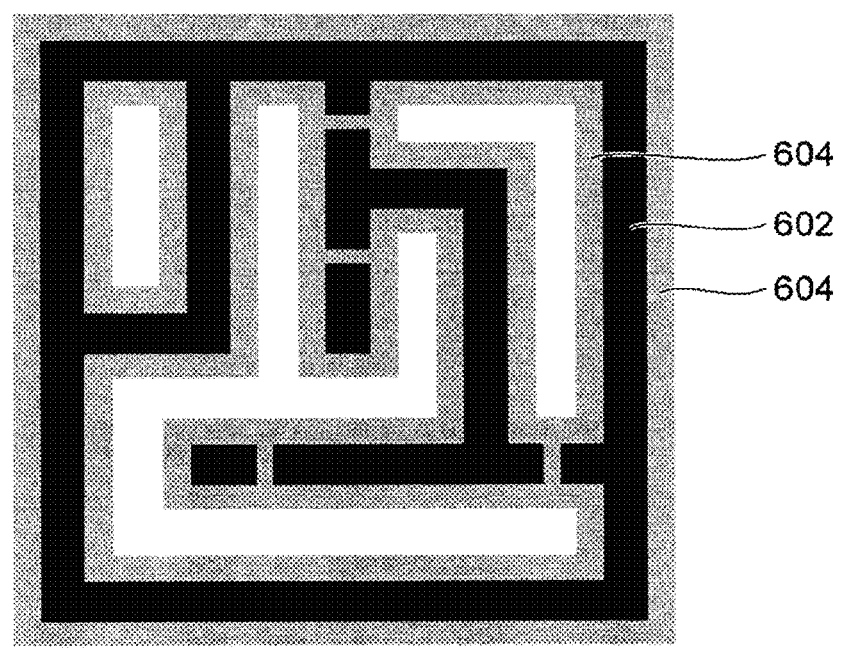
FIG. 63A is a process plan view illustrating the method for manufacturing the semiconductor device according to the sixth embodiment.
Figure 63B:
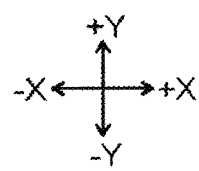
FIG. 63B shows an XY rectangular coordinate system adopted in FIG. 63A.

FIG. 63A is a process plan view illustrating the method for manufacturing the semiconductor device according to the sixth embodiment, and FIG. 63B shows an XY rectangular coordinate system adopted in FIG. 63A.

Figure 64A:
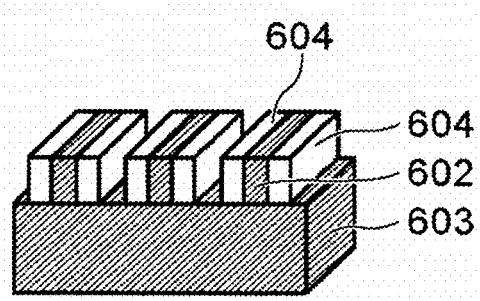
FIGS. 64A to 64C are process sectional views illustrating the method for manufacturing the semiconductor device according to the sixth embodiment.
Figure 64B:
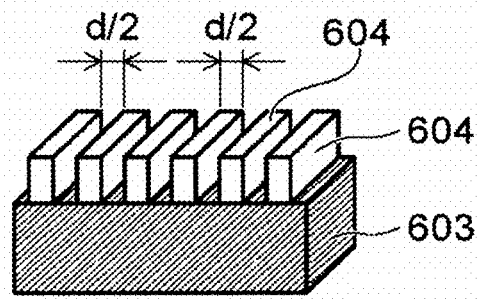
Figure 64C:
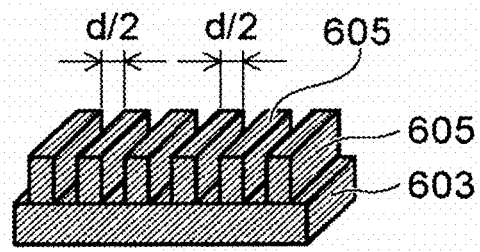

FIGS. 64A to 64C are process sectional views illustrating the method for manufacturing the semiconductor device according to the sixth embodiment.

Next, as shown in FIG. 63A and FIG. 64A, the sidewall 604 is subjected to etching back and an upper surface of the mandrel 602 is exposed.

Next, as shown in FIG. 64B, the mandrel 602 is removed by etching. Thereby, the sidewalls 604 with the width of d/2 are disposed with a space of d/2 on an insulating film 603.

As shown in FIG. 64C, the insulating film 603 is etched using the sidewall 604 as a mask, and thereby the insulating film 603 is selectively etched and a concave portion 605 is formed. After that, the sidewall 604 is removed. Thereby, the concave portions 605 with a width of d/2 are disposed with a space of d/2 on an upper surface of the insulating film 603.

Figure 65A:
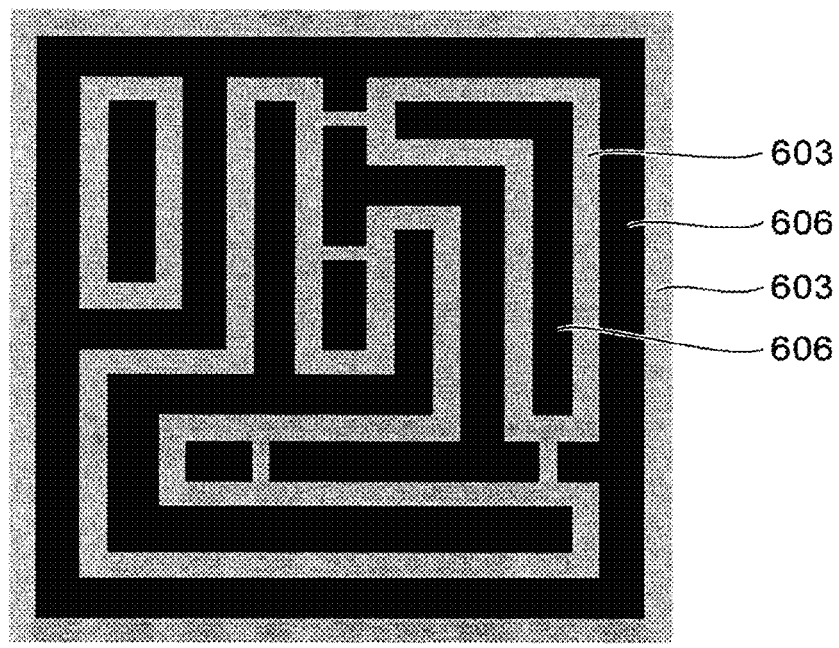
FIG. 65A is a process plan view illustrating the method for manufacturing the semiconductor device according to the sixth embodiment.
Figure 65B:
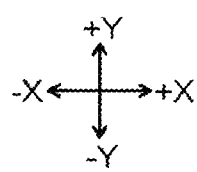
FIG. 65B shows an XY rectangular coordinate system adopted in FIG. 65A.
Figure 65C:
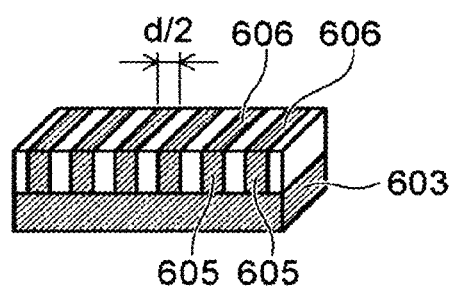
FIG. 65C is a process sectional view illustrating the method for manufacturing the semiconductor device according to the sixth embodiment.

FIG. 65A is a process plan view illustrating the method for manufacturing the semiconductor device according to the sixth embodiment, FIG. 65B shows an XY rectangular coordinate system adopted in FIG. 63A, and FIG. 65C is a process sectional view illustrating the method for manufacturing the semiconductor device according to the sixth embodiment.

Next, as shown in FIGS. 65A and 65C, a conductive material is deposited on the insulating film 603 so as to fill in the concave portion 605. The conductive material is planarized until the upper surface of the insulating film 603 is exposed. Thereby, wirings 606 with a width of d/2 are disposed with a space of d/2 on the upper surface of the insulating film 603. In this way, the wiring 606 buried in the concave portion 605 is formed by forming a pattern by a sidewall processing.

Figure 66A:
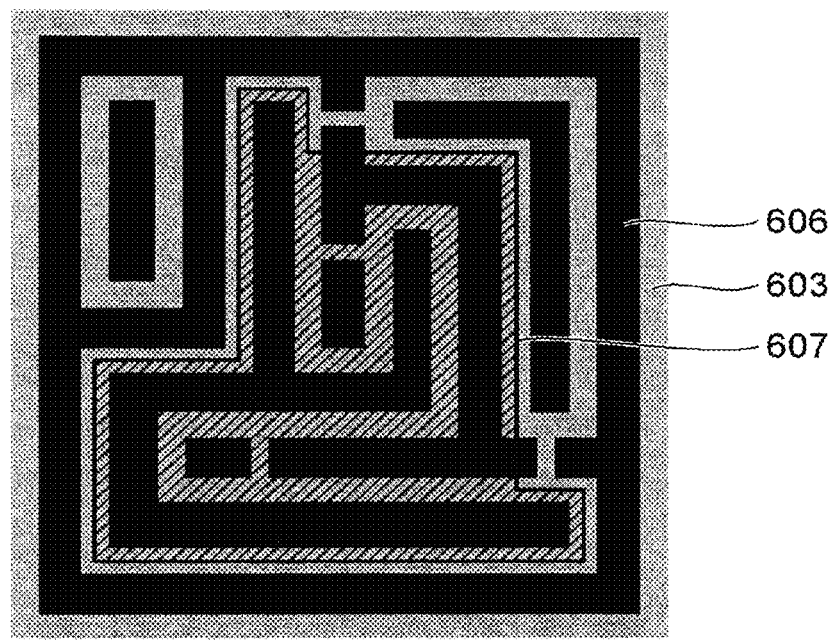
FIG. 66A is a process plan view illustrating the method for manufacturing the semiconductor device according to the sixth embodiment.
Figure 66B:
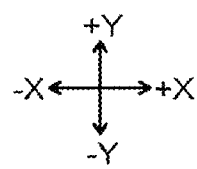
FIG. 66B shows an XY rectangular coordinate system adopted in FIG. 66A.

FIG. 66A is a process plan view illustrating the method for manufacturing the semiconductor device according to the sixth embodiment, and FIG. 66B shows an XY rectangular coordinate system adopted in FIG. 66A.

As shown in step S8 of FIG. 50 and in FIG. 66A, a trimming mask 607 is arranged on the insulating film 603 based on the trimming mask pattern 601.

Figure 67A:
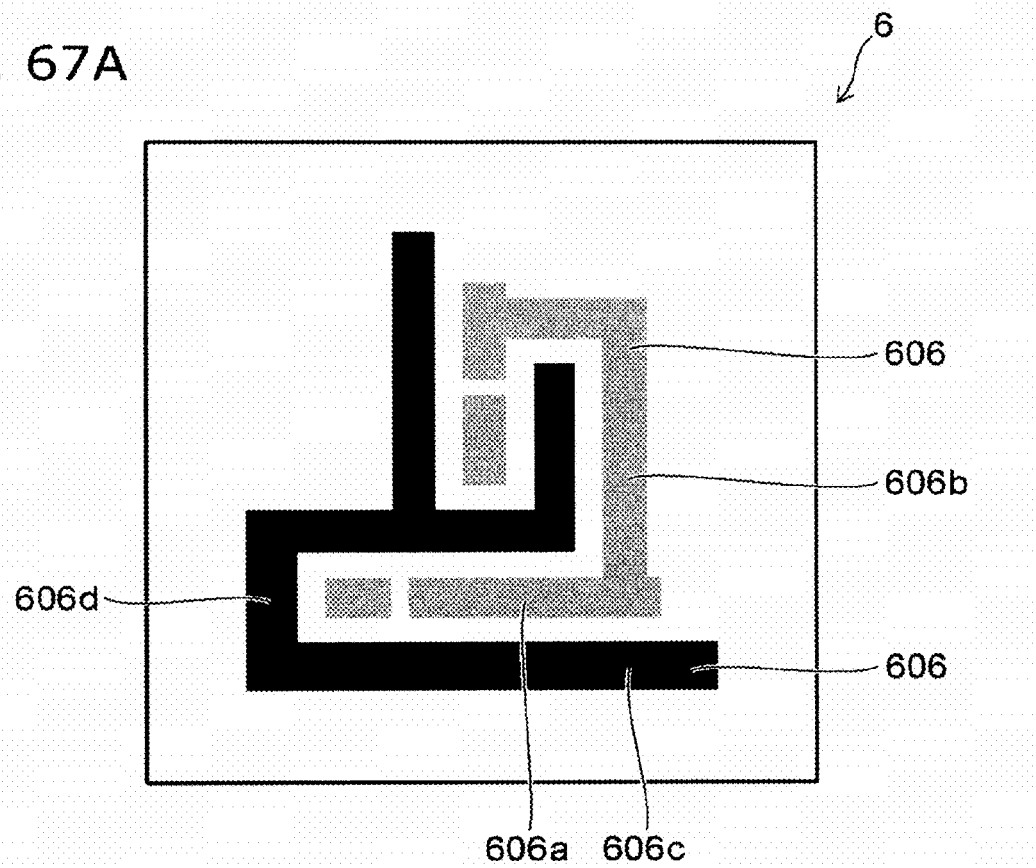
FIG. 67A is a process plan view illustrating the method for manufacturing the semiconductor device according to the sixth embodiment.
Figure 67B:
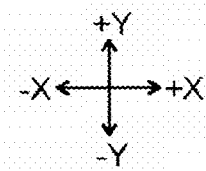
FIG. 67B shows an XY rectangular coordinate system adopted in FIG. 67A.

FIG. 67A is a process plan view illustrating the method for manufacturing the semiconductor device according to the sixth embodiment, and FIG. 67B shows an XY rectangular coordinate system adopted in FIG. 67A.

Next, as shown in FIG. 67A, unnecessary wiring patterns are removed by etching the insulating film 603 and the wiring 606 using the trimming mask 607 as a mask. In this way, a semiconductor device 6 is manufactured.

According to the method for manufacturing the semiconductor device of the embodiment, a length of a space between the adjacent wirings 40 in a direction perpendicular to an extending direction of the wiring 40 buried in the concave portion 605 can be smaller than a length of the smallest space of a pattern resolvable by a lithography method. Therefore, since the free design including the wiring space smaller than the minimum value of the space resolved by the lithography becomes possible, the semiconductor device including the highly integrated wiring can be manufactured.

In particular, the design of the wiring is possible with a focus on the final layout instead of designing the wiring by calculating the sidewall from the mandrel. As a result, design efficiency is markedly improved.

Next, the semiconductor device 6 according to the embodiment is described.

As shown in FIG. 67A, the semiconductor device 6 is provided with a plurality of wirings 606a connecting the grids R in the X direction, a plurality of wirings 606b connecting the grids R in the Y direction, a plurality of wirings 606c connecting grids B in the X direction, and a plurality of wirings 606d connecting the grids B in the Y direction.

When a plurality of first lines extending in the Y direction and disposed with ½ period of the third period in the X direction are supposed in the XY plane and integer numbers are allocated to the first lines in order from the end, and when a plurality of second lines extending in the X direction, disposed with ½ period of the fourth period in the Y direction, and intersecting the first lines are supposed in the XY plane and integer numbers are allocated to the second lines in order from the end, the wirings 606a are disposed in the odd-numbered first lines and the wirings 606b are disposed in the even-numbered first lines. Further, the wirings 606b are disposed in the odd-numbered second lines and the wirings 606a are disposed in the even-numbered second lines.

Then, at least one of the wirings 606a connects with the wiring 606b and at least one of the wirings 606c connects with the wiring 606d. Further, the wiring 606a and the wiring 606b, and the wiring 606c and the wiring 606d are separated from each other.

The semiconductor device 6 according to the embodiment includes the wiring space narrower than the minimum value of space by the resolution of lithography, and therefore, the degree of integration is high.

Seventh Embodiment

Next, a seventh embodiment will be described.

First, a design method of a wiring layout formed by the two-time sidewall method according to the seventh embodiment will be described.

Figure 68A:
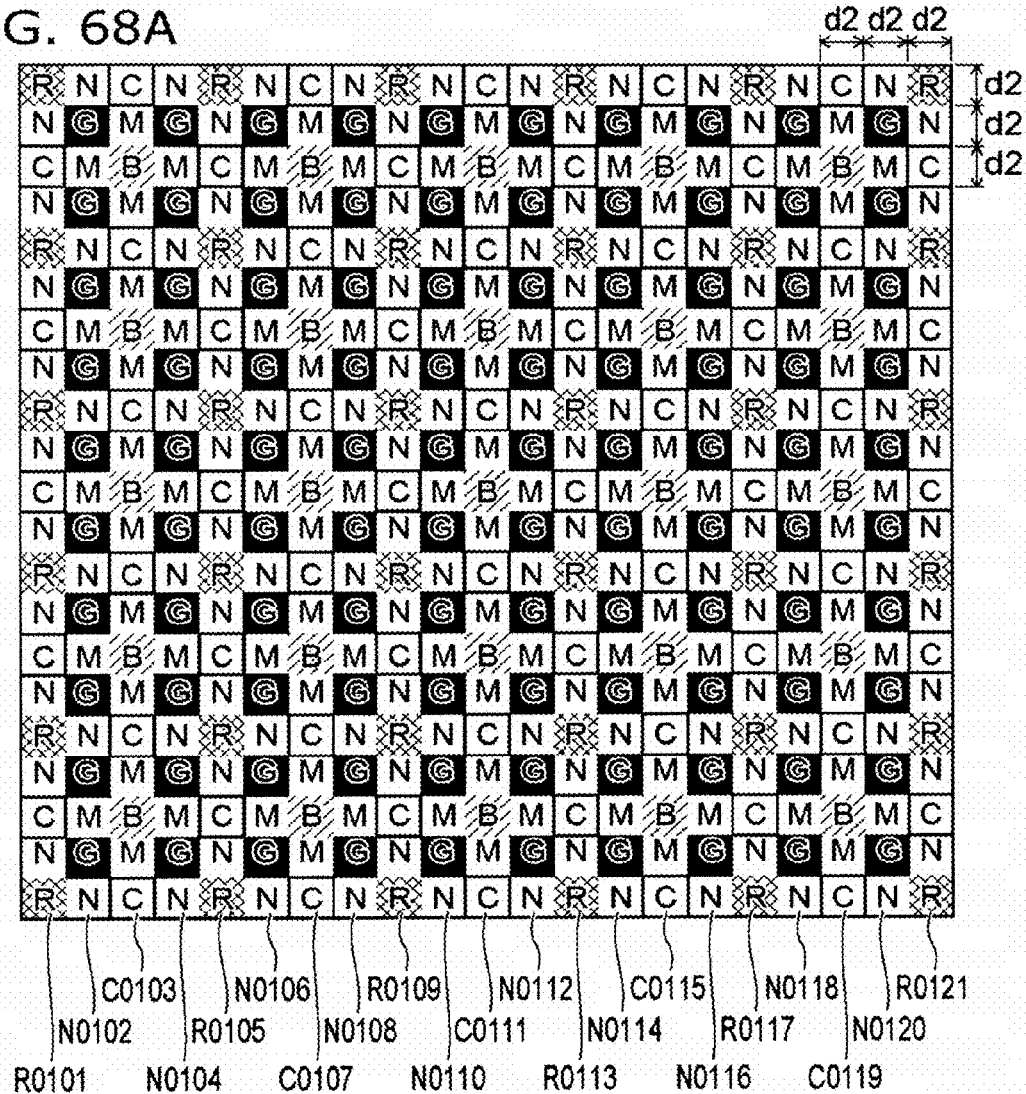
FIG. 68A is a plan view illustrating a sidewall wiring grid used in a design method of a wiring layout according to a seventh embodiment.
Figure 68B:
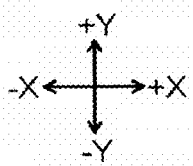
FIG. 68B shows an XY rectangular coordinate system adopted in FIG. 68A.

FIG. 68A is a plan view illustrating a sidewall wiring grid used in a design method of a wiring layout according to a seventh embodiment, and FIG. 68B shows an XY rectangular coordinate system adopted in FIG. 68A.

As shown in step S1 of FIG. 50 and in FIG. 68A, first, a sidewall wiring grid 700 is prepared. The sidewall wiring grid 700 is used for a wiring layout formed by the sidewall method.

As shown in FIG. 68B, also in the embodiment, the XY rectangular coordinate system similar to the above is adopted in order to describe the sidewall wiring grid 700.

The sidewall wiring grid 700 includes, for example, six kinds of grids, namely, a plurality of red grids R disposed in a matrix configuration, a plurality of blue grids B disposed in a matrix configuration, a plurality of green grids G disposed in a matrix configuration, a plurality of colorless grids C, a plurality of colorless grids M and a plurality of colorless grids N.

The plurality of red grids R are disposed in a matrix configuration with a fifth period in the X direction and with a sixth period in the Y direction. The plurality of blue grids B are disposed in a matrix configuration with a fifth period in the X direction and with a sixth period in the Y direction. However, the blue grids B are disposed with a shift of a half period of the fifth period in the X direction and with a shift of a half period of the sixth period in the Y direction.

The plurality of green grids G are disposed in a matrix configuration with a half period of the fifth period in the X direction and with a half period of the sixth period in the Y direction. However, the green grids G are disposed with a shift of ¼ period of the fifth period in the X direction and with a shift of ¼ period of the sixth period in the Y direction.

The plurality of colorless grids C are disposed one by one in a midway between the adjacent red grids R in the X direction and in a midway between the adjacent blue grids B in the X direction. Therefore, the plurality of colorless grids C include grids disposed in a matrix configuration with the fifth period in the X direction and with the sixth period in the Y direction and grids disposed with a shift of the half of the fifth period in the X direction and with a shift of the half period of the sixth period in the Y direction.

The plurality of colorless grids M are disposed one by one between the grid B and the grid C. The plurality of colorless grids N are disposed one by one between the grid R and the grid C.

In the embodiment, the fifth period is taken as the same as the sixth period. Shapes of the red grid R, the blue grid B, the green grid G, the colorless grid C, the colorless grid M and the colorless grid N are taken as a square with one side of a length d2 equal to ¼ period of the fifth period and the sixth period. When the X direction of the sidewall wiring grid 700 is taken as a row direction and the Y direction is taken as a column direction, the sidewall wiring grid 700 is in a matrix configuration in which six kinds of grids are disposed in the row direction and the column direction.

An arbitrary grid R is taken as the grid R0101 at the 1st row and the 1st column, namely, at the 01st row and the 01st column. Starting from the grid R0101, the grid R at the j-th column in the X direction and at the i-th row in the Y direction is taken as the grid Rij. For example, the arrangement of the grids in the first row is in order of the grid N0102, the grid C0103, the grid N0104, the grid R0105, the grid N0106, the grid C0107, the grid N0108, the gird R0109, the grid N0110, the grid C0111, the grid N0112, the grid R0113, the grid N0114, the grid C0115, the grid N0116, the grid R0117, the grid N0118, the grid C0119, the grid N0120 and the grid R0121 from the grid R0101 in the +X direction.

Figure 69A:
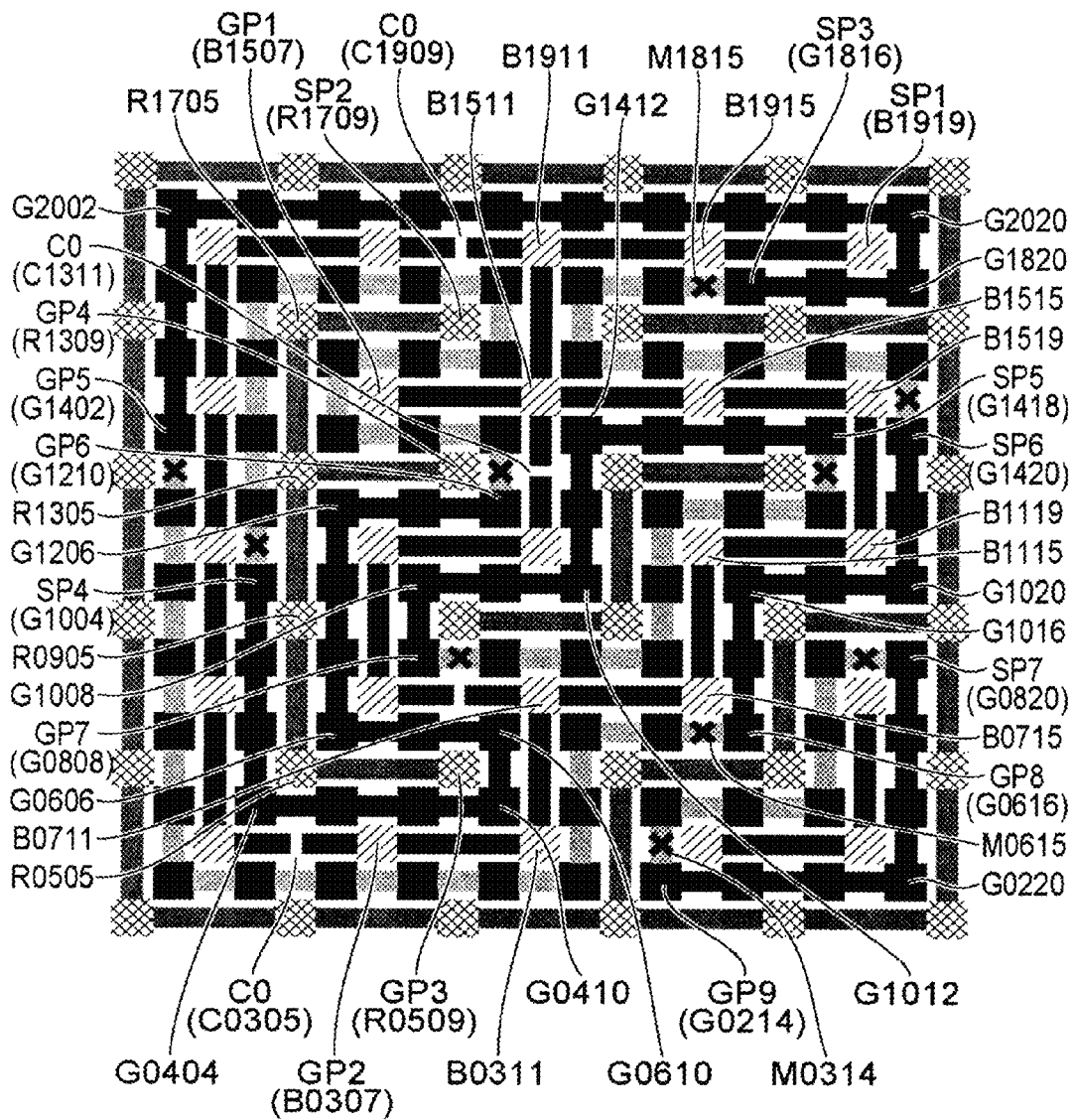
FIG. 69A is a plan view illustrating a state in which a wiring is drawn on the sidewall wiring grid in the sixth embodiment.
Figure 69B:
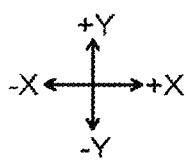
FIG. 69B shows an XY rectangular coordinate system adopted in FIG. 69A.

FIG. 69A is a plan view illustrating a state in which a wiring is drawn on the sidewall wiring grid in the seventh embodiment, and FIG. 69B shows an XY rectangular coordinate system adopted in FIG. 69A.

As shown in step S2 of FIG. 50 and in FIG. 69A, grid wiring is performed through connecting between the grids with a wiring. When connecting between the grids with a wiring, following four connection rules are applied in addition to the three connection rules in the sixth embodiment described above.

The first is that a wiring connecting between the red grids R or a wiring connecting between the blue grids B can be disposed on the grid C. The second is that a wiring connecting between the blue grids B or a wiring connecting between the green grids G can be disposed on the grid M.

The third is that a wiring connecting between the red grids R or a wiring connecting between the green grids G can be disposed on the grid N. The fourth is when a wiring having the green grid G as a pathway is bent, the wiring can be bent so as to come around the red grid R or the blue grid B being inside the wiring, and cannot be bent so as to come around the grid C being inside the wiring.

For example, a wiring is disposed between the grid B1919 taken as the grid SP1 of the start point and the grid B1507 taken as the grid GP1 of the end point via the grid B1915, the grid 81911 and the grid B1511, and then the grid SP1 of the start point becomes continuous with the grid GP 1 of the end point. Furthermore, a wiring is disposed between the grid B1511 and the grid B0307 taken as the grid GP2 of the end point via the grid B1515, the grid B1519, the grid B1119, the grid B1115, the grid 80715, the grid B0711 and the grid B0311, and then the grid SP1 of the start point becomes continuous with the grid GP2 of the end point.

Similarly, a wiring is disposed between the grid R1709 taken as the grid SP2 of the start point and the grid R0509 taken as the grid GP3 of the end point via the grid R1705, the grid R1305, the grid R0905 and the grid R0505, and then the grid SP2 of the start point becomes continuous with the grid GP3 of the end point. Furthermore, a wiring is disposed between the grid R1305 and the grid R1309 taken as the grid GP4 of the end point, and then the grid SP2 of the start point becomes continuous with the grid GP4 of the end point.

Furthermore, a wiring is disposed between the grid G1816 taken as the grid SP3 of the start point and the grid G1402 taken as the grid GP5 of the end point via the grid G1820, the grid G2020 and the grid G2002, and then the grid SP3 of the start point becomes continuous with the grid GP5 of the end point.

Similarly, a wiring is disposed between the grid G1004 taken as the grid SP4 of the start point and the grid G1210 taken as the grid GP6 of the end point via the grid G0404, the grid G0410, the grid G0610, the grid G0606 and the gird G1206, and then the grid SP4 of the start point becomes continuous with the grid GP6 of the end point.

A wiring is disposed between the grid G1418 taken as the grid SP5 of the start point and the grid G0808 taken as the grid GP7 of the end point via the grid G1412, the grid G1012 and the grid G1008, and then the grid SP5 of the start point becomes continuous with the grid GP7 of the end point.

A wiring is disposed between the grid G1420 taken as the grid SP6 of the start point and the grid G0616 taken as the GP8 of the end point via the grid G1020 and the grid G1016, and then the grid SP6 of the start point becomes continuous with the grid GP8 of the end point.

A wiring is disposed between the grid G0820 taken as the grid SP7 of the start point and the grid G0214 taken as the grid GP9 of the end point via the grid G0220, and then the grid SP7 of the start point becomes continuous with the grid GP9 of the end point. When needed, a trimming mask pattern is formed similar to the sixth embodiment described above.

Next, using a method similar to the sixth embodiment described above, first, a pattern of the dummy wiring connecting the red grids R and the blue grids B is disposed. The dummy wiring connecting the adjacent red grids R is disposed on one grid C and two grids N. The dummy wiring connecting the adjacent blue grids is disposed on one grid C and two grids M.

Next, a mandrel is selected. For example, the grid B, the wiring connected to the grid B and the dummy wiring are selected for the mandrel. Next, one-cutting pattern is allocated to the blank grid C0 (the grid C0305, the grid C1909, the grid C1311). The allocated one-cutting pattern has a color of the selected mandrel.

The dummy wiring connecting between the green grids G is disposed on the grid M and the grid N capable of being allocated. The dummy wiring is allocated to the green grid M0314, grid M1815 as well, on which the dummy wiring cannot be allocated according to the rule that the dummy wiring is allocated between the red grids R and between the blue grids B. Different from the case of the dummy wiring allocated between the red grids R and between the blue grids B, one-cutting pattern cannot be allocated to the dummy wiring disposed between the green grids G.

For example, the dummy wiring between grids G may also be cut by the method shown in FIG. 70A to FIG. 75B. FIG. 70A to FIG. 75D are schematic views showing the process of the two-time sidewall method. FIG. 70A is a plan view showing the upper face of an underlying layer 701. FIG. 70B is a cross-sectional view along the A-A line shown in FIG. 70A. The same applies from FIG. 71A to FIG. 75B.

As shown in FIG. 70A and FIG. 70B, a mandrel 703 is formed on the underlying layer 701. The width of the mandrel 703 is the width d of the wiring pattern, and the space between neighboring mandrels 703 is also made to be d. Subsequently, the mandrel 703 is slimmed so that the line width thereof is d/2.

Next, as shown in FIG. 71A and FIG. 71B, a sidewall (sidewall film 705 in which etching rate differs from mandrel 703) is formed on a side face of the mandrel 703. The sidewall film 705 is formed, for example, so that the width thereof is d/2. Consequently, a space of a width of d/2 is formed between neighboring mandrels 703 including the sidewalls.

Next, as shown in FIG. 72A and FIG. 72B, the mandrel 703 is selectively removed, and the sidewall film 705 is slimed to be the line width of d/4. Subsequently, using the sidewall film 705 as a new mandrel, a sidewall (an sidewall film 707 in which etching rate differs from sidewall 705) is formed on the side face thereof. The sidewall film 707 is formed so that the line width thereof is d/4. Consequently, a space of a width of d/4 is formed between neighboring mandrels (sidewall films 705) including the sidewalls.

Next, as shown in FIG. 73A and FIG. 73B, the dummy wiring part between grids G is covered, for example, with a resist 709. Then, the sidewall film 705 that is a mandrel is removed. Since the dummy wiring part is covered with the resist 709, the sidewall film 705 is not removed in the part. Consequently, a wiring space of a width d/4 surrounded by the sidewall film 707 is formed on the underlying layer 701.

Subsequently, as shown in FIG. 74A and FIG. 74B, the underlying layer 701 is etched using the sidewall film 707 as a mask, so as to form a wiring trench 713. As shown in FIG. 74A, no wiring trench is formed in the part where the sidewall film 705 is left.

Next, as shown in FIG. 75A and FIG. 75B, a wiring material is embedded into the wiring trench to form a wiring 715. As the result, as shown in FIG. 75A, no wiring 715 is formed in the dummy wiring part, and the wiring between grids G can be cut.

Alternatively, wirings corresponding to these grids G may be cut later by electron beam or laser or the like from the outside. It may also be possible to cut unnecessary pattern using a trimming mask, which is formed by using an apparatus that is able to expose a fine pattern with EUV (extreme ultraviolet).

In this manner, the layout of the wiring can be designed using wiring grid according to the sidewall method.

According to the design method of the wiring layout of the embodiment, the wiring layout can be designed including the wiring pattern connecting the grid SP of the start point with the grid GP of the end point. The wiring layout can be designed including the pattern forming the separated wiring, where the wiring pattern includes the pathway passing through only the red and colorless grids; the wiring pattern includes the pathway passing through only the blue and colorless grids; and the wiring pattern includes the pathway passing through only the green and colorless grids.

Furthermore, the wiring pattern including the pathway passing through only the red and colorless grids, the wiring pattern including the pathway passing through only the blue and colorless grids and the wiring pattern including the pathway passing through only the green and colorless grids are divided one another. One of the wiring pattern including the pathway passing through only the red and colorless grids and the wiring pattern including the pathway passing through only the blue and colorless grids can be the pattern of the mandrel of the wiring layout formed by the two-time sidewall method in which the sidewall is formed two times. Thus, free design including the separated wiring becomes possible, and highly integrating the wiring layout can be achieved in the wiring layout formed by the sidewall method.

In the embodiment, when the wiring is disposed between the red grids R and the blue grids B, the wiring is also disposed between the green grids G, however the disposal is not limited thereto.

For example, first, a wiring is disposed between the red grids R and the blue grids B. After that, a dummy wiring is disposed between the red grids R and the blue grids B. Next, a mandrel is selected, and one-cutting pattern is disposed on the pattern selected as the mandrel. A wiring and a dummy wiring may be disposed between the green grids G. Also in this case, the wiring connecting between the green grids G is formed in a loop. Therefore, the whole pattern in a loop is used as the wiring, alternatively unnecessary portions are cut by a trimming mask.

Next, a design method of a wiring layout formed by the two-time sidewall method will be described.

The program according to the embodiment causes the computer to perform the procedure shown in the following.

First, the computer may perform the procedure displaying the sidewall wiring grid 700 on the display device, for example. The wiring grid 700 displayed includes, as shown in FIG. 68A, six kinds grids, namely, a plurality of red grids R disposed in a matrix configuration, a plurality of blue grids B disposed in a matrix configuration, a plurality of green grids G disposed in a matrix configuration, a plurality of colorless grids C, a plurality of colorless grids M and a plurality of colorless grids N.

Next, the designer selects the grid SP of the start point and the grid GP of the end point on the sidewall wiring grid 700 displayed in the display device by using the input device, for example, a mouse dragging a pointer thereto. At this time, the computer performs the procedure displaying the selected grid SP of the start point and the grid GP of the end point.

Next, the designer disposes a wiring from the grid SP to the grid GP according to the connection rule via the input device on the sidewall wiring grid 700 displayed in the display. At this time, the computer performs the procedure connecting between the adjacent grids by the disposed wiring.

Next, the designer specifies the preferred direction of the dummy wiring disposed on the grid C, the grid M and the grid N having no wiring disposed on the sidewall wiring grid 700 displayed on the display device via the input device. At this time, the computer performs the procedure in which the dummy wiring connecting is disposed between the red and blue grids on the grid C, the grid M and the grid N, where the dummy wiring can be allocated, with the preferred direction. The computer performs the procedure replacing the grid C with the blank grid C0, where the dummy wiring cannot be allocated on the grid C.

Next, the designer specifies a prescribed length identifying the dummy wiring having the connection direction to be changed via the input device. At this time, the computer performs the procedure displaying the dummy wiring with a length shorter than the prescribed length. The dummy wiring around the isolated grids are also displayed as a candidate for the change.

The designer instructs to change the connection direction of the dummy wiring of the candidate via the input device. At this time, the computer performs the procedures changing the connection direction of the dummy wiring, which is identified as the candidate to be changed, and displaying a result of the change.

Next, the designer selects the mandrel via the input device. At this time, the computer color-codes the red grid R or the blue grid B selected for the mandrel with different colors, and hatches differently so as to be easy for the designer to lay out on the sidewall wiring grid 700. The computer performs the procedure allocating the one-cutting pattern to the blank grid C0.

Next, the designer disposes the dummy wiring connecting between the green grids using the input device. At this time, the computer performs the procedure in which the dummy wiring connecting between the green grids is disposed on the grid M and the grid N on which the dummy wiring can be allocated.

As a result, the wiring pattern including the pathway passing through only the red and colorless grids and the wiring pattern including the pathway passing through only the blue and colorless grids, and the wiring pattern including the pathway passing through only the red and colorless grids are patterns separated one another.

In this way, the program assisting the design of the wiring layout formed by the sidewall method allows the computer to assist the design of the wiring layout as shown in FIG. 69A.

According to the program of the embodiment, it is possible to cause the computer to assist the design of the wiring layout, and thus a time needed for the design of the wiring layout formable by the two-time sidewall method can be reduced.

The semiconductor device including the wiring formed based on the wiring layout by the sidewall method forming the sidewall two times and the method for manufacturing the same are the same as those in FIGS. 23A to 23H shown in the third embodiment described above, and thus the description will be omitted.

Variation of the Seventh Embodiment

Next, a variation of the seventh embodiment will be described.

Figure 76A:
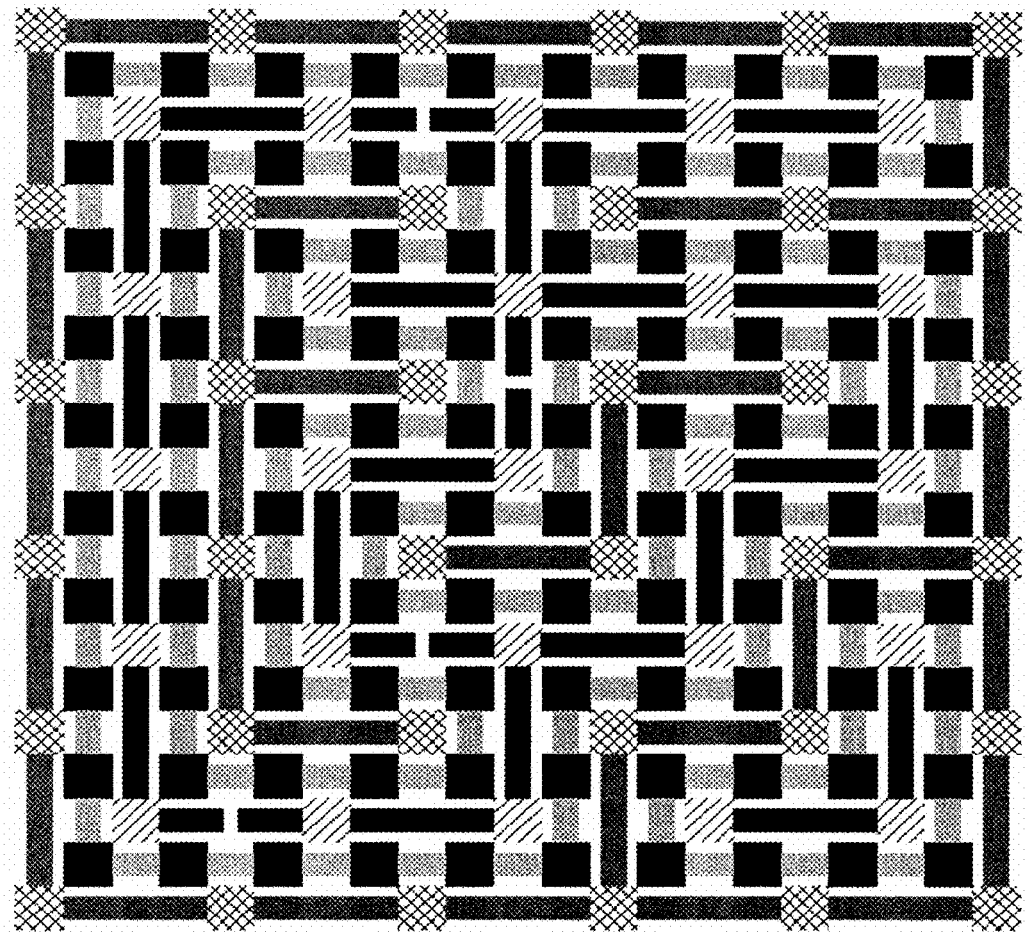
FIG. 76A is a plan view illustrating a state in which a wiring is drawn on a sidewall wiring grid in a variation of the seventh embodiment.
Figure 76B:
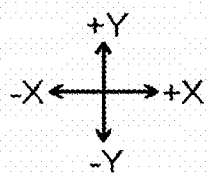
FIG. 76B shows an XY rectangular coordinate system adopted in FIG. 76A.

FIG. 76A is a plan view illustrating a state in which a wiring is drawn on a sidewall wiring grid in a variation of the seventh embodiment, and FIG. 76B shows an XY rectangular coordinate system adopted in FIG. 76A.

As shown in FIG. 76A, in the embodiment, the wiring disposed between the green grids is not cut using means of the electron beam or the like. Since the wiring disposed between the green grids is formed in a loop, the whole structure regards as a loop wiring. For example, the loop wiring is used as the grand line or the voltage source line.

The configuration and the effect other than the above of the embodiment are the same as those of the seventh embodiment described above.

Eighth Embodiment

Figure 77:
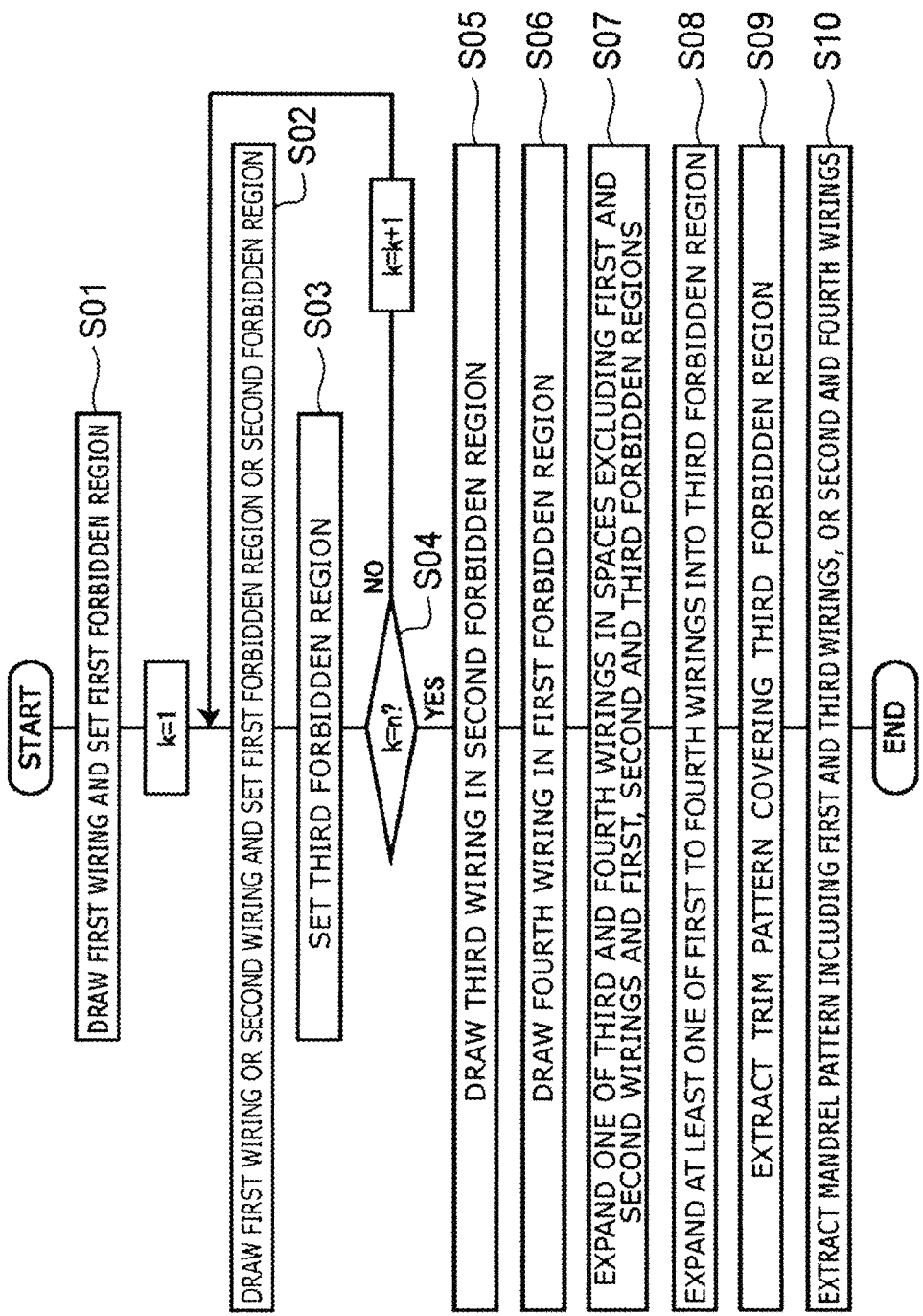
FIG. 77 is a flow chart showing a method of mask design according to an eighth embodiment.

FIG. 77 is a flow chart showing a method of mask design according to an eighth embodiment. The designer designs a mask layout, for example, using the input unit, the computer and the display unit shown in FIG. 49. That is, the designer operates the input unit to input design information into the controller in the computer. According to the inputted information, the controller, for example, draws (displays) a pattern on the screen of the display unit.

As shown in FIG. 77, on the basis of the inputted design information, the controller draws an initial first wiring on a plane, for example, on the screen of the display unit (S01). The first wiring, for example, connects two points set on the plane. The controller sets a first forbidden region adjacent to the first wiring, where a subsequent first wiring can not be drawn.

Subsequently, a counter "k" is set to be "1" and a following wiring is drawn (S02). On the basis of the design information, the controller determines, for example, whether a wiring to be drawn next is the first wiring or a second wiring.

When the kind of wiring to be drawn next is the first wiring, a first wiring is drawn connecting two points different from the two points for the initial first wiring. The first wiring to be newly drawn can not pass through the first forbidden region set on the plane. The controller sets the first forbidden region adjacent to the first wiring newly drawn.

On the other hand, when the kind of wiring to be drawn next is the second wiring, the controller draws a second wiring connecting two points different from the two points for the initial first wiring. The second wiring can pass through the first forbidden region, but does not intersect the first wiring and is drawn spaced from the first wiring. The controller sets a second forbidden region adjacent to the second wiring. The second forbidden region is a region where a subsequent second wiring can not be drawn.

Furthermore, a third forbidden region is set in a region where the first forbidden region and the second forbidden region overlap each other (S03). Both the first wiring and the second wiring can not be drawn in the third forbidden region.

Next, the controller determines whether or not the number of drawn wirings (the counter "k") is equal to the total number of wirings "n" specified in the design information. When the number "k" of drawn wirings is equal to the total number of wirings "n," the process moves to the subsequent step S05. On the other hand, when the number of drawn wirings "k" is not equal to the total number of drawn wirings "n," "1" is added to the counter "k" and a wiring connecting new two points is drawn (S02).

When the drawing of the first wiring and the second wiring is completed, the controller draws a third wiring in the second forbidden region (S05). In addition, the controller draws a fourth wiring in the first forbidden region (S06).

Next, one of the third wiring and the fourth wiring is expanded into a vacant space on the plane excluding the region where the first wiring is drawn, the region where the second wiring is drawn, the first forbidden region, the second forbidden region and the third forbidden region (S08).

Furthermore, at least one of the first wiring, the second wiring, the third wiring and the fourth wiring is expanded into the third forbidden region where the first forbidden region and the second forbidden region overlap each other (S08). Consequently, one of the first wiring, the second wiring, the third wiring and the fourth wiring is drawn in all the regions on the plane. Thereby, the space between the first wiring and the second wiring, the space between the first wiring and the fourth wiring, and the space between the second wiring and the third wiring are made to be prescribed widths.

Next, a trim pattern covering the third forbidden region is extracted from the plane (S09). In addition to the third forbidden region, the trim pattern may include the region where the third wiring is drawn (the first forbidden region) and the region where the fourth wiring is drawn (the second forbidden region).

Next, a mandrel pattern including the first wiring and the third wiring is extracted among the first wiring, the second wiring, the third wiring and the fourth wiring drawn on the plane (S10), and the mask design is completed. Alternatively, a mandrel pattern including the second wiring and the fourth wiring may be extracted therefrom.

It may be possible to use other flow not including the counter "k", in which the designer instructs the controller in the computer to proceed to S05 when completing the design.

Figure 78C:
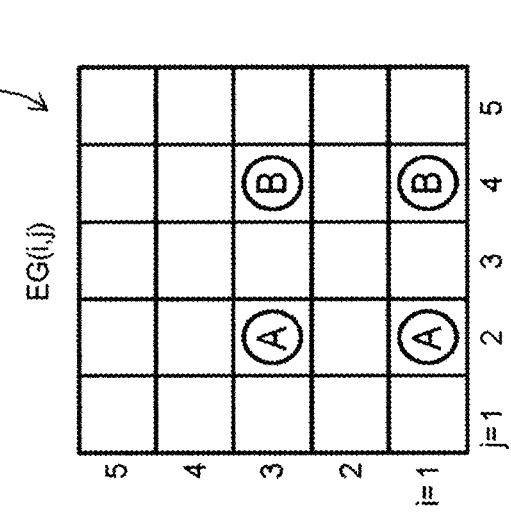
Figure 78B:
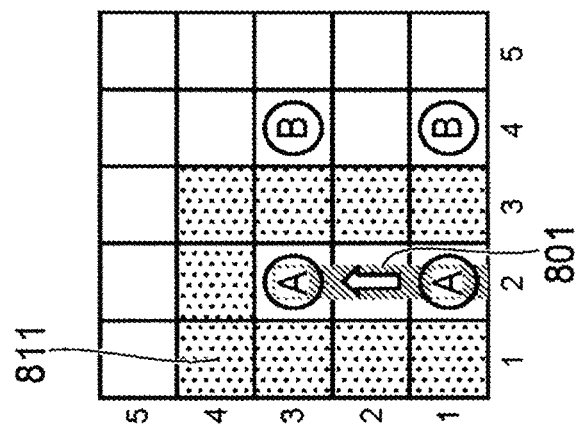
Figure 78A:
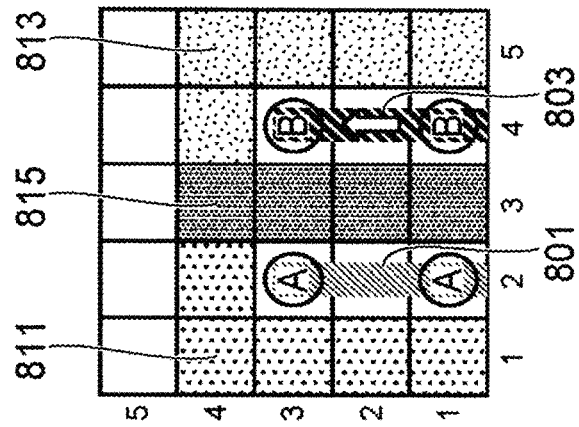

FIG. 78A to FIG. 78C are plan views explaining a first rule of the mask design according to the embodiment. FIG. 78A shows terminals A and B displayed on a base grid 810. FIG. 78B shows a first wiring 801 connecting two terminals A. FIG. 78C shows a second wiring 803 connecting two terminals B, which is drawn in addition to the first wiring 801.

As shown in FIG. 78A, the base grid 810 includes a grid EC(i,j) disposed in a matrix of 5 rows and 5 columns. The designer inputs a pathway of the first wiring 801, specifying in sequence, for example, grids EG(1,2), EG(2,2) and EG(3,2).

As shown in FIG. 78B, the controller displays the first wiring 801 having the terminal A displayed in EG(1,2) as a start point, according to the pathway inputted by the designer. Then, the first forbidden region is set in a region adjacent to the first wiring 801 (S01). Specifically, grids EG(1,1), EG(2,1), EG(3,1), EG(1,3), EG(2,3), EG(3,3) and EG(4,2) in contact with grids EG(1,2), EG(2,2) and EG(3,2) displaying the first wiring 801 are specified as a first forbidden grid 811 (a first grid), and are displayed as being distinguished from other grids. For example, the grids are displayed with a changed color.

Here, the case that grids are "in contact with each other" also includes a case where corners of neighboring grids are in contact with each other, in addition to a case where sides of neighboring grids are in contact with each other.

Subsequently, as shown in FIG. 78C, the controller displays the second wiring 803 having the terminal B displayed in EG(1,4) as a start point, according to the pathway inputted by the designer. Then, the second forbidden region is set in a region adjacent to the second wiring 803 (S02). Specifically, grids EG(1,5), EG(2,5), EG(3,5), EG(4,5) and EG(5,4) in contact with grids EG(1,4), EG(2,4) and EG(3,4) displaying the second wiring 803 are specified as a second forbidden grid 813 (a second grid), and are displayed as being distinguished from other grids. For example, the grids are displayed with a different color or with a different hatching.

On the other hand, grids EG(1,3), EG(2,3), EG(3,3) and EG(4,3) between the first wiring 801 and the second wiring 803 are a region where the first forbidden region and the second forbidden region overlap each other. Accordingly, grids EG(1,3), EG(2,3), EG(3,3) and EG(4,3) are displayed distinguished from other grids as a third forbidden grid 815 (a third grid) (S03).

FIG. 79A and FIG. 79B are plan views explaining a second rule of mask design according to the embodiment. FIG. 79A is a plan view showing a state where the first wiring 801, the second wiring 803, the first forbidden grid 811, the second forbidden grid 813 and the third forbidden grid 815 are displayed on the base grid 810. Grids EG(5,1) to EG(5,5) are vacant grids where none of these are displayed.

In the embodiment, the third wiring 805 is displayed on the second forbidden grid 813 (S05). In addition, the fourth wiring 807 is displayed on the first forbidden grid 811 (S06). Then, on vacant grids other than the grid on which the first wiring 801 is displayed, the grid on which the second wiring 803 is displayed, the first forbidden grid 811, the second forbidden grid 813 and the third forbidden grid 815, one of the third wiring 805 and the fourth wiring 807 is displayed (S07).

In the example shown in FIG. 79B, a third wiring 805a is displayed on the grids EG(5,1) to EG(5,5) that are vacant grids. In other words, in the example, the third wiring 805 displayed in the second forbidden region 813 is expanded into the vacant grids.

FIG. 80A to FIG. 80C are schematic plan views explaining a third rule of the mask design according to the embodiment.

In FIG. 80A, the first wiring 801, the second wiring 803, the third wiring 805 and the fourth wiring 807 are displayed on the base grid 810. No wiring is displayed on the third forbidden grid 815.

Next, FIG. 80B is a plan view showing a state where the first wiring 801 is displayed on the third forbidden grid 815. For example, an expanded part 801d is displayed expanding the first wiring 801 on the third grid 815.

In the embodiment, on the third forbidden grid 813, the expanded part 801d is displayed expanding at least one of the first wiring 801, the second wiring 803, the third wiring 805 and the fourth wiring 807 (S08).

Furthermore, as shown in FIG. 80C, the expanded part 801 of the first wiring 801 may be expanded to connect the first wiring 801 with the third wiring 805. That is, at least one of the first wiring 801, the second wiring 803, the third wiring 805 and the fourth wiring 807 displayed on the first forbidden grid may be expanded to connect the first wiring 801 with the third wiring 805, or to connect the second wiring 803 with the fourth wiring 807. Consequently, a wiring pattern can be designed so that the space between the first wiring 801 and the second wiring 803, the space between the first wiring 801 and the fourth wiring 807, and the space between the second wiring 803 and the third wiring 805 are prescribed spaces.

Figure 81B:
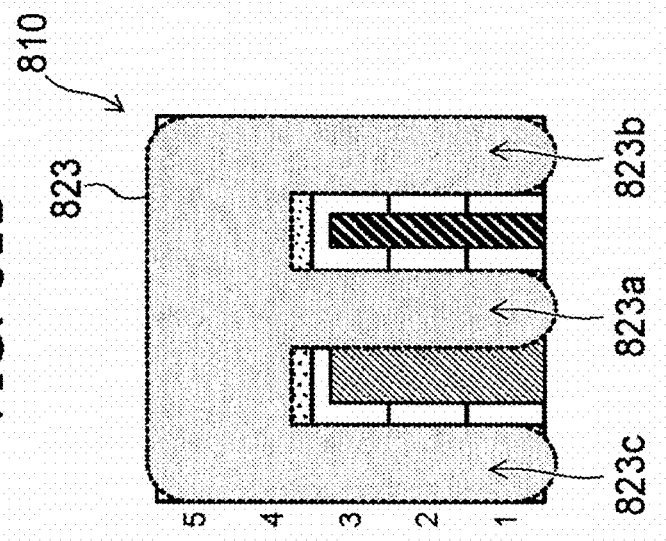
Figure 81A:
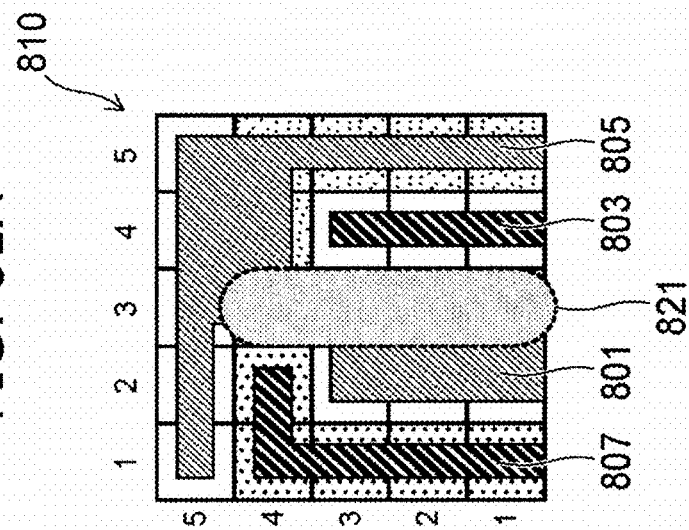

FIG. 81A and FIG. 81B are schematic plan views showing a method for extracting the trim pattern. FIG. 81A and FIG. 81B show an example of extracting the trim pattern from the base grid 810 shown in FIG. 80C.

For example, as shown in FIG. 81A, a trim pattern 821 covering the expanded part 801d of the first wiring 801 is extracted. In other words, the trim pattern 821 covering the third forbidden grid 815 is extracted (S09).

In addition, as shown in FIG. 81B, a trim pattern 823 including a part 823a covering the expanded part 801d, a part 823b covering the third wiring 805 and a part 823c covering the fourth wiring 807 may be extracted.

Figures 82A, 82B, 82C:
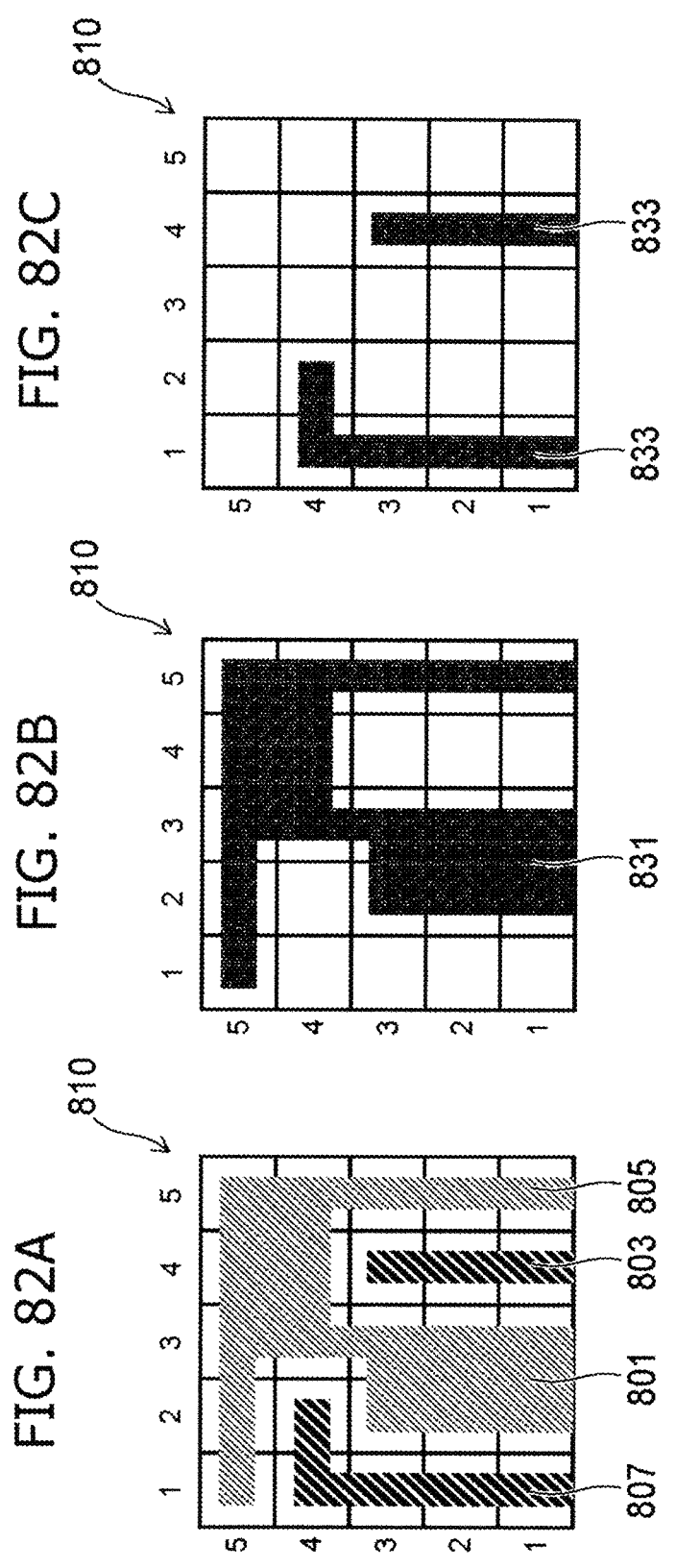

Next, FIG. 82A to FIG. 82C are plan views showing a method for extracting the mandrel pattern. FIG. 82A shows the base grid 810 displaying the first wiring 801, the second wiring 803, the third wiring 805 and the fourth wiring 807. In the example, the first wiring 801 is connected with the third wiring 805.

For example, as shown in FIG. 82B, a mandrel pattern 831 including the first wiring 801 and the third wiring 805 may be extracted (S10). Alternatively, a mandrel pattern 833 including the second wiring 803 and the fourth wiring 805 may be extracted as shown in FIG. 82C. Next, a specific layout procedure according to the first rule of the embodiment is explained referring from FIG. 83 to FIG. 94. FIG. 83 to FIG. 99C are schematic plan views showing a process of mask design according to the embodiment.

Figure 83:
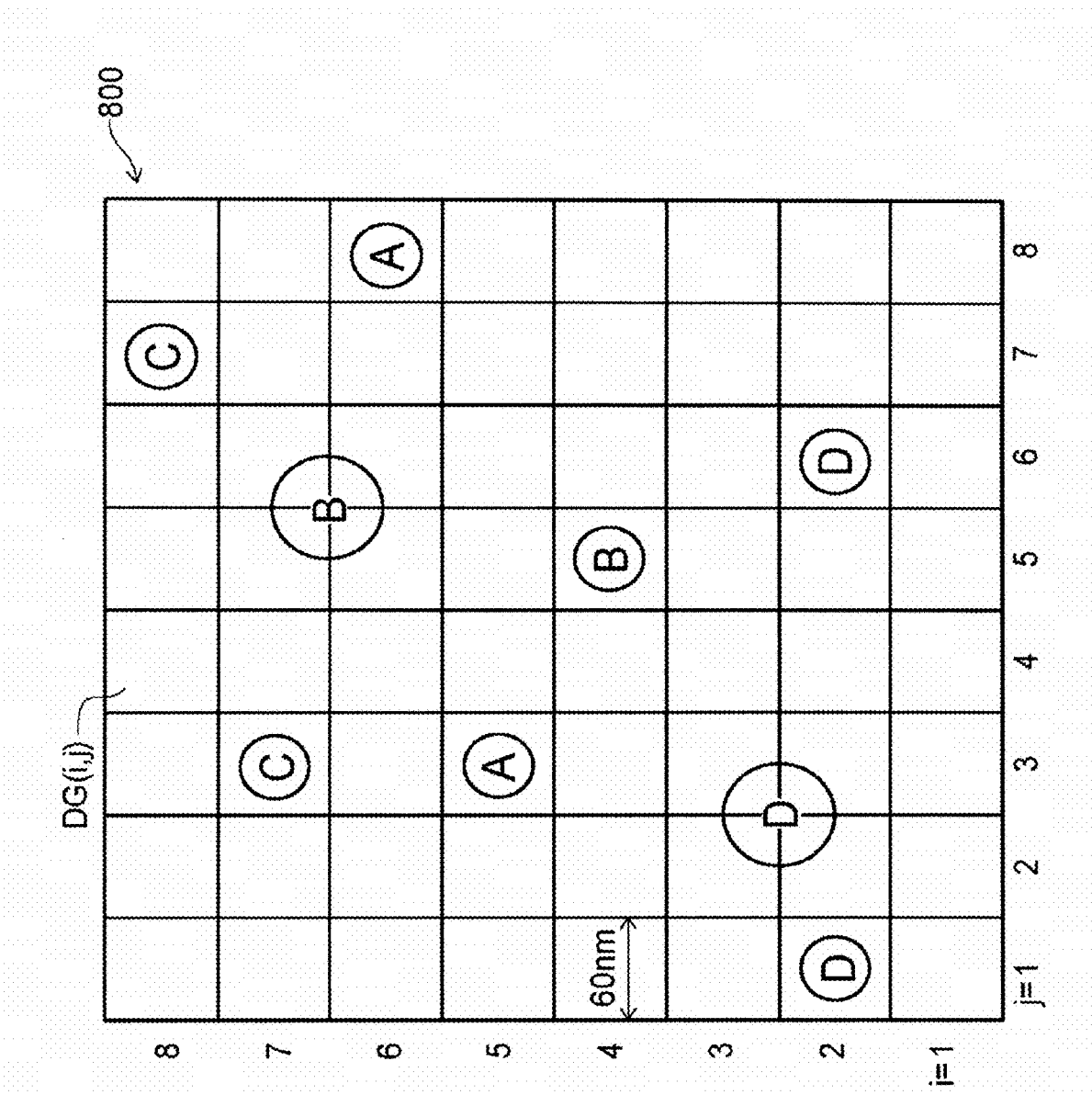
FIG. 83 is a plan view illustrating a base grid according to the embodiment.

FIG. 83 is a plan view illustrating a base grid 800 according to the embodiment. The base grid 800 is displayed, for example, on the screen of the display unit. The base grid 800 shown here includes a grid DG(i,j) (1≤i≤8, 1≤j≤8) disposed in a matrix of 8 rows and 8 columns. The grid DG(i,j) is set, for example, to be a size corresponding to exposure limit of photolithography. In the example, it is 60 nm.

As shown in FIG. 83, the controller displays, for example, terminals A to D on the base grid 800 on the basis of design information. Terminals A to D may be inputted by specifying the grid DG(i,j) on the screen by the designer using a pointer. Here, terminals A to D may be set to be a part where a contact is disposed. The total number n of wirings can be determined by the disposition of contacts. For example, in the case of FIG. 83, a contact is disposed for terminals A to D, and, when terminals A to D are connected with wiring, the total number of wirings is determined to be four.

For example, a terminal displayed within the grid DG(i,j) shows simply a start point or an end point of a wiring. On the other hand, it is shown that each of terminals B and D displayed spreading over four grids DG(i,j) serves as a pad.

Figure 84:
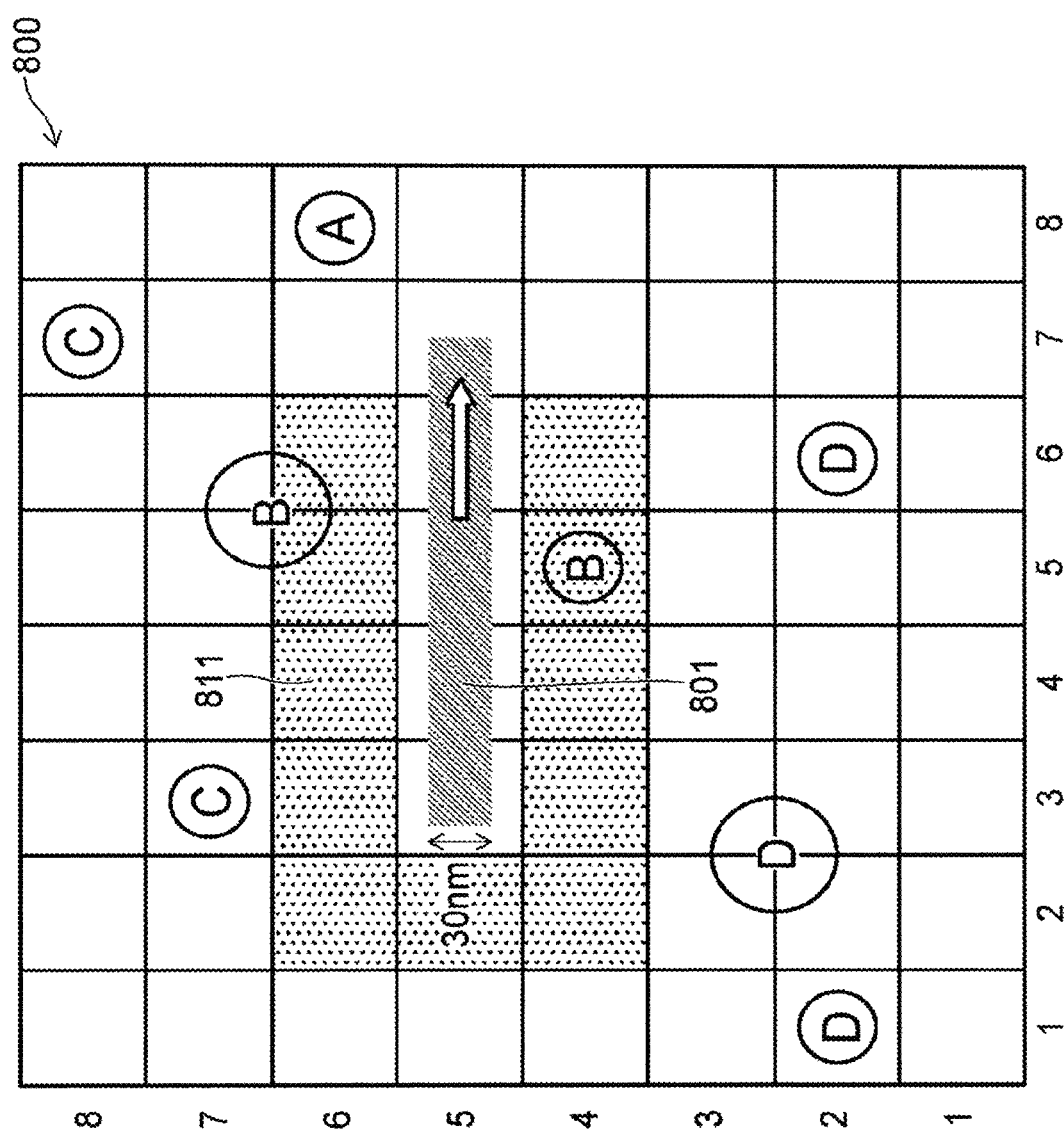
FIG. 84 and FIG. 85 are schematic plan views showing a process for drawing a first wiring on the base grid.
Figure 85:
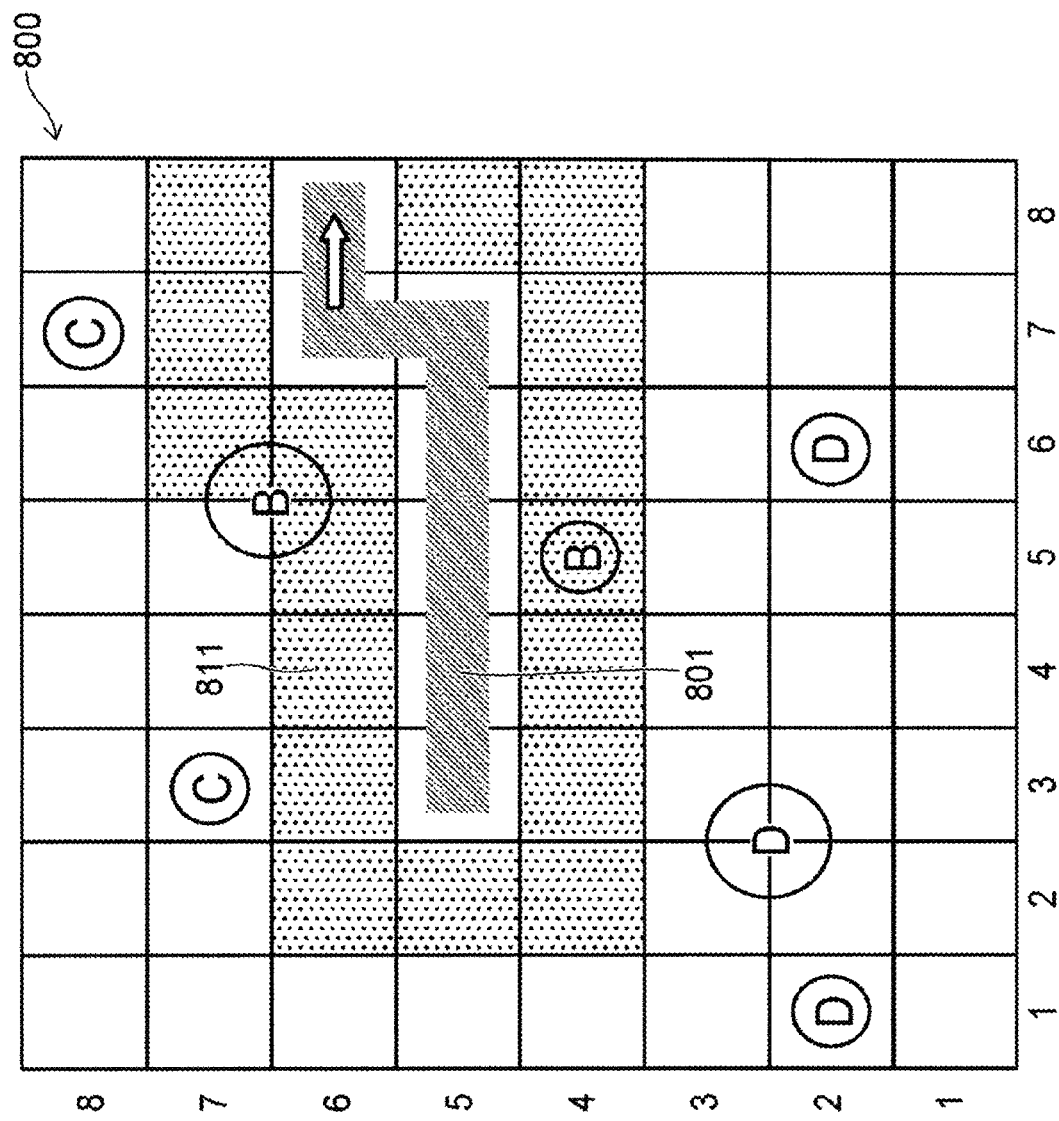

FIG. 84 and FIG. 85 are schematic plan views showing a process for drawing the first wiring 801 on the base grid 800.

The designer inputs the pathway of the first wiring 801, specifying in order from a grid DG(5,3) displaying the terminal A to DG(5,4), DG(5,5), DG(5,6) and DG(5,7).

As shown in FIG. 84, the controller displays the first wiring 801 on grids DG(5,3), DG(5,4), DG(5,5), DG(5,6) and DG(5,7). The line width of the first wiring 801 is displayed, for example, in accordance with an actual wiring size. In this case, the line width of the first wiring 801 is 30 nm.

Grids DG(4,2) to DG(4,6), DG(5,2) and DG(6,2) to DG(6,6) in contact with the grid displaying the first wiring 801 are displayed as the first forbidden grid 811.

Subsequently, as shown in FIG. 85, grids DG(6,7) and DG(6,8) are specified to establish the pathway of the first wiring 801. That is, when the designer specifies the grid DG(6,8) displaying the terminal A of the end point, the pathway of the first wiring 801 is established.

The controller displays the first wiring 801 running from the start point to the end point, and displays grids DG(7,4), DG(8,4), DG(8,5) and DG(7,6) to DG(7,8) as the first forbidden grid 811.

Figure 86:
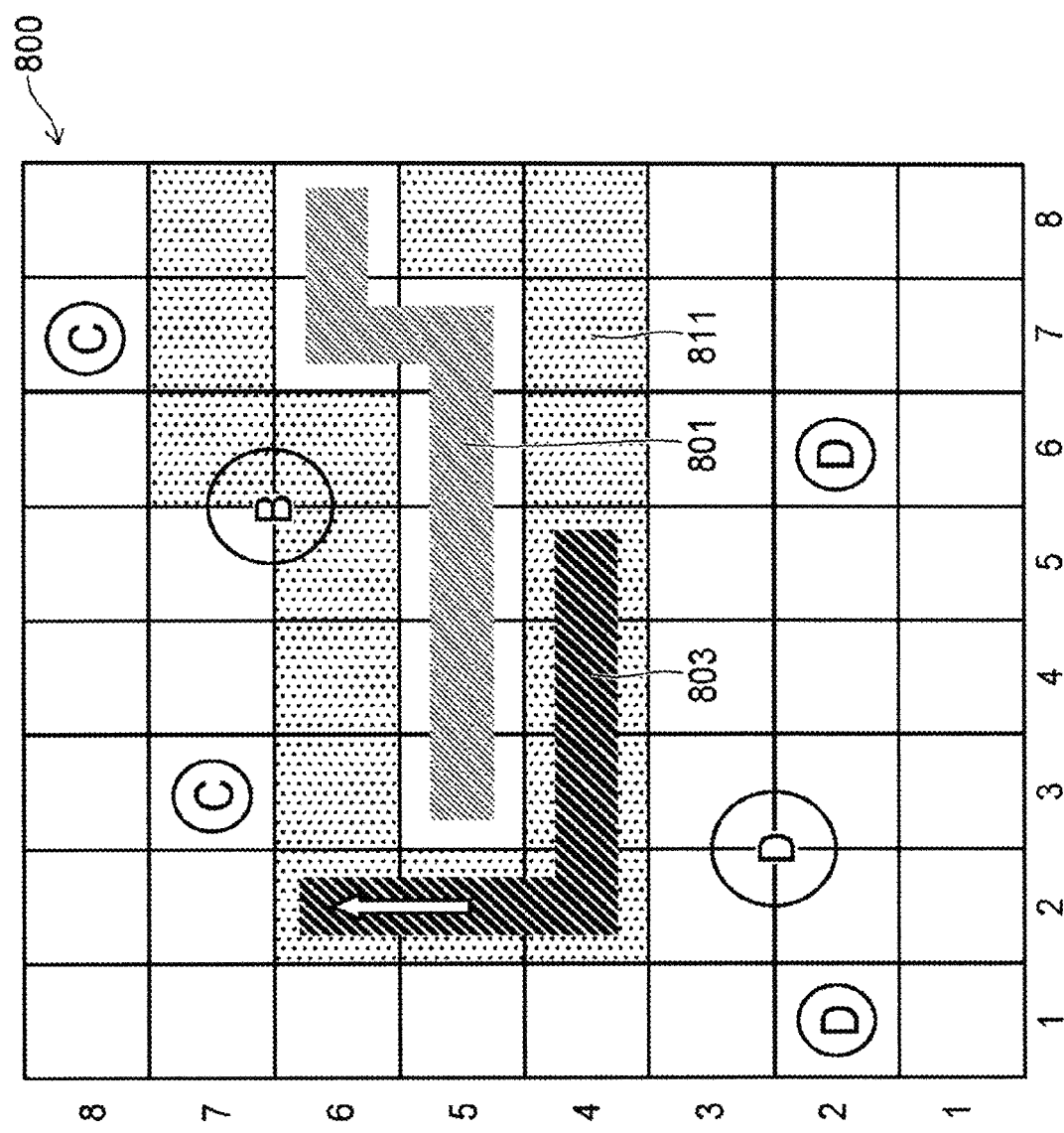
FIG. 86 to FIG. 88 are plan views showing a process for drawing a second wiring on the base grid.
Figure 87:
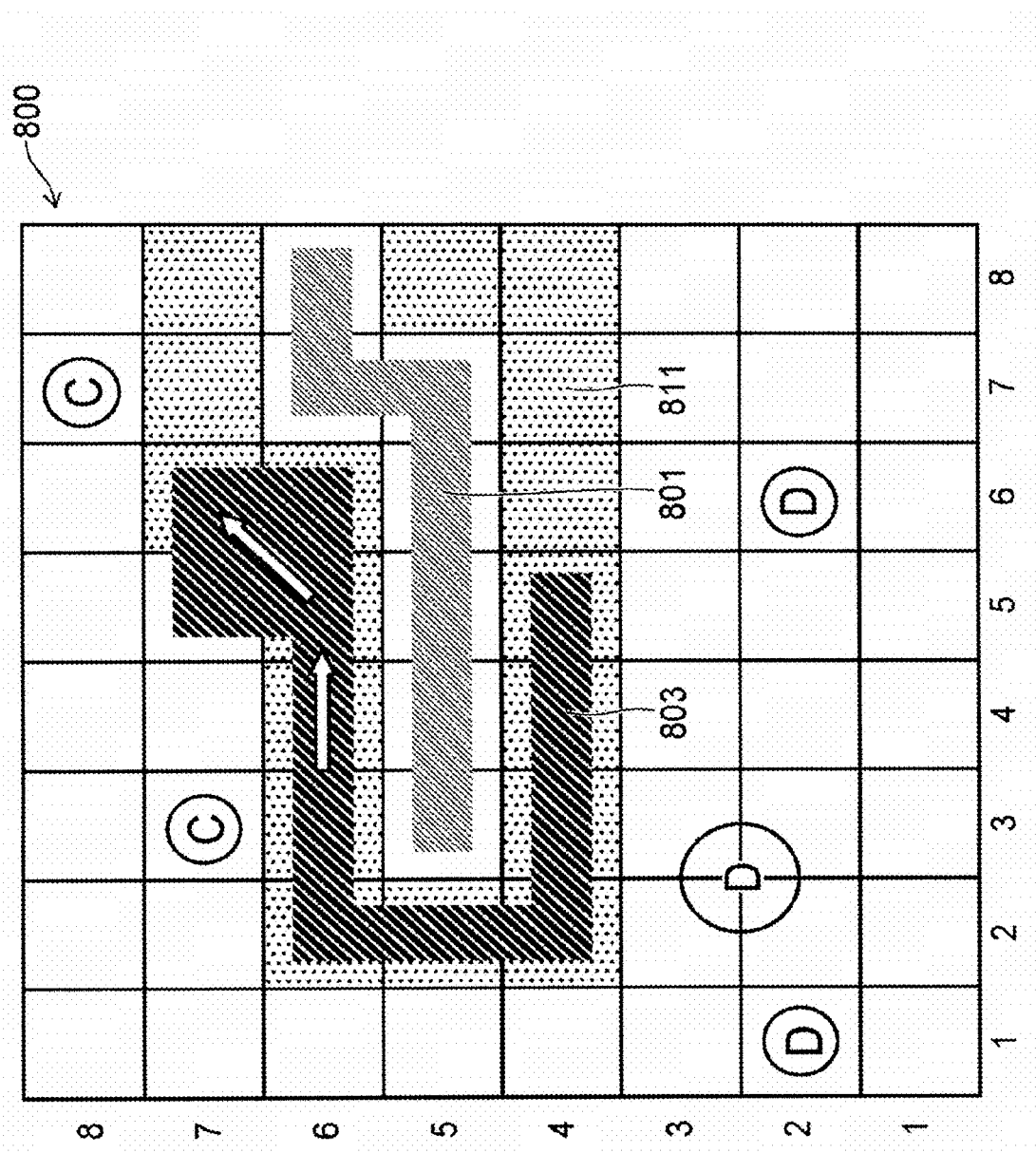
Figure 88:
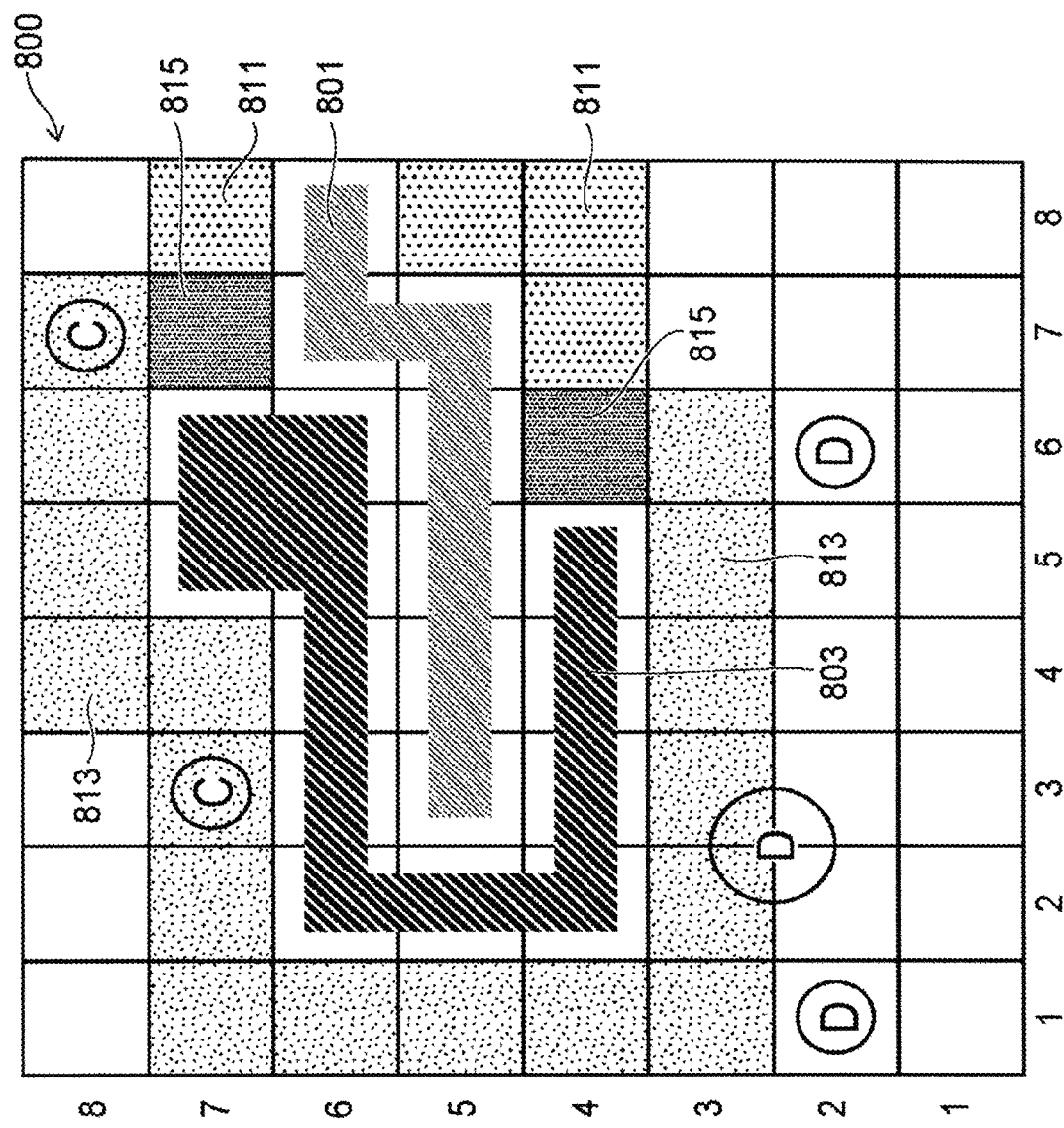

FIG. 86 to FIG. 88 are plan views showing a process for drawing the second wiring 803 on the base grid 800.

The designer inputs the pathway of the second wiring 803, specifying in order from a grid DG(5,4) displaying the terminal B to DG(4,4), DG(4,3), DG(4,2), DG(5,2) and DG(6,2). In this case, the first wiring 801 can not be drawn, since the grid DG(5,4) is the first forbidden grid 811.

For example, grids displaying two terminals are neither the first forbidden grid 811 nor the second forbidden grid 813, and the pathway connecting the two terminals does not include the first forbidden grid 811 and the second forbidden grid 813, either of the first wiring 801 and the second wiring 803 may be selected.

As shown in FIG. 86, the controller displays the second wiring 803 on grids DG(5,4), DG(4,4), DG(4,3), DG(4,2), DG(5,2) and DG(6,2).

Subsequently, the designer specifies grids DG(6,3), DG(6,4), DG(6,5) and DG(7,6), and establishes the pathway of the second wiring 803.

As shown in FIG. 87, the controller displays the remaining part of the second wiring 803 on grids DG(6,3), DG(6,4), DG(6,5), DG(6,6), DG(7,5) and DG(7,6).

For example, when grids DG(6,5) and DG(7,6) are specified, the controller determines that grids DG(7,5) and DG(6,6) are also wiring regions. Then, it displays a pad spreading over the four grids.

Next, as shown in FIG. 88, a vacant grid (a fourth grid) in contact with the second wiring 803 is displayed as the second forbidden region 813. Here, the "vacant grid" indicates a grid on which the first wiring 801 and the second wiring 803 are not displayed and which is not displayed as the first to third forbidden regions.

Furthermore, the controller displays grids DG(4,6) and DG(7,7) in contact with both the grid displaying the first wiring 801 and the grid displaying the second wiring 803, distinguishing from other grids as the third forbidden grid 815.

FIG. 89 to FIG. 94 are schematic plan views showing a process for drawing a subsequent first wiring 801 on the base grid 800. Hereinafter, the first wiring displayed first is distinguished from the first wiring to be displayed subsequently by being referred to as the first wiring 801a and the first wiring 801b, and the first wiring 801c, respectively. In addition, the first wirings 801a to 801c are occasionally referred to as the first wiring 801 collectively.

The designer inputs the pathway of the first wiring 801b, specifying in order from the grid DG(7,3) displaying the terminal C to DG(7,4) and DG(8,4). Since the grid DG(7,3) is the second forbidden grid 813, the second wiring 803 can not be drawn.

Figure 89:
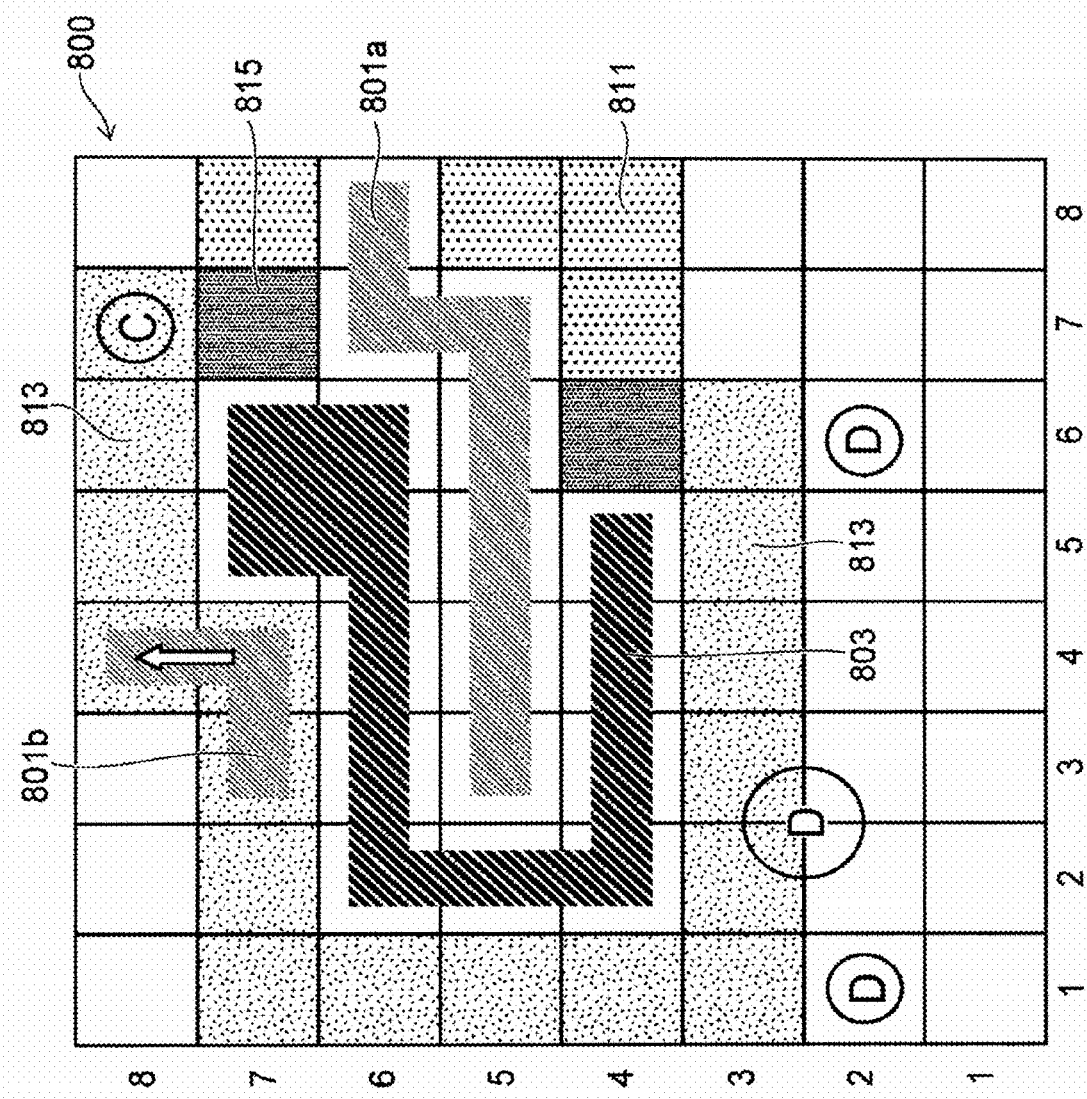
FIG. 89 to FIG. 94 are schematic plan views showing a process for drawing a subsequent first wiring 801 on the base grid.

As shown in FIG. 89, the controller displays the first wiring 801b on grids DG(7,3), DG(7,4) and DG(8,4).

Subsequently, the designer specifies grids DG(8,5), DG(8,6) and DG(8,7), and establishes the pathway of the first wiring 801b.

Figure 90:
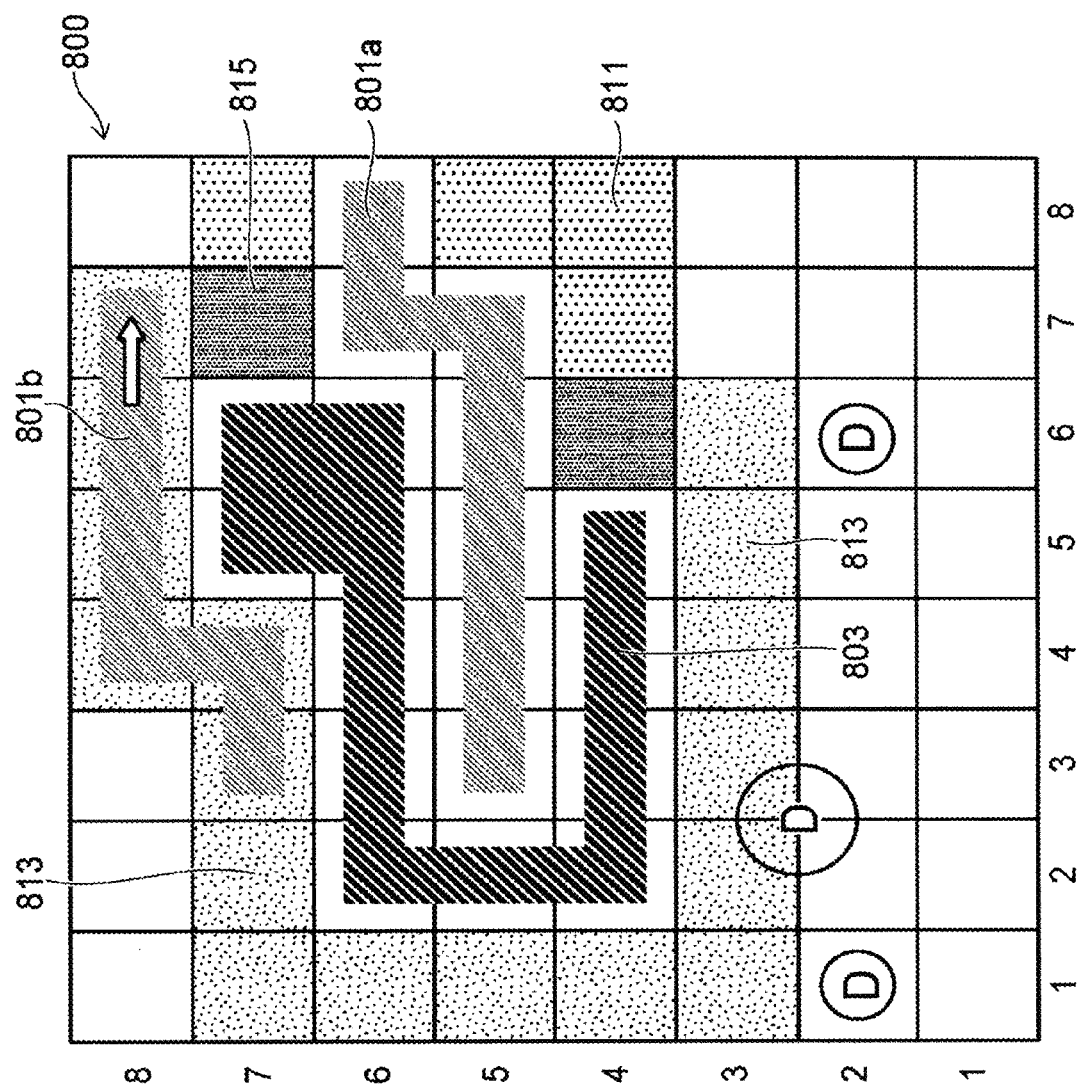

As shown in FIG. 90, the controller displays the remaining part of the first wiring 801b on grids DG(8,5), DG(8,6) and DG(8,7).

Figure 91:
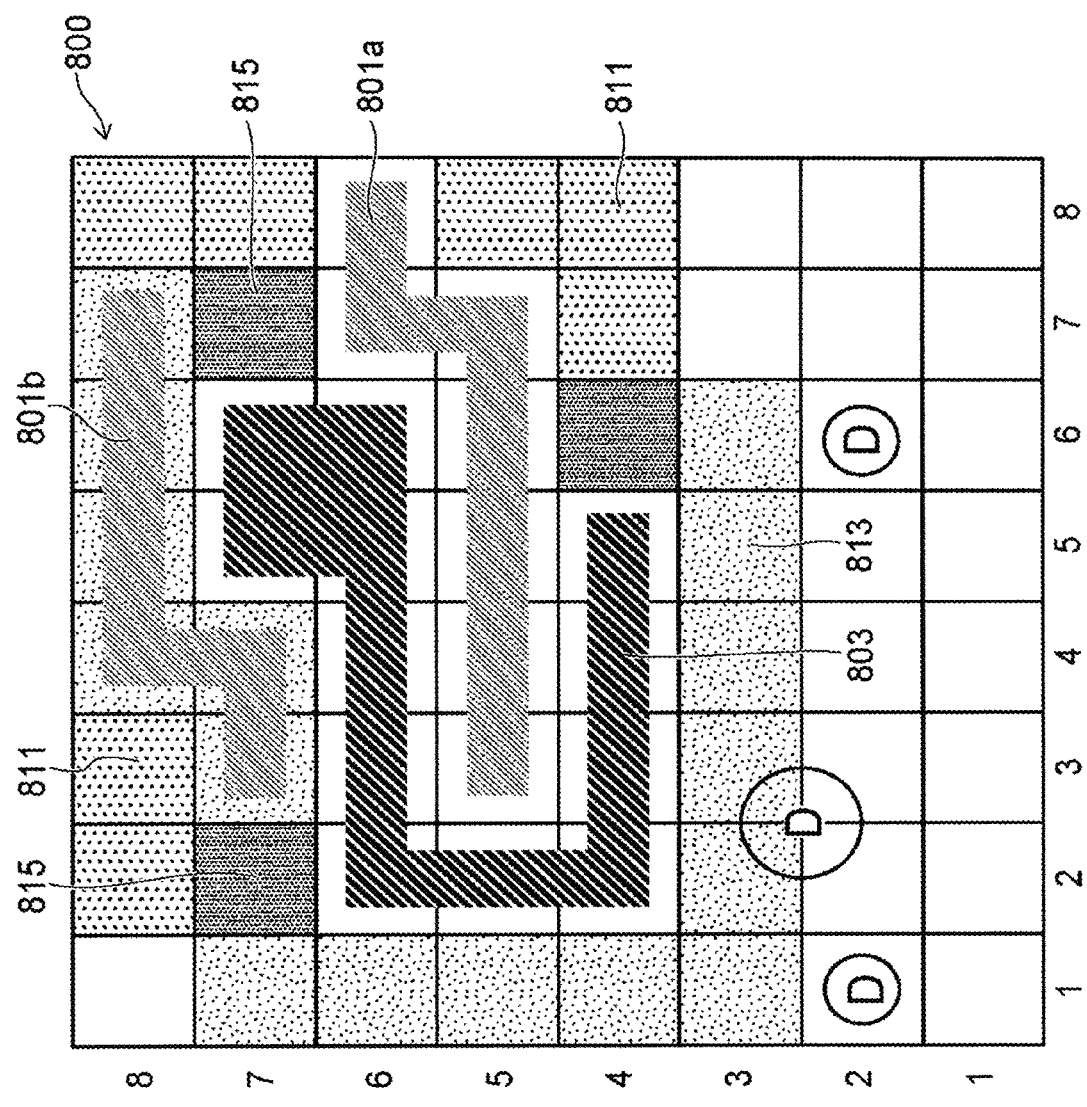

Next, as shown in FIG. 91, vacant grids DG(8,2), DG(8,3) and DG(8,8) in contact with the first wiring 801b are displayed as the first forbidden region 811.

Furthermore, the controller displays the grid DG(7,2) in contact with both the grid displaying the first wiring 801b and the grid displaying the second wiring 803 as the third forbidden grid 815, distinguishing them from other grids.

Next, the designer inputs the pathway of the first wiring 801c, specifying in order from the grid DG(2,6) displaying the terminal D to DG(2,5) and DG(2,4). Grids displaying the terminal D, DG(3,2) and DG(3,3) are the second forbidden grid 813. Therefore, the second wiring 803 can not be drawn.

Figure 92:
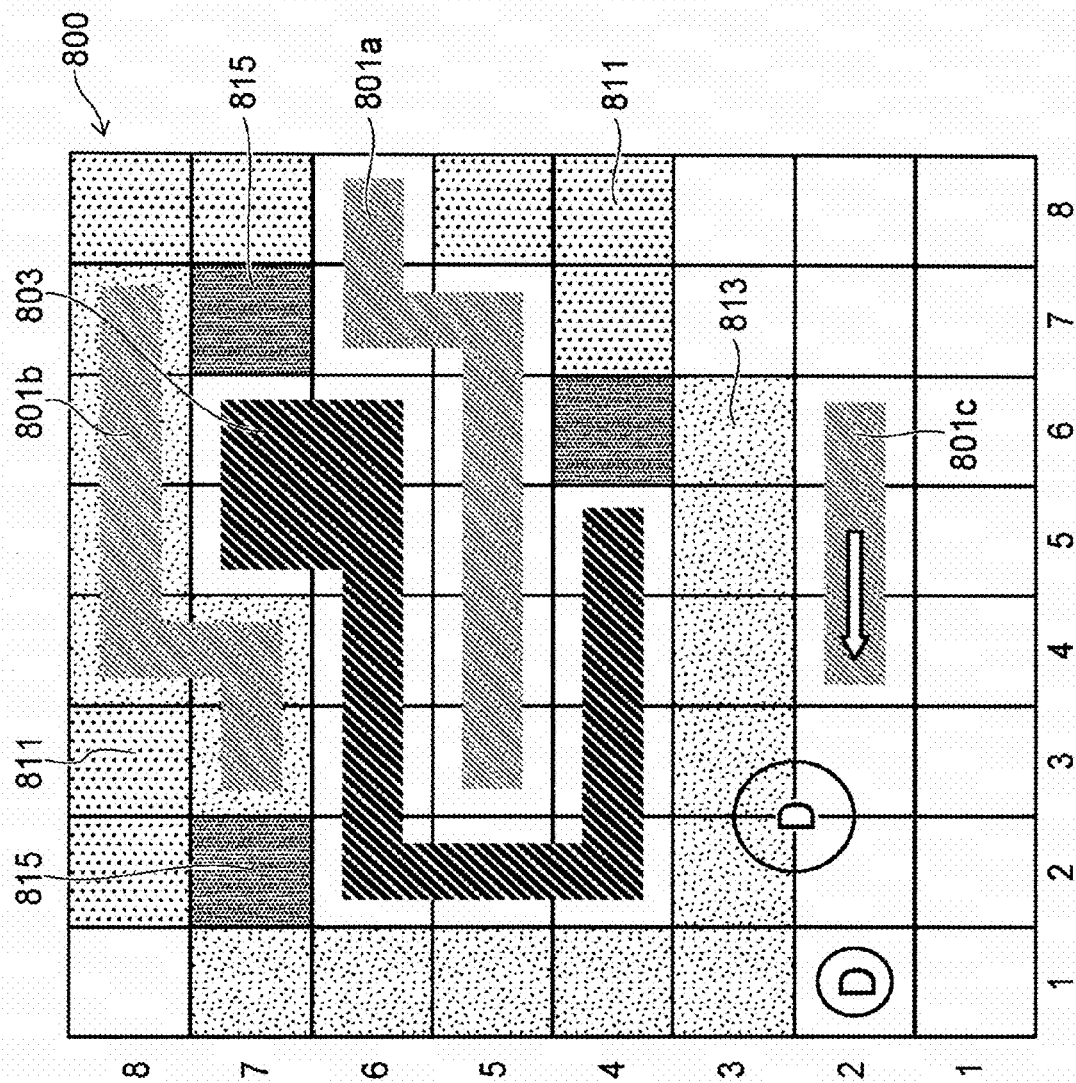

As shown in FIG. 92, the controller displays the first wiring 801c on grids DG(2,6), DG(2,5) and DG(2,4).

Subsequently, the designer specifies grids DG(2,3), DG(3,2) and DG(2,1), and establishes the pathway of the first wiring 801c.

Figure 93:
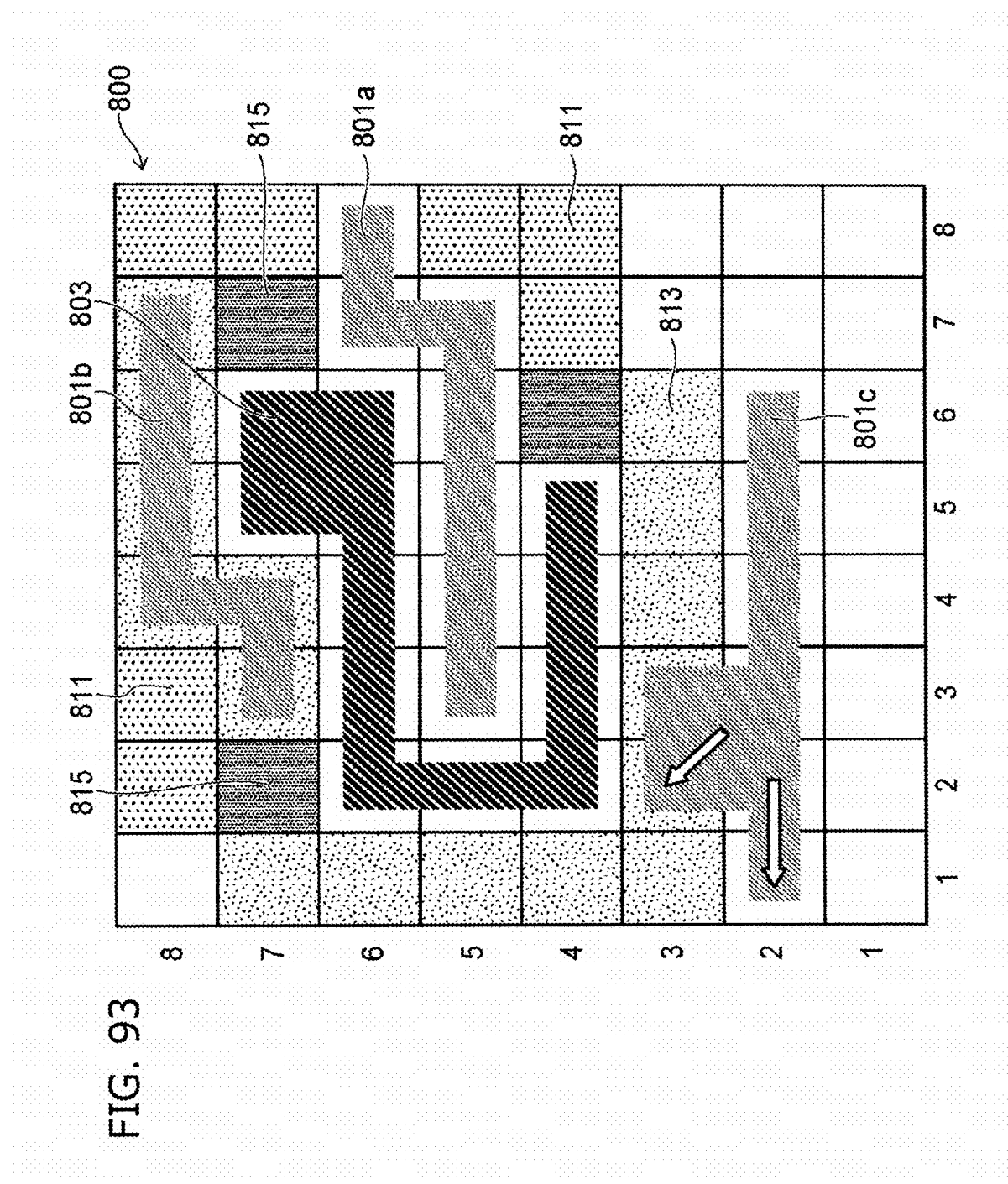

As shown in FIG. 93, the controller displays the remaining part of the first wiring 801b on grids DG(2,3), DG(2,2), DG(2,1), DG(3,3) and DG(3,2).

Figure 94:
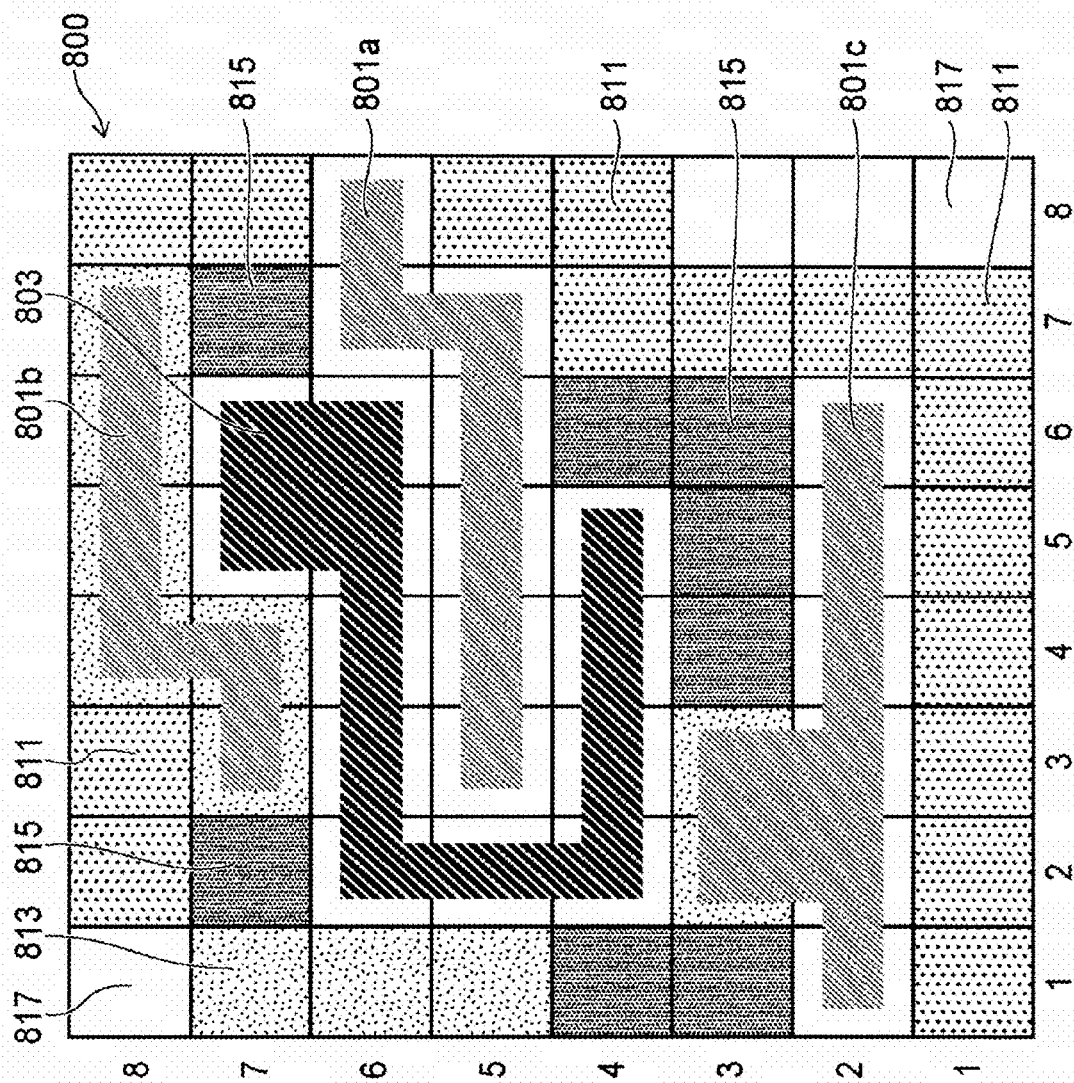

Next, as shown in FIG. 94, vacant grids DG(1,1) to DG(1,7), DG(2,7) and DG(3,7) in contact with the first wiring 801c are displayed as the first forbidden region 811.

Furthermore, the controller displays grids DG(3,1), DG(3,4), DG(3,5) and DG(3,6) in contact with both the grid displaying the first wiring 801c and the grid displaying the second wiring 803 as the third forbidden grid 815, distinguishing them from other grids.

Figure 95:
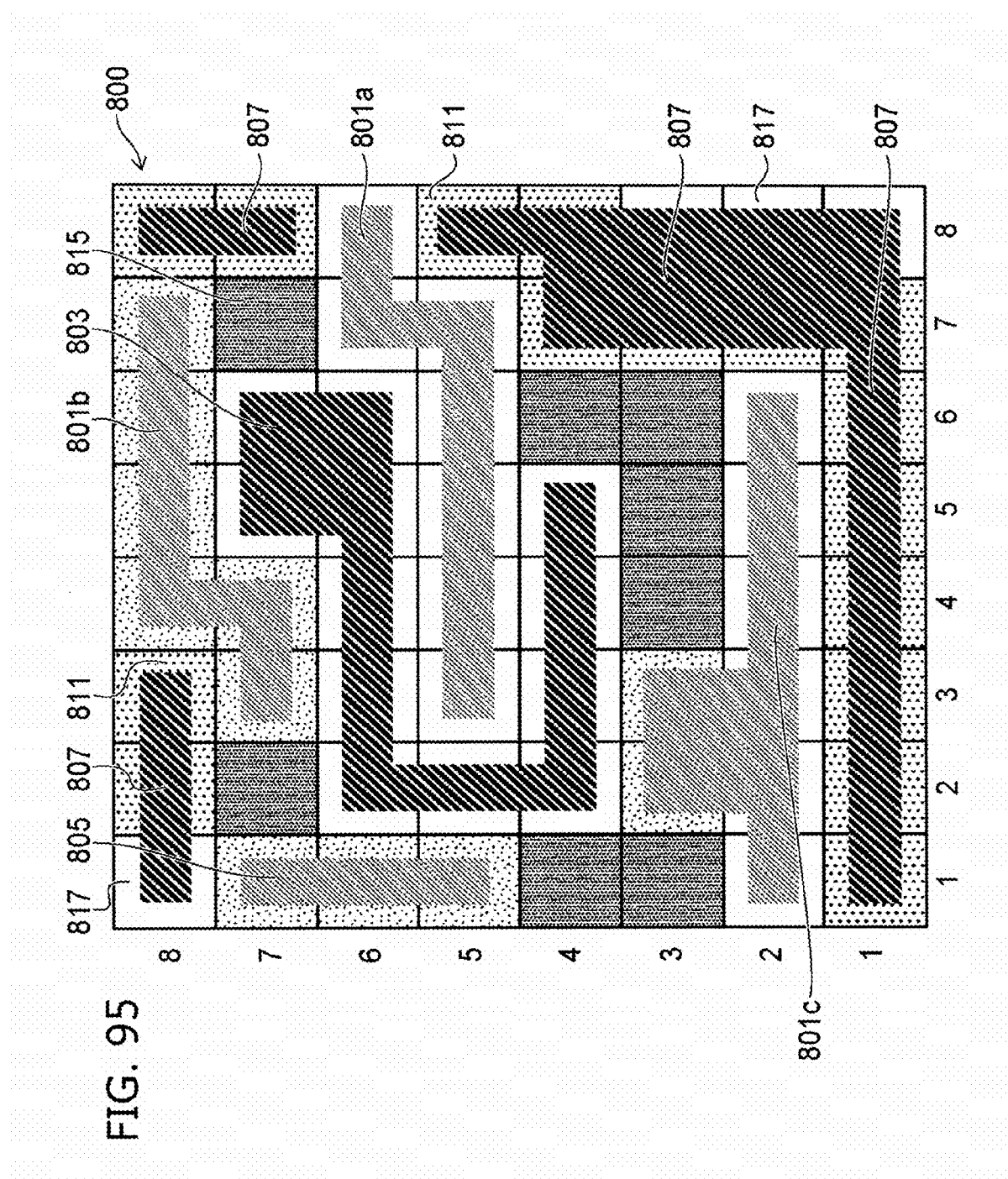
FIG. 95 is a schematic plan view showing a process for drawing a third wiring and a fourth wiring on the base grid.
Figure 96:
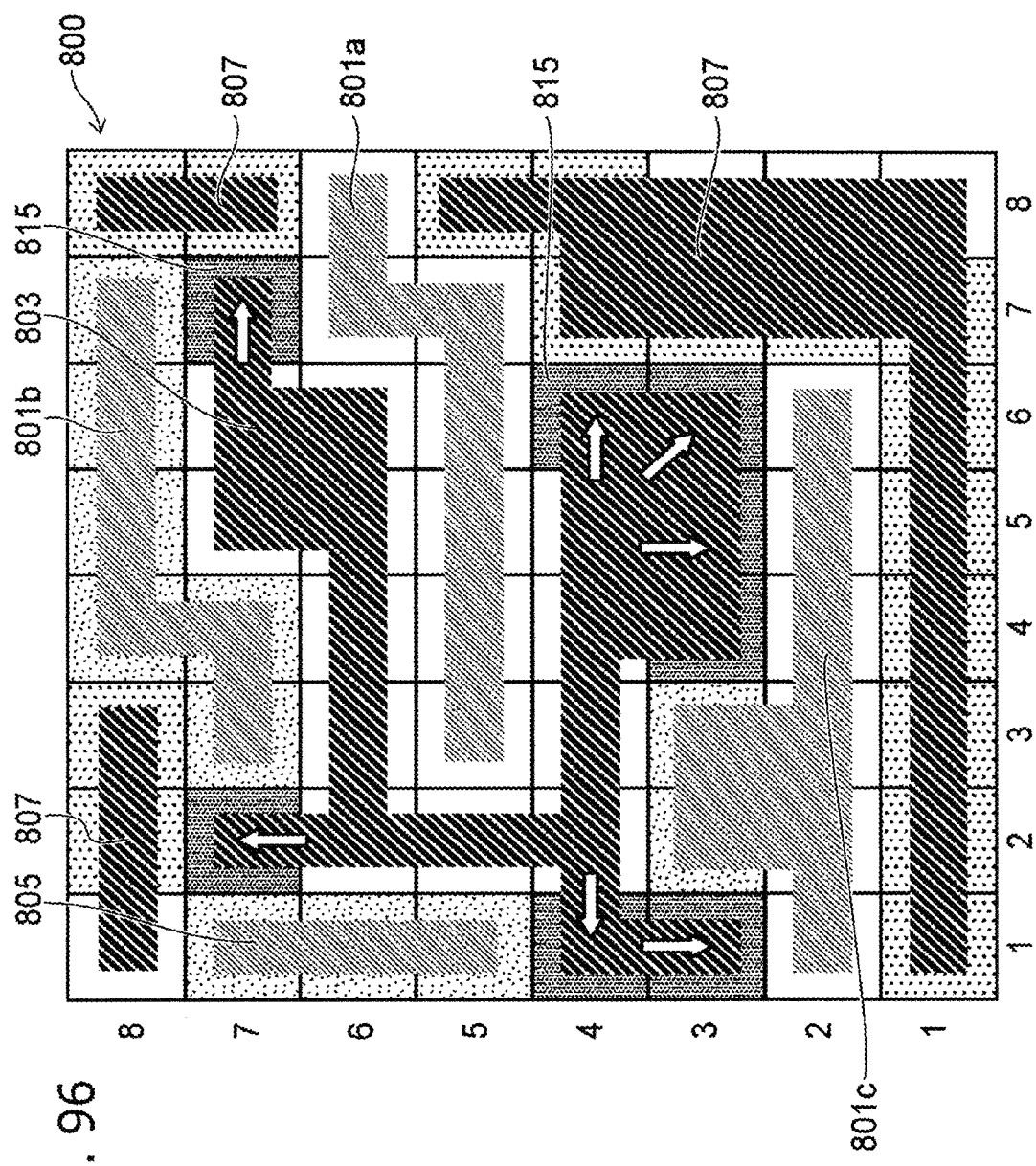
FIG. 96 and FIG. 97 are plan views showing a process for expanding the second wiring.
Figure 97:
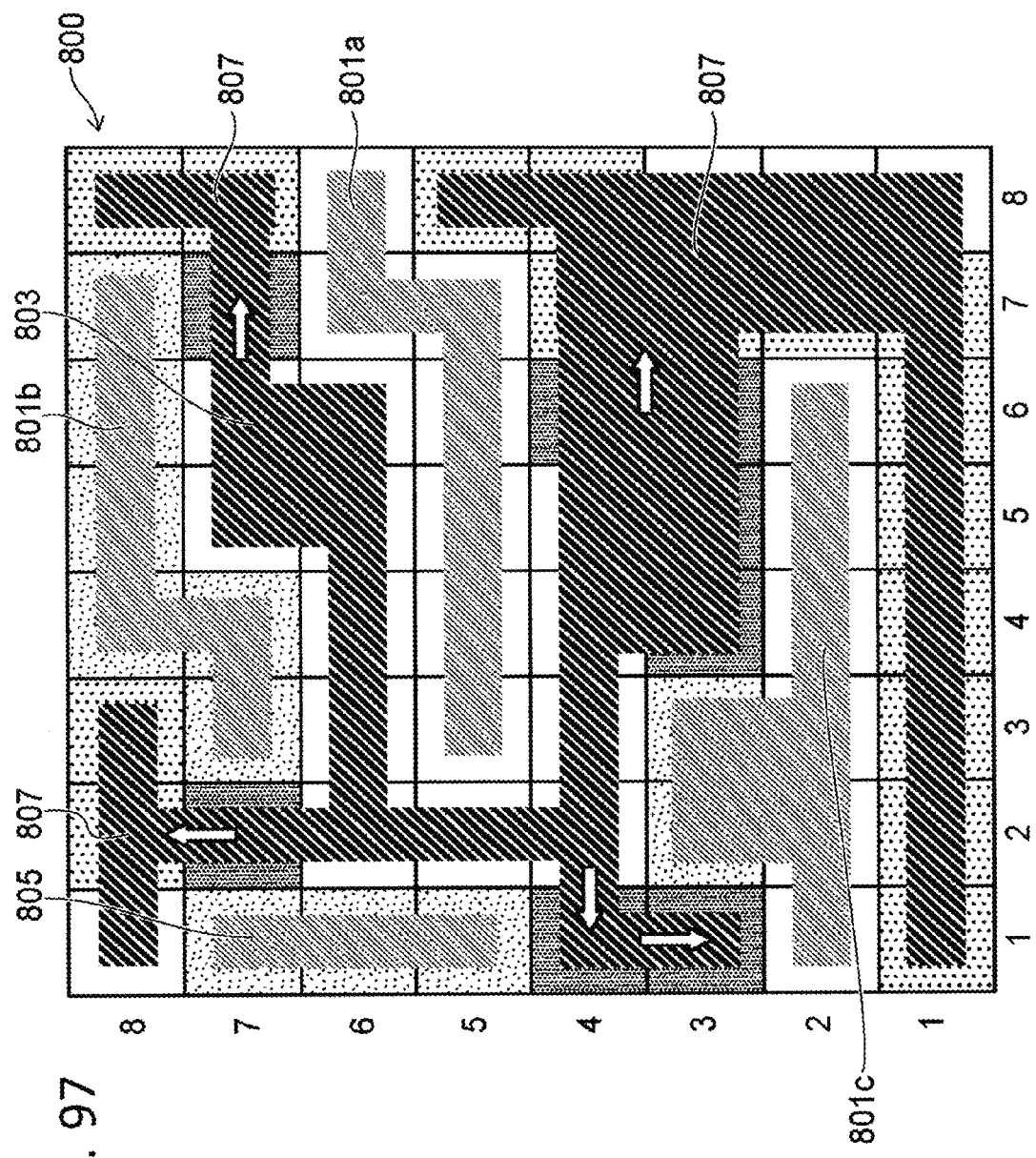

Next, using FIG. 95 to FIG. 97, a specific layout procedure on the basis of the second rule is explained.

FIG. 95 is a schematic plan view showing a process for drawing the third wiring and the fourth wiring on the base grid 800.

On the base grid 800, the first wirings 801a, 801b and 801c, the second wiring 803, the third wiring 805 and the fourth wiring 807 are displayed. In the example, on vacant grids DG(1,8), DG(2,8), DG(3,8) and DG(8,1), the fourth wiring 817 is displayed. For example, the fourth wiring 817 displayed on the vacant grid is a part obtained by extending or expanding the fourth wiring 807 displayed on the first forbidden grid 811.

FIG. 96 and FIG. 97 are plan views showing a process for expanding the second wiring so that the space between the first wiring 801 and the second wiring 803 becomes a prescribed space on the base grid 800.

As shown in FIG. 96, the second wiring 803 is displayed on the third forbidden grid 815. For example, the second wiring 803 is expanded to be extended on the third forbidden grid 815.

Subsequently, as shown in FIG. 97, the second wiring 803 displayed on the third forbidden grid 815 is extended to connect the second wiring 803 with the fourth wiring 807.

In the example, the second wiring 803 is displayed on the third forbidden grid 815, but the mode is not limited to this. For example, it is also possible to display the fourth wiring 807 on the third forbidden grid 803, and to connect the second wiring 803 with the fourth wiring 807. In addition, it is also possible to display either of the first wiring 801 and the third wiring 805 on the third forbidden grid 815, and to connect the first wiring 801 with the third wiring 805.

Figure 98:
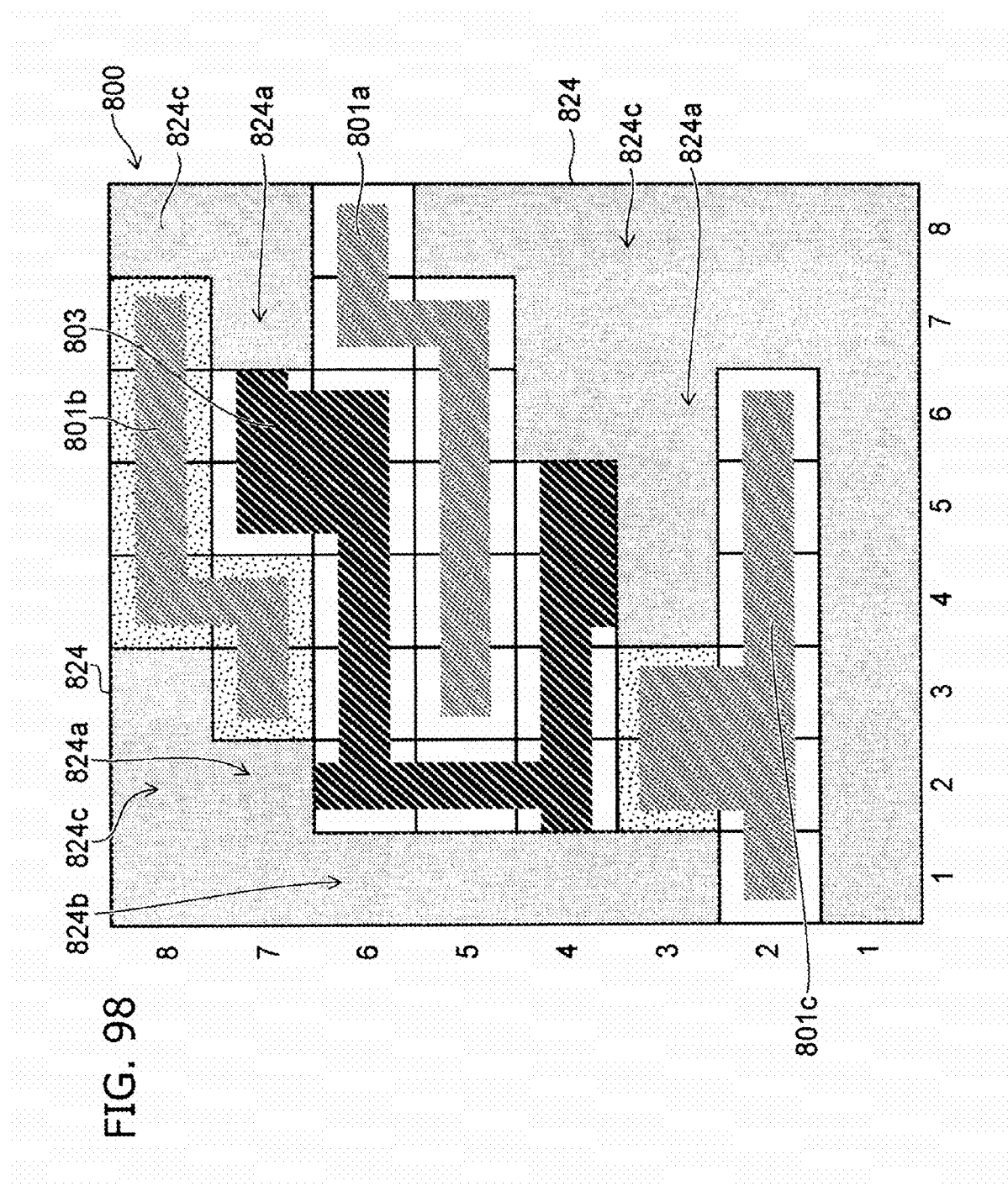
FIG. 98 is a plan view showing a state where a trim pattern is extracted from the base grid.

FIG. 98 is a plan view showing a state where a trim pattern 824 is extracted from the base grid 800 shown in FIG. 97. The trim pattern 824 includes a part 824a covering the expanded part of the second wiring 803, a part 824b covering the third wiring 805 and a part 824c covering the fourth wiring 807.

That is, the controller displays the grid displaying the third forbidden grid 815 and the third wiring, and the grid displaying the fourth wiring, distinguishing them from other grids. For example, it may be preferable to change the color of each grid.

Figure 99A:
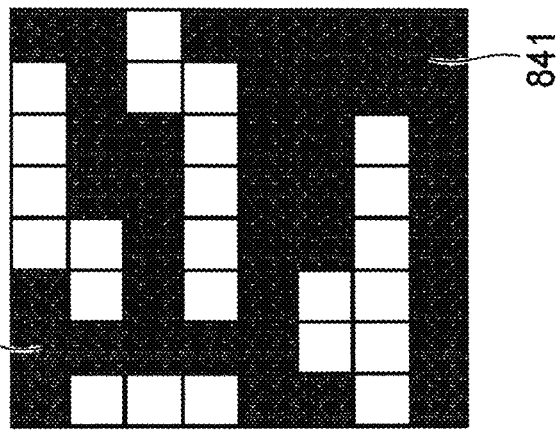
FIG. 99A to FIG. 99C are schematic plan views showing an extraction of a mandrel pattern in the base grid.
Figure 99B:
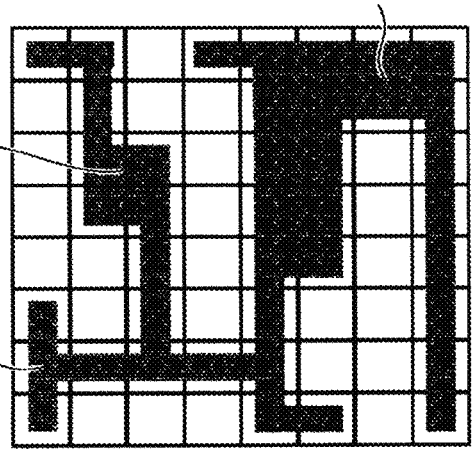
Figure 99C:
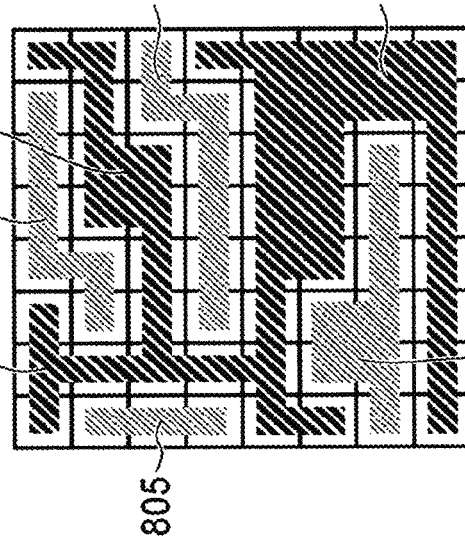

FIG. 99A to FIG. 99C are schematic plan views showing the extraction of the mandrel pattern in the base grid 800. FIG. 99A shows the same grids as the base grid 800 shown in FIG. 97. The first wiring 801, the second wiring 803, the third wiring 805 and the fourth wiring 807 are shown, and the second wiring 803 is connected with the fourth wiring 807.

For example, as shown in FIG. 99B, the second wiring 803 and the fourth wiring 807 are extracted from the base grid 800 shown in FIG. 99A. Subsequently, as shown in FIG. 99C, the grid displaying the second wiring 803, and the grid displaying the fourth wiring 807 are displayed as being distinguished from other grids. Consequently, a mandrel pattern 841 can be extracted including the second wiring 803 and the fourth wiring 807.

According to the second rule of mask design, the third wiring 805 or the fourth wiring 807 is expanded to the vacant spaces excluding the region where the first wiring is drawn, the region where the second wiring is drawn, the first forbidden region, the second forbidden region and the third forbidden region, after completing the drawing of the first wiring and the second wiring, but the embodiment is not limited thereto. For instance, it may be possible to sequentially dispose another third wiring and fourth wiring in the vacant places. In addition, it may be possible to set a maximum allowable line width for the third and fourth wiring.

FIGS. 100A to 101C are schematic plan views showing another rules of the mask design. In this example, the base grid 820 includes a grid EC(i,j) disposed in a matrix of 6 rows and 8 columns.

The first wiring 801 and the second wiring 803 are displayed in the base grid 820 shown in FIG. 100A. The first forbidden region 811 has been set on the grids EG(1,3) to EG(6,3) that are adjacent to the first wiring 801 displayed on the grids EG(1,2) to EG(6,2), and the second forbidden region 813 has been set on the grids EG(1,7) to EG(6,7) that are adjacent to the second wiring 803 displayed on the grids EG(1,8) to EG(6,8). The grids EG(1,4) to EG(6,6) between the first forbidden region 811 and the second forbidden region 813 are the vacant grids. Here, the case specifying a pair of grids at diagonal corners of square region means specifying all grids included therein.

FIG. 100B shows the base grids 820, in which the fourth wiring 807 is displayed on the first forbidden grids 811 shown in FIG. 100A, and the third wiring 805 is displayed on the second forbidden grids 813. According to the second rule, the fourth wiring 807 is expanded to the vacant grids EG(1,4) to EG(6,6), so that the distance between the third wiring 305 and the fourth wiring 307 is set to be the prescribed distance. In this case, the area combining the second wiring 803 and the fourth wiring 807 becomes larger than the area combining the first wiring 801 and the third wiring 803.

On the other hand, it may be possible to expand both the third wiring 805 and the fourth wiring 807. In FIG. 100C, the fourth wiring 807 displayed on the first forbidden grids 811 is expanded to the vacant grids EG(1,4) to EG(5,6), and the third wiring 805 displayed on the second forbidden grids 813 is expanded to the vacant grids EG(1,6) to EG(6,6). Then, the distance between the third wiring 305 and the fourth wiring 307 is set to be the prescribed distance. Furthermore, the area combining the second wiring 803 and the fourth wiring 807 becomes equivalent to the area combining the first wiring 801 and the third wiring 803. Thereby, it may become possible to improve accuracy of pattern transfer in the photolithography and etching process of wiring.

Figure 101C:
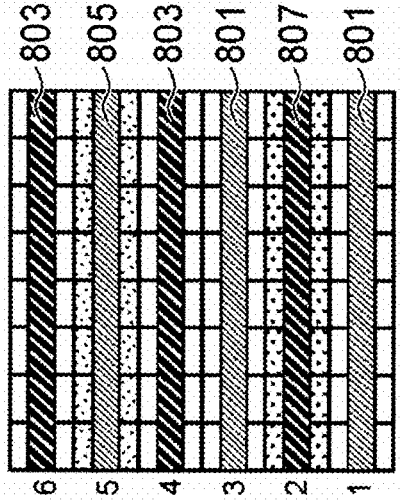
Figure 101B:
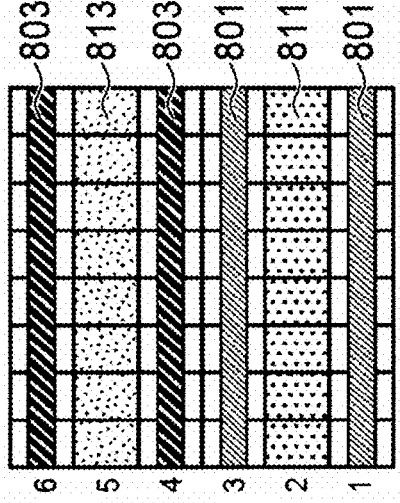
Figure 101A:
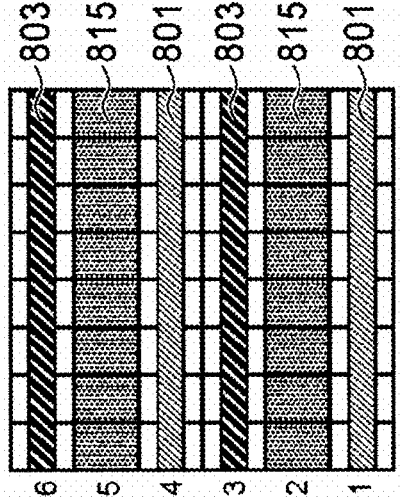

FIG. 101A shows another base grid 820, in which the first wiring 801 and the second wiring 803 are alternately displayed in the vertical direction. The grids between the first wiring 801 and the second wiring 803, i.e. grids EG(2,1) to EG(2,8) and grids EG(5,1) to EG(5,8) are set to be the third forbidden grids. Therefore, a new grid cannot be displayed thereon.

In regard to this, it may be preferable to convert the first wiring 801, displayed on the grids EG(4,1) to EG(4,8), to the second wiring 803, and to convert the second wiring 803 displayed on the grids EG(3,1) to EG(3,8), to the first wiring

801, as shown in FIG. 101B. Thereby, the third forbidden grids 815 set on the grids EG(2,1) to EG(2,8) is converted to the first forbidden grids 811, and the third forbidden grids 815 set on the grids EG(5,1) to EG(5,8) is converted to the second forbidden grids 813.

Then, it becomes possible to display the fourth wiring 807 on the first forbidden grids 811 set on the grids EG(2,1) to EG(2,8), and to display the third wiring 805 on the second forbidden grids 813 set on the grids EG(5,1) to EG(5,8), as shown in FIG. 101C. Thus, it is preferable to convert the first wiring 801 and the second wiring 803 to each other, after completing the design of the first and second wirings, and thereby to increase number of the wirings.

In the embodiment described above, the pathway of the wiring is manually inputted between the start point and the end point, and the controller displays the wiring according to the inputted information. The embodiment is not limited thereto. For instance, it may be possible to automatically establish the pathway of the wiring by way of applying automatic wiring algorism, such as a maze solving algorism, using information of the start grid and the end grid given as a netlist.

It may also be possible to apply an automatic wire-routing algorism minimizing the number of the third forbidden grids as a cost parameter. For instance, when applying the maze solving algorism and like, the automatic wire-routing algorism may seek a pathway for both the first wiring and the second wiring, since the grids available for each of the first and second wirings are different from each other. Consequently, the pathway or the wiring that makes the number of the third forbidden grids minimum is selected from a plurality wiring pathways.

Alternatively, it may be possible to use a method that converts the first wiring and the second wiring to one another after completing the design of the first and second wiring or in the procedure of the wiring design. For instance, it may be advantageous to seek a combination of the first wiring and the second wiring by applying a binary integer programming using the selection of the first wiring or the second wiring as a parameter, and to determine the combination which makes the number of the third forbidden grids minimum.

In the example described above, the wirings are displayed on the grids, but the embodiment is not limited thereto. It may be possible to set the first forbidden region and the second forbidden region, which have the width corresponding to the exposure limit of the photolithography, in the space surrounding the first wiring 801 and the second wiring 803.

FIGS. 102A and 104B are schematic plan views showing a rule of mask design according to a variation of the eighth embodiment. In these examples, the grids are not displayed on the screen of the display unit.

The designer may instruct the controller in the computer to display the first wiring 801 and the second wiring 803 as shown in FIG. 101A, each of which connects a pair of points set on arbitrary positions on the screen. Then, the controller sets the first forbidden region 811 adjacent to a first wiring region 831 and the second forbidden region 813 adjacent to a second wiring region 833. The first wiring region 831 and the second wiring region 833 include the first wiring 801 and the second wiring 803 respectively, and may have the width corresponding to the exposure limit of the photolithography.

As shown in FIGS. 102A and 102B, in the case where the first forbidden region 811 does not overlap the second forbidden region 813, the fourth wiring 807 is displayed on the first forbidden region 811, and the third wiring 805 is displayed on the second forbidden region 813. The same may apply to the case where the first forbidden region 811 is set to be separated from the second forbidden region 813.

In the case where the first forbidden region 811 overlaps the second forbidden region 813 at least in part, the controller sets the third forbidden region 815 on a space including the overlapping portion between the first wiring region and the second wiring region as shown in FIGS. 103A and 104A.

In the example shown in FIG. 103A, a width of the overlapping portion 835 is the same as each width of the first forbidden region 811 and the second forbidden region 813. In the example shown in FIG. 104A, the overlapping portion 835 is narrower than each of the first forbidden region 811 and the second forbidden region 813.

Subsequently, as shown in FIGS. 103B and 104B, the controller expands one of the first wiring 801 and the second wiring 803 to the third forbidden region 815, whereby a distance between the first wiring 801 and the second wiring 803 becomes the prescribed distance.

Figure 105B:
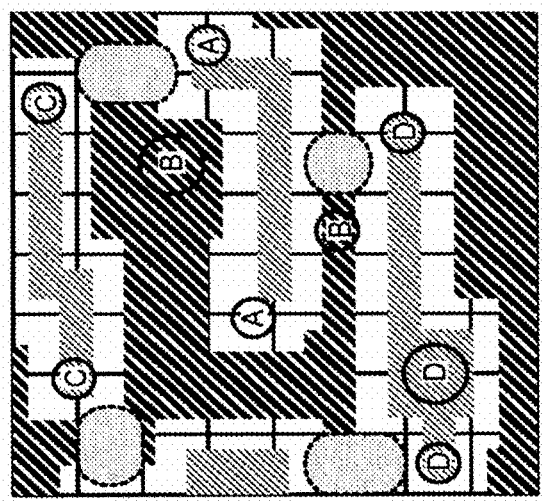
Figure 105A:
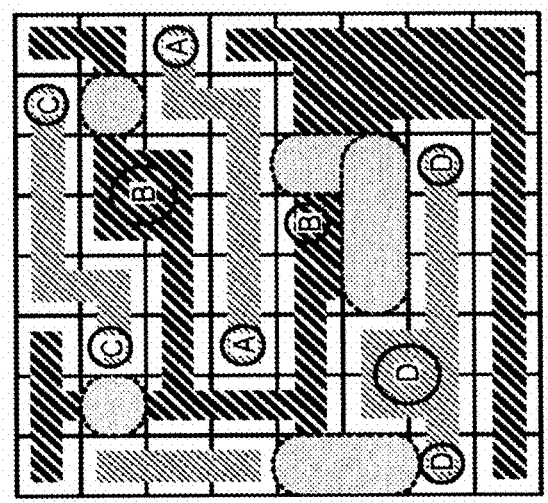

FIGS. 105A and 105B are schematic views showing the mask designs according to the eighth embodiment. FIG. 105A shows the case where the screen includes the grids set thereon. FIG. 105B shows the case where the screen includes no grids thereon.

In the example shown in FIG. 105A, the terminals A to D and the pathways of wiring are designed according to the rule based on the grids. In contrast to this, in the example shown in FIG. 105B, the terminal can be set on an arbitrary position on the screen, and a pathway of the wiring is flexibly set therebetween. That is, the mask design shown in FIG. 105B has larger flexibility than that shown in FIG. 105A.

Next, referring to FIG. 106A to FIG. 108C, the method for manufacturing a semiconductor device according to the eighth embodiment is explained. FIG. 106A to FIG. 108C are schematic plan views showing the manufacturing process of a semiconductor device according to the eighth embodiment.

FIG. 106A is a plan view showing a mandrel 901 formed on a wafer 900. The mandrel 901 is, for example, a first insulating film having etching selectivity for an underlying layer 903.

For example, on the first insulating film provided on the underlying layer 903, an etching mask is formed by transferring a mandrel pattern 841 shown in FIG. 99C. Subsequently, the first insulating film is etched selectively to form the mandrel 901 on the underlying layer 903. For example, the line width of the mandrel 901 is 60 nm, which is the exposure limit in photolithography.

Next, as shown in FIG. 106B, the mandrel 901 is slimmed so that the line width becomes 30 nm. For example, the first insulating film is over-etched while an etching mask is left on the mandrel 901. Consequently, the line width of the mandrel 901 can be made to have a width not more than the exposure limit of photolithography.

Figure 107B:
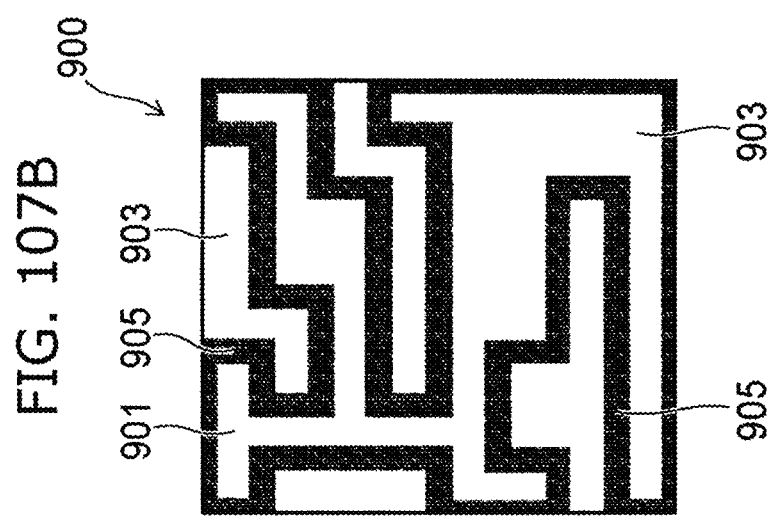
Figure 107A:
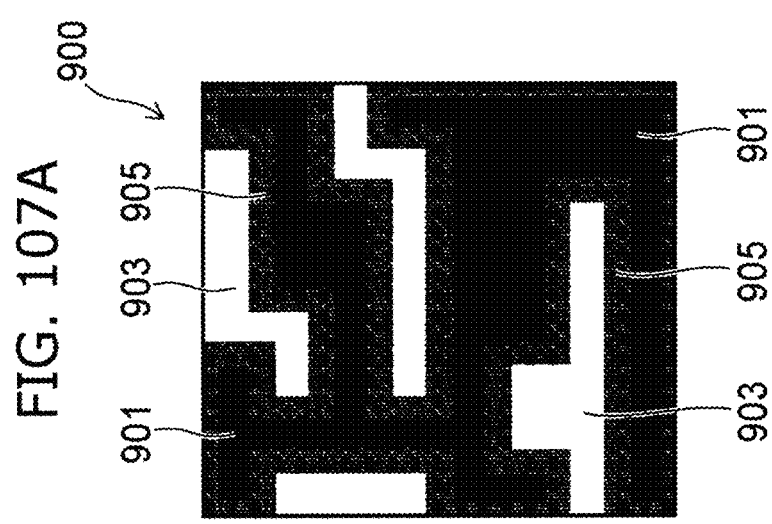

Next, as shown in FIG. 107A, a sidewall 905 is formed on the side face of the mandrel 901. For example, a second insulating film covering the mandrel 901 is formed on the wafer 900. Subsequently, using an RIE method, the second insulating film is etched selectively to form the sidewall 905 composed of the second insulating film on the side face of the mandrel 901. Material having etching selectivity for the mandrel 901 is used for the second insulating film.

For example, the second insulating film is etched under such an anisotropic condition, where an etching rate in the direction perpendicular to the wafer face is larger than an etching rate in the direction parallel to the wafer face. Consequently, the second insulating film formed on the mandrel 901 and on the underlying layer 903 can be selectively etched, while leaving the sidewall 905 on the side face of the mandrel 901.

Subsequently, as shown in FIG. 107B, the mandrel 901 is removed while leaving the sidewall 905 on the underlying layer 903.

Next, as shown in FIG. 108A, for example, a resist mask 911 is formed on the wafer 900. The trim pattern 824 has been transferred on the resist mask 911.

Next, using the sidewall 905 and the resist 911 as etching masks, the underlying layer 903 is etched, for example, using an RIE method. Subsequently, the resist 911 and the sidewall 905 are removed. Consequently, as shown in FIG. 108B, a wiring trench 903a is formed in the underlying layer 903.

Next, a metal layer is formed on the underlying layer 903. For example, a metal layer having a stacked structure of a barrier layer containing tungsten and a wiring layer containing copper is formed. Subsequently, the surface of the metal layer is removed, for example, using a CMP (Chemical Mechanical Polishing) method to expose the underlying layer 903. Consequently, as shown in FIG. 108C, it is possible to form a wiring 907 having the so-called damascene structure embedded in the wiring trench 903a.

The wiring 907 formed through the above process has a line width smaller than the exposure limit of photolithography. That is, a highly integrated semiconductor device can be realized using the manufacturing method according to the embodiment.

The method of mask design according to the embodiment facilitates the design of wiring layout used in the sidewall method. Since no base pattern is used in the embodiment, degree of freedom in design is large. Consequently, the time necessary for designing wiring layout can be shortened to improve the manufacturing efficiency.

Ninth Embodiment

Next, a ninth embodiment will be described with reference to FIG. 109A to FIG. 113.

A method for automatically designing a wiring layout will be described according to the embodiment, which is used for a 2-time sidewall method.

For example, a designer inputs a start point and an end point of the wiring into the input unit shown in FIG. 49. The computer generates an appropriate wiring on the basis of the start point and the end point, and displays a layout thereof on the display unit. In this example, the wiring layout design is performed using the sidewall wiring base grid 700 described in the seventh embodiment. The base grid 700 includes blue grids B, red grids R, green grids G, and three kinds of colorless grids C, M, N. The same color grid connects each other, which result in the wiring layout including, for example, a blue wiring connecting the blue grids B, a red wiring connecting the red grids R, and a green wiring connecting the green grids G.

In the embodiment, the following seven rules are used for connecting grids.

(1) A start point and an end point of a wiring are grids with the same color.

(2) The wiring connecting the start point and the end point passes through grids with the same color as the color of the start point and the end point. In regard to the colorless grids, the rules (4) to (6) below refer thereto.

(3) The colorless grids through which the wiring passes become exchanged grids with the same color as the color of the start point and the end point.

(4) The blue or red wiring may pass through the grids C among the three colorless grids C, M, N.

(5) The blue or green wiring may pass through the colorless grids M.

(6) The red or green wiring may pass through the colorless grids N.

(7) When the green wiring connects the grids G and the pathway of the green wiring is bent, the red grids R or the blue grids B are located inside the corner at the turning point of the pathway of the green wiring.

Figure 109A:
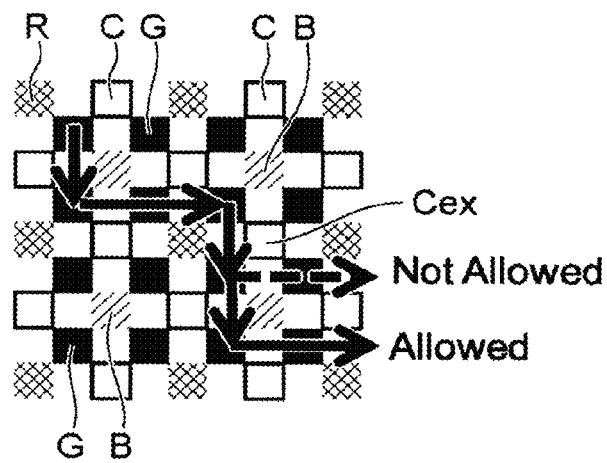
Figure 109B:
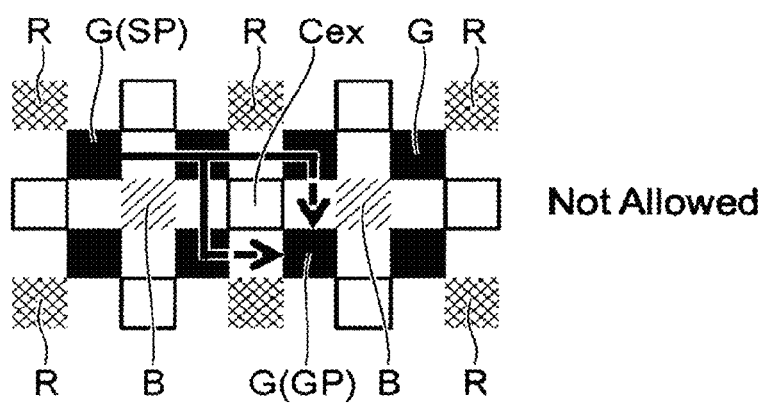
Figure 109C:
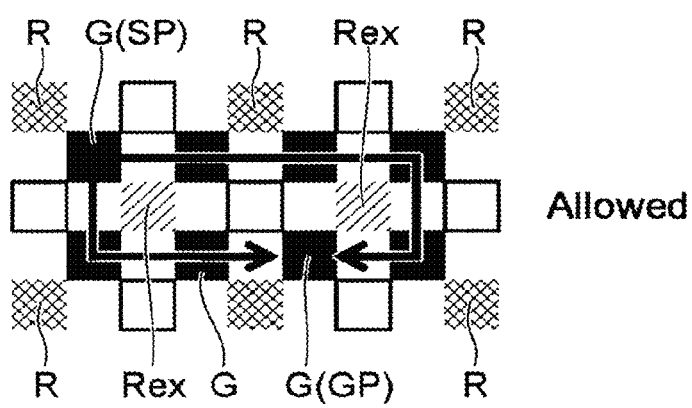

FIG. 109A to FIG. 109C are schematic views showing examples of the pathway of the green wiring. FIG. 109A shows the seventh rule. As shown by a dotted line in FIG. 109A, a turn of the wiring is not allowed, where a colorless grid Cex locates inside a corner at the turning point of the pathway of the green wiring.

In FIG. 109B, each of two pathways of the green wiring connects a start point and an end point with a bent, where a colorless grid Cex locates inside a corner at the turning point of the pathway of the green wiring. Therefore, the pathways shown in FIG. 109B are not allowed. On the other hand, in the example shown in FIG. 109C, two pathways of the green wiring connect a start point and an end point, and each pathway has a bent, where a red grid Rex locates inside the corner at the turning point of the pathway of the green wiring. Thus, the wiring layouts shown in FIG. 109C are allowed.

Next, an example of wiring designs according to the embodiment will be described with reference to FIG. 110 to FIG. 113. In this example, a green wiring among blue, red, and green wirings is designed in first, where the rule of turning pathway is added. Thereby, it may be possible to reduce number of isolated grids.

Figure 110:
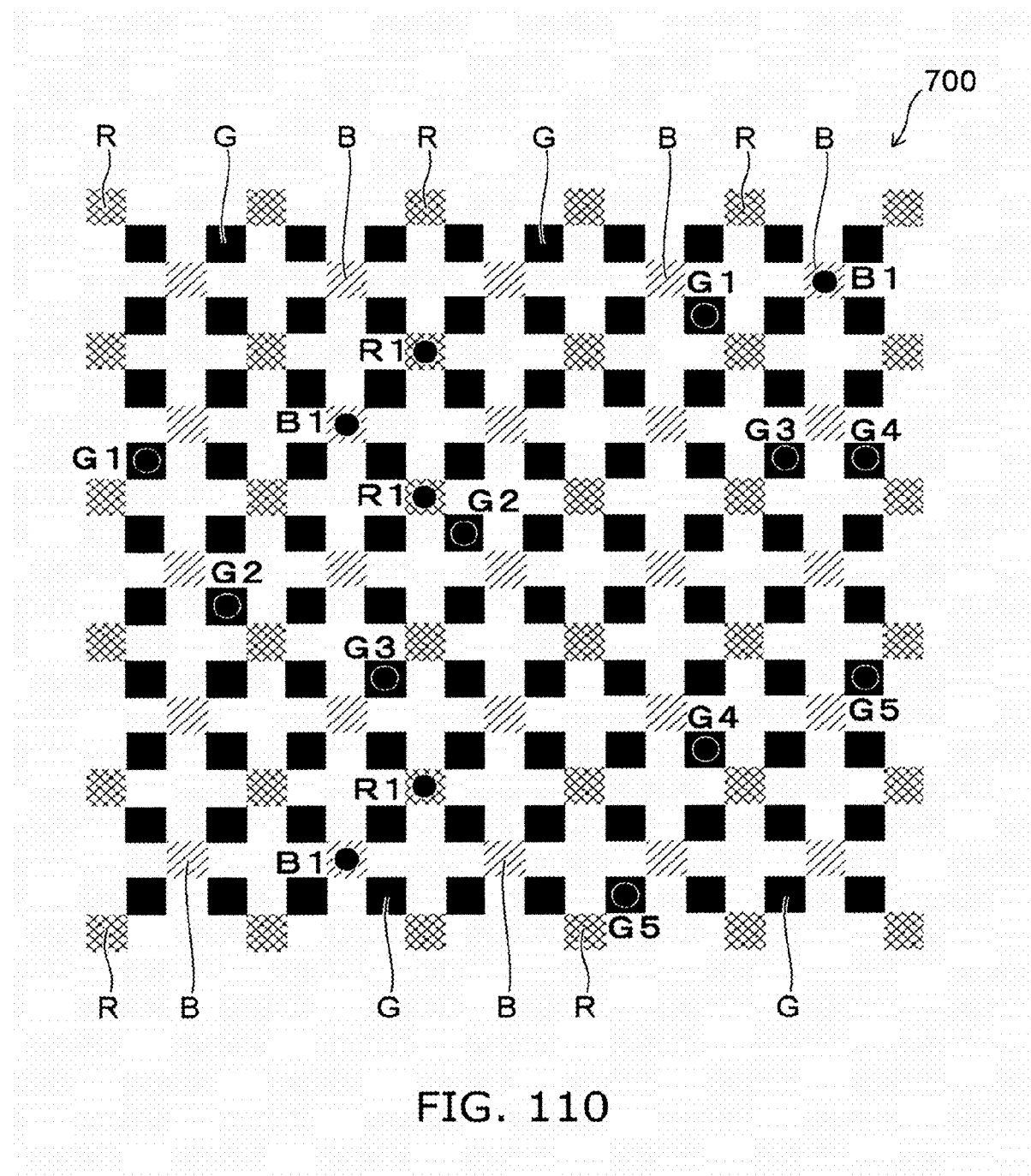

First, as shown in FIG. 110, the designer specifies the grid (terminal) serving as a start point or an end point of each wiring on the base grid 700. In this example, the designer specifies three terminals B1 serving as the start point or the end point of the blue wiring, three terminals R1 serving as the start point or the end point of the red wiring. The designer also specifies terminal pairs G1 to G5, and each terminal pair serves as a start point and an end point of a green wiring. As shown in the figure, two grids are specified for each of the terminal pairs G1 to G5.

Figure 111:
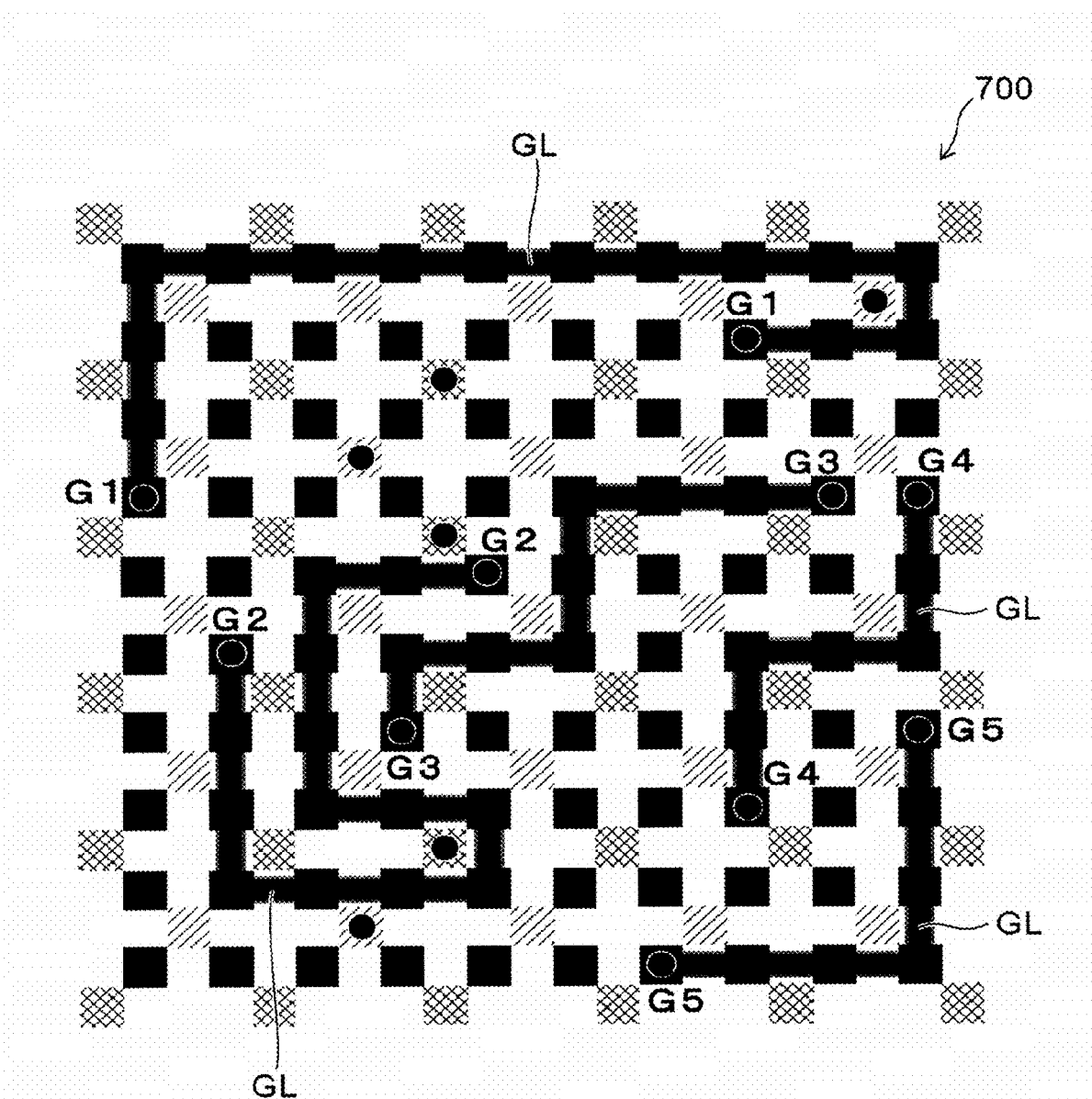

As shown in FIG. 111, the computer designs the green wiring connecting each of terminal pairs G1 to G5 in accordance with the rules (1) to (7). At this time, it is preferable to design a green wiring so as not to cross a blue or red wiring, which is designed later, and so as not to cross other green wiring. In this example, the pathways are designed so that the same wirings are provided as the wiring layout shown in FIG. 69A, however it is not limited thereto.

Figure 112:
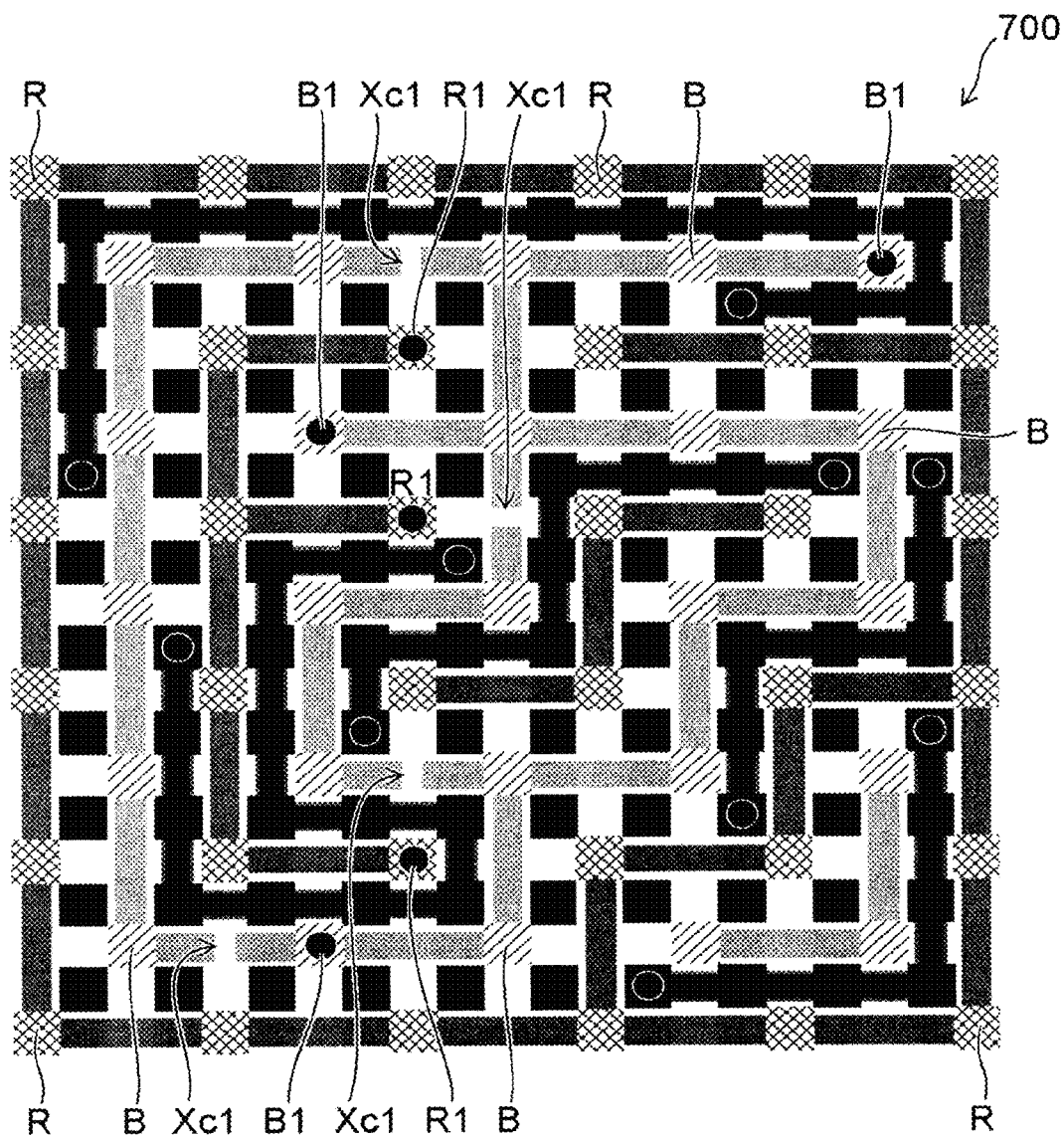

Next, as shown in FIG. 112, the computer designs the blue wiring connecting the terminals B1, and the red wiring connecting the terminals R1. For example, the blue wiring is designed so as to have one of the three terminals B1 taken as the start point, and remaining two taken as the end point. Subsequently, the red wiring is designed so as to have one of the three terminals R1 taken as the start point, and remaining two taken as the end point.

Either of the blue wiring and the red wiring may be designed in first. The blue wiring and the red wiring are designed so as not to cross each other, and both are designed so as not to cross the green wiring.

Next, the computer selects one of the blue wiring and the red wiring as the mandrel. For example, when the blue wiring is selected as the mandrel, a blue dummy wiring is designed, connecting grids B on which the blue wiring connecting the three terminals B1 does not provided. Furthermore, all grids B are connected to each other so that each grid B is connected to the adjacent one located at the connectable position. The computer designs the blue dummy wiring so as not to cross the red and green wirings. Then, the computer disposes one-line cutting patterns $X_{c1}$ on grids C, each of which locates at a position between the blue wiring and the blue dummy wiring.

Subsequently, the computer designs a red dummy wiring connecting between the grids R, on which the red wiring is not provided. All grids R are connected to each other so that each grid R is connected to the adjacent one, which locates at the connectable position. The computer designs the red dummy wiring so as not to cross the blue wiring, the blue dummy wiring, and the green wiring. When the red wiring is selected as the mandrel, the one-line cutting patterns $X_{c1}$ are disposed on the grids C, each of which locates at a position between the red wiring and the red dummy wiring.

Figure 113:
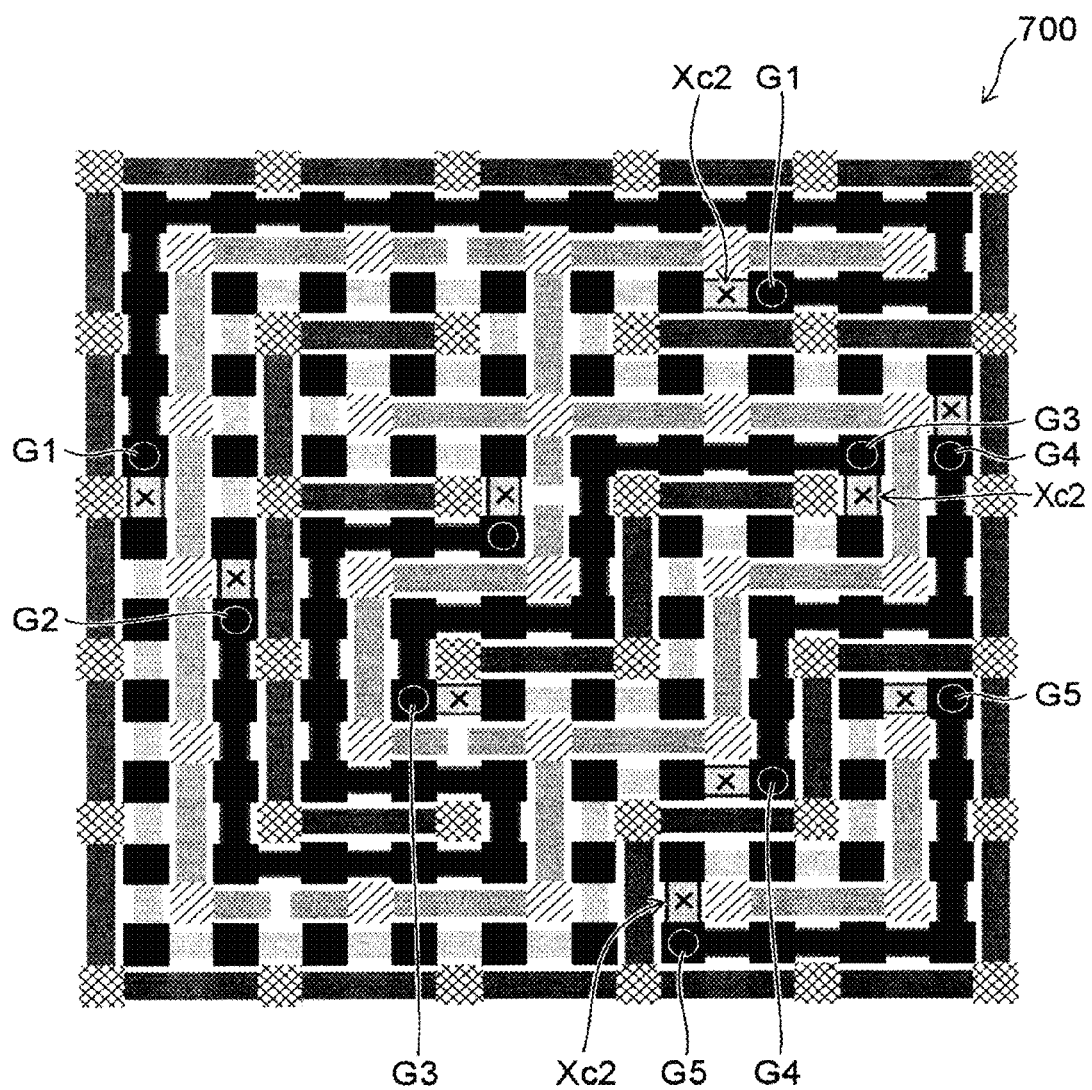

Next, as shown in FIG. 113, the computer designs green dummy wirings, each of which connects the grids G not included in the green wirings each connecting any one of the terminal pairs G1 to G5. The computer arranges an one-line cutting patterns $X_{c2}$ on the grids M and N, each of which locates at a position between one of the terminals G1 to G5 and the green dummy wiring adjacent thereto.

Through the above process, the computer may generate automatically the wiring layout shown in FIG. 69A, wherein the designer only specifies the start point and the end point of the wiring. Then, for example, a semiconductor device may be manufactured using the process shown in FIG. 70A to FIG. 75B. In this process, a resist 709 is provided at portions corresponding to the grids M and N, where the one-line cutting pattern $X_{c2}$ is disposed. Thereby, it is possible to cut a wiring 715 at a position where the one-line cutting pattern $X_{c2}$ is disposed.

At this point, this embodiment shows that the green wiring is designed first of all. However it is possible to design the blue wiring or the red wiring before designing the green wiring. In other words, a sequence of designing the wirings may not only depend on the color difference thereof. For example, the computer may design the wirings according a random order, such as a first blue wiring, a first green wiring, a second blue wiring, a first red wiring . . . .

Tenth Embodiment

Next, a tenth embodiment will be described with reference to FIG. 114A to FIG. 127. In the embodiment, an exemplary wiring process is described, which is different from a damascene process, and applied for forming wirings beneath a mask for selectively removing metal layer. FIG. 114A to FIG. 115F are schematic views showing a manufacturing process of a semiconductor device according to the tenth embodiment. FIG. 116 to FIG. 121 are plan views showing a method for designing a wiring layout according to the embodiment. FIG. 122 to FIG. 127 are schematic views showing a process of forming a wiring pattern according to the embodiment.

Figure 114A:
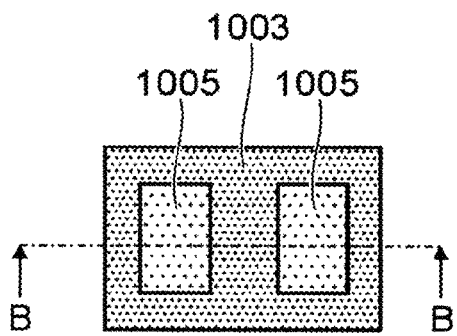
Figure 114B:
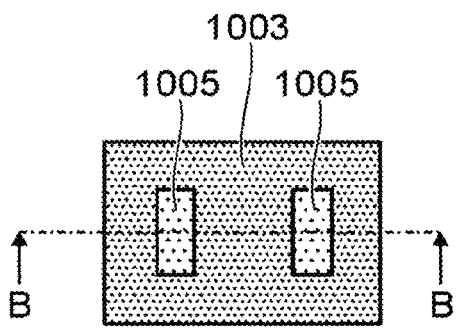
Figure 114C:
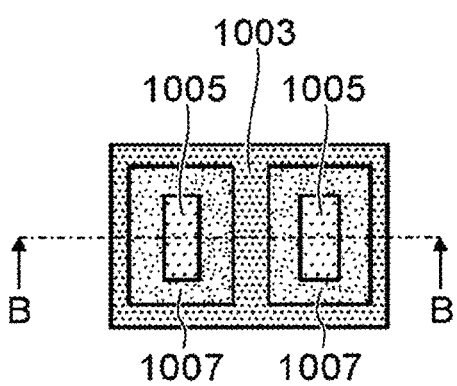
Figure 114D:
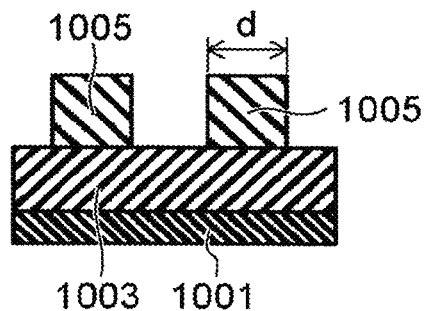

As shown in FIG. 114A and FIG. 114D, a metal layer 1003 is formed on an underlying layer 1001, and a mandrel 1005 is provided thereon. FIG. 114A is a plan view showing an upper surface of the metal layer 1003, and FIG. 114D is a cross-sectional view taken along B-B line in FIG. 114A. The relationship between the plan view and the section view is much the same for views showing following processes.

The underlying layer 1000 is, for example, an interlayer insulating film, and the metal layer 1003 is, for example, a tungsten layer. A width of the mandrel 1005 is, for example, a critical width "d" of the wiring pattern capable of being formed by photolithography, and spacing between the adjacent mandrels 1005 is also provided with a width around "d".

Figure 114E:
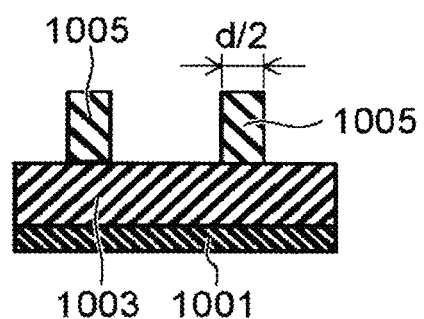

Next, as shown in FIG. 114B and FIG. 114E, the mandrel 1005 is subjected to slimming, and the line width is provided with a width around "d"/2.

Figure 114F:
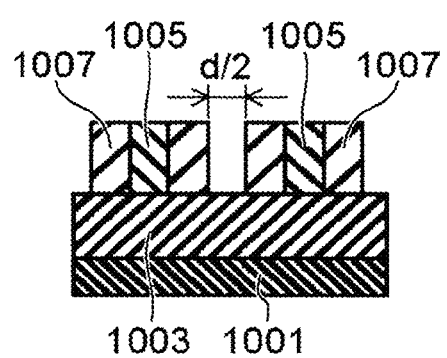

Subsequently, as shown in FIG. 114C and FIG. 114F, a side wall (insulating film 1007) is formed on a side surface of the mandrel 1005. The insulating film 1007 is formed to have a width around "d"/2, for example. Thereby, a space with the width around "d"/2 is provided between the adjacent mandrels 1005 via the side walls provided on each side surface thereof.

Figure 115A:
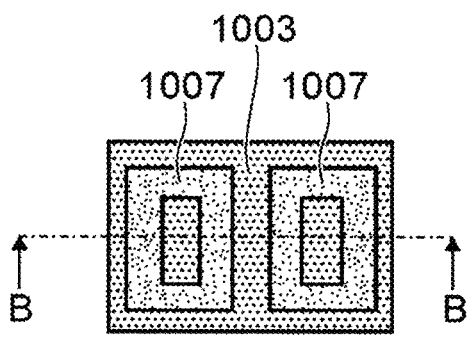
Figure 115D:
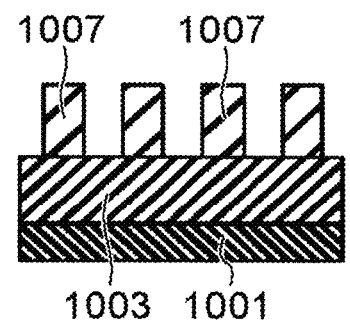

Next, as shown in FIG. 115A and FIG. 115D, the mandrel 1005 is selectively removed. Thereby, the side wall 1007 is left on the metal layer 1003. A width of the side wall 1007 and spacing between the side walls 1007 adjacent to each other are provided to be around "d"/2, respectively.

Figure 115B:
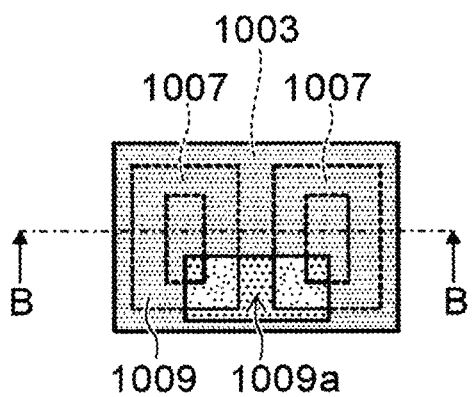
Figure 115E:
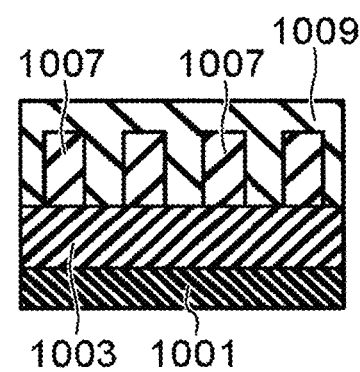

Next, as shown in FIG. 115B and FIG. 115E, for example, a resist 1009 is formed so as to cover the metal layer 1003 having the side wall 1007. The resist 1009 has an opening 1009a, and part of the side wall 1007 is exposed inside the opening 1009a. Subsequently, the exposed part of the side wall 1007 is removed by etching, wherein the resist 1009 serves as a mask. The resist 1009 may be formed so as to have the opening 1009a, for example, using the trimming mask of the sixth and seventh embodiments.

Figure 115C:
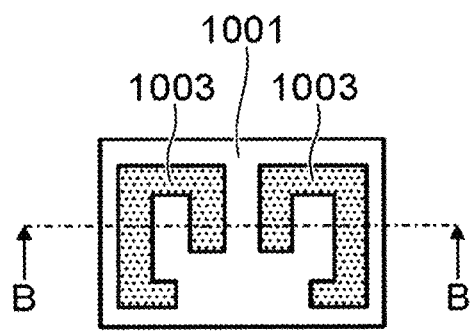
Figure 115F:
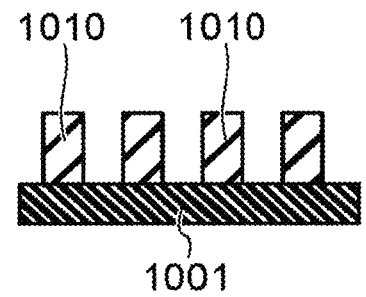

Subsequently, the resist 1009 is removed, and the metal layer 1003 is etched using the side wall 1007 as a mask. Thereby, as shown in FIG. 115C and FIG. 115F, a wiring 1010 is formed on the underlying layer 1001. The wiring 1010 has a width of about "d"/2 and spacing between the adjacent wirings has also the width around "d"/2.

In the manufacturing method according to the embodiment, a portion on which the mandrel 1005 is formed provides a space between the wirings.

Next, a method for designing the wiring mask used for the manufacturing process above will be described with reference to FIG. 116 to FIG. 121. In the embodiment, the wiring layout is also designed using the side wall wiring base grid 700. As described in the seventh embodiment and the other embodiment, the base grid 700 includes the blue grid B, the red grid R, the green grid G, and three kinds of colorless grids C, M, N (see FIG. 68A).

Figure 116:
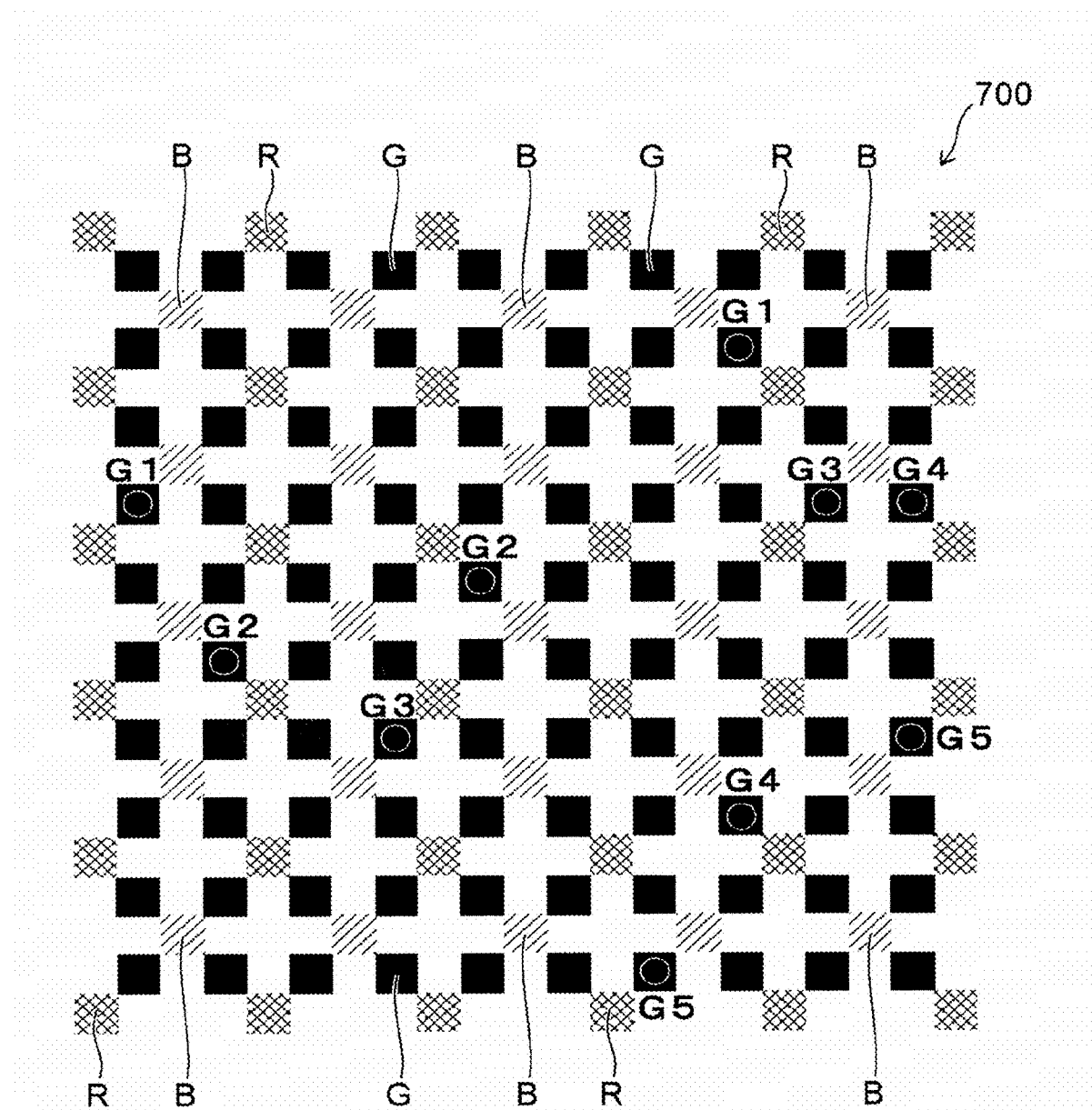

As shown in FIG. 116, a pair of terminals G1 is disposed respectively on two green grids. Terminals G2 to G5 are also disposed on the other green grids G in the same manner. For example, it is preferable that one of the terminals G1 is a start point of two-terminal-pair network, and an end point thereof. Each of terminal pair G2 to G5 also includes a start point and an end point of the two-terminal-pair network.

Figure 117:
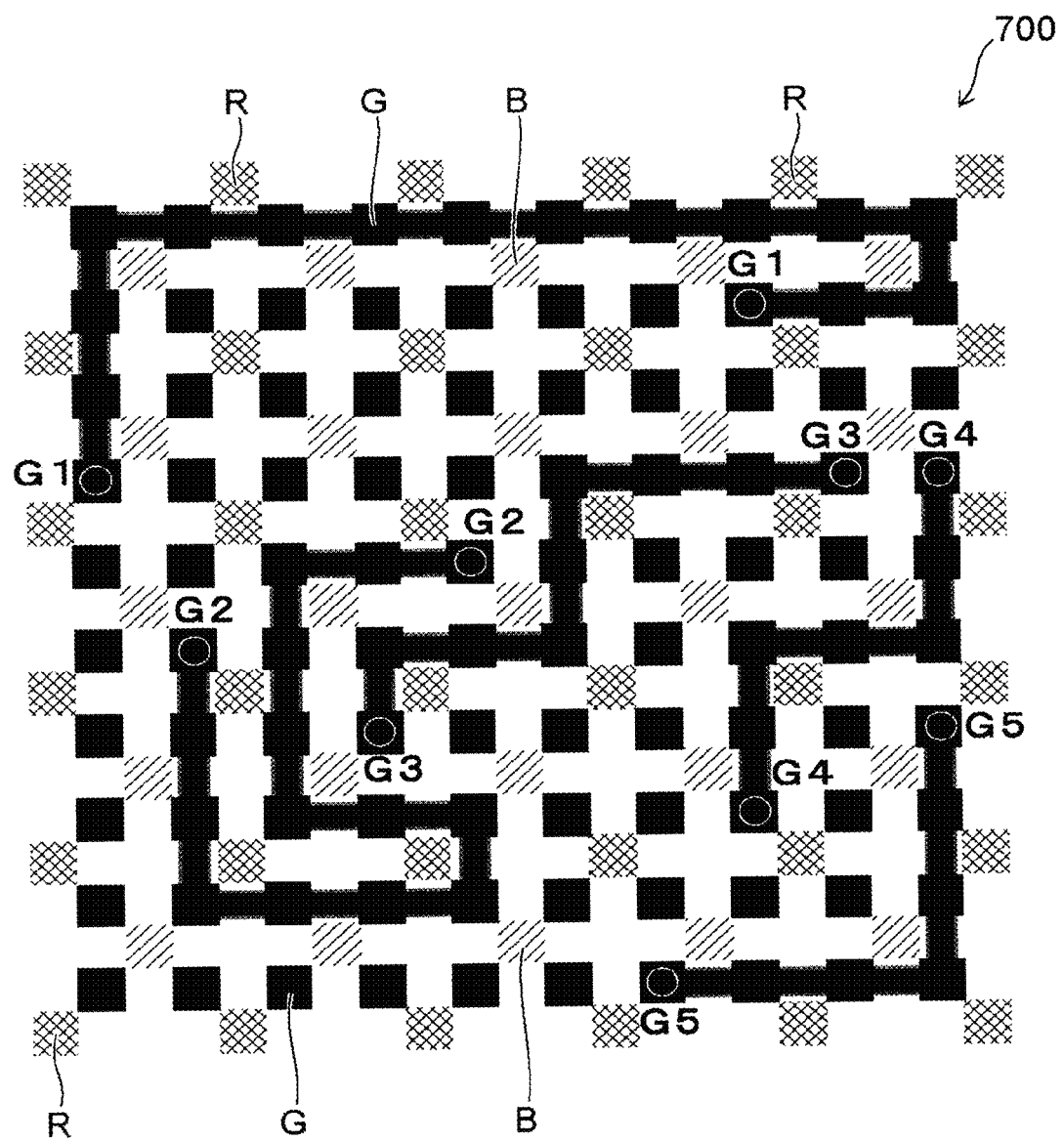

Next, as shown in FIG. 117, the green wiring GL is formed so as to connect terminal pair G1 in accordance with the rules described, for example, in the seventh or ninth embodiment. Subsequently, the other green wirings GL are formed so as to connect each of the terminal pair G2 to G5. The green wirings GL each connecting different terminal pair are formed so as not to cross each other. In this example, the green wirings GL are provided with the same pathways as the ones shown in FIG. 69A. However, it is not limited thereto, and another pathway may be selected.

Figure 118:
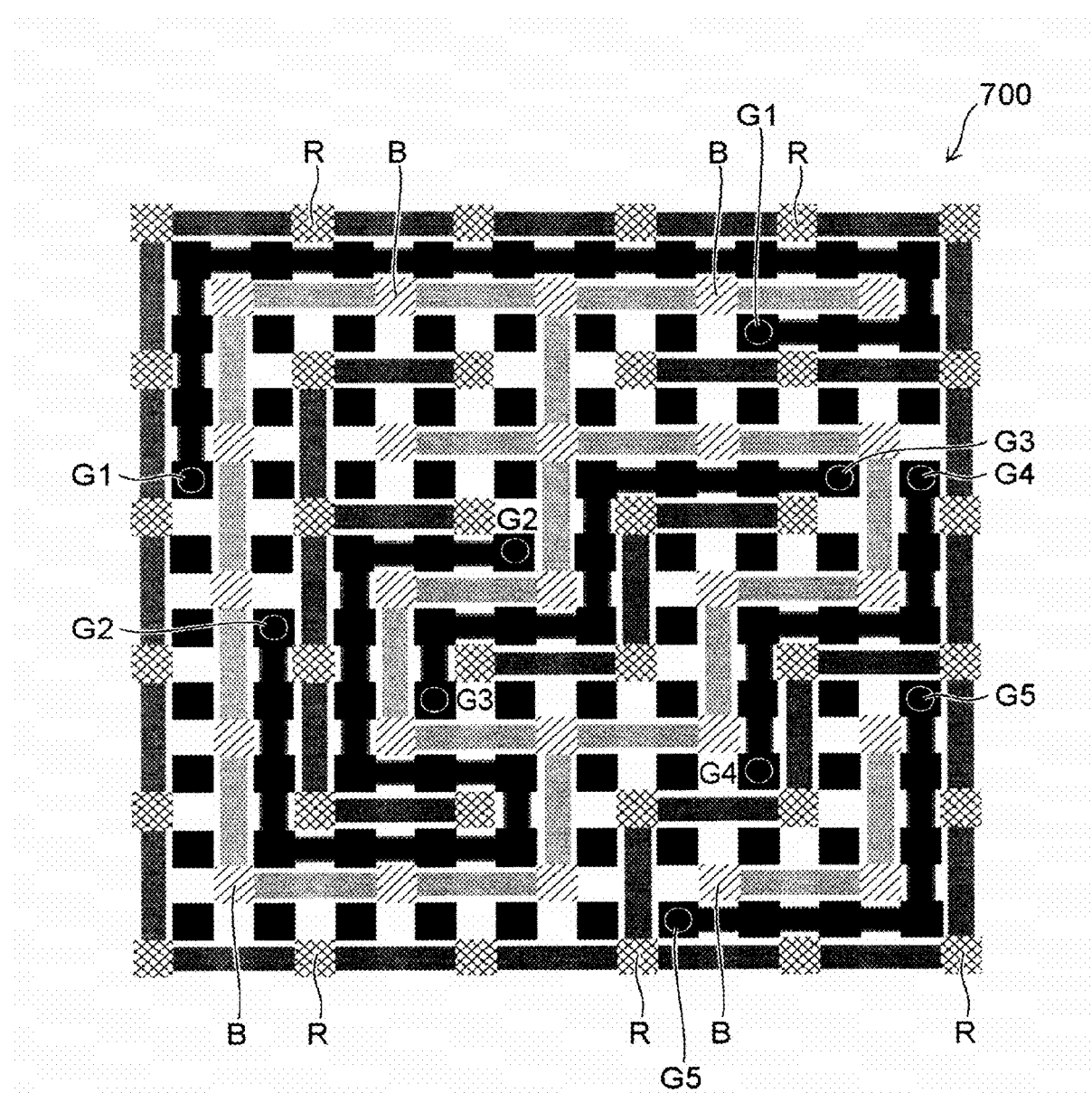

Next, as shown in FIG. 118, the blue wiring is formed so as to connect blue grids B to each other, and the red wiring is formed so as to connect red grids R to each other. All blue grids B and all red grids R are respectively connected to each other, and the wiring paths are provided on all of the colorless grids C. The blue wiring and red wiring are formed not to cross one another, and not to cross the green wirings GL.

Figure 119:
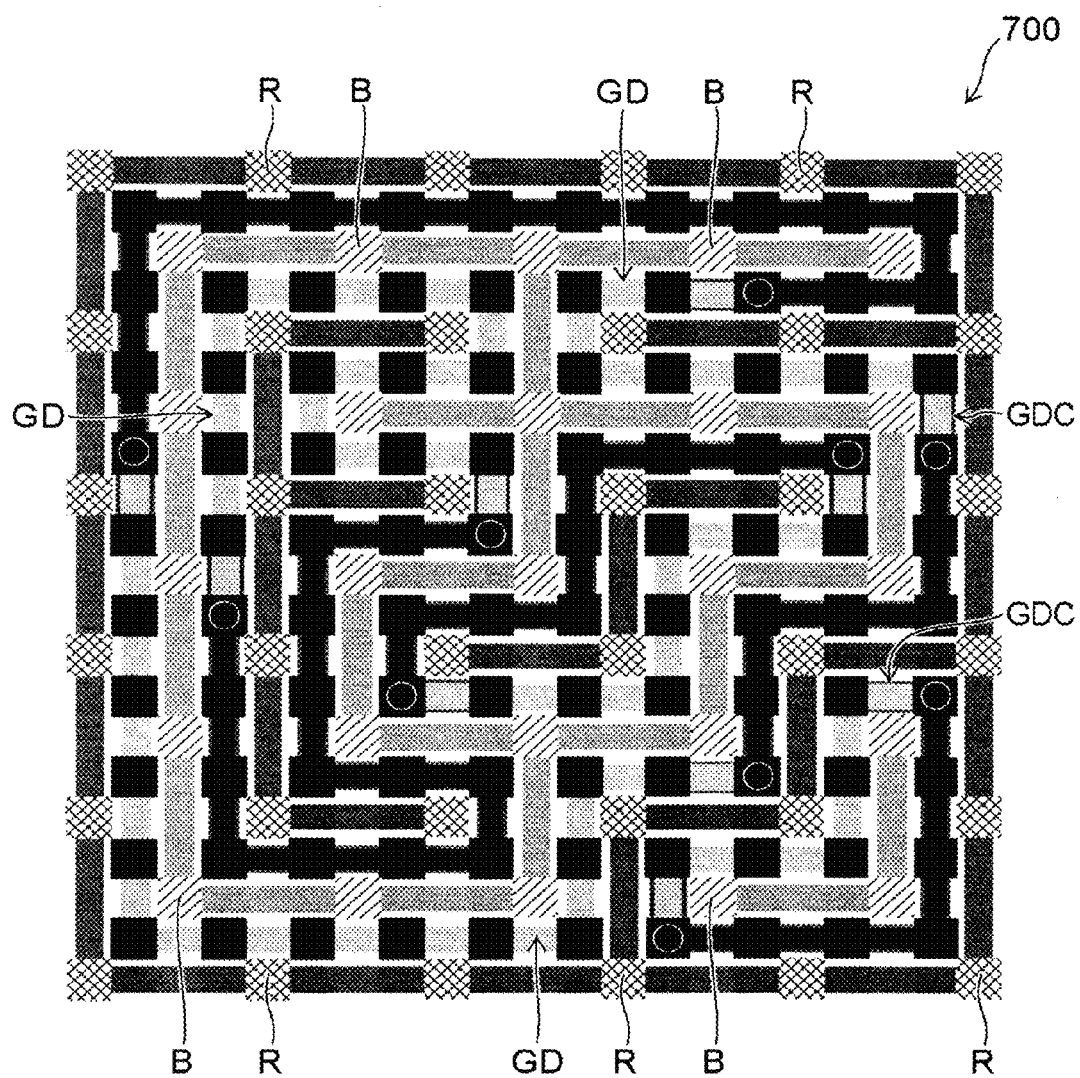

Next, as shown in FIG. 119, dummy green wirings GD are formed by connecting green grids G on which the green wiring GL is not provided. Furthermore, dummy wirings GDC are disposed on the colorless grids M and N each located between one of terminals G1 to G5 and a green dummy wiring GD adjacent thereto. Thereby, all green grids G are connected to each other, and thus the wirings are provided on all colorless grids M and N.

Figure 120:
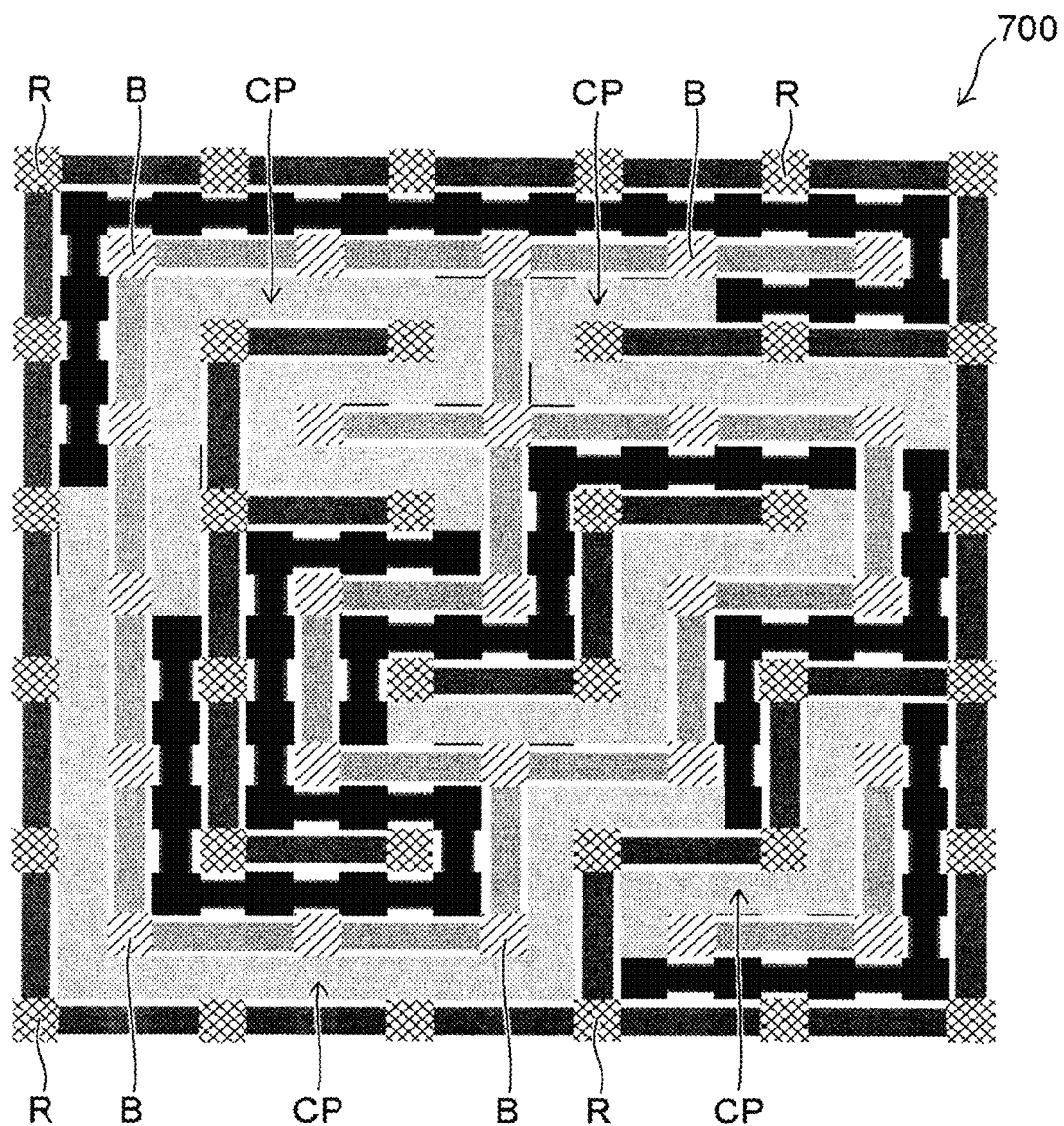

Next, as shown in FIG. 120, cut patterns CP are extracted to cover the green dummy wirings GD and GDC using the method for forming a trimming mask described in the sixth embodiment, for example.

Figure 121:
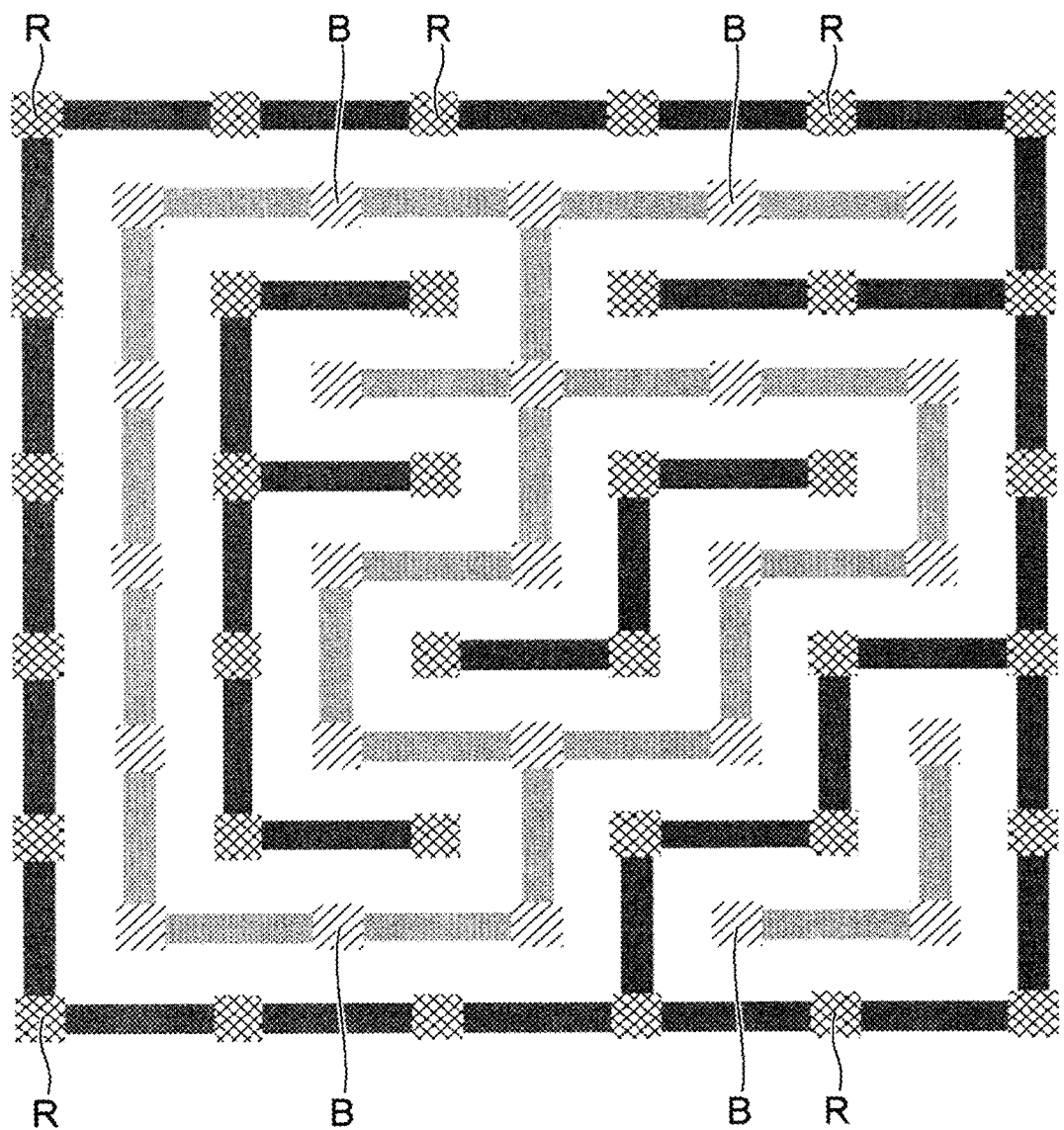

FIG. 121 is a layout that shows the blue wirings and the red wirings extracted from the wiring layout in FIG. 119. Either of the blue wirings and the red wirings shown in the figure can be used as a mandrel pattern.

Next, examples of the layout pattern used in a manufacturing process according to the embodiment will be described.

Figure 122:
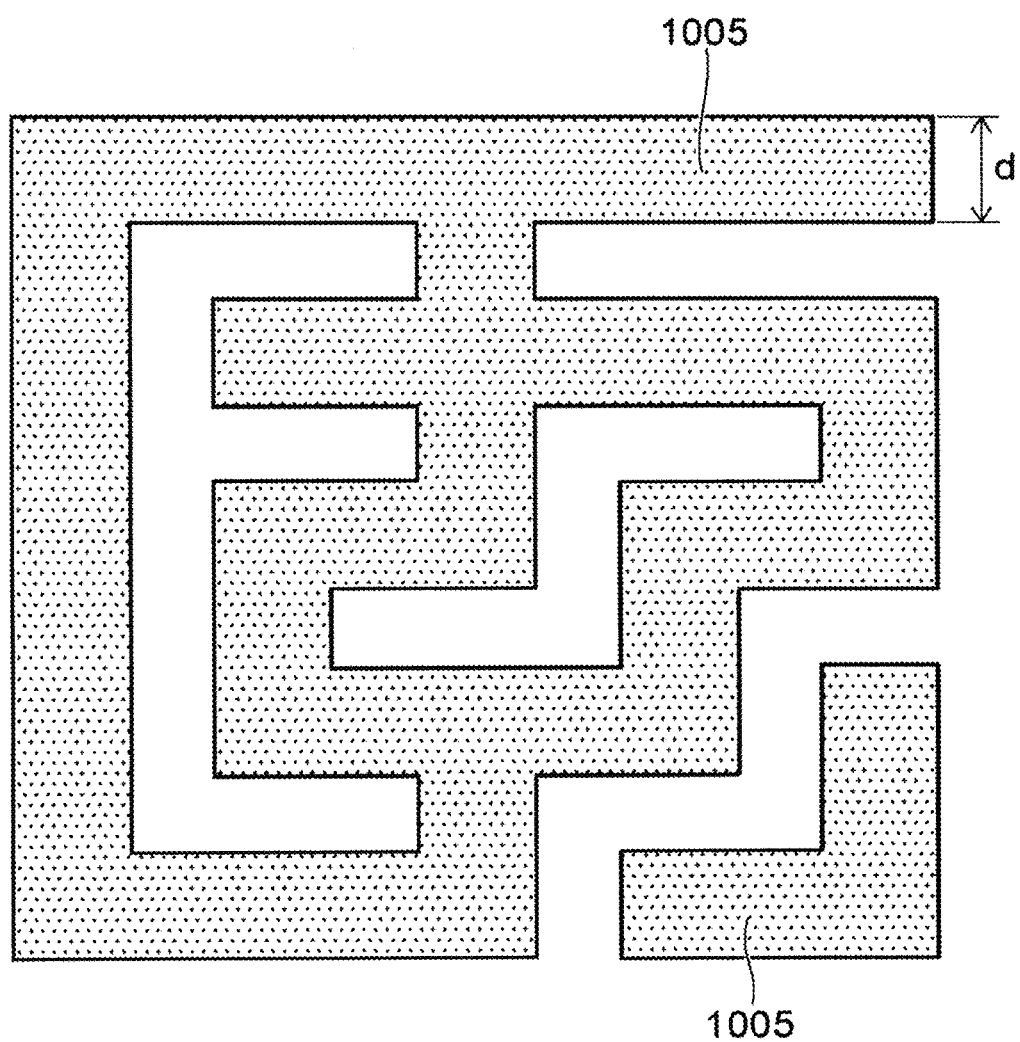

In FIG. 121, the blue wirings are selected as the mandrel, and the mask pattern is formed, for example. FIG. 122 shows the mask pattern of the mandrel, which is formed using the blue wirings. The mask pattern is provided with a width around "d" (2F), for example.

Figure 123:
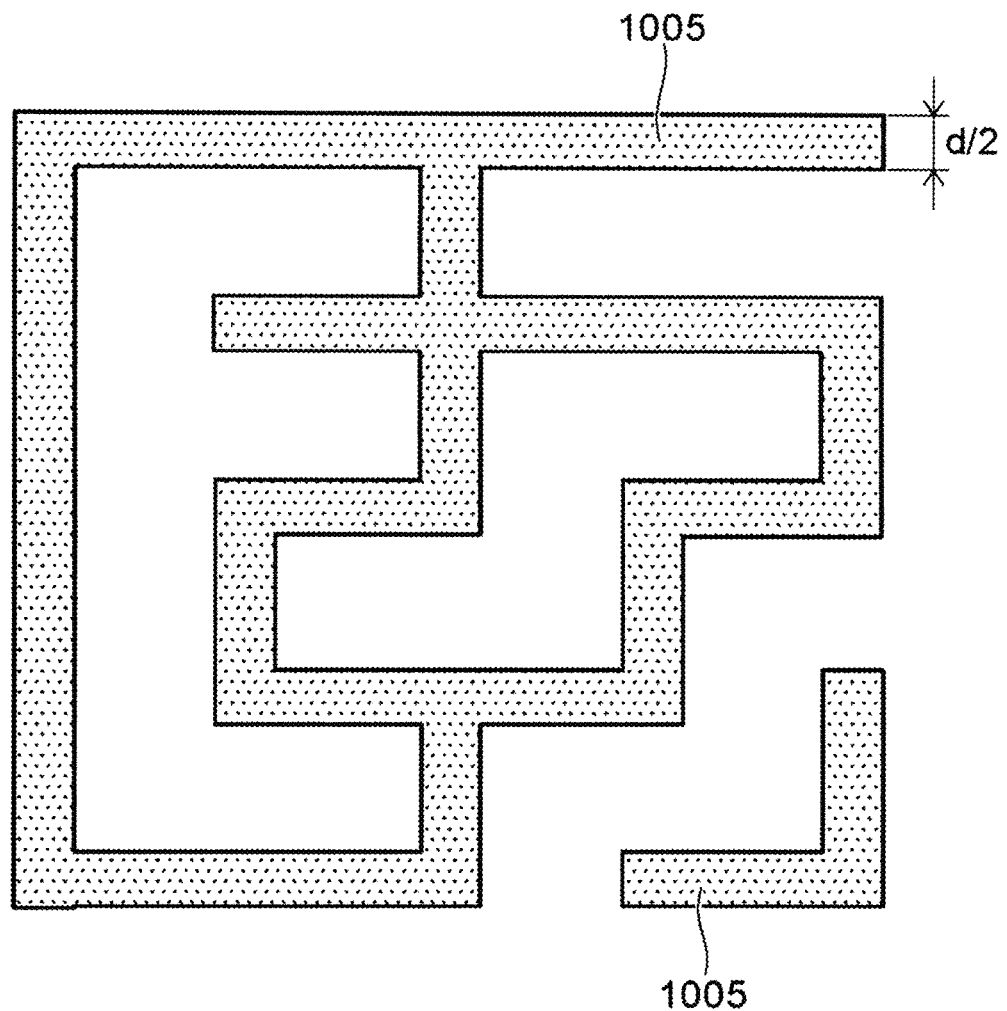

Next, the mandrel 1005 is formed on the metal layer 1003 using the mask pattern of the mandrel shown in FIG. 122 (see FIG. 114A and FIG. 114D). Subsequently, as shown in FIG. 123, the mandrel 1005 is subjected to slimming, and provided with the width around "d"/2 (F).

Figure 124:
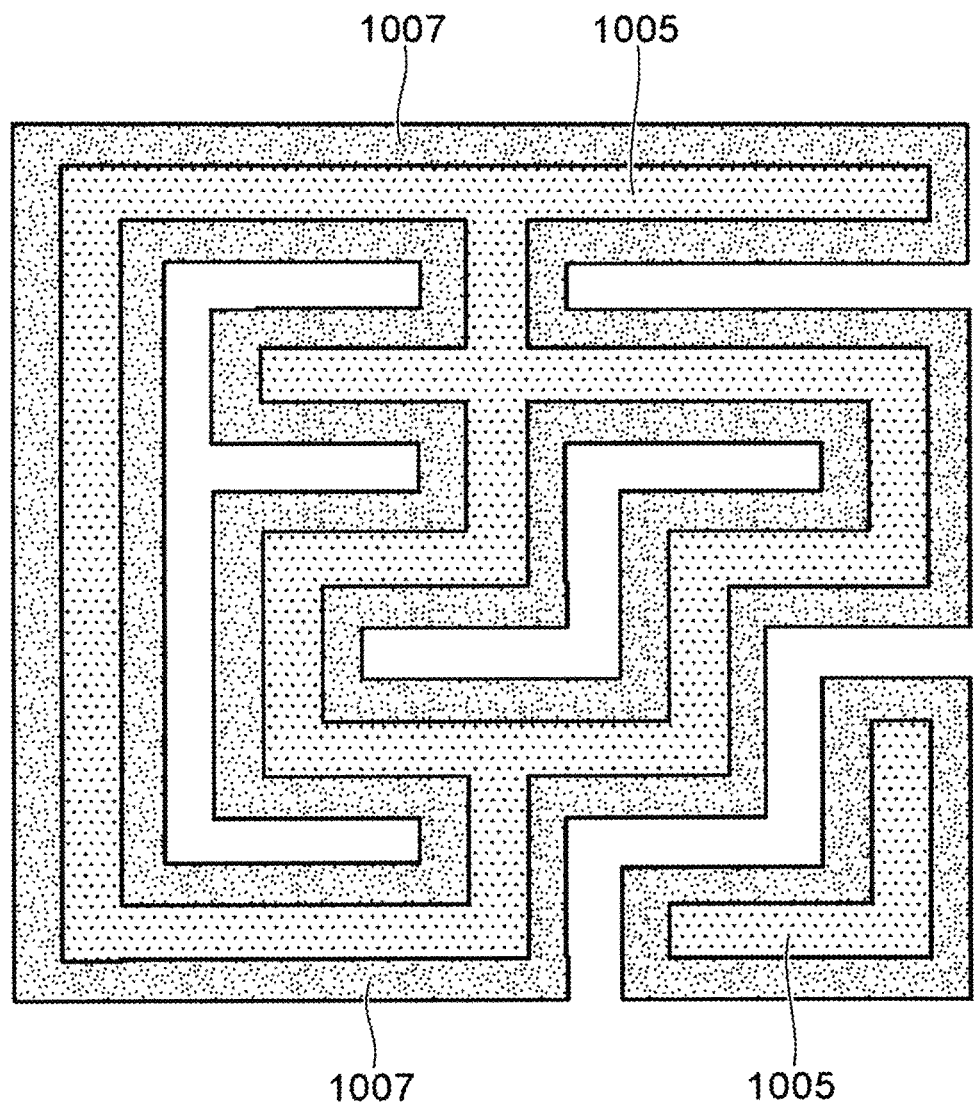
Figure 125:
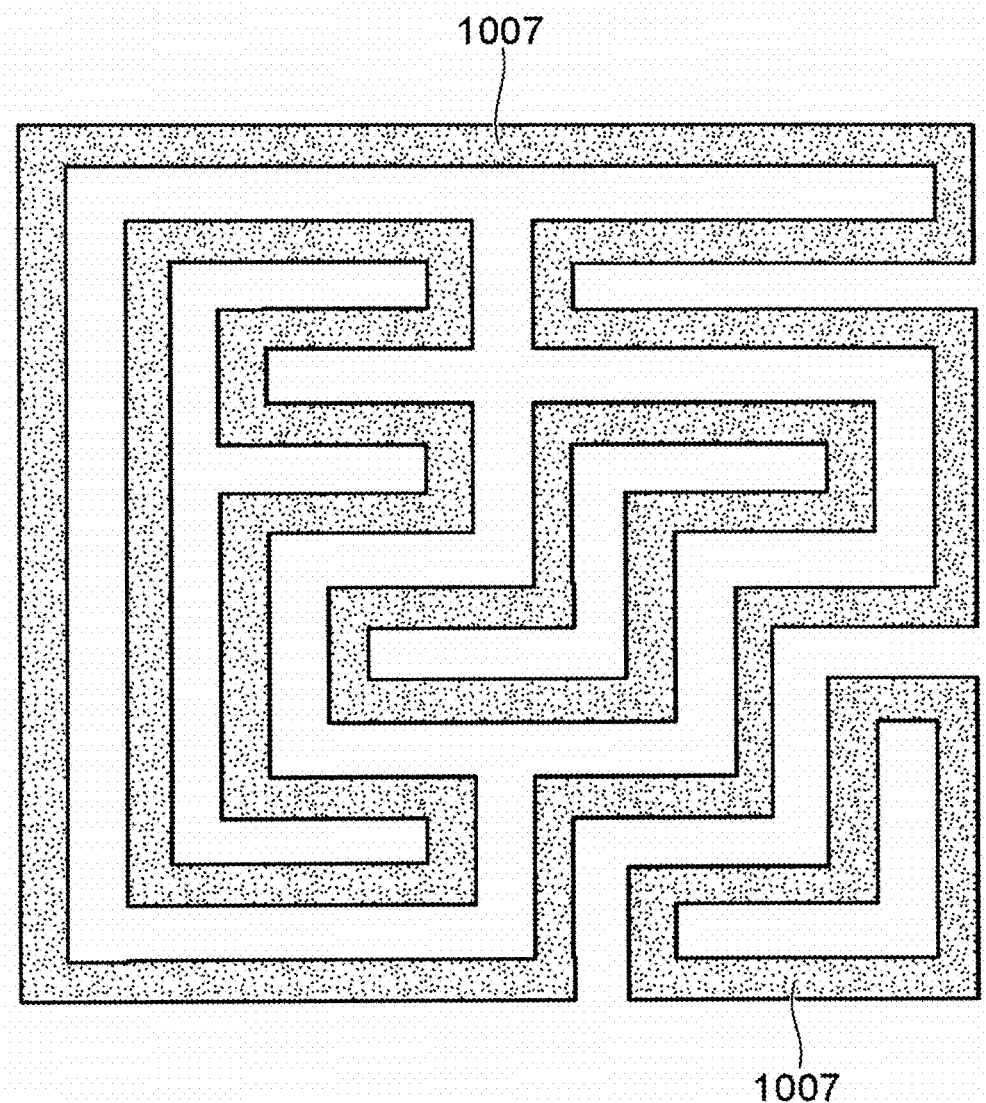

Next, as shown in FIG. 124, a side wall 1007 is formed on a side surface of the mandrel 1005. The side wall 1007 is formed to have a width around "d"/2 (F), for example. Subsequently, as shown in FIG. 125, the mandrel 1005 is selectively removed, leaving the side wall 1007 on the metal layer 1003.

Figure 126:
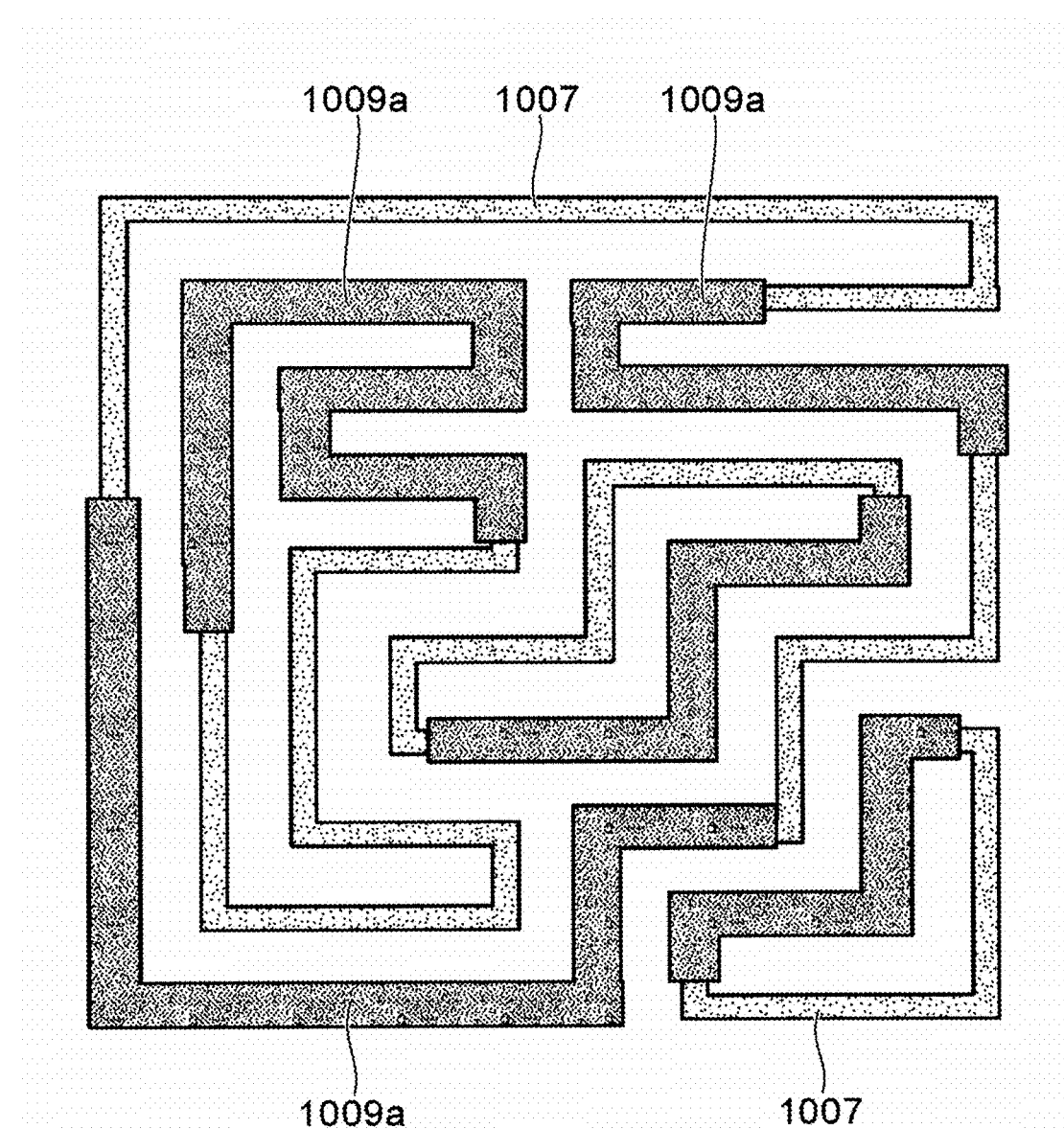

Next, as shown in FIG. 126, a resist 1009 is formed so as to cover the metal layer 1003 and the side wall 1007 formed thereon (see FIG. 115B). The resist 1009 has the opening 1009a corresponding to the cut pattern CP. The opening 1009a is provided with a width, for example, around "d" (2F), and thus it may be possible to be formed using photolithography.

Figure 127:
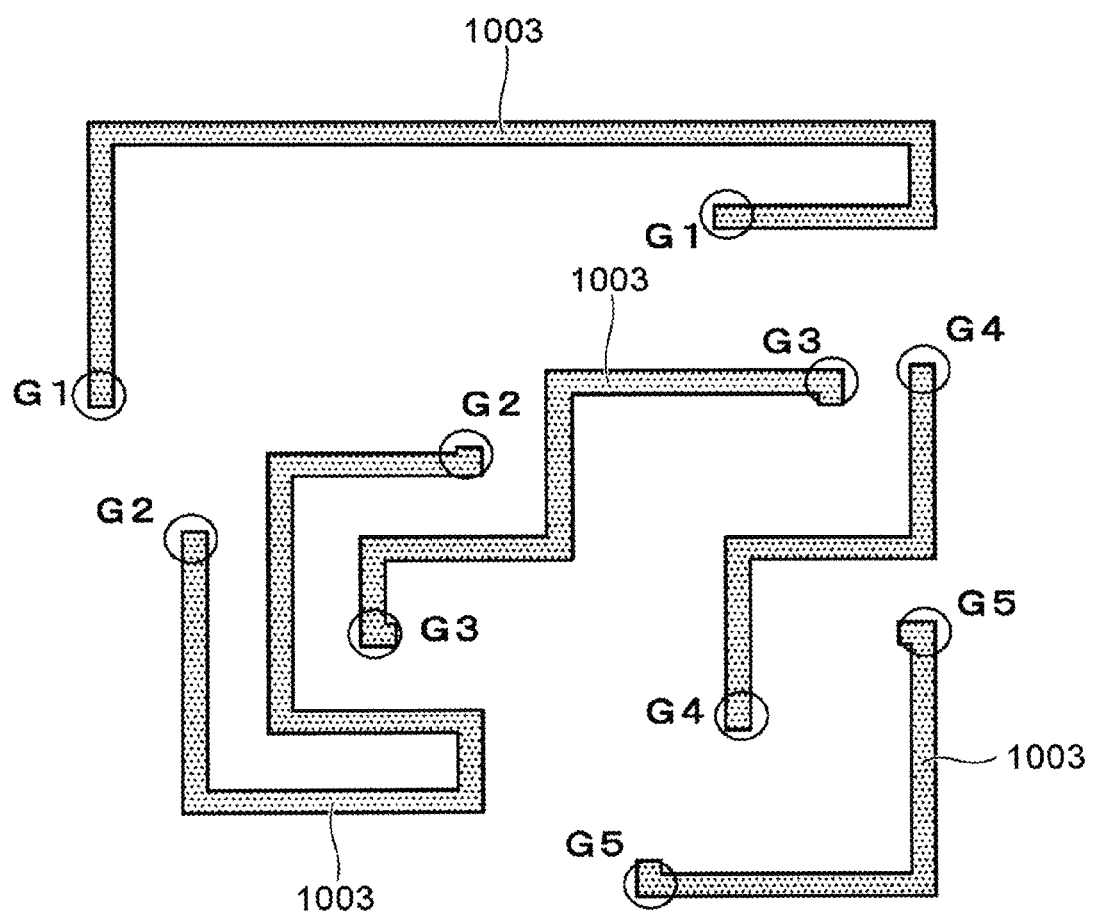

Subsequently, unnecessary portions of the side wall 1007 are removed by etching, using the resist 1009 as a mask. Thereby, as shown in FIG. 127, wiring patterns are formed so as to connect each of terminal pairs G1 to G5. The wiring 1010 is formed by etching the metal layers 1003 using the side wall 1007 as a mask, and electrically connects each terminal pair (see FIG. 115C and FIG. 115F).

In this manner, the wiring layout is realized for implementing the manufacturing method where the wirings are formed beneath the side wall.

Eleventh Embodiment

A method of mask design according to an embodiment will be described with reference to FIG. 128 to FIG. 136.

Figure 128:
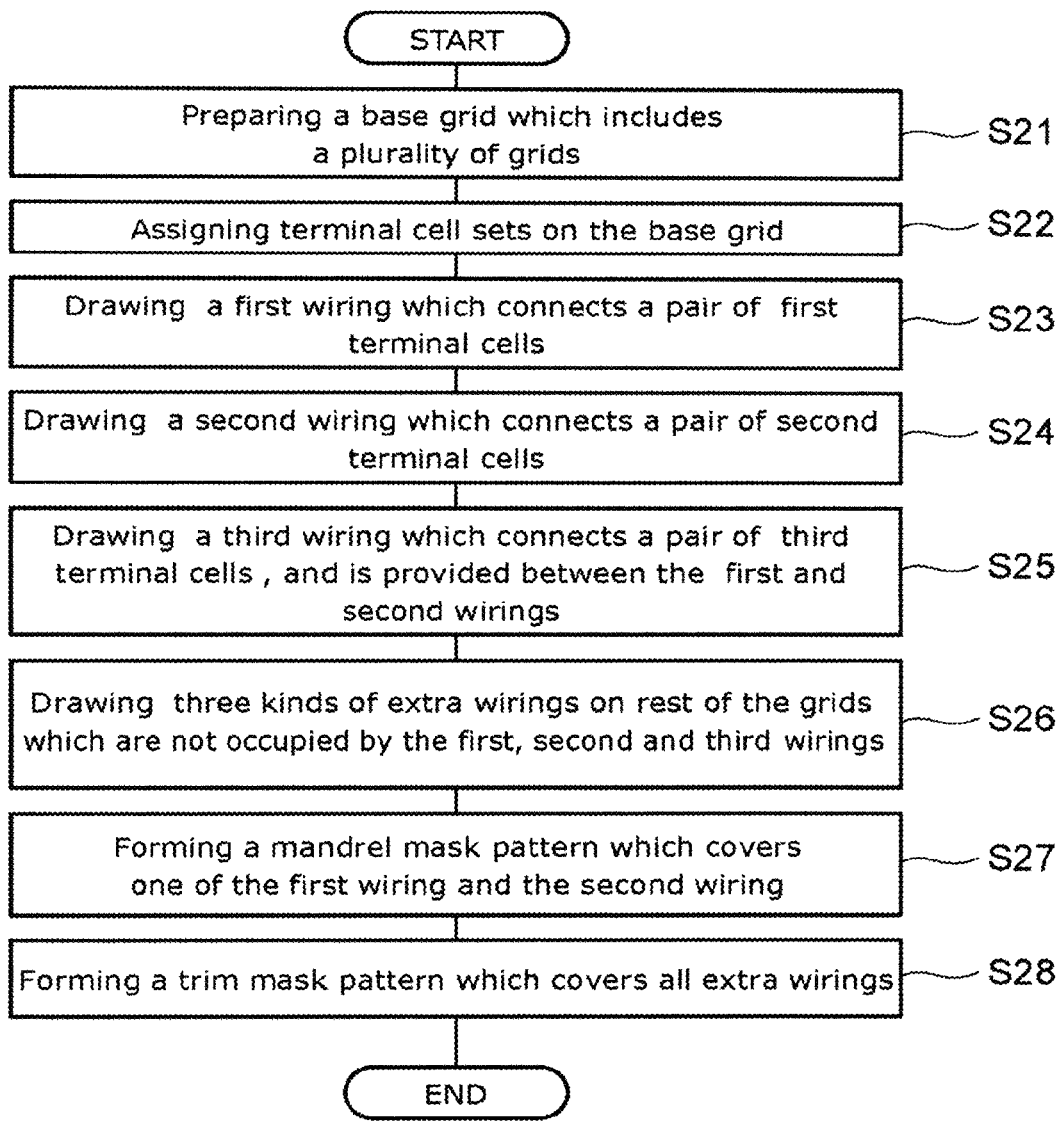

FIG. 128 is a flow chart illustrating a process of mask design.

As shown in FIG. 128, the method of mask design according to the embodiment includes the following procedures.

1) A base grid including a plurality of grids G(m,n) is prepared. The indexes m and n used here are positive integer. The base grid has, for example, a structure in which the plurality of grids are disposed in m×n matrix configuration (S21).

2) A plurality of pairs of terminals are disposed on the base grid (S22). More specifically, the grids G(m,n) on which the terminals are disposed are assigned. Hereinafter, when not assigning positions of the grids, the grid is referred to as grid G. Here, only one terminal is disposed on one grid G.

3) A first wiring connecting between a first pair of terminals among the plurality of pairs of terminals is drawn on the base grid (S23). The first wiring passes through at least one or more grids G and connects one terminal of the first pair of terminals to the other terminal. In other words, the first wiring shows one path connecting one of the first pair of terminals to the other. The first wiring is not limited to one, but may be a plurality of first wirings connecting each pairs of first terminals. The first wirings are drawn so as to separate from each other via the three or more grids G.

4) A second wiring connecting between a second pair of terminals among the plurality of pairs of terminals is drawn on the base grid (S24). The second wiring passes through at least one or more grids G and connects one terminal of the second pair of terminals to the other terminal. In other words, the second wiring shows one path connecting the one of second pair of terminals to the other. The second wiring is not limited to one, but may be a plurality of second wirings connecting each of pairs of second terminals. The plurality of second wirings are drawn so as to separate from each other via three or more grids. The second wiring is drawn so as to be separated from the first wiring via one or more grids G.

5) A third wiring connecting between a third pair of terminals among the pairs of terminals is drawn on the base grid (S25). The third wiring passes through at least one or more grids G and connects one terminal of the third pair of terminals to the other terminal. In other words, the third wiring shows one path connecting the one of third pair of terminals to the other. The third wiring is drawn on the grid G placed between the first wiring and the second wiring. One side of the third wiring faces only the first wiring, and one other side faces only the second wiring.

6) Three types of dummy wirings are drawn on the grid G where any of the first wiring, the second wiring and the third wiring are not drawn (hereinafter, referred to as open grid) (S26).

The first dummy wiring is drawn on the open grids along a first side of the third wiring. The first side surface of the third wiring faces the first wiring. The second dummy wiring is drawn on the grid G along a second side of the third wiring. The second side surface of the third wiring faces the second wiring. There may be a plurality of first dummy wirings and the second dummy wirings disposed along third wirings.

Next, another first dummy wiring is drawn on the open grids where any wiring is not drawn. For example, the first dummy wiring is drawn so as to be separated from other first dummy wiring via three or more grids. The first dummy wiring is drawn on the open grids separated from the second wiring or the second dummy wiring via one or more grids G.

That is, the one or more grids G is interposed between the first dummy wiring and the second wiring or the second dummy wiring.

Another second dummy wiring is drawn so as to be separated from other second dummy wiring via three or more grids. Another second dummy wiring is drawn on the open grids separated from the first wiring or the first dummy wiring via one or more grids G. The one or more grids G is interposed between another second dummy wiring and the first wiring or the first dummy wiring.

Next, at least one of the first wiring, the first dummy wiring, the second wiring and the second dummy wiring is expanded over the open grids where any wiring is not drawn. In this case, an expanded part of the first wiring and an expanded part of the first dummy wiring are drawn to be separated from one of the second wiring and the second dummy wiring via one or more grids. The expanded parts of the first wiring and the second wiring are regarded as parts of dummy wirings, respectively.

Subsequently, a third dummy wiring is drawn on open grids between the first wiring and one of the second wiring and the second dummy wiring, and between the first dummy wiring and one of the second wiring and the second dummy wiring. The third dummy wiring is drawn so as to bury all open grids where any wiring is not drawn.

7) A mandrel mask pattern covering the first wiring and the first dummy wiring, or the second wiring and the second dummy wiring is derived (S27).

8) A trimming mask pattern covering all dummy wirings is also derived (S28).

In the above procedure, the first wiring, the second wiring and the third wiring are not limited to an example connecting between two terminals, and may be drawn, for example, so as to go through a third terminal. The above process is executed, for example, by using a mask design system shown in FIG. 49. For example, the computer (i.e. the controller) displays the base grid on the display unit and draws respective wirings based on data inputted by a designer via an input unit.

Next, a method of mask design will be more specifically described with reference to FIGS. 129 to 136. FIGS. 129 to 136 are schematic plan views illustrating a process of mask design.

Figure 129:
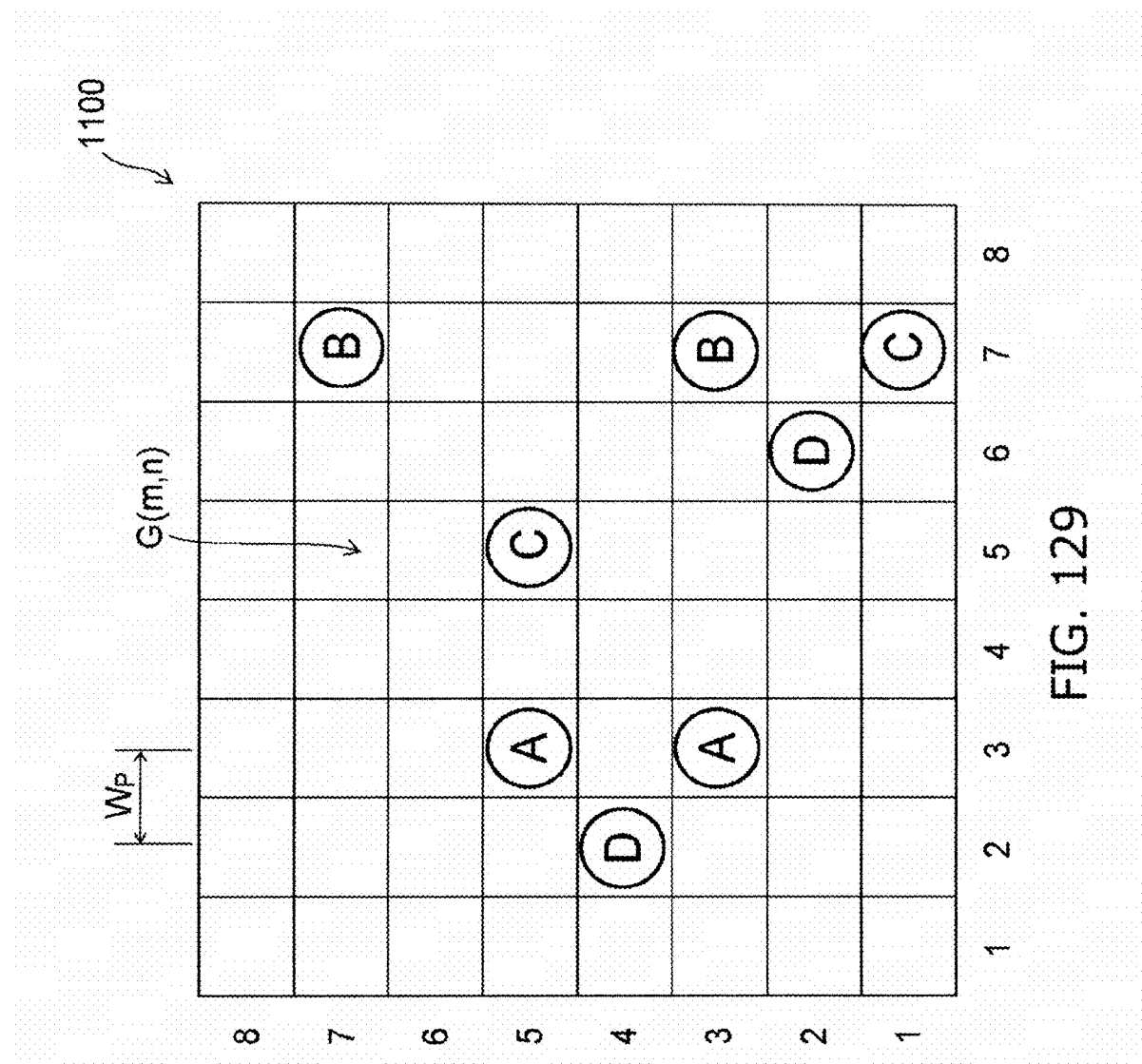

A base grid 1100 shown in FIG. 129 is prepared (S21). The base grid 1100 includes a plurality of grids G(m,n). The grids G are disposed, for example, in 8×8 matrix configuration. Disposition pitch $W_p$ of the grids G is, for example, finally taken as a wiring pitch. Subsequently, a plurality of pairs of terminals A to D are disposed on the base grid 1100 (S22).

Figure 130:
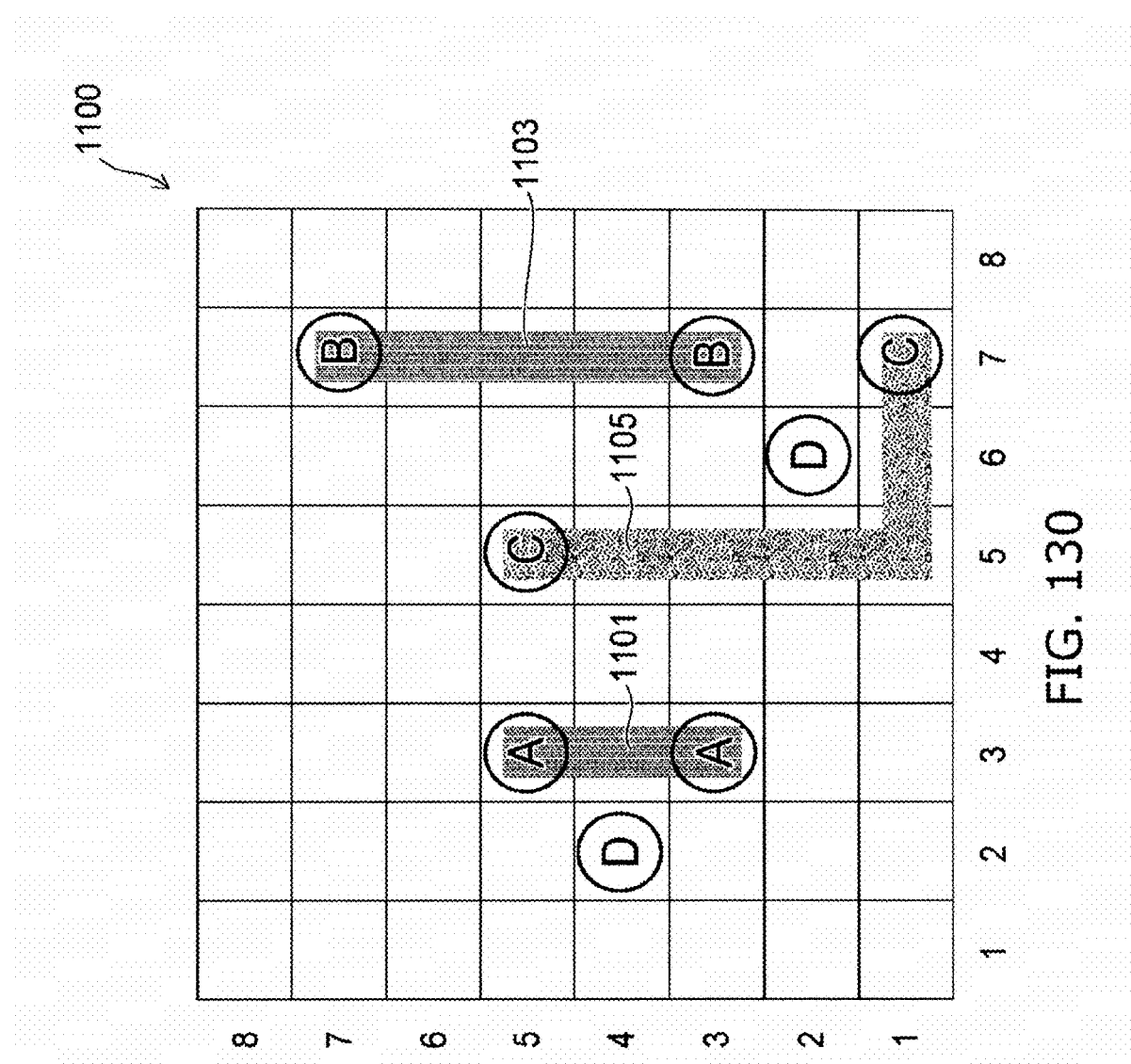

As shown in FIG. 130, a first wiring 1101 is drawn to connect the pair of terminals A, and another first wiring 1103 is drawn to connect the pair of terminals B (S23). The first wiring 1103 is drawn so as to be separated from the first wiring 1101 via three grids G. The first wiring 1101 is drawn so as not to pass through the grids G where terminals other than the pair of terminals A are disposed. The first wiring 1103 is drawn so as not to pass through the grids where terminals other than the pair of terminals B are disposed.

Subsequently, a second wiring 1105 is drown to connect the pair of terminals C (S24). The second wiring 1105 is drawn so as to be separated from the first wirings 1101 and 1103 via one grid G. The second wiring 1105 is drawn so as not to pass through the grids on which terminals other than the pair of terminals C are disposed.

Figure 131:
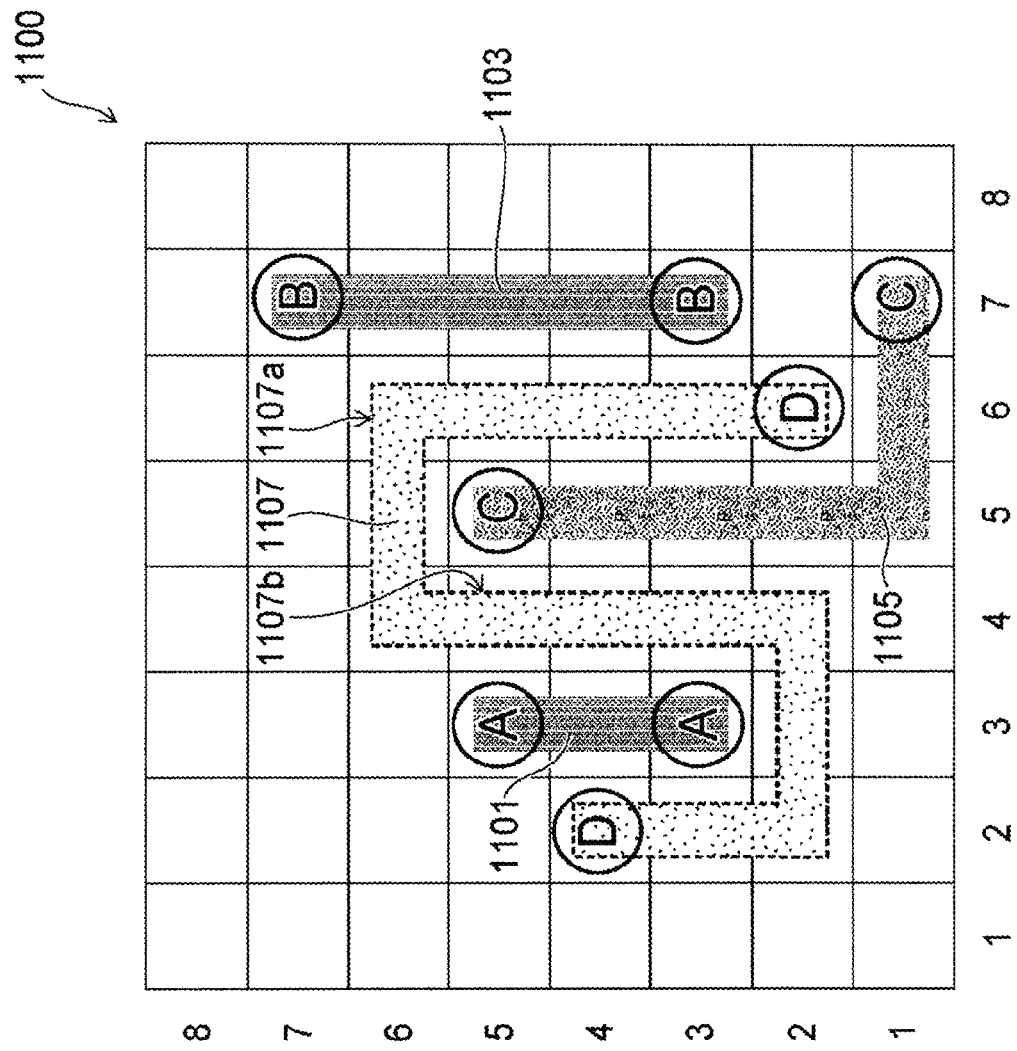

As shown in FIG. 131, a third wiring 1107 is drawn to connect the pair of terminals D (S25). The third wiring is drawn so as to pass through grids G between the first wiring 1101 and the second wiring 1105 and between the first wiring 1103 and the second wiring 1105. A first side 1107a of the third wiring 1107 faces the first wirings 1101 and 1103, but does not face the second wiring 1105. A second side 1107b of the third wiring 1107 faces the second wiring 1105, but does not face the first wirings 1101 and 1103. The third wiring 1107 is drawn so as not to have a branch which provides a T-shaped part.

Figure 132:
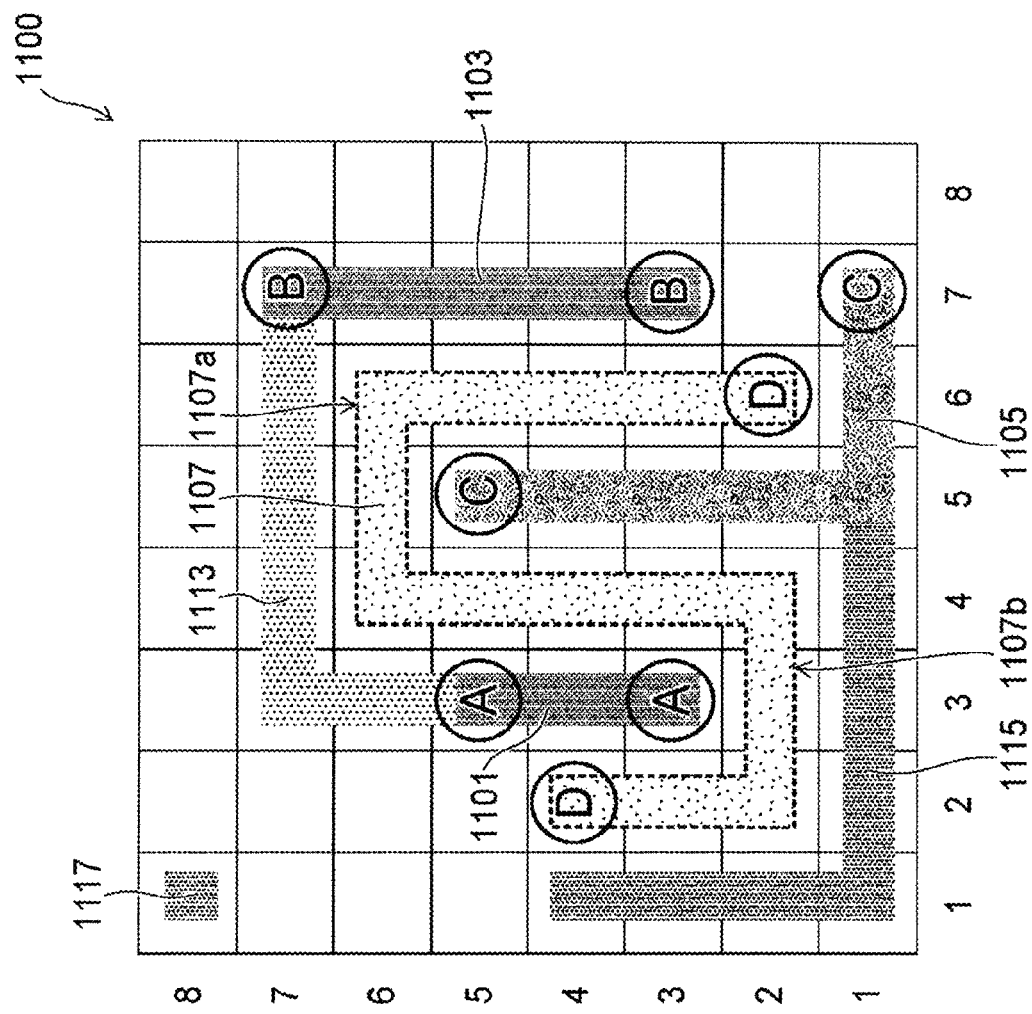

As shown in FIG. 132, a first dummy wiring 1113 and a second dummy wiring 1115 are drawn (S26). The first dummy wiring 1113 is drawn on open grids along the first side 1107a of the third wiring 1107. The second dummy wiring 1115 is drawn on open grids along the second side 1107b of the third wiring 1107.

Subsequently, the first dummy wiring and the second dummy wiring are drawn on remaining open grids. The first dummy wiring is drawn so as to be separated from the first wiring and other first dummy wiring via three or more grids. The first dummy wiring is drawn on the open grids separated from the second wiring or the second dummy wiring via one or more grids G. Thus, one or more grids G are interposed between the first dummy wiring and the second wiring or the second dummy wiring.

The second dummy wiring is drawn so as to be separated from the second wiring and other second dummy wiring via three or more grids. The second dummy wiring is drawn on the open grids separated from the first wiring or the first dummy wiring via one or more grids G. One or more grids G are interposed between the second dummy wiring and the first wiring or the first dummy wiring.

In an example shown in FIG. 132, an open grid that satisfies these restriction is only the open grid G(1, 8), when drawing a first dummy wiring or a second dummy wiring. Then, the second dummy wiring 1117 is drawn on the grid G(1,8).

Figure 133:
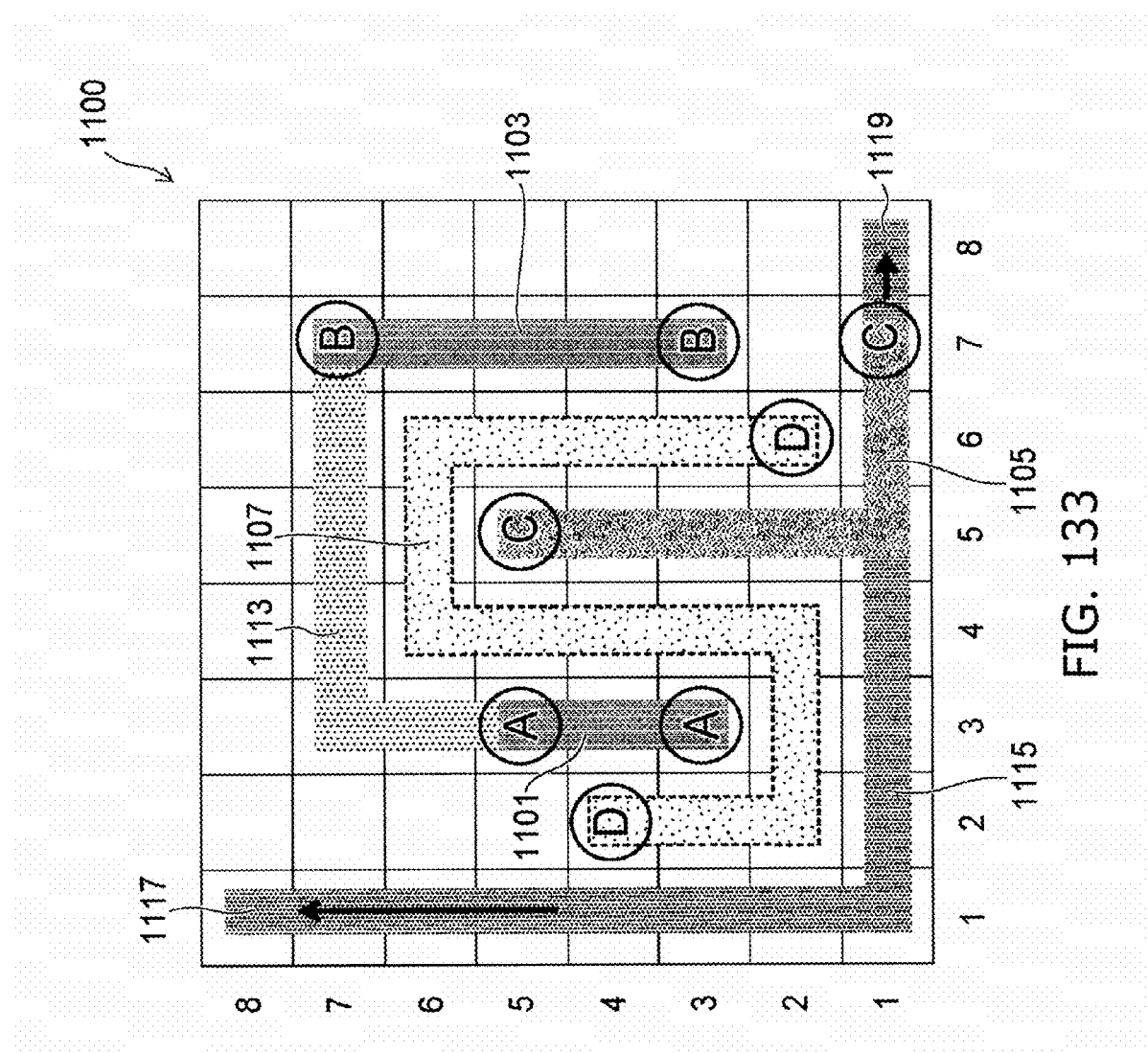

As shown in FIG. 133, for example, the second dummy wiring 1115 is expanded over the grid G(1,5) to grid G(1,7). The second wiring 1105 is expanded over the grid G(8,1). Here, the second dummy wiring 1117 may be expanded over the grid G(1,5) to grid G(1,7). A wiring expanded over the grid G(8,1) is taken as a second dummy wiring 1119. The respective expanded parts are separated from the first wirings 1101, 1103 and the first dummy wiring 1113 via one or more grids G.

The expanded part of the second wiring 1105 or the second dummy wiring 1115 is drawn on an open grid located at a position separated from the first wirings 1103, 1105 and the first dummy wiring 1113 via one or more grid G. In an example shown in FIG. 133, such an open grid is limited to the grid G(1,5) to grid G(1,7) and the grid G(8,1).

When expanding the first wiring 1103 or the first dummy wiring 1113, the expanded parts are drawn on an open grid located at a position separated from the second wiring 1105, the second dummy wirings 1115 and 1117 via one or more grid G.

Figure 134:
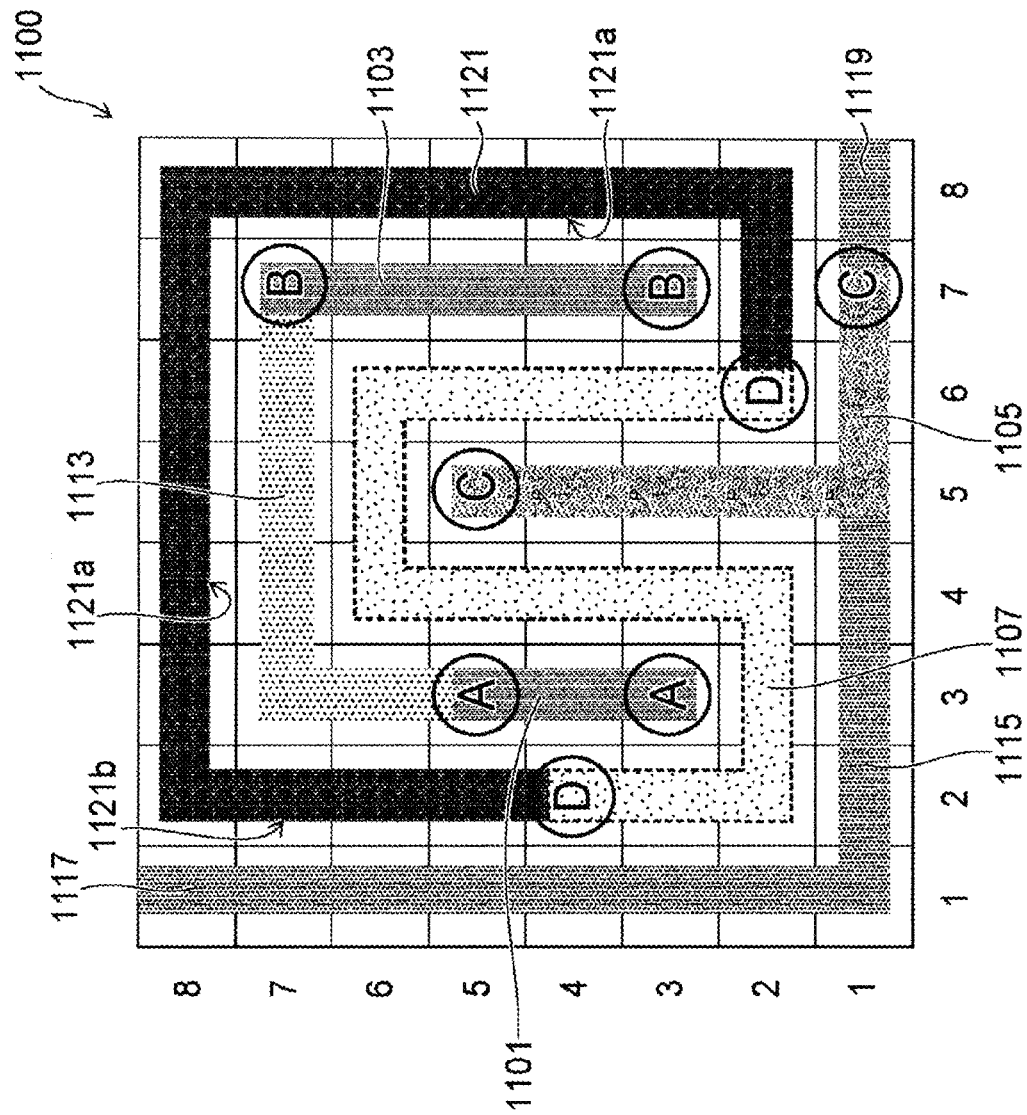

As shown in FIG. 134, a third dummy wiring 1121 is drawn on an open grid remained after expanding the second wiring 1105 and the second dummy wiring 1115. A first side 1121a of the third dummy wiring 1121 faces the first wirings 1101, 1103 and the first dummy wiring 1113. A second side 1121b of the third dummy wiring 1121 faces the second wiring 1105, the second dummy wirings 1115, 1117 and 1119. As shown in FIG. 134, the respective wirings are drawn so as to set a space between adjacent wirings to be equal.

Figure 135:
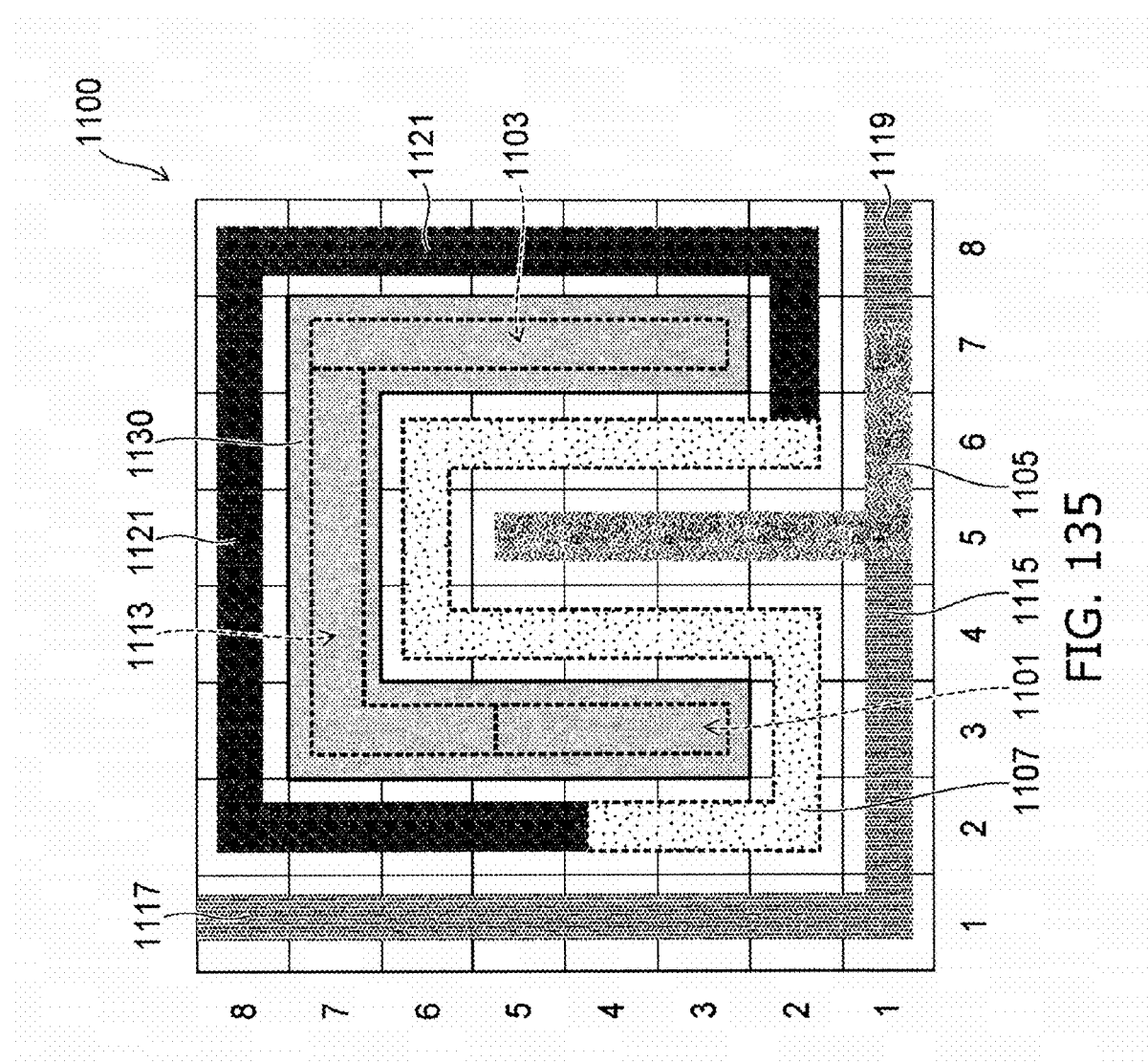

As shown in FIG. 135, a mandrel mask pattern 1130 is derived (S27). The mandrel mask pattern 1130 covers the first wirings 1101, 1103 and the first dummy wiring 1113. A width of the mandrel mask pattern 1130 is, for example, set to be the same as a width of the pitch $W_p$ of the grid G. Alternatively, a mandrel mask pattern covering the second wiring 1105, the second dummy wirings 1115, 1117 and 1119 may be derived.

Figure 136:
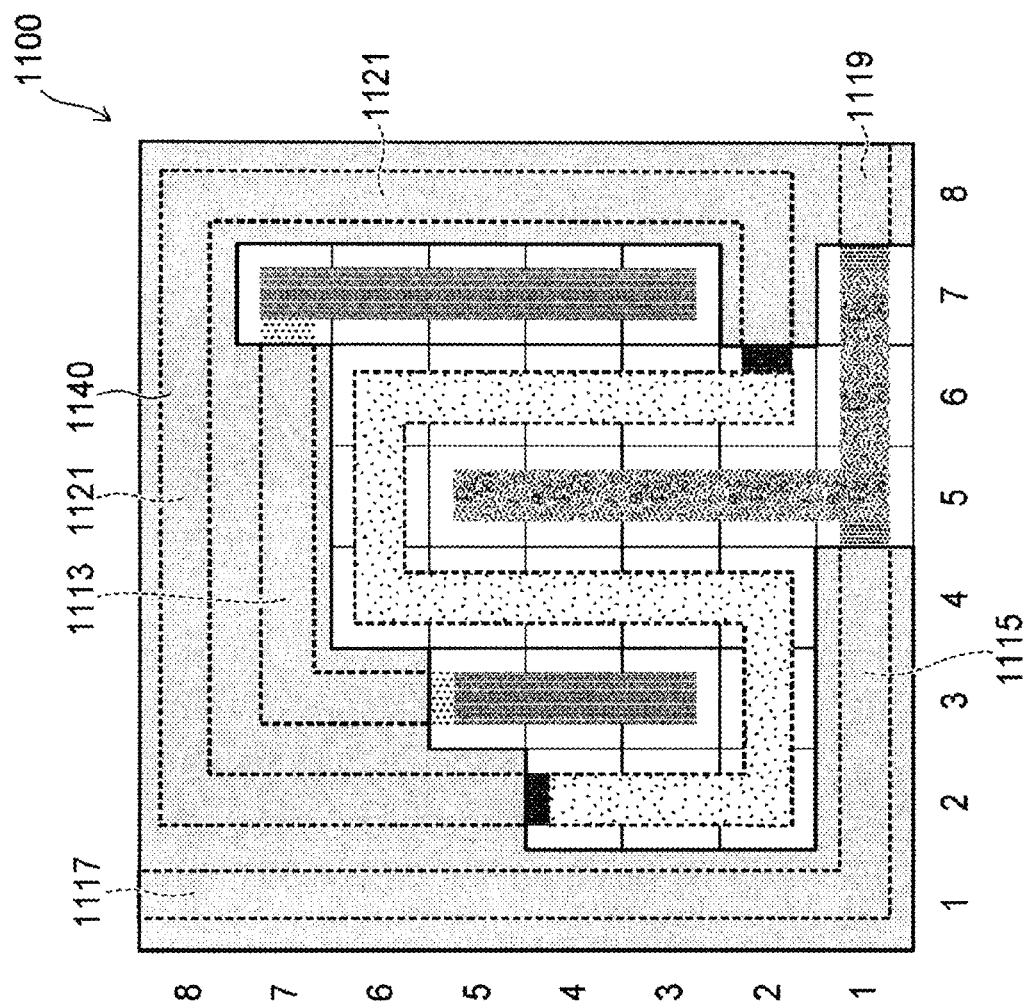

As shown in FIG. 136, a trimming mask pattern 1140 is derived (S28). The trimming mask pattern 1140 covers the first dummy wiring 1113, the second dummy wirings 1115, 1117, 1119, and the third dummy wiring 1121. In other words, the trimming mask pattern 1140 covers all open grids.

Next, a method for manufacturing a semiconductor device using the mandrel mask pattern 1130 and the trimming mask pattern 1140 will be described with reference to FIGS. 137A to 141B. FIGS. 137A to 141B are schematic views illustrating a manufacturing process of a semiconductor device according to the eleventh embodiment.

Figure 137B:
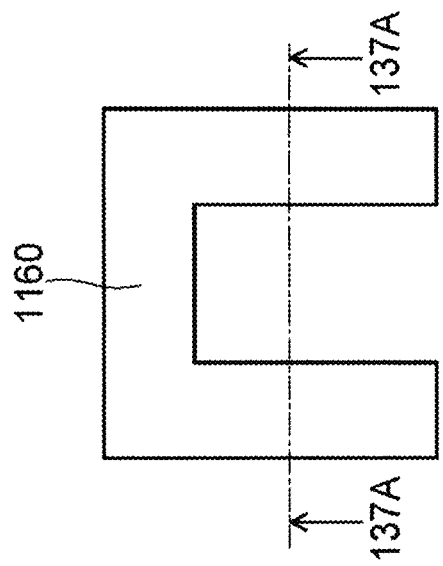
Figure 137A:
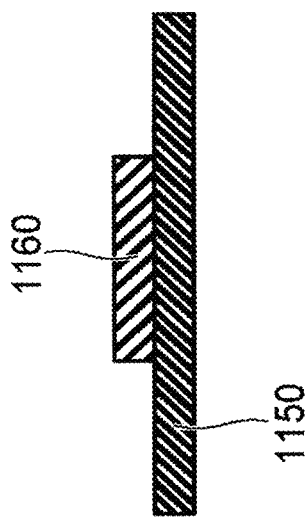

FIGS. 137A and 137B are schematic views showing a first mandrel 1160. FIG. 137A is a cross-sectional view along line 137A to 137A shown in FIG. 137B. FIG. 137B is a plan view showing the first mandrel 1160.

As shown in FIG. 137A, the first mandrel 1160 is formed, for example, on an interlayer insulating film 1150. The interlayer insulating film 1150 is provided on a wafer not shown. As shown in FIG. 137B, the first mandrel 1160 is formed using the mandrel mask pattern 1130.

FIGS. 138A to 138C are schematic views showing a first side wall process. FIGS. 138A to 138B are cross-sectional views along line 138B to 138B shown in FIG. 138C. FIG. 137C is a plan view showing a first side wall 1170.

As shown in FIG. 138A, the first side wall 1170 is formed on both sides of the first mandrel 1160. The first mandrel 1160 is, for example, slimmed to be a prescribed width narrower than the width $W_p$ of the mandrel mask pattern 1130. After that, a first insulating film covering the first mandrel 1160 is formed. Subsequently, the first insulating film is etched, for example, using RIE so that the first side wall 1170 remains on a side surface of the first mandrel 1160. As shown in FIG. 138C, the first side wall 1170 is formed along an outer periphery of the first mandrel 1160. Subsequently, as shown in FIG. 138B, the first mandrel 1160 is selectively removed and the first side wall 1170 is remained on the interlayer insulating film 1150.

FIGS. 139A to 139C are schematic views showing a second side wall process. FIGS. 139A and 139B are cross-sectional views along line 139B to 139B shown in FIG. 130C. FIG. 139C is a plan view showing a second side wall 1190.

As shown in FIG. 139A, the second side wall 1190 is formed on both sides of the first side wall 1170. The first side wall 1170 is used for a second mandrel. The first side wall 1170 is slimmed, for example, to be a prescribed width. After that, a second insulating film is formed to cover the first side wall 1170. Subsequently, the second insulating film is etched, for example, using RIE so that the second side wall 1190 remains on a side surface of the first side wall 1170. As shown in FIG. 139C, the second side wall 1190 is formed along an outer periphery of the first side wall 1170.

Subsequently, as shown in FIG. 139B, the first side wall 1170 is selectively removed and the second side wall 1190 is remained on the interlayer insulating film 1150. Spaces between the second side walls 1190 include a space where the first mandrel 1160 is removed, a space where the first side wall 1170 is removed, and a space 1180 where both of the first mandrel 1160 and the first side wall 1170 are not formed.

Figure 140:
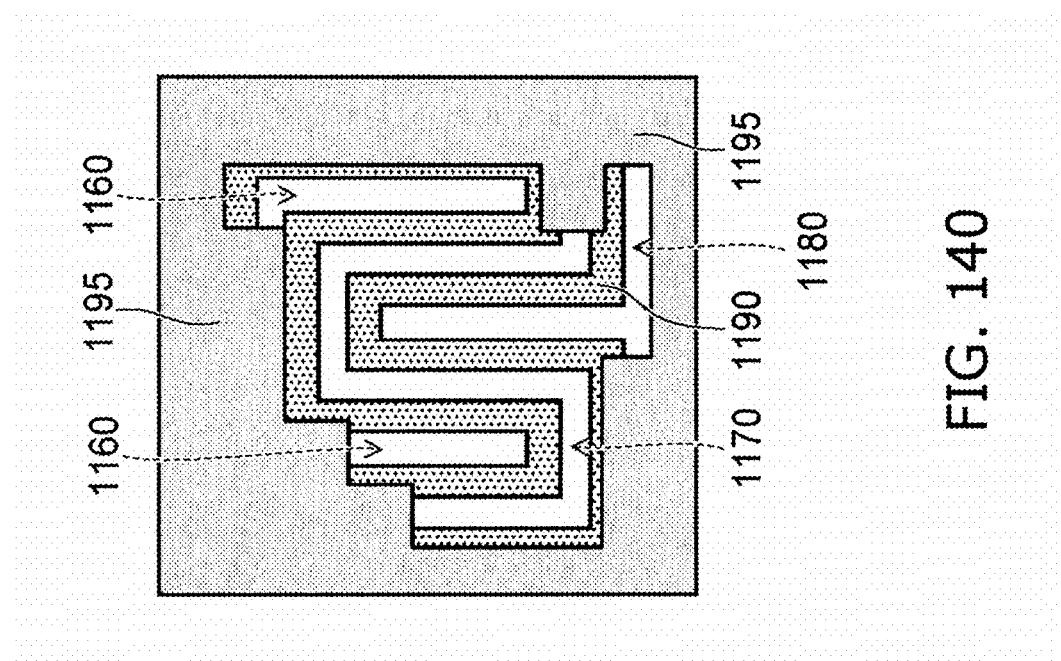
Figure 141:
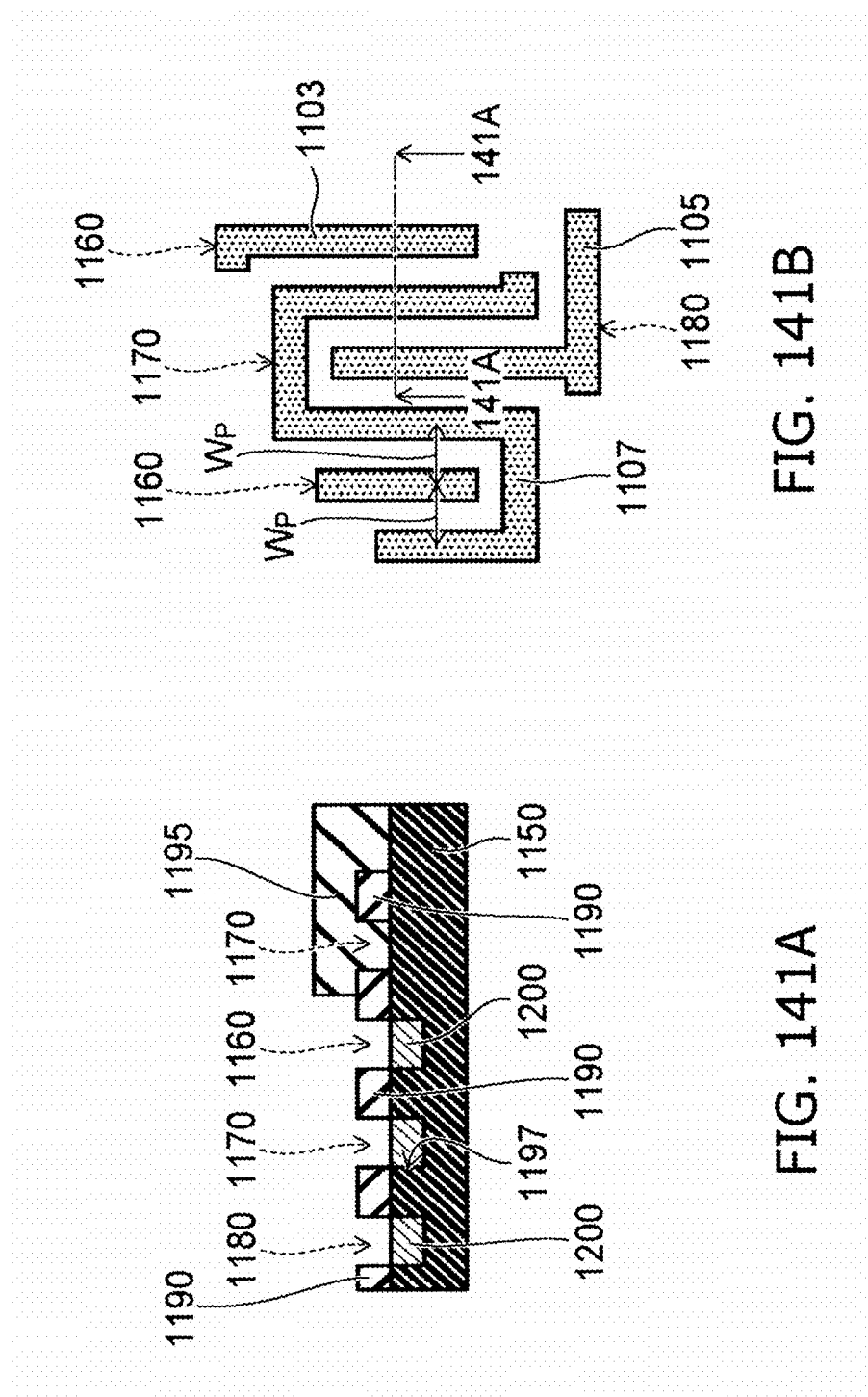
Figure 142:
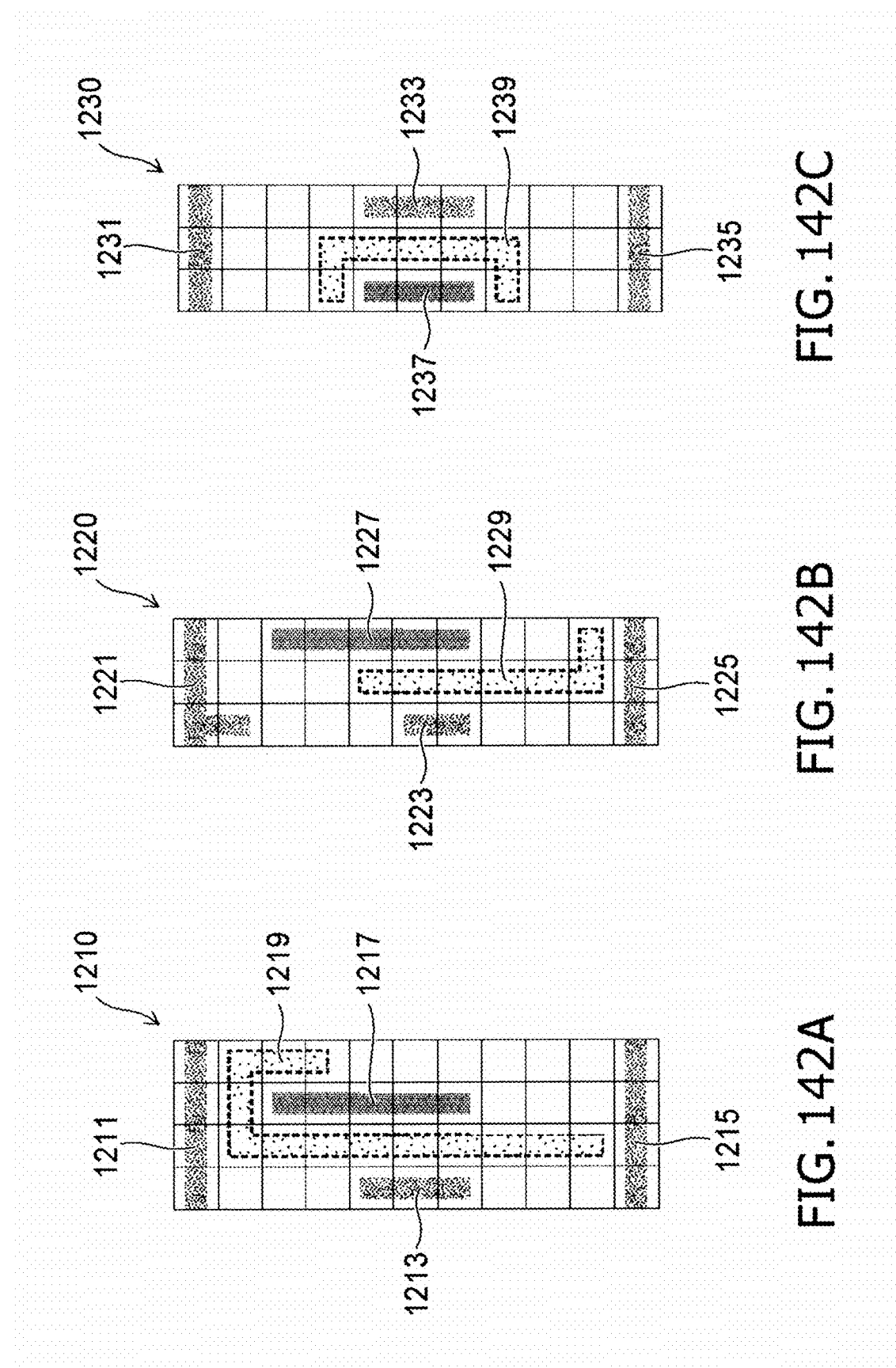

FIG. 140 is a schematic plan view showing a trimming mask 1195. The trimming mask 1195 is formed using the trimming mask pattern 1140.

As shown in FIG. 140, the trimming mask 1195 covers partially the second side walls 1190 and the space between the second side walls. A part of the space where the first mandrel 1160 is removed, a part of the space where the first side wall 1170 is removed, and a part of the space 1180 are exposed in the open space not covered with the trimming mask 1195 and the second side walls 1190.

FIGS. 141A and 141B are schematic views showing wirings formed using the second side walls 1190 and the trimming mask 1195. FIG. 141A is a cross-sectional view along line 141A to 141A shown in FIG. 141B.

As shown in FIG. 141A, the interlayer insulating film 1150 is etched using the second side walls 1190 and the trimming mask 1195 as an etching mask, and wiring grooves 1197 are formed. Subsequently, a wiring metal 1200 is buried inside the wiring groove 1197 to form wirings of a damascene structure.

As shown in FIG. 141B, wirings can be formed corresponding to each of the first wirings 1101 and 1103, the second wiring 1105, and the third wiring 1107. The first wirings 1101 and 1103 are formed in the space where the first mandrel 1160 is removed. The second wiring 1150 is formed in the space 1180 where both of the first mandrel 1160 and the first side wall 1170 are not formed. The third wiring 1107 is formed in the space where the first side wall 1170 is removed. Furthermore, the final wiring pitch is formed to be the same as the pitch $W_p$ of the grid G.

According to the embodiment, terminal pairs may be disposed flexibly on the base grid. Routing wirings for connecting terminals is less restricted. Therefore, the mask layout design may be improved so as to have larger flexibility.

Next, a mask design method according to a variation of the embodiment will be described with reference to FIGS. 142A to 153. FIGS. 142A to 153 are schematic views showing the mask design method according to the variation of the embodiment.

For example, the mask design can be made using layout parts 1210 to 1230 shown in FIGS. 142A to 142C. Each layout part includes first wirings, second wirings, and third wirings. The first wirings, the second wirings, and the third wirings are disposed in accordance with the previously described rule. That is, the first wirings are drawn so as to be separated from each other via three or more grids G. The second wirings are drawn so as to be separated from the first wirings via one or more grids G. The third wirings are drawn on the grid G located between the first wirings and the second wirings. One side of the third wirings faces only the first wirings and another side faces only the second wirings.

As shown in FIG. 142A, the layout part 1210 includes the first wirings 1211, 1213, 1215, the second wiring 1217, and the third wiring 1219. In this example, the first wiring 1211 and the first wiring 1215 are power source lines. For example, the first wiring 1211 is a power source line on High potential side, and the first wiring 1215 is a power source line on Low potential side.

As shown in FIG. 142B, the layout part 1220 includes the first wirings 1221, 1223, 1225, the second wiring 1227, and the third wiring 1229. The first wiring 1221 is a power source line on High potential side, and the first wiring 1225 is a power source line on Low potential side.

As shown in FIG. 142C, the layout part 1230 includes the first wirings 1231, 1233, 1235, the second wiring 1237, and the third wiring 1239. The first wiring 1231 is a power source line on High potential side, and the first wiring 1235 is a power source line on Low potential side.

Figure 143:
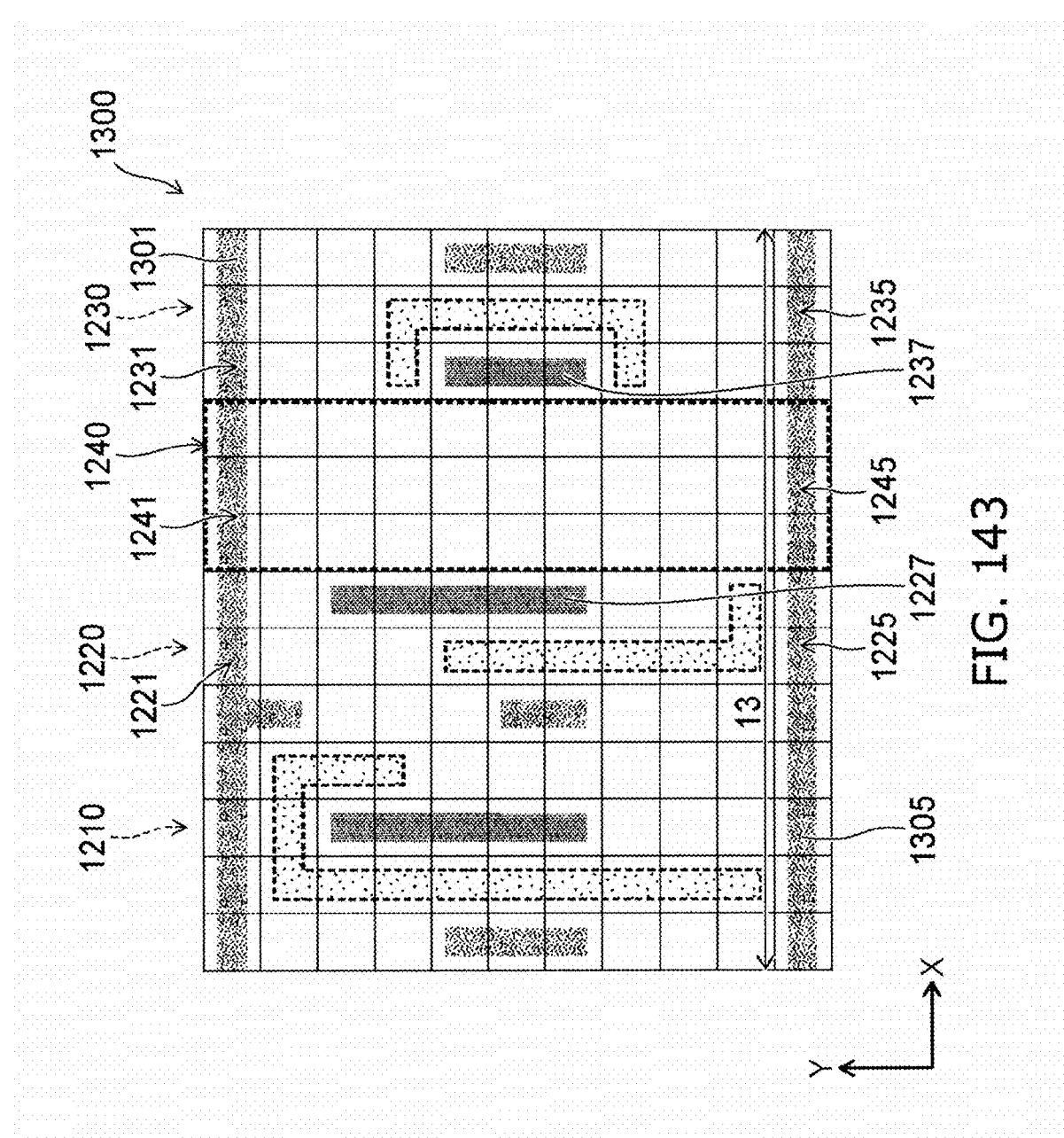

FIG. 143 shows a wiring layout 1300 where the layout parts 1210, 1220 and 1230 are disposed on the base grid 1100. The layout parts 1210, 1220, and 1230 are connected so as to share the power source lines on High potential side and on Low potential side.

In the example shown in FIG. 143, the second wiring 1227 of the layout part 1220 is disposed to face the second wiring 1237 of the layout part 1230. Then, a space 1240 is interposed so as to separate the second wiring 1227 from the second wiring 1237 via three or more grids G. The space 1240 includes three grids G in the X-direction.

Furthermore, the power source line of the layout part 1220 is connected to the power source line of the layout part 1230. That is, the first wiring 1241 is drawn in the space 1240. The first wiring 1241 connects the first wiring 1221 of the layout part 1220 and the first wiring 1231 of the layout part 1230. The first wiring 1245 is drawn in the space 1240. The first wiring 1245 connects the first wiring 1225 of the layout part 1220 and the first wiring 1235 of the layout part 1230. Thereby, the first wiring 1301 on High potential side and the first wiring 1305 on Low potential side can be drawn on the base grid 1100.

Figure 144:
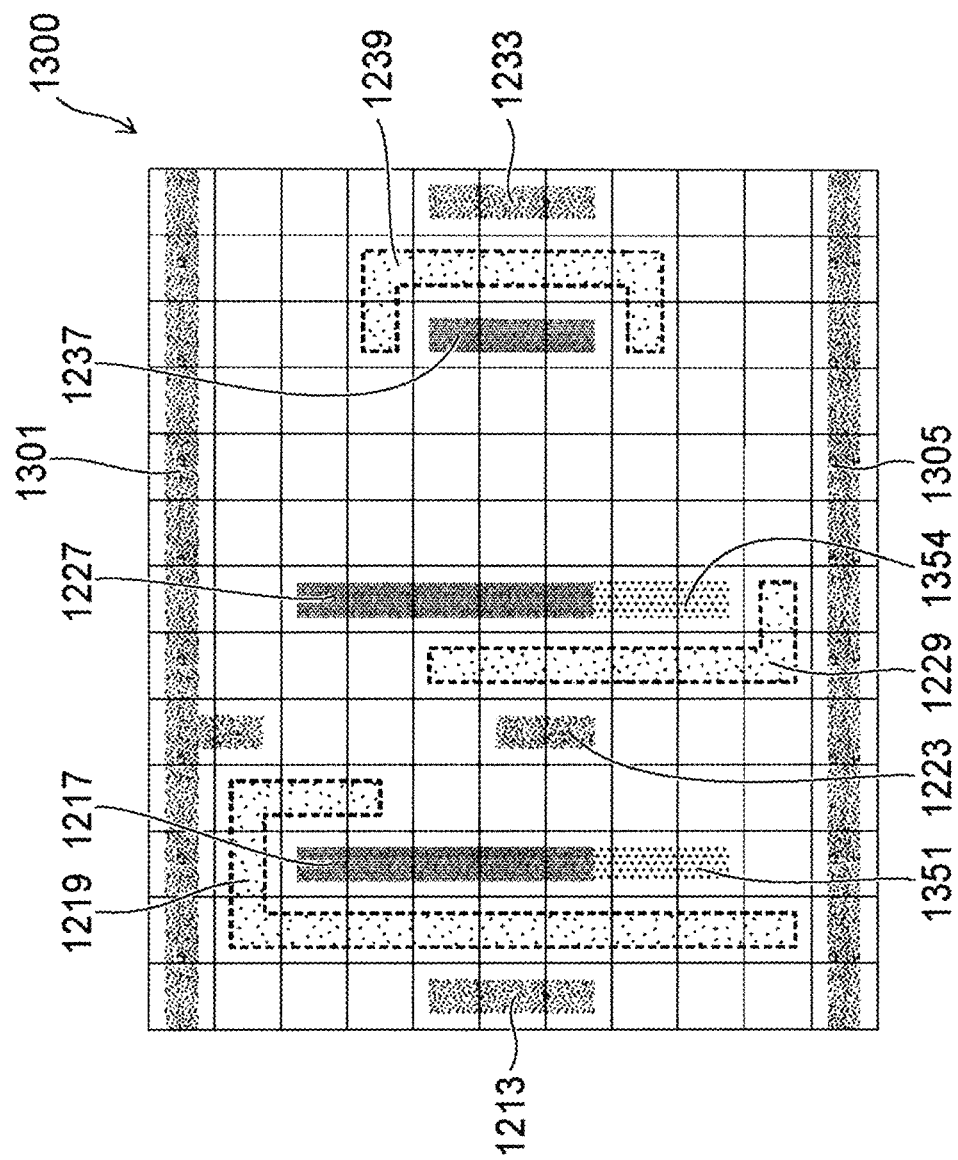

Next, the first dummy wirings and the second dummy wirings are drawn along the third wirings. For example, in the layout shown in FIG. 143, there is no first dummy wiring capable of being drawn along the third wirings with three or more grids G interposed between the first wirings and itself. Then, as shown in FIG. 144, the second dummy wiring 1351 along the third wiring 1219 and the second dummy wiring 1354 along the third wiring 1229 are drawn.

Next, the first wirings or the second wirings are enlarged over open grids on which no wiring is drawn. In this case, the first wirings are enlarged so as to be separated from the second wirings and the second dummy wirings via one or more grids G in accordance with the previously described rule. The second wirings are enlarged so as to be separated from the first wirings and the first dummy wirings via one or more grids G.

Figure 145:
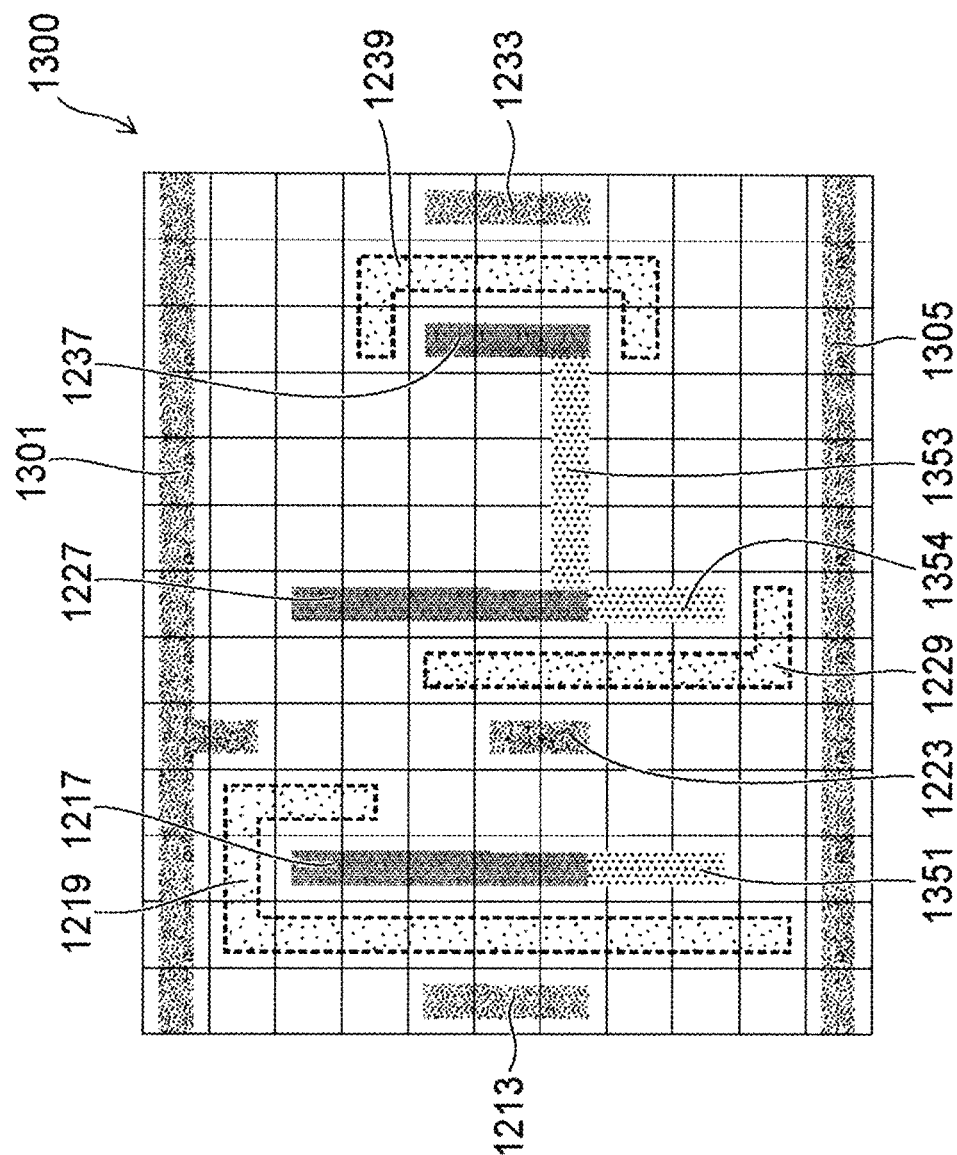

In this example, an expanded part (hereinafter, second dummy wiring 1353) is drawn between the second wiring 1227 and the second wiring 1327 as shown in FIG. 145. In the following explanation, the expanded parts drawn on multiple open grids arranged in series are described as the first dummy wirings or the second dummy wirings.

Figure 146:
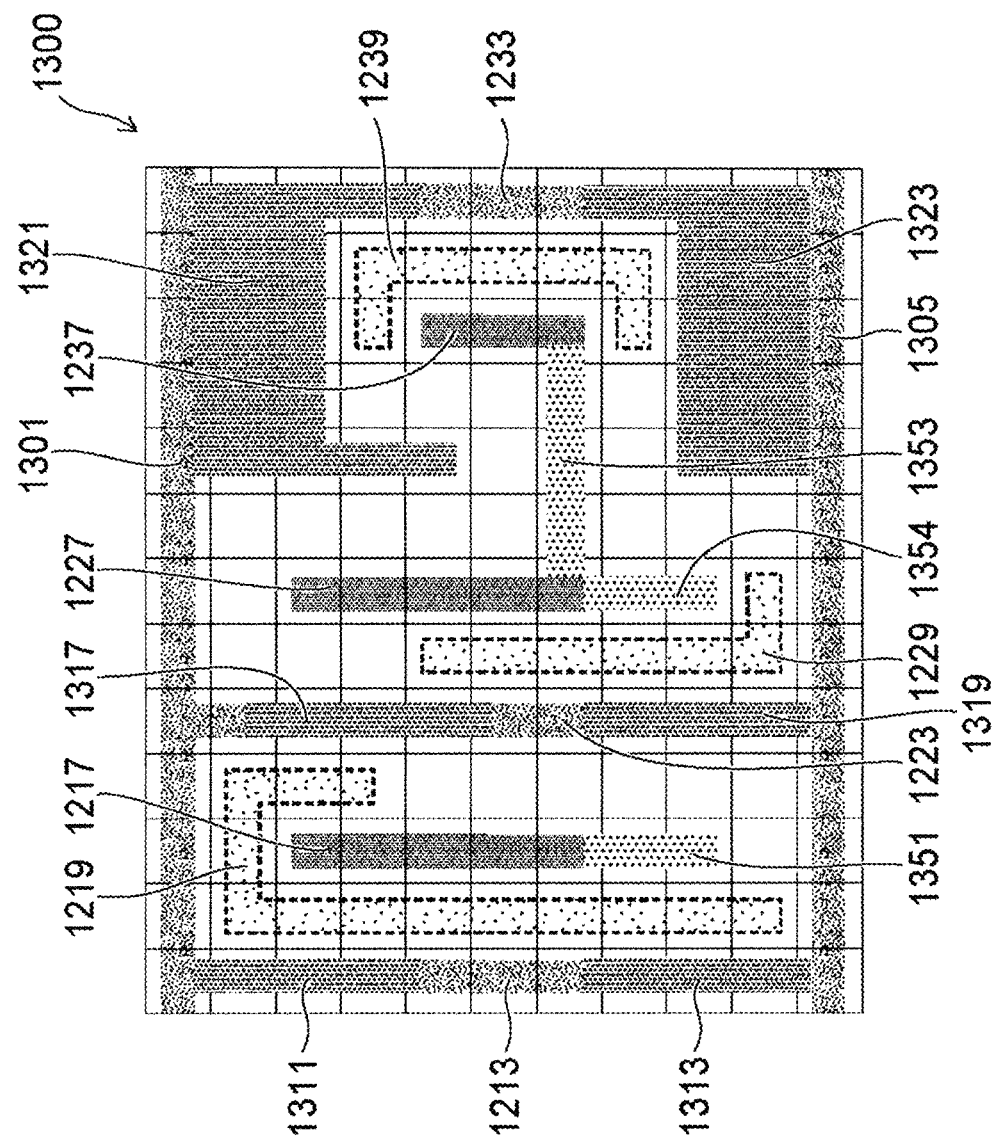

Subsequently, the expanded parts of the first wirings are drawn as shown in FIG. 146. The first dummy wiring 1311 is drawn between the first wiring 1301 and the first wiring 1213. The first dummy wiring 1313 is drawn between the first wiring 1305 and the first wiring 1213. The first dummy wiring 1317 is drawn between the first wiring 1301 and the first wiring 1223. The first dummy wiring 1319 is drawn between the first wiring 1305 and the first wiring 1223.

Furthermore, the expanded parts 1321 and 1323 are drawn. The expanded part 1321 is drawn on open grids between the first wiring 1301 and the second wiring 1227, between the first wiring 1301 and the second dummy wiring 1353, between the first wiring 1301 and the second wiring 1237, and between the first wiring 1301 and the first wiring 1233. The expanded part 1323 is drawn on open grids between the first wiring 1305 and the second dummy wiring 1354, between the first wiring 1305 and the second dummy wiring 1353, between the first wiring 1305 and the second wiring 1237, and between the first wiring 1305 and the first wiring 1233.

Figure 147:
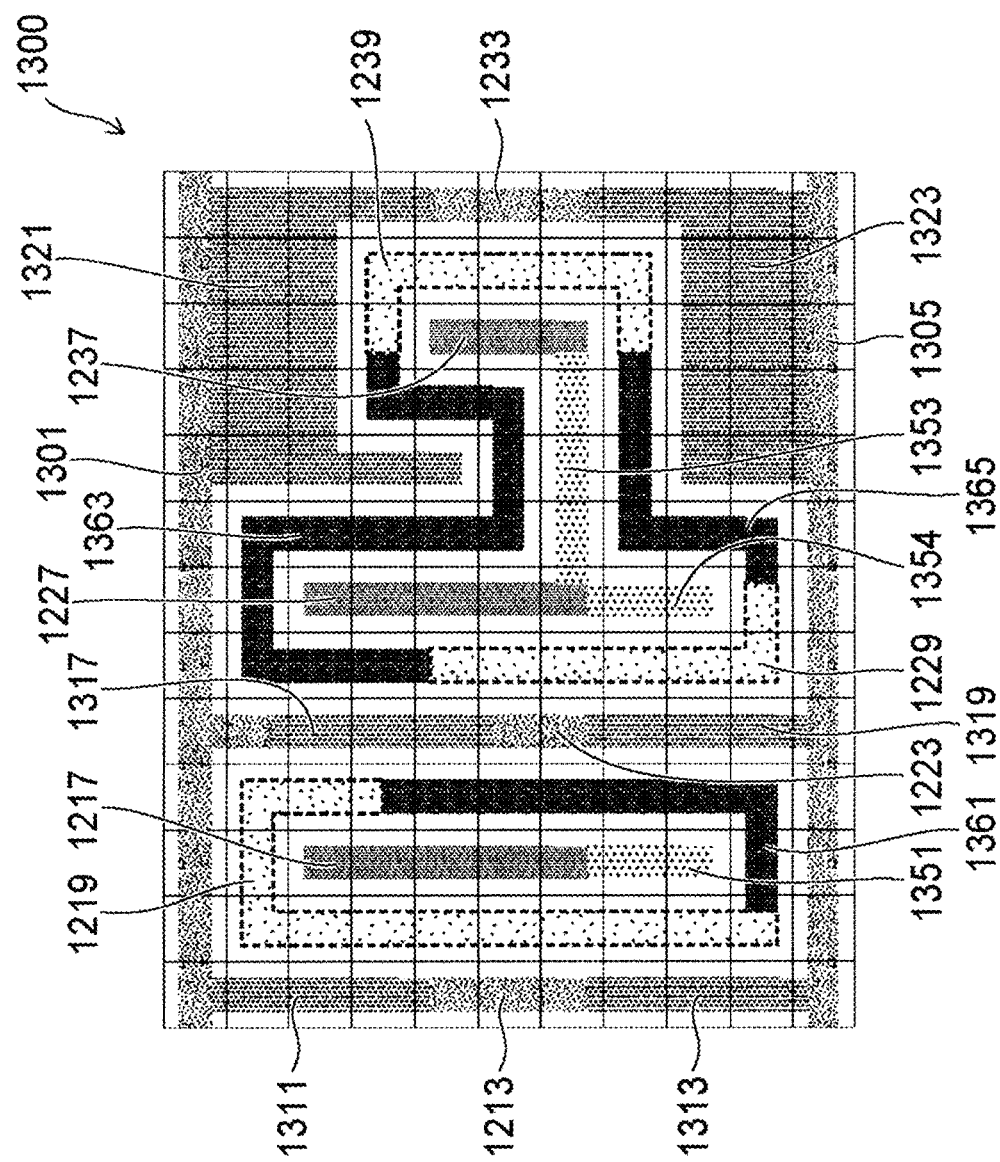
Figure 148:
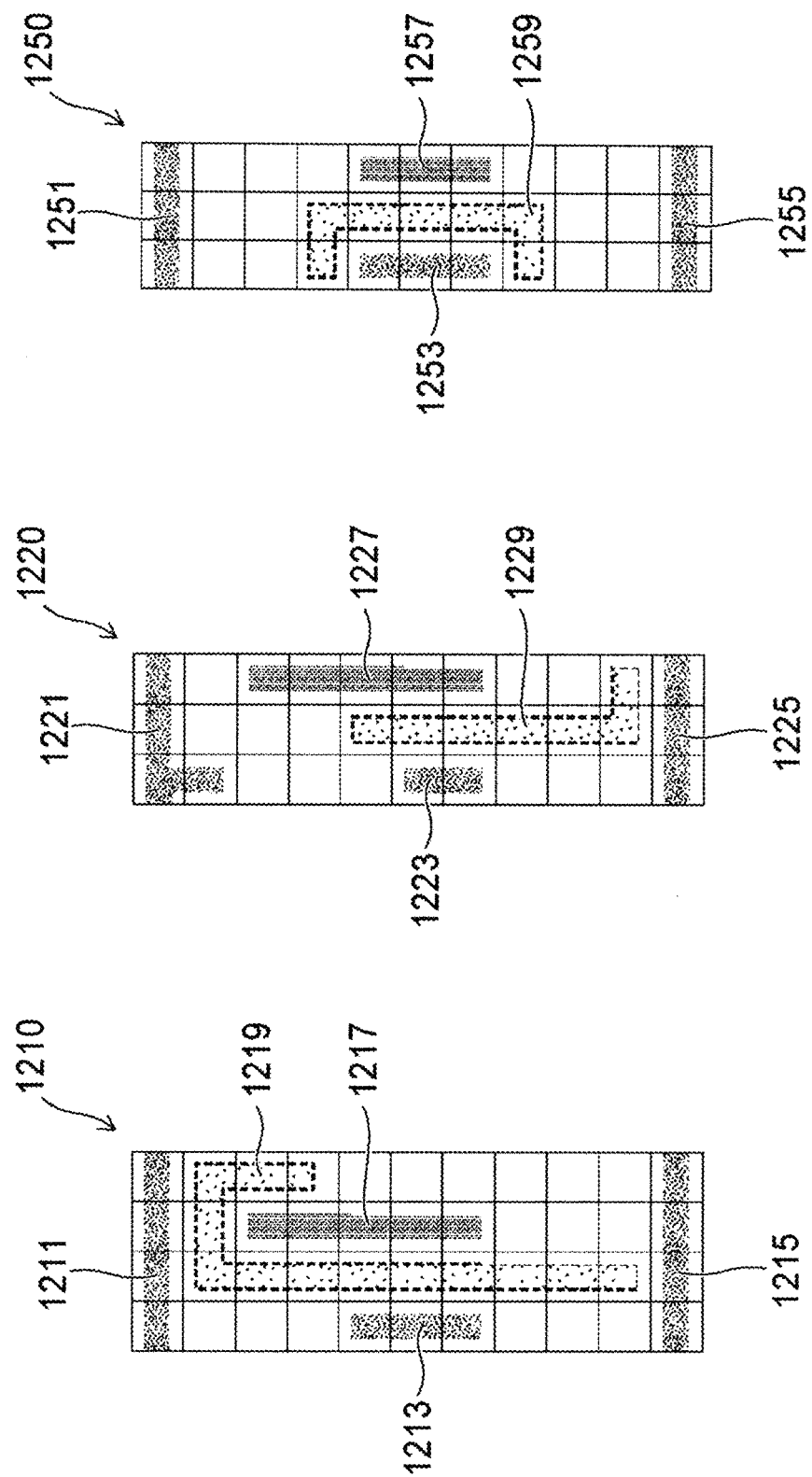

Next, as shown in FIG. 147, the third dummy wirings 1361, 1363 and 1365 are drawn, and thus, the wiring layout 1300 is completed.

The third dummy wiring 1361 is drawn on open grids between the first wiring 1305 and the second dummy wiring 1351, between the first dummy wiring 1319 and the second dummy wiring 1351, between the first wiring 1223 and the second wiring 1217, and between the first dummy wiring 1317 and the second wiring 1217.

The third dummy wiring 1363 is drawn on open grids between the first dummy wiring 1317 and the second wiring 1227, between the first wiring 1301 and the second wiring 1227, between the expanded part 1321 and the second dummy wiring 1353, and between the expanded part 1321 and the second wiring 1237. The third dummy wiring 1365 is drawn on open grids between the expanded part 1323 and the second dummy wiring 1353, and between the expanded part 1323 and the second dummy wiring 1254.

Next, the first wirings and the first dummy wirings or the second wirings and the second dummy wirings are extracted as a core pattern. Furthermore, a trim mask covering the first dummy wirings, the second dummy wirings and the expanded parts is extracted and the mask design is completed.

FIGS. 148A to 148C show other combination of layout parts. The layout part 1210 shown in FIG. 148A, the layout part 1220 shown in FIG. 148B, and the layout part 1250 shown in FIG. 148C are used in this example. The layout part 1250 includes the first wirings 1251, 1253, 1255, the second wiring 1257 and the third wiring 1259. The first wiring 1251 and the first wiring 1255 are, for example, power source lines.

Figure 149:
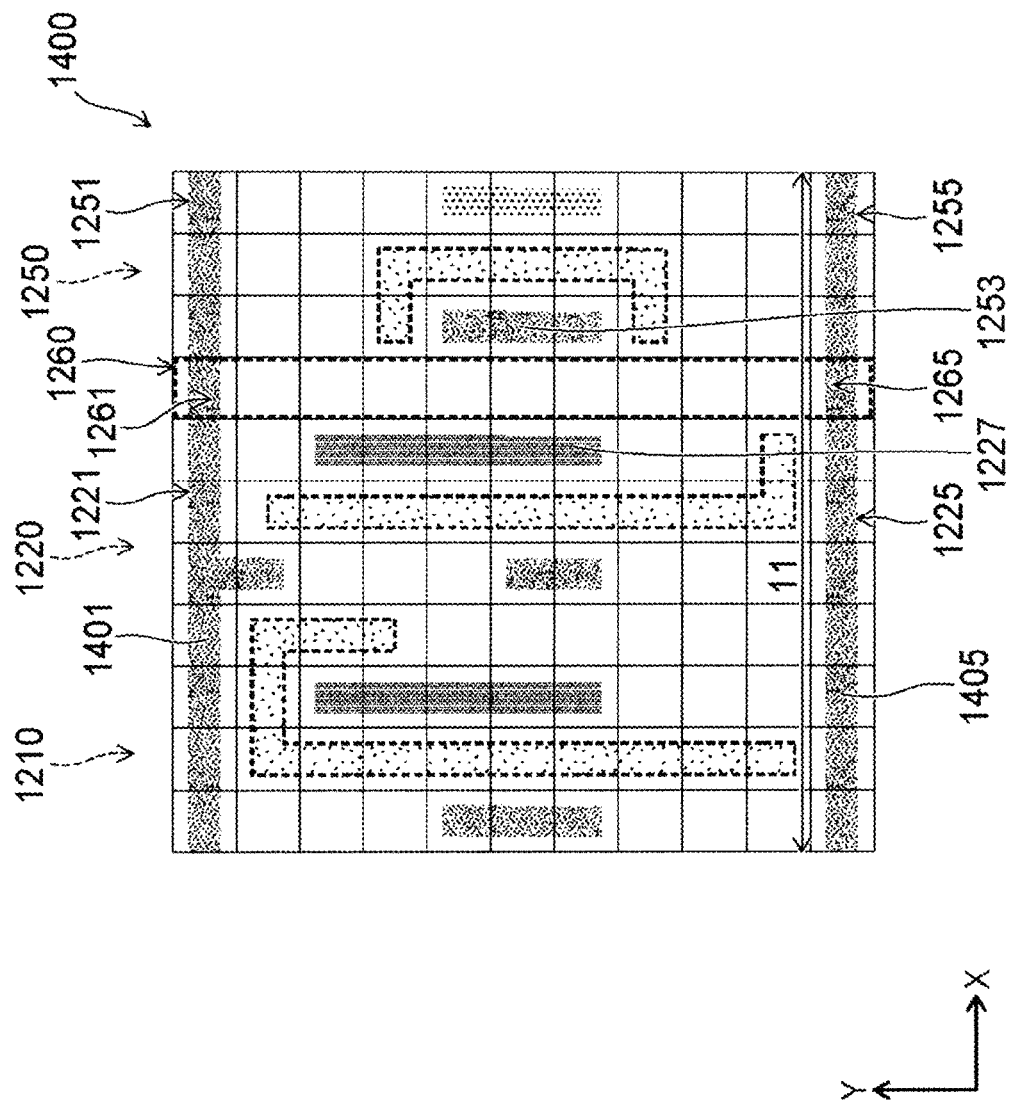

FIG. 149 shows a wiring layout 1400 where the lay out parts 1210, 1220 and 1250 are disposed on the base grid 1100. The layout parts 1210, 1220 and 1250 are connected so as to share the power source lines on High potential side and on Low potential side.

In the example shown in FIG. 149, the second wiring 1227 of the layout part 1220 faces the first wiring 1253 of the layout part 1250. Then, the space 1260 is interposed so as to separate the second wiring 1227 from the first wiring 1253 via one or more grids G.

The space 1260 includes one grid G in the X-direction. The first wirings 1261 and 1265 are drawn on the space 1260. The first wiring 1261 connects the first wiring 1221 of the layout part 1220 and the first wiring 1251 of the layout part 1250. The first wiring 1265 connects the first wiring 1225 of the lay out part 1220 and the first wiring 1255 of the lay out part 1250. Thereby, the first wirings 1401 and 1405 are drawn on the base grid 1100.

Figure 150:
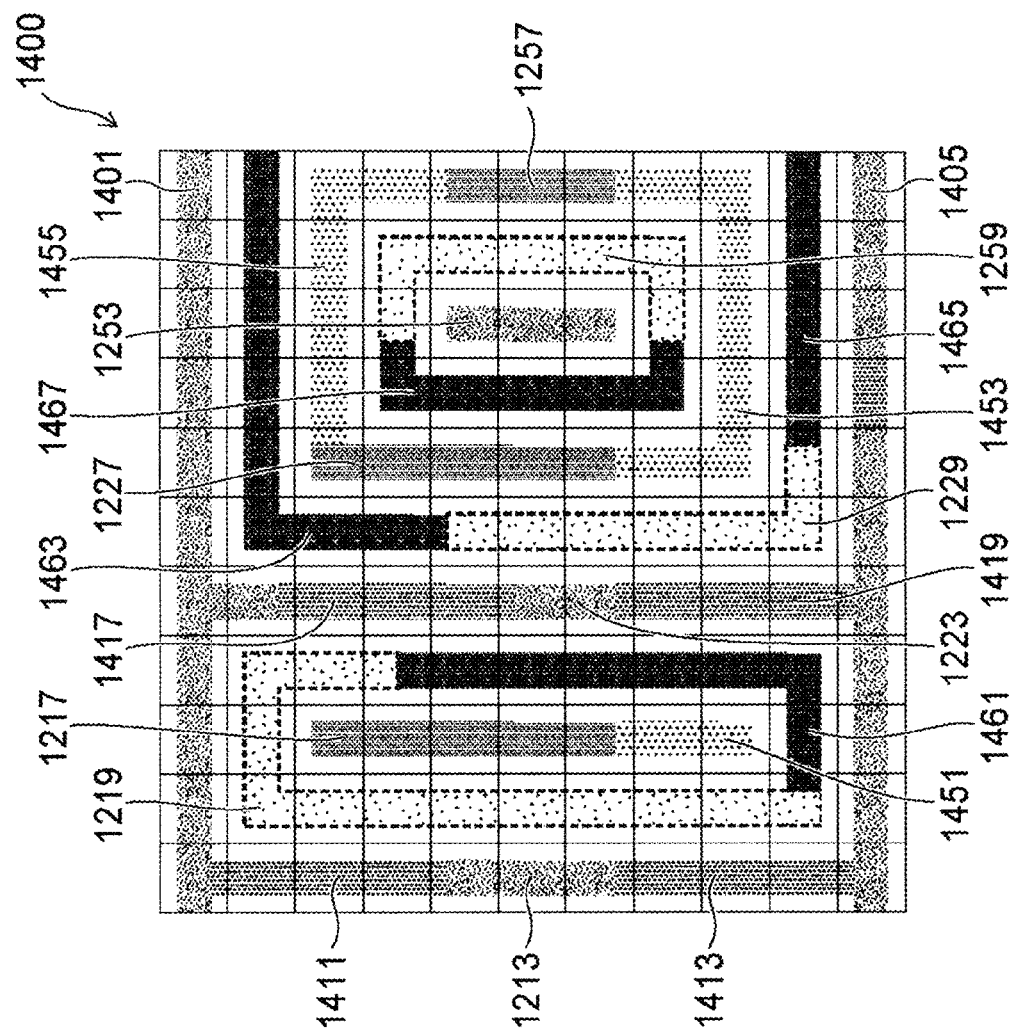
Figure 151:
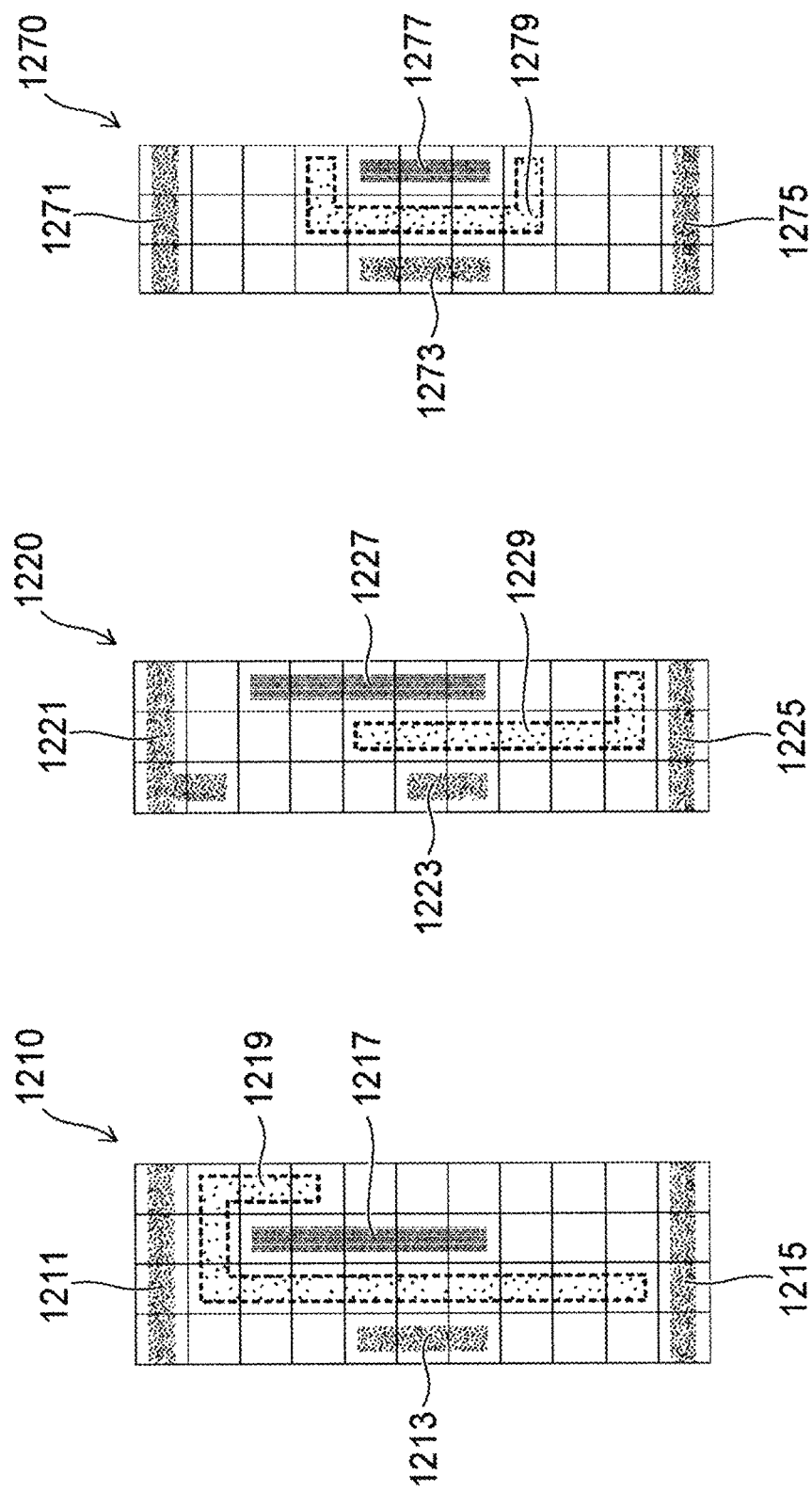

Subsequently, the first dummy wirings and the second dummy wirings are drawn in accordance with the previously described rule. Then, the first wirings and the first dummy wirings, or the second wirings and the second dummy wirings are expanded. Furthermore, the third dummy wirings are drawn, and a wiring layout 1400 is completed as shown in FIG. 150.

In this example, the second dummy wiring 1451 is drawn along the third wiring 1219. The second dummy wirings 1453 and 1355 are drawn along the third wirings 1229 and 1259.

Furthermore, the second dummy wirings 1453 and 1455 are expanded so as to surround the first wiring 1253. The first wiring 1401 and the first wiring 1405 are expanded, and the first dummy wirings 1411, 1413, 1417, and 1419 are drawn. The third dummy wirings 1461, 1463, and 1465 are drawn, and the wiring layout 1400 is completed.

Here, the number of grids arranged in a lateral direction is 11 in the layout of FIG. 149. In contrast, the number of grids arranged in a lateral direction is 13 in the layout of FIG. 143. That is, the first wirings 1233 and 1253 are inversely disposed in the lateral direction between the layout in FIG. 142C and the layout in FIG. 148C. Then, such arrangements make a lateral width of the space 1260 narrower than that of the space 1240.

FIGS. 151A to 151C show other combination of layout parts. The layout part 1210 shown in FIG. 151A, the layout part 1220 shown in FIG. 151B, and the layout part 1270 shown in FIG. 151C are used in this example. The layout part 1270 includes the first wirings 1271, 1273, 1275, the second wiring 1227 and the third wiring 1279. The first wiring 1271 and the first wiring 1275 are, for example, power source lines.

Figure 152:
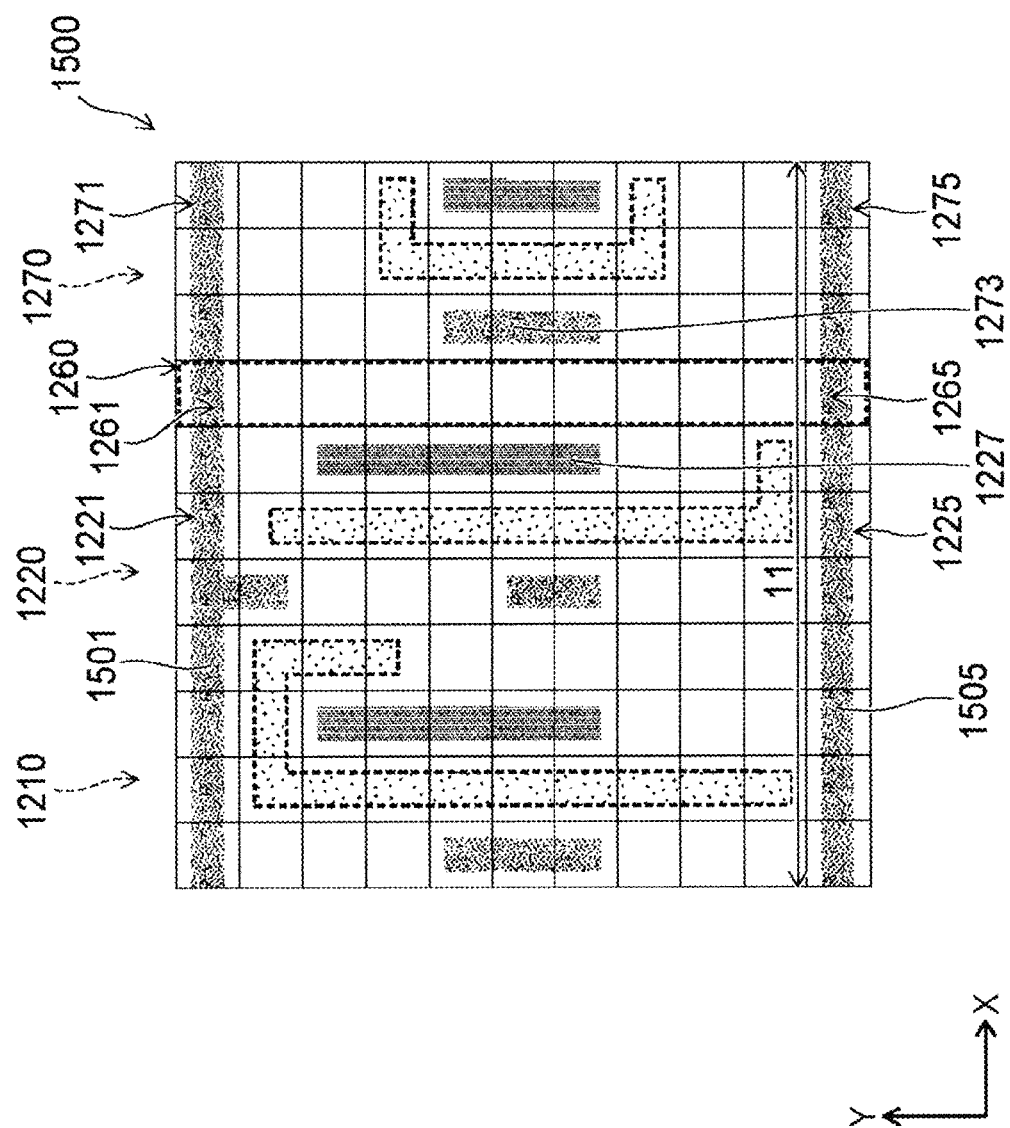

FIG. 152 shows a wiring layout 1500 where the layout parts 1210, 1220, and 1270 are disposed on the base grid 1100. The layout parts 1210, 1220 and 1270 are connected so as to share the power source lines on High potential side and on Low potential side.

In this example, the second wiring 1227 of the layout part 1220 faces the first wiring 1273 of the layout part 1270. Then, the space 1260 is interposed so as to separate the second wiring 1227 from the first wiring 1273 via one or more grids G.

The space 1260 includes one grid G in the X-direction. The first wirings 1261 and 1265 are drawn on the space 1260. The first wiring 1261 connects the first wiring 1221 of the layout part 1220 and the first wiring 1271 of the layout part 1270. The first wiring 1265 connects the first wiring 1225 of the layout part 1220 and the first wiring 1275 of the layout part 1270. Thereby, the first wirings 1501 and 1505 are drawn on the base grid 1100.

Figure 153:
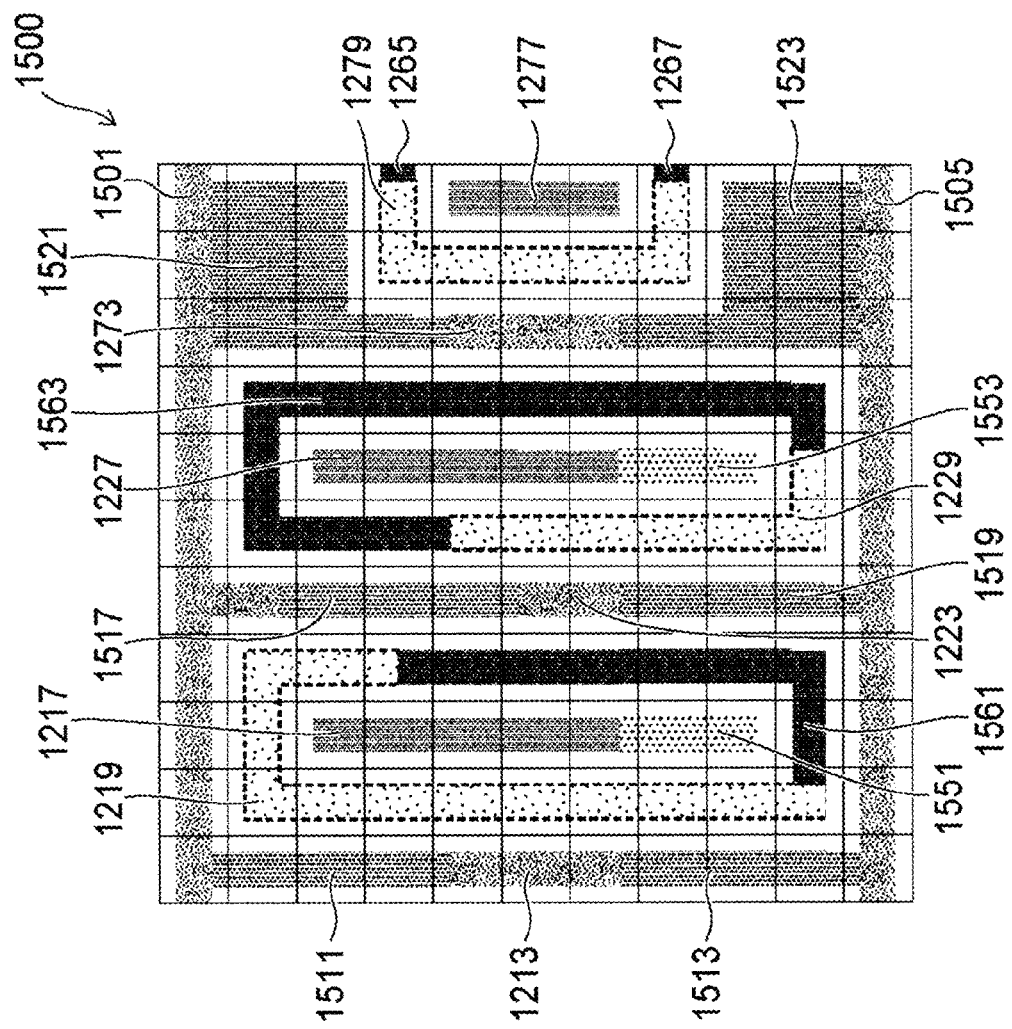

Subsequently, the first dummy wirings and the second dummy wirings are drawn in accordance with the previously described rule. Then, the first wirings and the first dummy wirings, or the second wirings and the second dummy wirings are expanded. Furthermore, the third dummy wirings are drawn, and the wiring layout 1500 is completed as shown in FIG. 153.

In this example, the second dummy wiring 1551 is drawn along the third wiring 1219. The second dummy wiring 1553 is drawn along the third wiring 1229.

Furthermore, the first wiring 1501 and the first wiring 1505 are expanded, and the first dummy wirings 1511, 1513, 1517, 1519, and the expanded parts 1521, 1523 are drawn. The third dummy wirings 1561, 1563, 1565, and 1567 are drawn, and the wiring layout 1500 is completed.

Here, the number of grids arranged in a lateral direction is 11 in the layout of FIG. 152. In contrast, the number of grids arranged in a lateral direction is 13 in the layout of FIG. 143. That is, reversing the layout parts makes a lateral width of the space 1260 narrower than that of the space 1240 as shown in FIG. 151C and FIG. 148C.

According to the embodiments explained above, it is possible to provide a method for designing a wiring layout capable of aiming at a high degree of integration, a semiconductor device, a program for supporting a design of a wiring layout, and a method for manufacturing a semiconductor device.

It is also possible to combine an automatic wiring method represented by an algorithm, such as a maze method, with the embodiments. As a result of that, it is possible to perform automatic wiring of a pattern capable of being subjected to wiring formed by the sidewall method. As a result of that, it is possible to further improve the design efficiency.

In the embodiments described above, the descriptions have been made so that the red, blue and green correspond to the wirings different from each other, for convenient, and it may be possible to implement a method for distinguishing the wirings other than color method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A design method of a mask pattern, the method comprising:

providing a base pattern including a plurality of first cells, a plurality of second cells, and a plurality of blank cells, the base pattern including first columns, second columns, first rows, and second rows, the first columns and the second columns each including a plurality of cells aligned in a first direction, and being alternately arranged in a second direction orthogonal to the first direction, and the first rows and the second rows each including a plurality of cells aligned in the second direction, and being alternately arranged in the first direction, wherein the plurality of first cells are disposed at cross points of the first columns and the first rows respectively, the plurality of second cells are disposed at cross points of the second columns and the second rows respectively, and the plurality of blank cells are disposed in the first direction and the second direction between the plurality of first cells and between the plurality of second cells;

assigning a start first cell and an end first cell in the plurality of first cells;

providing first patterns on blank cells of the plurality of blank cells respectively, the first patterns each connecting two adjacent first cells of the plurality of first cells in the first or second direction, and being disposed to make a pathway from the start first cell to the end first cell;

assigning a start second cell and an end second cell in the plurality of second cells;

providing second patterns on blank cells of the plurality of blank cells respectively, the second patterns each connecting two adjacent second cells of the plurality of second cells in the first or second direction without overlapping the first patterns, and being disposed to making a pathway from the start second cell to the end second cell; and extracting a first group or a second group to make the mask pattern, the first group including the first patterns and the first cells connected by the first patterns, and the second group including the second patterns and the second cells connected by the second patterns.

2. The method according to claim 1, further comprising:
providing extra first patterns on blank cells of the plurality of blank cells, the extra first patterns each connecting two adjacent first cells of the plurality of first cells in the first or second direction without overlapping the first patterns and the second patterns, and no one of the extra first patterns being connected to the first cells connected by the first patterns; and providing extra second patterns on blank cells of the plurality of blank cells, the extra second patterns each connecting two adjacent second cells of the plurality of second cells in the first or second direction without overlapping the first patterns, the second patterns, and the extra first patterns, and no one of the extra second patterns being connected to the second cells connected by the second patterns, wherein the first group further includes the extra first patterns and the first cells connected by the extra first patterns, and the second group further includes the extra second patterns and the second cells connected by the extra second patterns.

3. The method according to claim 1, further comprising:
providing extra second patterns on blank cells of the plurality of blank cells, the extra second patterns each connecting two adjacent second cells of the plurality of second cells in the first or second direction without overlapping the first patterns and the second patterns, and no one of the extra second patterns being connected to the second cells connected by the second patterns; and providing extra first patterns on blank cells of the plurality of blank cells, the extra first patterns each connecting two adjacent first cells of the plurality of first cells in the fow or column first or second direction without overlapping the first patterns, the second patterns and the extra second patterns, and no one of the extra first patterns being connected to the first cells connected by the first patterns, wherein the first group further includes the extra first patterns, and the second group further includes the extra second patterns.

4. The method according to claim 1, further comprising:
providing a trimming pattern covering the first patterns, the first cells connected by the first patterns, the second patterns and the second cells connected by the second patterns.

5. The method according to claim 4, wherein
the trimming pattern further covers one of a first cell and a second cell, no one of a first pattern and a second pattern being connected to the one of a first cell and a second cell, and the one of a first pattern and a second pattern being surrounded by first cells and first patterns connected thereto, or second cells and second patterns connected thereto; and/or the trimming pattern further covers a blank cell, no one of a first pattern and a second pattern being provided on the blank cell, and the blank cell being surrounded by first cells and first patterns connected thereto, or by second cells and second patterns connected thereto.

6. The method according to claim 2, further comprising:
providing a cutout part without overlapping any one of the first patterns, the second patterns, the extra first patterns, and the extra second patterns, the cutout part being disposed on a blank cell positioned between a first cell, to which one of the first patterns is connected, and another first cell, to which one of the extra first patterns is connected, when the first group is to be extracted, and the cutout part being provided not to connect the first cell to the another first cell; and providing a cutout part without overlapping any one of the first patterns, the second patterns, the extra first patterns, and the extra second patterns, the cutout part being disposed on a blank cell positioned between a second cell, to which one of the second patterns is connected, and another second cell, to which one of the extra second patterns is connected, when the second group is to be extracted, and the cutout part being provided not to connect the second cell to the another second cell.

7. The method according to claim 6, further comprising:
providing another cutout part without overlapping any one of the first patterns, the second patterns, the extra first patterns, and the extra second patterns, the another cutout part being disposed on a blank cell positioned between a first cell, to which one of the first patterns is connected, and another first cell, to which no one of the first patterns and the extra first patterns is connected, or between a second cell, to which one of the second patterns is connected, and another second cell, to which no one of the second patterns and the extra second patterns is connected, and the another cutout part being provided not to connect the first cell to the another first cell, or the second cell to the another second cell.

8. A design method of a mask pattern, the method comprising:
providing a base pattern including a plurality of first cells, a plurality of second cells, a plurality of third cells, a plurality of first blank cells, a plurality of second blank cells, and a plurality of third blank cells, the base pattern including first columns, second columns, third columns, first rows, second rows, and third rows, the first to third columns each including a plurality of cells aligned in a first direction, the first columns and the second columns being alternately arranged in a second direction orthogonal to the first direction, each of the third columns being disposed between one of the first columns and one of the second columns adjacent to each other in the second direction, the first to third rows each including a plurality of cells aligned in the second direction, the first rows and the second rows being alternately arranged in the first direction, and each of the third rows being disposed between one of the first rows and one of the second rows adjacent to each other in the first direction, wherein the plurality of first cells are disposed at cross points of the first columns and the first lows, respectively, the plurality of second cells are disposed at cross points of the second columns and the second rows, respectively, the plurality of third cells are disposed at cross points of the third columns and third rows, respectively, the plurality of first blank cells are disposed respectively between the plurality of first cells in the first and second directions and between the plurality of second cells in the first and second directions, each of the plurality of second blank cells is disposed between a first cell of the plurality of first cells and a first blank cell of the plurality of first blank cells adjacent to each other in the first and second direction, and each of the plurality of third blank cells is disposed between a second cell of the plurality of second cells and a first blank cell of the plurality of first blank cells adjacent to each other in the first or second direction;

assigning a start first cell and an end first cell in the plurality of first cells;

providing first patterns each extending over a first blank cell of the plurality of first blank cells and two second blank cells adjacent to the first blank cell, the first patterns each connecting two adjacent first cells of the plurality of first cells in the first or second direction, and being disposed to make a pathway from the start first cell to the end first cell;

assigning a start second cell and an end second cell in the plurality of second cells;

providing second patterns each extending over a first blank cell of the plurality of first blank cells and two third blank cells adjacent to the first blank cell, the second patterns each connecting two adjacent second cells of the plurality of second cells in the first or second direction without overlapping the first patterns, and being disposed to making a pathway from the start second cell to the end second cell;

assigning a start third cell and an end third cell in the plurality of third cells;

providing third patterns each disposed on a second blank cell of the plurality of second blank cells or a third blank cell of the plurality of third blank cells, the third patterns each connecting two adjacent third cells of the plurality of third cells in the first or second direction without overlapping any one of the first patterns and the second patterns, and being disposed to making a pathway from the start third cell to the end third cell; and extracting a first group or a second group to make the mask pattern, the first group including the first patterns and the first cells connected by the first patterns, and the second group including the second patterns and the second cells connected by the second patterns.

9. The method according to claim 8, wherein no third pattern is disposed such that one of the plurality of first blank cells locates at a position adjacent to two third patterns connected to one of the plurality of third cells in the second direction and the first direction respectively.

10. The method according to claim 8, further comprising:

providing extra first patterns each extending over a first blank cell of the plurality of first blank cells and two second blank cells adjacent to the first blank cell, the extra first patterns each connecting two adjacent first cells of the plurality of first cells in the first or second direction without overlapping any one of the first patterns, the second patterns, and the third patterns, and no one of the extra first patterns being connected to the first cells connected by the first patterns;

providing extra second patterns each extending over a first blank cell of the plurality of first blank cells and two third blank cells adjacent to the first blank cell, the extra second patterns each connecting two adjacent second cells of the plurality of second cells in the first or second direction without overlapping the first patterns, the second patterns, the third patterns, and the extra first patterns, and no one of the extra second patterns being connected to the second cells connected by the second patterns; and providing extra third patterns each provided on a second blank cell of the plurality of second blank cells or a third blank cell of the plurality of third blank cells, the extra third patterns each connecting two adjacent third cells of the plurality of third cells in the first or second direction without overlapping any one of the first patterns, the second patterns, the third patterns, the extra first patterns, and the extra second patterns, wherein the first group further includes the extra first patterns and the first cells connected by the extra first pattern, and the second group further includes the extra second patterns and the second cells connected by the extra second pattern.

11. The method according to claim 10, further comprising:

providing a cutout part without overlapping any one of the first patterns, the second patterns, the third patterns, the extra first patterns, the extra second patterns, and the extra third patterns, the cutout part being disposed on one of a first blank cell and two second blank cells, the first blank cell and the two second blank cells being positioned between a first cell, to which one of the first patterns is connected, and another first cell, to which one of the extra first patterns is connected, when the first group is to be extracted, and the cutout part being provided not to connect the first cell to the another first cell; and providing a cutout part without overlapping any one of the first patterns, the second patterns, the third patterns, the extra first patterns, the extra second patterns, and the extra third patterns, the cutout part being disposed on one of a first blank cell and two third blank cells, the first blank cell and the two third blank cells being positioned between a second cell, to which one of the second patterns is connected, and another second cell, to which one of the extra second patterns is connected, when the second group is to be extracted, and the cutout part being provided not to connect the second cell to the another second cell.

12. A design method of mask patterns, the method comprising:

providing a base pattern including a plurality of first cells, a plurality of second cells, a plurality of third cells, and a plurality of blank cells, the base pattern including first columns, second columns, third columns, first rows, second rows, and third rows, the first to third columns each including a plurality of cells aligned in a first direction, the first columns and the second columns being alternately arranged in a second direction orthogonal to the first direction, each of the third columns being disposed between one of the first columns and one of the second columns adjacent to each other in the second direction, the first to third rows each including a plurality of cells aligned in the second direction, the first rows and the second rows being alternately arranged in the first direction, and each of the third rows being disposed between one of the first rows and one of the second rows adjacent to each other in the first direction, wherein the plurality of first cells are disposed at cross points of the first columns and the first lows, respectively, the plurality of second cells are disposed at cross points of the second columns and the second rows, respectively, the plurality of third cells are disposed at cross points of the third columns and third rows, respectively, the plurality of blank cells are disposed respectively between the plurality of first cells in the first direction and the second direction, between the plurality of second cells in the first direction and the second direction, and between the plurality of third cells in the first direction and the second direction;

assigning a start third cell and an end third cell in the plurality of third cells;

providing third patterns disposed on blank cells of the plurality of blank cells respectively, the third patterns each connecting two adjacent third cells of the plurality of third cells in the first or second direction, and being disposed to make a pathway from the start third cell to the end third cell;

providing first patterns each extending over blank cells of the plurality of blank cells positioned between two adjacent first cells of the plurality of first cells in the first or second direction, the first patterns each connecting the two adjacent first cells without overlapping the third patterns;

providing second patterns each extending over blank cells of the plurality of blank cells positioned between two adjacent second cells of the plurality of second cells in the first or second direction, the second patterns each connecting the two adjacent second cells without overlapping the first patterns and the third patterns; and extracting a first group or a second group to make the mask pattern, the first group including the first patterns and the first cells connected by the first patterns, and the second group including the second patterns and the second cells connected by the second patterns.

13. The method according to claim 12, wherein
the third patterns are disposed such that no one of the plurality of blank cells is located at a position adjacent to two third patterns connected to one of the plurality of third cells, one of the two third pattern being connected to the one of the plurality of third cells in the second direction, and the other of the two third pattern being connected to the one of the plurality of third cells in the first direction.

14. The method according to claim 12, further comprising:
providing extra third patterns each provided on a blank cell of the plurality of blank cells, the extra third patterns each connecting two adjacent third cells of the plurality of third cells in the first or second direction without overlapping any one of the first patterns, the second patterns, and the third patterns; and
providing a trimming pattern covering the extra third patterns.

15. The method according to claim 12, further comprising:
assigning a start first cell and an end first cell in the plurality of first cells; and
assigning a start second cell and an end second cell in the plurality of second cells,
wherein the first patterns are disposed to make a pathway from the start first cell to the end first cell, and the second patterns are disposed to make a pathway from the start second cell to the end second cell.

16. The method according to claim 15, further comprising:
providing extra first patterns each extending over blank cells between two adjacent first cells of the plurality of first cells, the extra first patterns each connecting the two adjacent first cells in the first or second direction without overlapping any one of the first patterns, the second patterns, and the third patterns, and no one of the extra first patterns being connected to the first cells connected by the first patterns;
providing extra second patterns each extending over blank cells between two adjacent second cells of the plurality of second cells, the extra second patterns each connecting the two adjacent second cells in the first or second direction without overlapping the first patterns, the second patterns, the third patterns, and the extra first patterns, and no one of the extra second patterns being connected to the second cells connected by the second patterns; and
providing extra third patterns each provided on a blank cell of the plurality of blank cells, the extra third patterns each connecting two adjacent third cells of the plurality of third cells in the first or second direction without overlapping any one of the first patterns, the second patterns, the third patterns, the extra first patterns, and the extra second patterns, and no one of the extra third patterns being connected to the third cells connected by the third patterns.

17. The method according to claim 15, further comprising:
providing a cutout part without overlapping any one of the first patterns, the second patterns, the third patterns, the extra first patterns, the extra second patterns, and the extra third patterns, the cutout part being disposed on a blank cell positioned between a first cell, to which one of the first patterns is connected, and another first cell, to which one of the extra first patterns is connected, when the first group is to be extracted, and the cutout part being provided not to connect the first cell to the another first cell; and
providing a cutout part without overlapping any one of the first patterns, the second patterns, the third patterns, the extra first patterns, the extra second patterns, and the extra third patterns, the cutout part being disposed on a blank cell positioned between a second cell, to which one of the second patterns is connected, and another second cell, to which one of the extra second patterns is connected, when the second group is to be extracted, and the cutout part being provided not to connect the second cell to the another second cell.

18. A design method of mask patterns, the method comprising:
providing a base pattern including a plurality of blank cells disposed in a plurality of columns, each of the plurality of columns including blank cells aligned in a first direction, and the plurality of columns being arranged in a second direction orthogonal to the first direction;
assigning a plurality of pairs of start and end cells on the base pattern, the plurality of pairs of start and end cells including first to third start cells and first to third end cells each assigned on a blank cell of the plurality of blank cells;
providing a first interconnection connecting a first start cell and a first end cell by disposing first patterns on blank cells of the plurality of blank cells respectively;
providing other first interconnection connecting other first start cell and other first end cell by disposing other first patterns on blank cells of the plurality of blank cells respectively, the other first interconnection being separated from the first interconnection with a distance equal to or more than a length of three blank cells arranged in series;
providing a second interconnection connecting a second start cell and a second end cell by disposing second patterns on blank cells of the plurality of blank cells respectively, the second interconnection being separated from the first interconnection and the other first interconnection with a distance equal to or more than a length of one blank cell;
providing a third interconnection connecting a third start cell and a third end cell of the plurality of pairs by disposing third patterns on blank cells of the matrix respectively, the third interconnection extending between the first interconnection and the second interconnection and/or between the other first interconnection and the second interconnection; and extracting a first group of interconnections or a second group of interconnections to make the mask pattern, the first group including the first interconnection and the other first interconnection, and the second group including the second interconnection.

19. The method according to claim 18, further comprising:
providing other second interconnection connecting other second start cell and other second end cell by disposing other second patterns on blank cells of the plurality of blank cells respectively, the other second interconnection being separated from the second interconnection with a distance equal to or more than a length of three blank cells arranged in series.

20. The method according to claim 18, wherein:
the third interconnection has a first side and a second side, the first side facing the first interconnection and/or the other first interconnection, and the second side facing the second interconnection.

21. The method according to claim 20, further comprising:
providing an extra first interconnection by disposing extra first patterns respectively on blank cells positioned along the first side of the third interconnection; and
providing an extra second interconnection by disposing extra second patterns respectively on blank cells positioned along the second side of the third interconnection.

22. The method according to claim 21, further comprising:
providing at least one of an other extra first interconnection and an other extra second interconnection, wherein
the other extra first interconnection is formed by disposing other extra first patterns on blank cells of the plurality of blank cells respectively, the other extra first interconnection being separated from the first interconnection, the other first interconnection and the extra first interconnection with a distance equal to or more than a length of three blank cells arranged in series, and being separated from the second interconnection and the extra second interconnection with a distance equal to or more than a length of one blank cell, and
the other extra second interconnection is formed by disposing other extra second patterns on blank cells of the plurality of blank cells respectively, the other extra second interconnection being separated from the second interconnection and the extra second interconnection with a distance equal to or more than a length of three blank cells arranged in series, and being separated from the first interconnection, the other first interconnection and the extra first interconnection with a distance equal to or more than a length of one blank cell;
extending at least one of the first interconnection, the other first interconnection, the extra first interconnection, the other extra first interconnection, the second interconnection, the extra second interconnection, and the other extra second interconnection over blank cells capable of extending thereover; and
providing at least one of extra third interconnections to fill all of blank cells in the plurality of blank cells, the extra third interconnections being formed by disposing extra third patterns on blank cells of the plurality of blank cells respectively.

23. The method according to claim 22, further comprising:
providing a trimming pattern covering part of the plurality of blank cells other than the first interconnection, the other first interconnection, the second interconnection, and the third interconnection.

24. The method according to claim 23, wherein
the trimming pattern further covers the extended parts of the first interconnection, the other first interconnection and the second interconnection.

25. The method according to claim 18, further comprising:
providing a plurality of sub-base patterns each including a part of the plurality of blank cells,
wherein the plurality of pairs are assigned on the plurality of sub-base patterns, and the first to third interconnections are provided on the plurality of sub-base patterns.

26. The method according to claim 18, wherein
an area of the mask pattern is reduced by interchanging one of the first interconnections with one of the second interconnections.

27. A method for manufacturing a semiconductor device, the method comprising:
forming a first layer on a semiconductor substrate;
forming a second layer on the first layer;
forming a core member on the first layer by selectively removing the second layer;
forming a side wall around the core member on the first layer, the side wall being provided on a side surface of the core member;
removing the core member so that the side wall remains on the first layer; and
selectively removing the first layer using the side wall as an etching mask, wherein
the second layer is selectively removed using a mask pattern designed by a method comprising:
providing a base pattern including a plurality of first cells, a plurality of second cells and a plurality of blank cells, the base pattern including first columns, second columns, first rows, and second rows, the first columns and the second columns each including a plurality of cells aligned in a first direction, and being alternately arranged in a second direction orthogonal to the first direction, and the first rows and the second rows each including a plurality of cells aligned in the second direction, and being alternately arranged in the first direction, wherein the plurality of first cells are disposed at cross points of the first columns and the first rows respectively, the plurality of second cells are disposed at cross points of the second columns and the second rows respectively, and the plurality of blank cells are disposed in the first direction and the second direction between the plurality of first cells and between the plurality of second cells;
assigning a start first cell and an end first cell in the plurality of first cells;
providing first patterns on blank cells of the plurality of blank cells respectively, the first patterns each connecting two adjacent first cells of the plurality of first cells in the first or second direction, and being disposed to make a pathway from the start first cell to the end first cell;
assigning a start second cell and an end second cell in the plurality of second cells;
providing second patterns on blank cells of the plurality of blank cells respectively, the second patterns each connecting two adjacent second cells of the plurality of second cells in the first or second direction without overlapping the first patterns, and being disposed to making a pathway from the start second cell to the end second cell; and extracting a first group or a second group to make the mask pattern, the first group including the first patterns and the first cells connected by the first patterns, and the second group including the second patterns and the second cells connected by the second patterns.

* * * * *